(12) United States Patent
Morgan et al.

(10) Patent No.: US 9,040,808 B2
(45) Date of Patent: May 26, 2015

(54) LIGHT-GUIDE SOLAR PANEL AND METHOD OF FABRICATION THEREOF

(75) Inventors: John Paul Morgan, Toronto (CA);
Philip M. Chang, Scarborough (CA);
Stefan H. S. Myrskog, Richmond Hill (CA)

(73) Assignee: MORGAN SOLAR INC., Toronto (CA)

( * ) Notice: Subject to any disclaimer, the term of this patent is extended or adjusted under 35 U.S.C. 154(b) by 605 days.

(21) Appl. No.: 12/705,415

(22) Filed: Feb. 12, 2010

(65) Prior Publication Data

US 2011/0011449 A1     Jan. 20, 2011

Related U.S. Application Data

(63) Continuation-in-part of application No. 12/113,705, filed on May 1, 2008, now Pat. No. 7,873,257.

(60) Provisional application No. 60/951,775, filed on Jul. 25, 2007, provisional application No. 60/942,745, (Continued)

(51) Int. Cl.
*H02N 6/00*     (2006.01)
*H01L 31/042*   (2014.01)
(Continued)

(52) U.S. Cl.
CPC .......... *H01L 31/0522* (2013.01); *H01L 31/0422* (2013.01); *H01L 31/18* (2013.01); *Y02E 10/52* (2013.01)

(58) Field of Classification Search
USPC .......... 136/255, 243, 246, 257, 259; 126/634, 126/684, 685; 359/365, 853, 868, 869; 362/84, 183, 228, 557; 385/31, 33, 385/146, 147, 900, 901
See application file for complete search history.

(56) References Cited

U.S. PATENT DOCUMENTS 3,780,722 A   12/1973  Swet
4,037,096 A    7/1977  Brendgord et al.
(Continued)

FOREIGN PATENT DOCUMENTS

DE   19937448 A1   2/2001
EP    1895228 A1   3/2008
(Continued)

OTHER PUBLICATIONS

International Search Report of PCT/CA2010/001184; Nov. 22, 2010; Varma Suchita.

(Continued)

*Primary Examiner* — Tamir Ayad
(74) *Attorney, Agent, or Firm* — BCF LLP

(57) ABSTRACT

The present invention is that of a solar energy system that uses a light-guide solar panel (LGSP) to trap light inside a dielectric or other transparent panel and propagates the light to one of the panel edges for harvesting by a solar energy collector such as a photovoltaic cell. This allows for very thin modules whose thickness is comparable to the height of the solar energy collector. This eliminates eliminating the depth requirements inherent in traditional concentrated photovoltaic solar energy systems. A light guide solar panel has a deflecting layer, a light guide layer and a solar cell in optical communication with the light guide layer. The deflecting layer receives light at a first surface and inputs the light into the light guide layer. The light guide layer propagates the light to the solar cell, which is aligned generally parallel to the input surface.

20 Claims, 112 Drawing Sheets

Related U.S. Application Data filed on Jun. 8, 2007, provisional application No. 60/915,207, filed on May 1, 2007, provisional application No. 61/151,006, filed on Feb. 9, 2009, provisional application No. 61/229,542, filed on Jul. 29, 2009.

(51) Int. Cl.
*H01L 31/052* (2014.01)
*H01L 31/18* (2006.01)

(56) References Cited

U.S. PATENT DOCUMENTS

| | | | |
|---|---|---|---|
| 4,074,704 A | 2/1978 | Gellert | |
| 4,151,582 A | 4/1979 | Grunberger | |
| 4,199,376 A | 4/1980 | Sill | |
| 4,252,416 A | 2/1981 | Jaccard | |
| 4,257,401 A | 3/1981 | Daniels | |
| 4,282,862 A | 8/1981 | Soleau | |
| 4,344,417 A | 8/1982 | Malecek | |
| 4,357,486 A | 11/1982 | Blieden et al. | |
| 4,379,613 A | 4/1983 | Coburn | |
| 4,389,698 A | 6/1983 | Cibie | |
| 4,411,490 A | 10/1983 | Daniel | |
| 4,432,039 A | 2/1984 | Cibie | |
| 4,496,211 A | 1/1985 | Daniel | |
| 4,505,264 A | 3/1985 | Tremblay | |
| 4,529,830 A | 7/1985 | Daniel | |
| 4,539,625 A | 9/1985 | Bornstein et al. | |
| 4,691,994 A | 9/1987 | Afian et al. | |
| 4,697,867 A | 10/1987 | Blanc et al. | |
| 4,798,448 A | 1/1989 | Van Raalte | |
| 4,863,224 A | 9/1989 | Afian et al. | |
| 4,954,930 A | 9/1990 | Maegawa et al. | |
| 5,050,946 A | 9/1991 | Hathaway | |
| 5,089,055 A | 2/1992 | Nakamura | |
| 5,136,480 A | 8/1992 | Pristash et al. | |
| 5,197,792 A | 3/1993 | Jiao et al. | |
| 5,202,950 A | 4/1993 | Arego et al. | |
| 5,220,462 A | 6/1993 | Feldman, Jr. | |
| 5,357,592 A | 10/1994 | Neilson | |
| 5,385,615 A | 1/1995 | Horne | |
| 5,390,085 A | 2/1995 | Mari-Roca et al. | |
| 5,396,350 A | 3/1995 | Beeson et al. | |
| 5,438,485 A | 8/1995 | Li et al. | |
| 5,485,291 A | 1/1996 | Qiao et al. | |
| 5,485,354 A | 1/1996 | Ciupke et al. | |
| 5,521,725 A | 5/1996 | Beeson et al. | |
| 5,528,720 A | 6/1996 | Winston et al. | |
| 5,540,216 A | 7/1996 | Rasmusson | |
| 5,664,862 A | 9/1997 | Redmond et al. | |
| 5,719,649 A | 2/1998 | Shono et al. | |
| 5,806,955 A | 9/1998 | Parkyn, Jr. et al. | |
| 5,838,403 A | 11/1998 | Jannson et al. | |
| 5,877,874 A | 3/1999 | Rosenberg | |
| 5,914,760 A | 6/1999 | Daiku | |
| 5,926,601 A | 7/1999 | Tai et al. | |
| 5,977,478 A | 11/1999 | Hibino et al. | |
| 6,021,007 A | 2/2000 | Murtha | |
| 6,036,340 A | 3/2000 | Fohl et al. | |
| 6,072,551 A | 6/2000 | Jannson et al. | |
| 6,097,549 A | 8/2000 | Jenkins et al. | |
| 6,108,059 A | 8/2000 | Yang | |
| 6,129,439 A | 10/2000 | Hou et al. | |
| 6,139,176 A | 10/2000 | Hulse et al. | |
| 6,201,246 B1 | 3/2001 | Potekev et al. | |
| 6,224,223 B1 | 5/2001 | Higuchi et al. | |
| 6,252,155 B1 | 6/2001 | Ortabasi | |
| 6,294,723 B2 | 9/2001 | Uematsu et al. | |
| 6,367,941 B2 | 4/2002 | Lea et al. | |
| 6,379,016 B1 | 4/2002 | Boyd et al. | |
| 6,425,391 B1 | 7/2002 | Davoren et al. | |
| 6,440,769 B2 | 8/2002 | Peumans et al. | |
| 6,461,007 B1 | 10/2002 | Akaoka | |
| 6,473,554 B1 | 10/2002 | Pelka et al. |
| 6,476,312 B1 | 11/2002 | Barnham |
| 6,541,694 B2 | 4/2003 | Winston et al. |
| 6,570,710 B1 | 5/2003 | Nilsen et al. |
| 6,576,887 B2 | 6/2003 | Whitney et al. |
| 6,607,286 B2 | 8/2003 | West et al. |
| 6,612,709 B2 | 9/2003 | Yamada et al. |
| 6,623,132 B2 | 9/2003 | Lekson et al. |
| 6,639,733 B2 | 10/2003 | Minano et al. |
| 6,647,199 B1 | 11/2003 | Pelka et al. |
| 6,730,840 B2 | 5/2004 | Sasaoka et al. |
| 6,811,277 B2 | 11/2004 | Amano |
| 6,819,687 B1 | 11/2004 | Fein |
| 6,899,443 B2 | 5/2005 | Rizkin et al. |
| 6,966,661 B2 | 11/2005 | Read |
| 7,021,805 B2 | 4/2006 | Amano et al. |
| 7,046,907 B2 | 5/2006 | Miyashita |
| 7,083,313 B2 | 8/2006 | Smith |
| 7,134,778 B2 | 11/2006 | Kazuhiro et al. |
| 7,160,010 B1 | 1/2007 | Chinniah et al. |
| 7,286,296 B2 | 10/2007 | Chaves et al. |
| 7,347,611 B2 | 3/2008 | Kwon |
| 7,371,001 B2 | 5/2008 | Miyashita |
| 7,672,549 B2 | 3/2010 | Ghosh et al. |
| 2002/0148497 A1 | 10/2002 | Sasaoka et al. |
| 2003/0063474 A1 | 4/2003 | Coushaine |
| 2003/0067760 A1 | 4/2003 | Jagt et al. |
| 2003/0075167 A1 | 4/2003 | Minano Dominguez et al. |
| 2003/0075212 A1 | 4/2003 | Chen |
| 2004/0103938 A1 | 6/2004 | Rider |
| 2005/0111235 A1 | 5/2005 | Suzuki et al. |
| 2005/0129358 A1 | 6/2005 | Minano et al. |
| 2005/0254259 A1 | 11/2005 | Yamashita et al. |
| 2006/0072222 A1 | 4/2006 | Lichy |
| 2006/0077692 A1 | 4/2006 | Noh et al. |
| 2006/0098929 A1 | 5/2006 | Steenblik et al. |
| 2006/0207650 A1 | 9/2006 | Winston et al. |
| 2007/0047260 A1 | 3/2007 | Lee et al. |
| 2007/0171418 A1 | 7/2007 | Nyhart, Jr. |
| 2007/0246040 A1 | 10/2007 | Schaafsma |
| 2007/0251568 A1 | 11/2007 | Maeda |
| 2008/0041441 A1 | 2/2008 | Schwartzman |
| 2008/0048102 A1 | 2/2008 | Kurtz et al. |
| 2008/0087323 A1 | 4/2008 | Araki et al. |
| 2008/0165437 A1 | 7/2008 | DiDomenico |
| 2008/0184989 A1 | 8/2008 | Mecham |
| 2008/0223443 A1 | 9/2008 | Benitez et al. |
| 2008/0257408 A1 | 10/2008 | Chen et al. |
| 2008/0264486 A1 | 10/2008 | Chen et al. |
| 2008/0271776 A1 | 11/2008 | Morgan |
| 2008/0314436 A1 | 12/2008 | O'Connell et al. |
| 2009/0126792 A1 | 5/2009 | Gruhlke et al. |
| 2010/0024868 A1 | 2/2010 | Baruchi et al. |
| 2010/0037954 A1 | 2/2010 | Thony |
| 2010/0065120 A1 | 3/2010 | McDonald |
| 2010/0108124 A1 | 5/2010 | Knox et al. |
| 2010/0116336 A1 | 5/2010 | Martinez Anton et al. |
| 2010/0165495 A1 | 7/2010 | Murtha |
| 2010/0202142 A1 | 8/2010 | Morgan et al. |

FOREIGN PATENT DOCUMENTS

| | | |
|---|---|---|
| EP | 2061093 A1 | 5/2009 |
| EP | 2077586 A1 | 7/2009 |
| ES | P200803237 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| WO | 9826212 A1 | 6/1998 |
| WO | 0244766 A2 | 6/2002 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2007045917 A2 | 4/2007 |
| WO | 2008001277 A2 | 1/2008 |

(56) References Cited

FOREIGN PATENT DOCUMENTS

| WO | 2008058245 | A2 | 5/2008 |
|---|---|---|---|
| WO | 2008092679 | A1 | 8/2008 |
| WO | 2008103987 | A2 | 8/2008 |
| WO | 2009001106 | A2 | 12/2008 |
| WO | 2009030037 | A1 | 3/2009 |
| WO | 2009041330 | A1 | 4/2009 |
| WO | 2009058619 | A2 | 5/2009 |
| WO | 2009063416 | A2 | 5/2009 |
| WO | 2009064701 | A1 | 5/2009 |
| WO | 2009086293 | A2 | 7/2009 |
| WO | 2010033859 | A2 | 3/2010 |
| WO | 2010040053 | A1 | 4/2010 |

OTHER PUBLICATIONS

English Abstract of FR2872256.
English Abstract of JP2001289515.
English Abstract of JP2003258291.
English Abstract of JP2005019587.
English Abstract of JP2005123036.
English Abstract of EP1895228.
English Abstract of DE19937448.
Benitez et al., "High Performance Fresnel-based Photovoltaic Concentrator", Apr. 26, 2010, Optical Society of America, vol. 18, No. S1.
Winston et al., "Planar Concentrators Near the Étendue Limit", Oct. 1, 2005, Optical Society of America, vol. 30, No. 19.
Chaves et al.: "Ideal Concentrators with Gaps", Mar. 1, 2002, Applied Optics, vol. 41, No. 7, pp. 1267-1276.
Chaves et al.: "Ultra Flat Ideal Concentrators of High Concentration", 2000, Solar Energy, vol. 69, No. 4, pp. 269-281.
Ghosh et al.: "A New Approach to Concentrating and Aggregating Light Energy", Jun. 2007.
Document "Chapter 2: Holographic Methods".
The William L. Bonnell Company, "Extrusion Process Description".
"Plastic and Their Properties".
"High Reflectors".
"Plexiglas Acrylic Molding Resin", 2008, Altuglas International.
Plexiglas Acrylic Molding Resin "Extrusion", 2008, Altuglas International.
JDSU "Thin Film Custom Optics", Dec. 2007.
"Meisner Acrylic Casting".

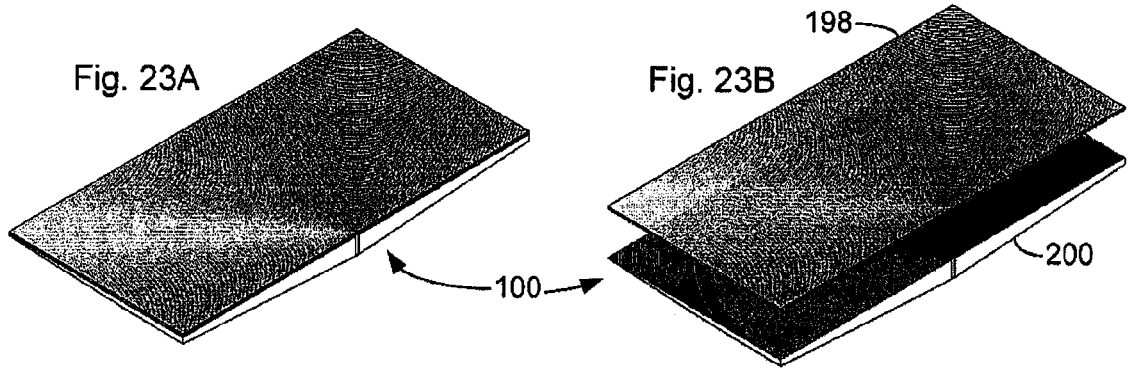
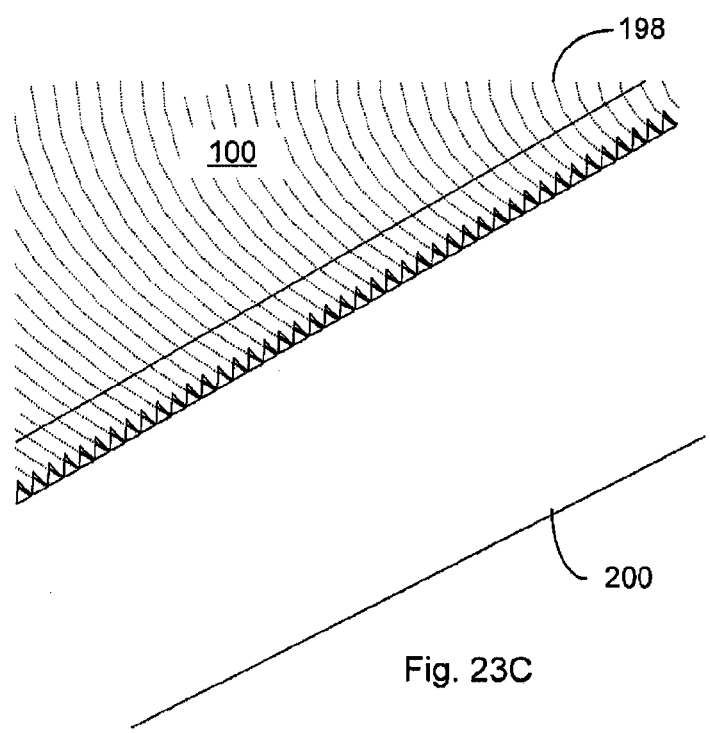

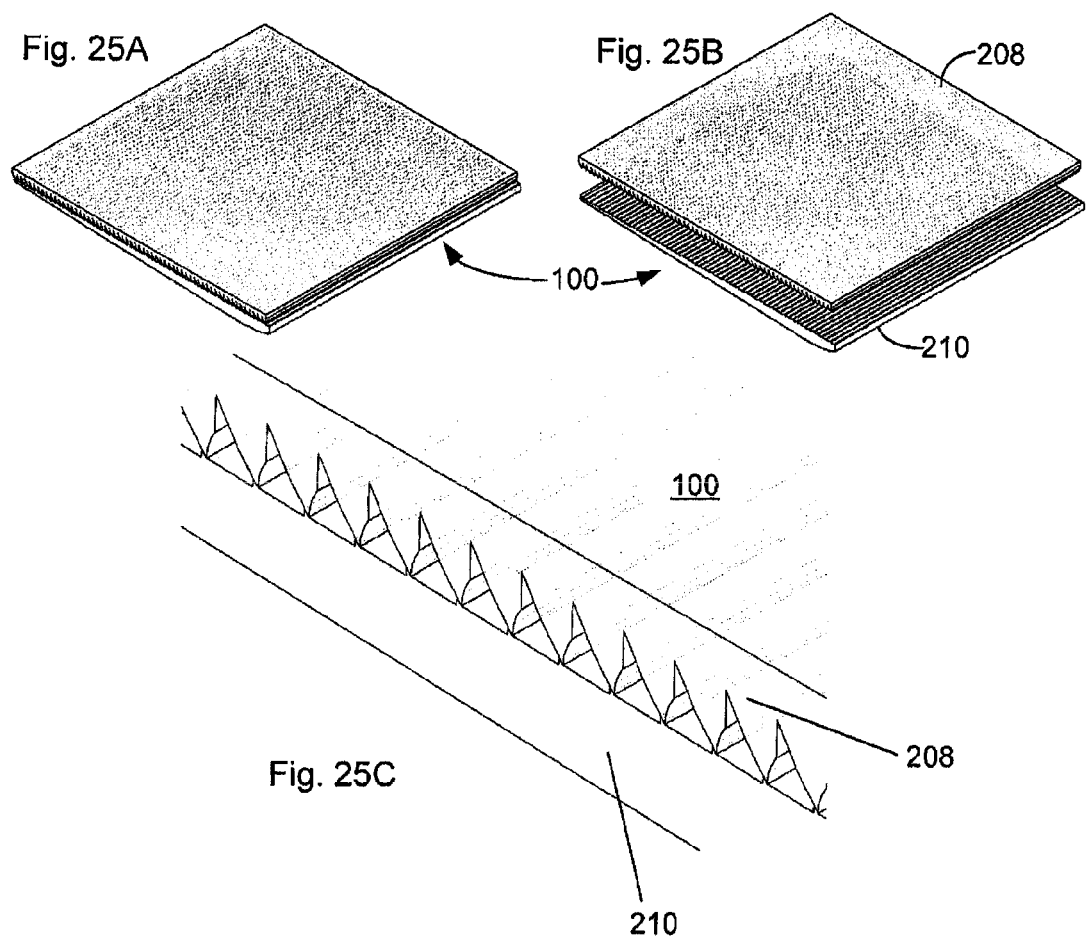

244

242

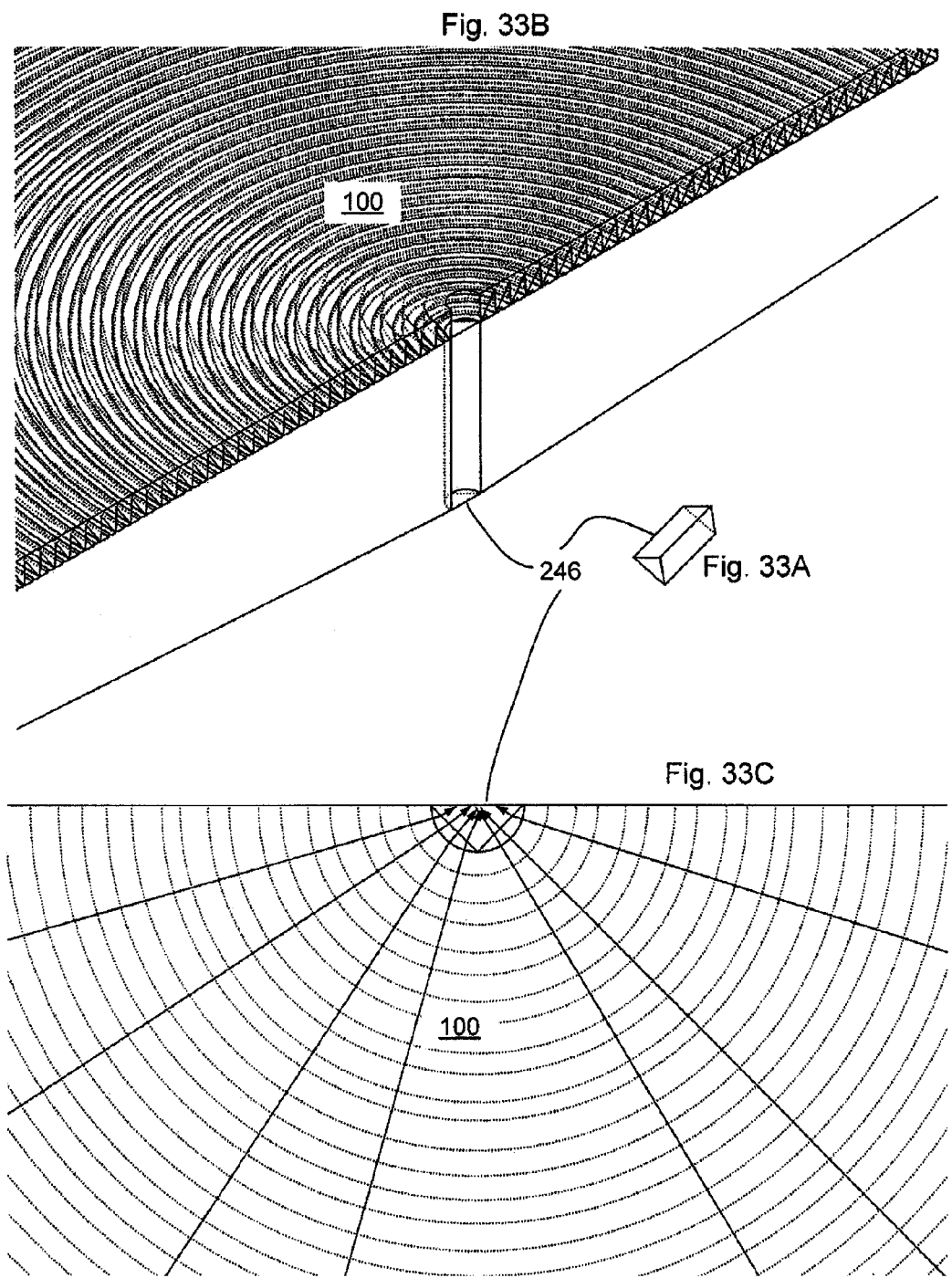

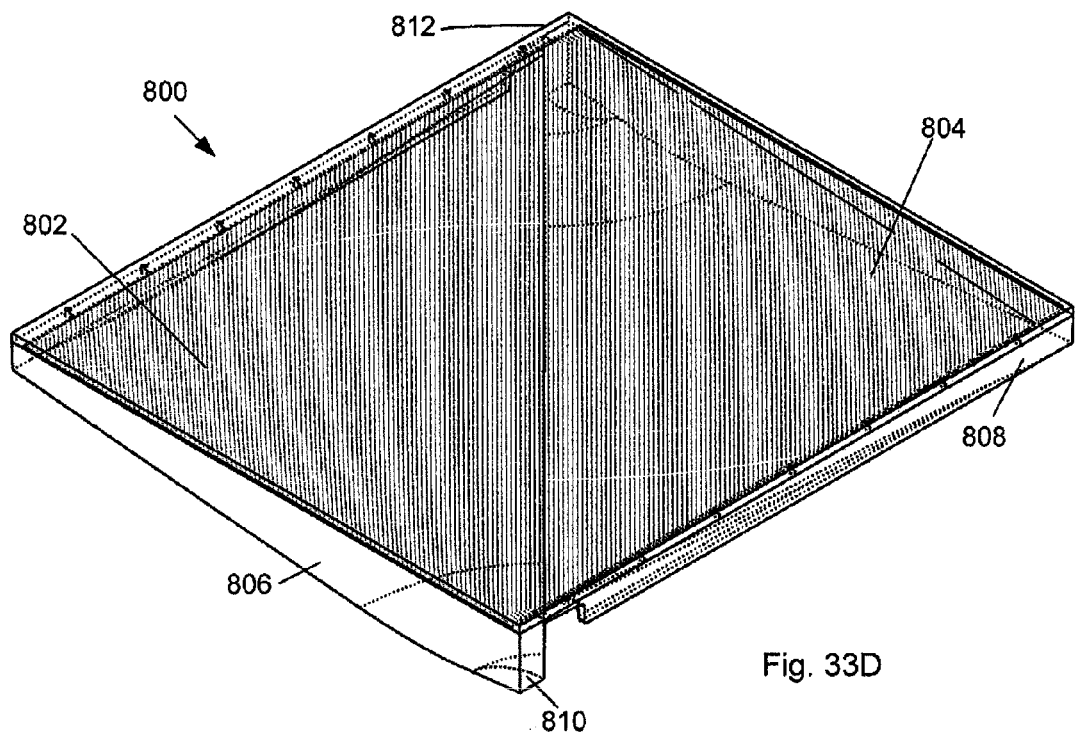
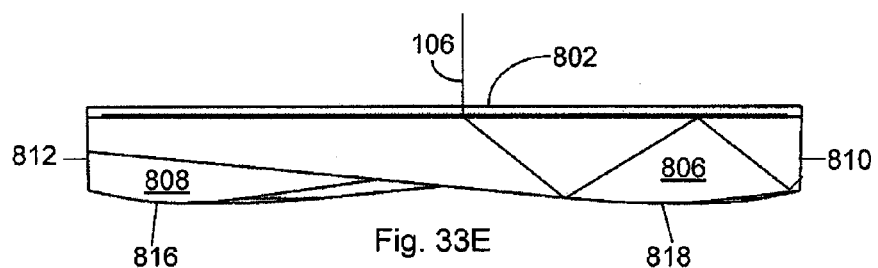
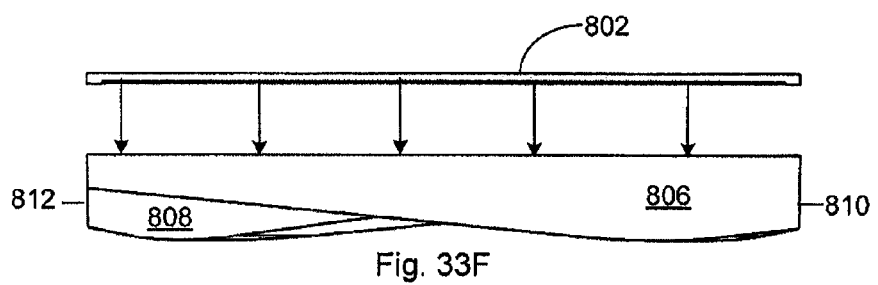

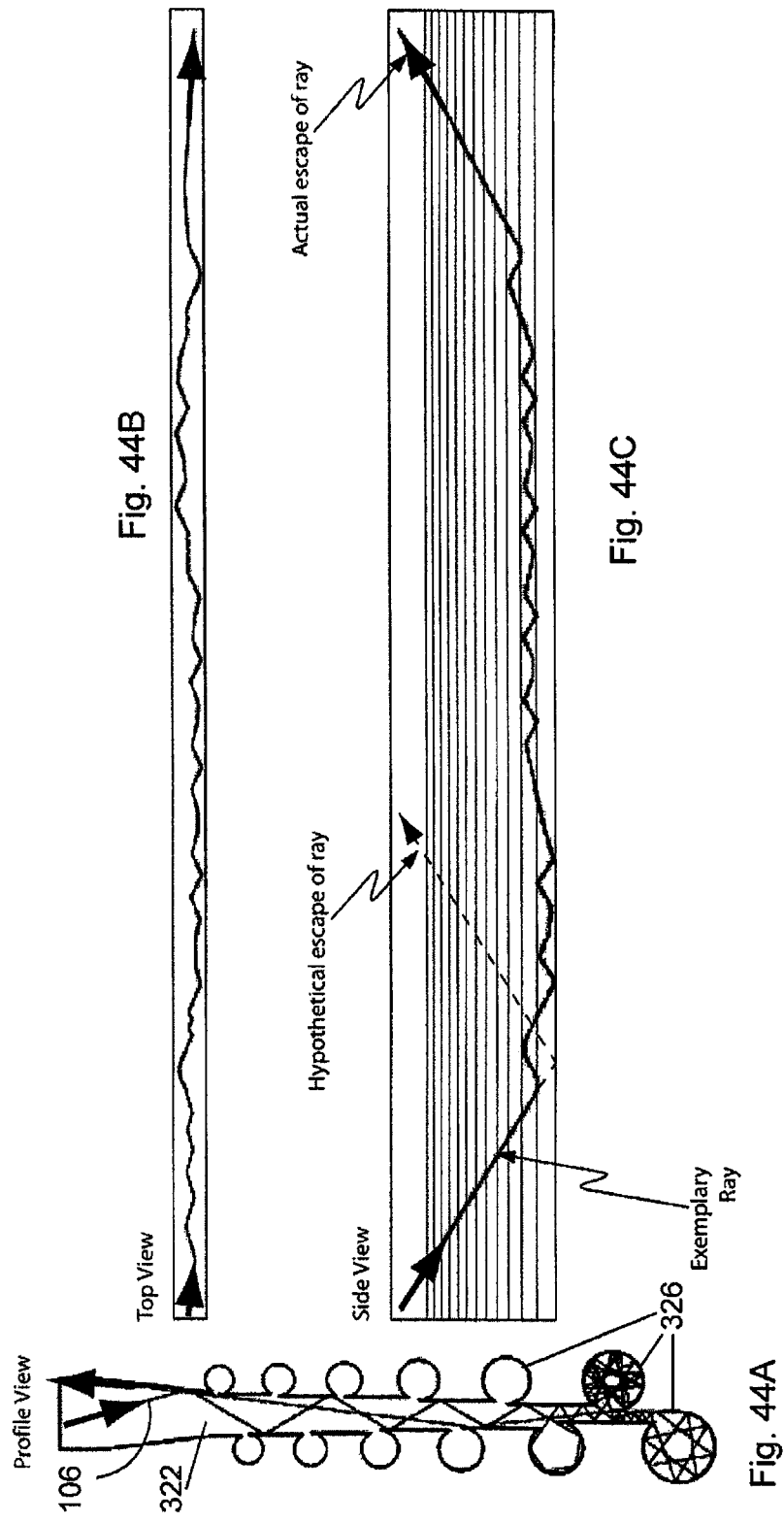

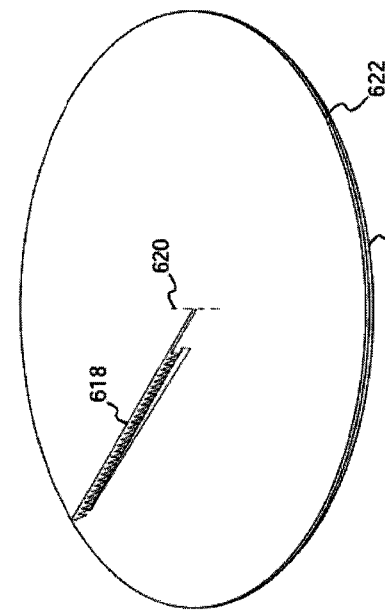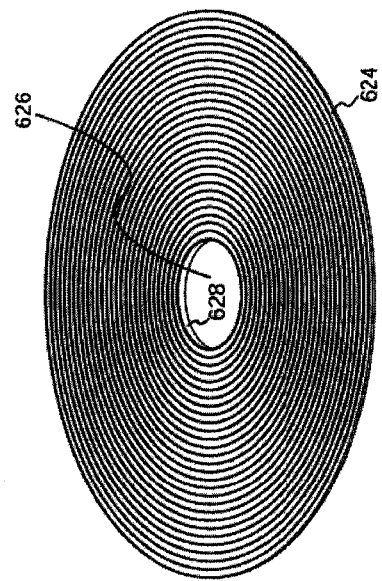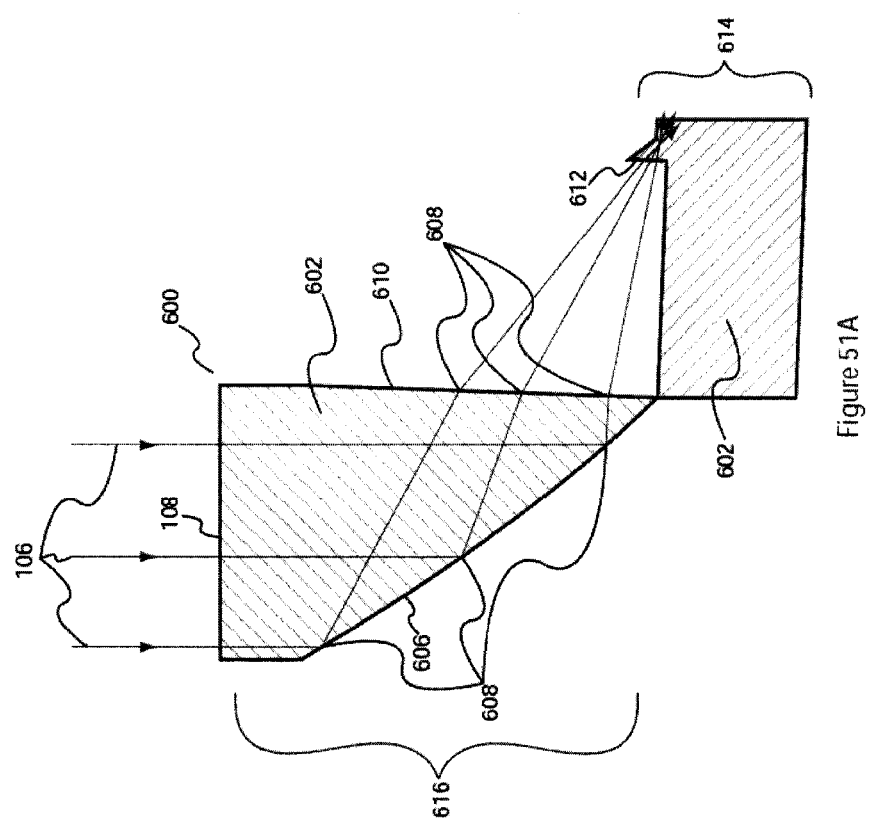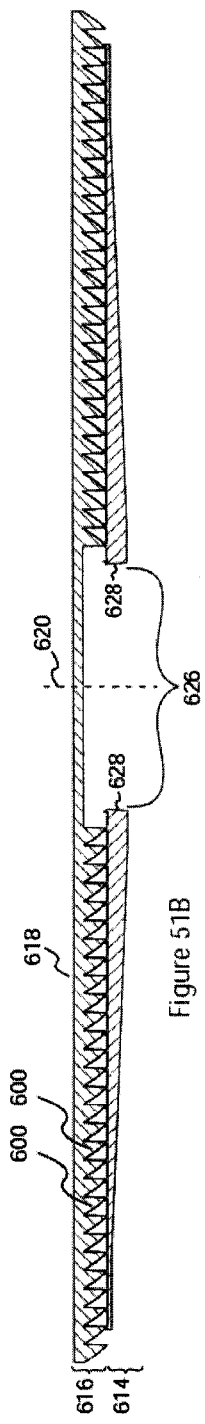

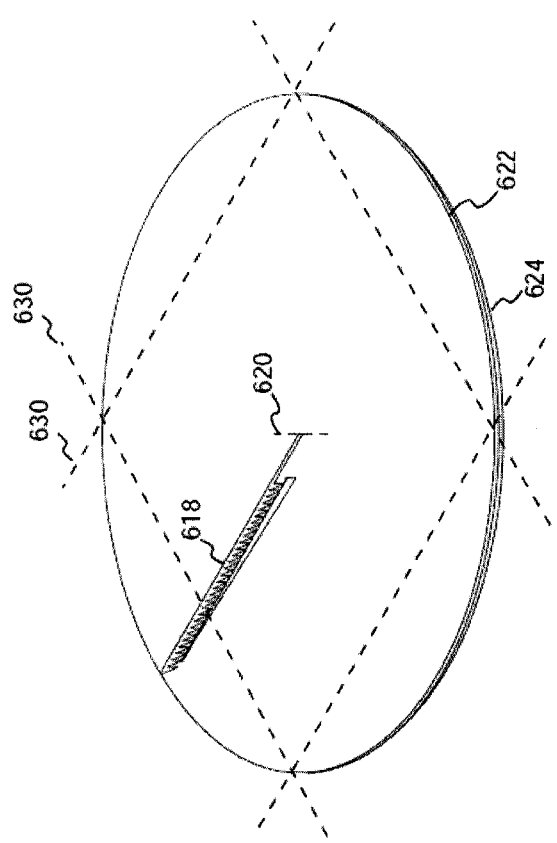
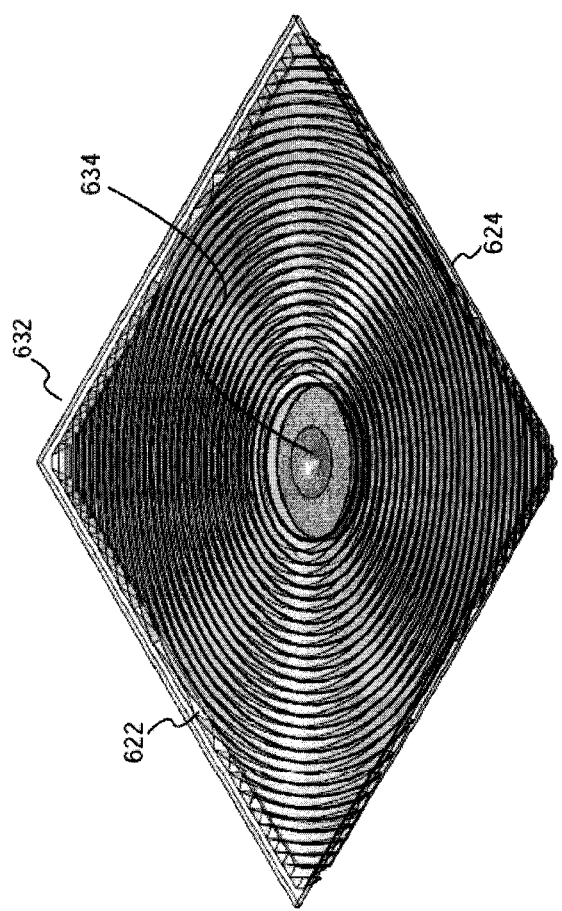
Figure 52A
Figure 52B

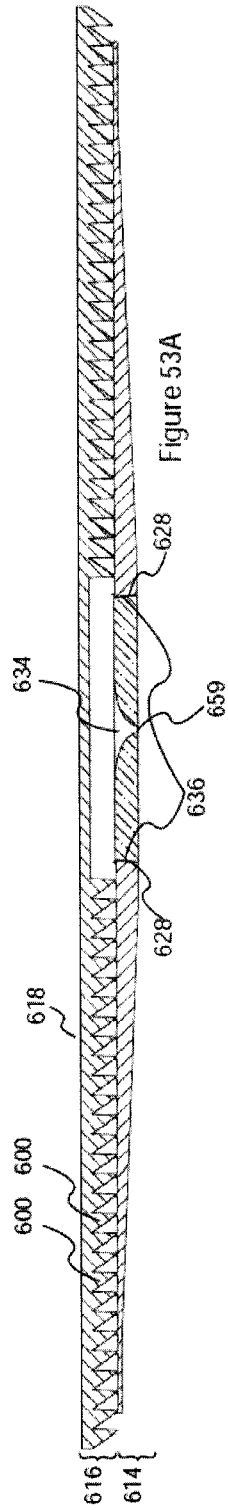
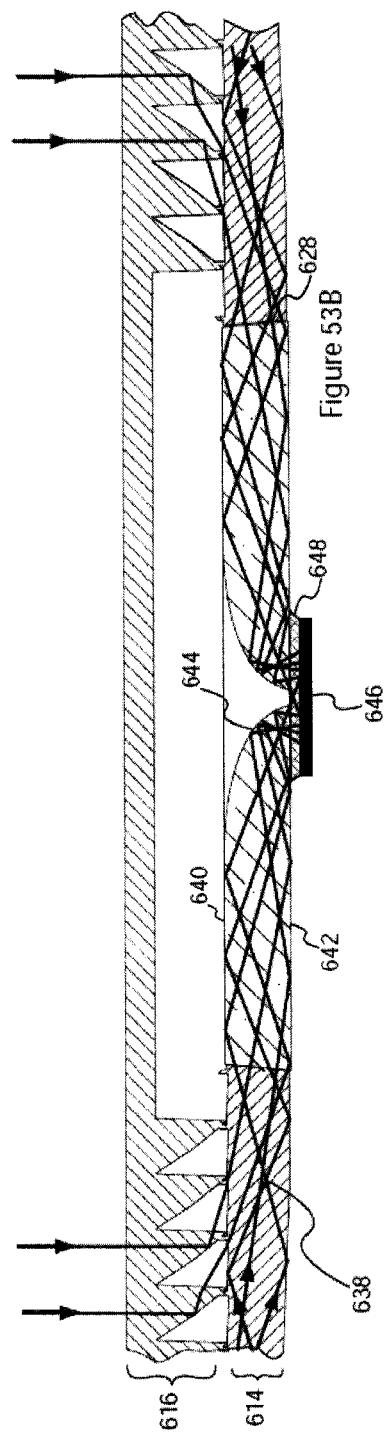
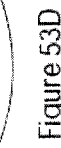
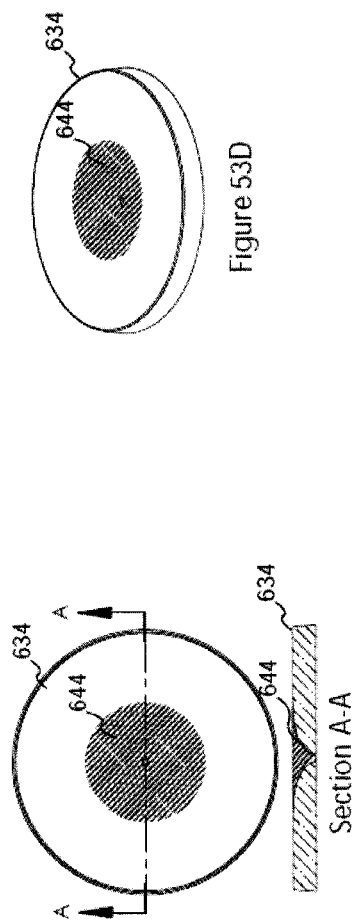
Figure 53A
Figure 53B
Figure 53D
Figure 53C

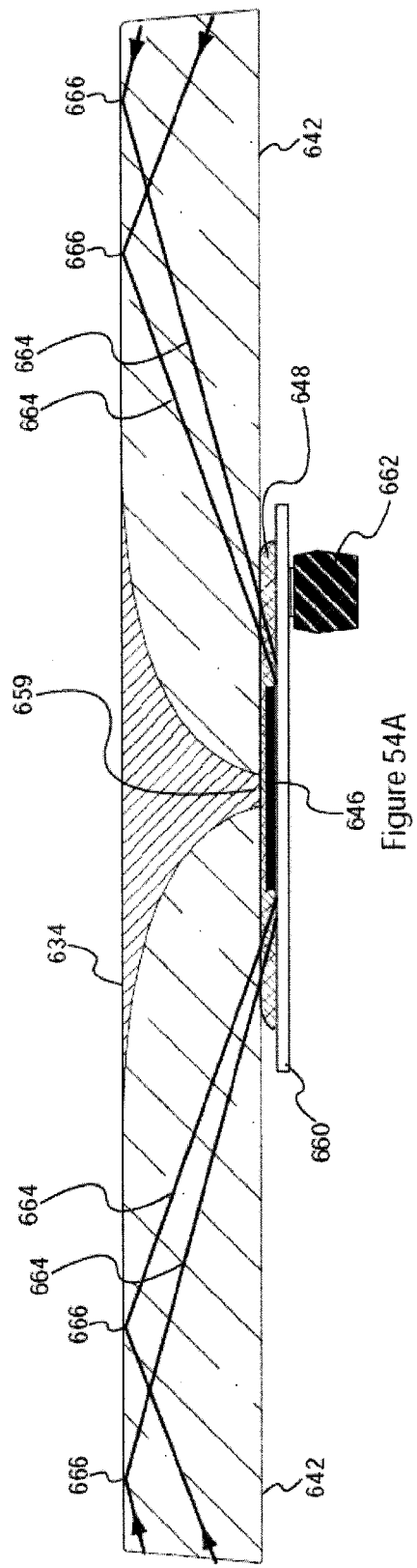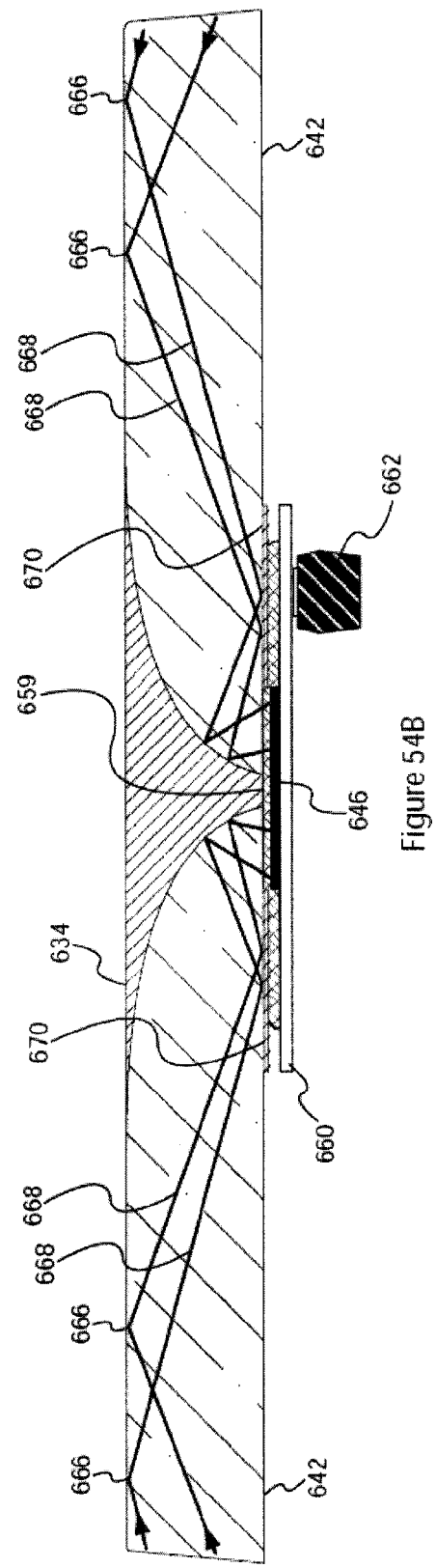

SECTION A-A

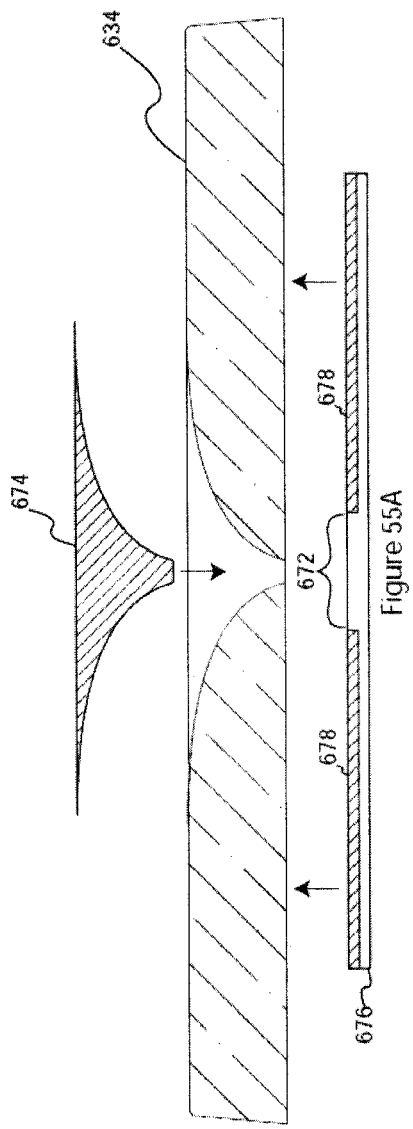
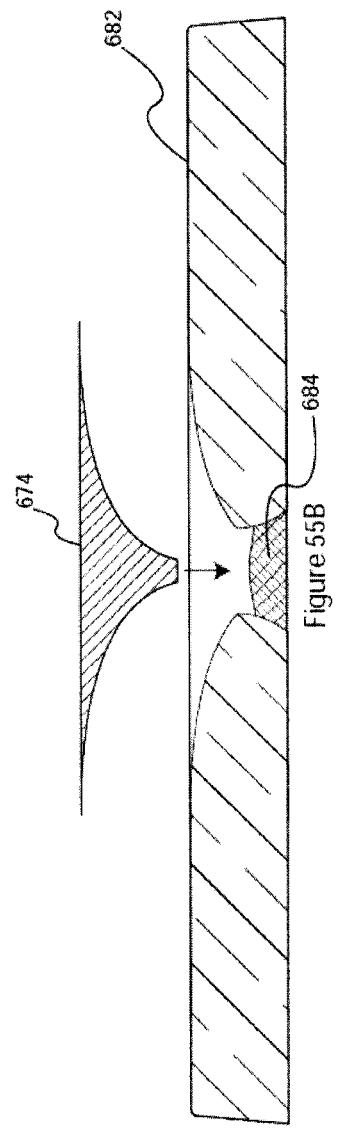
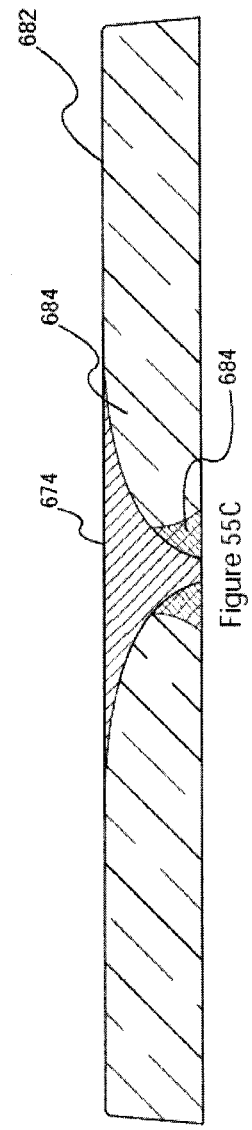

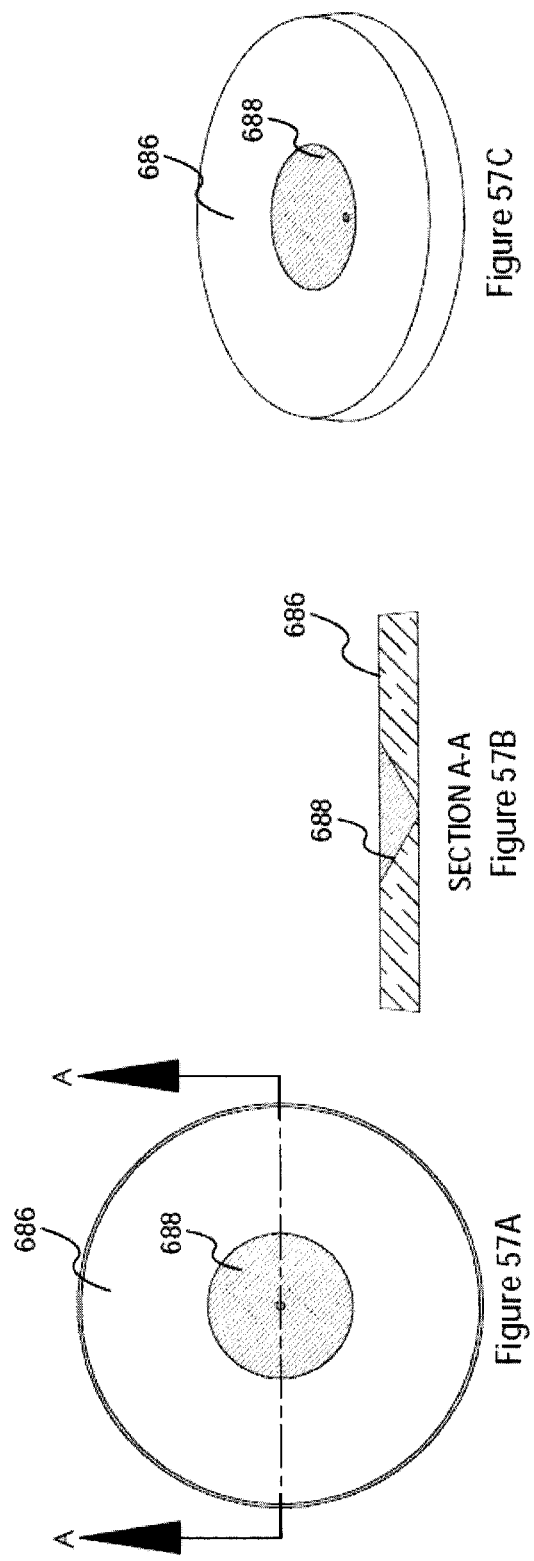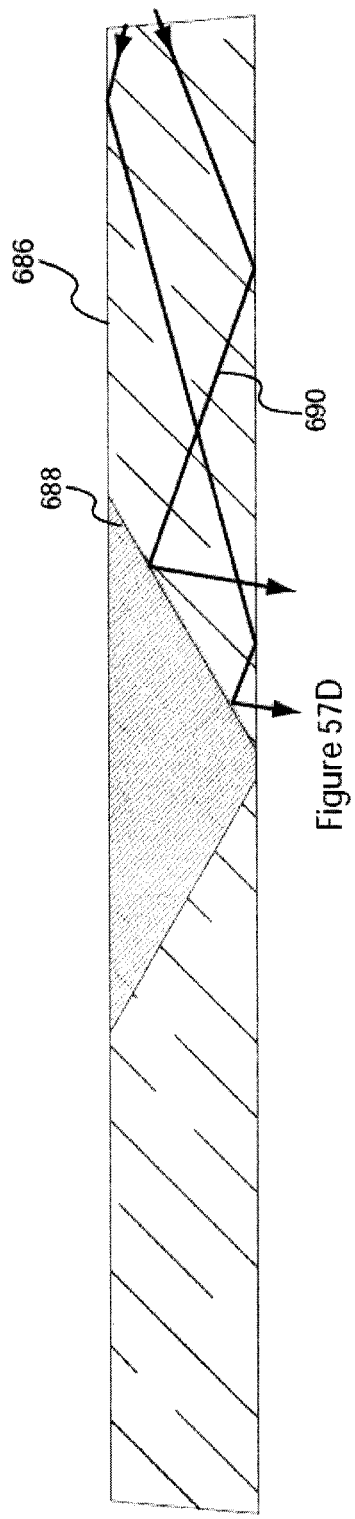

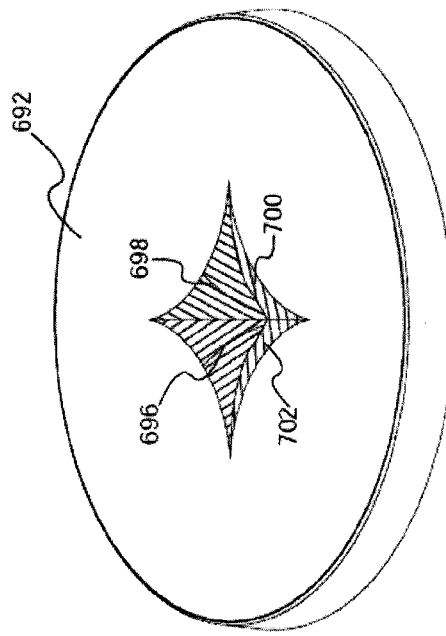
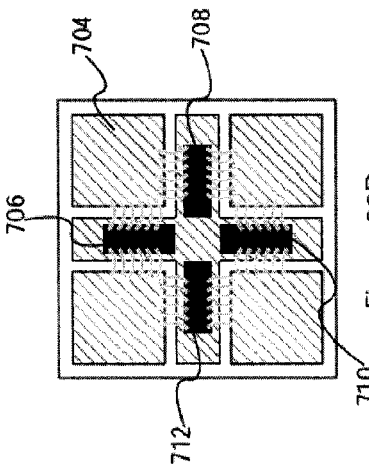
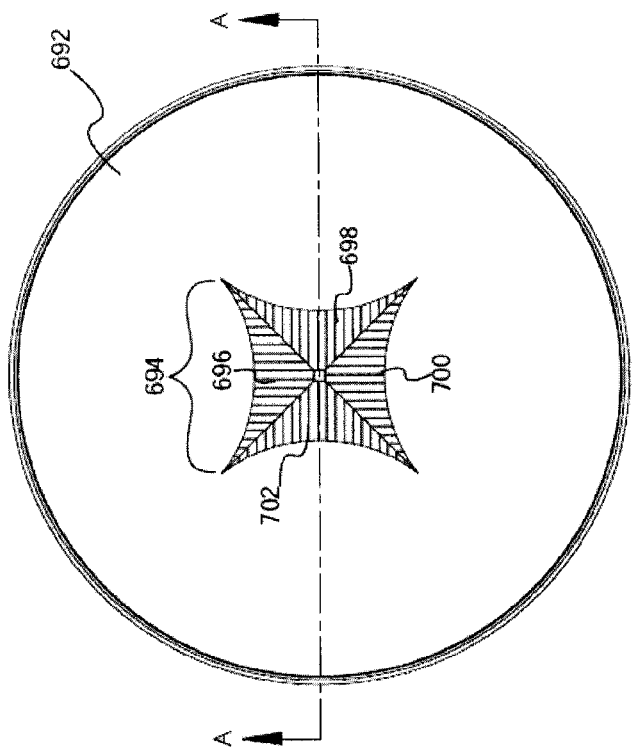
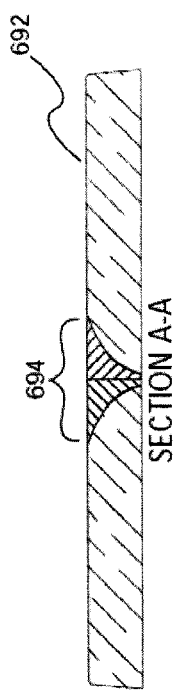

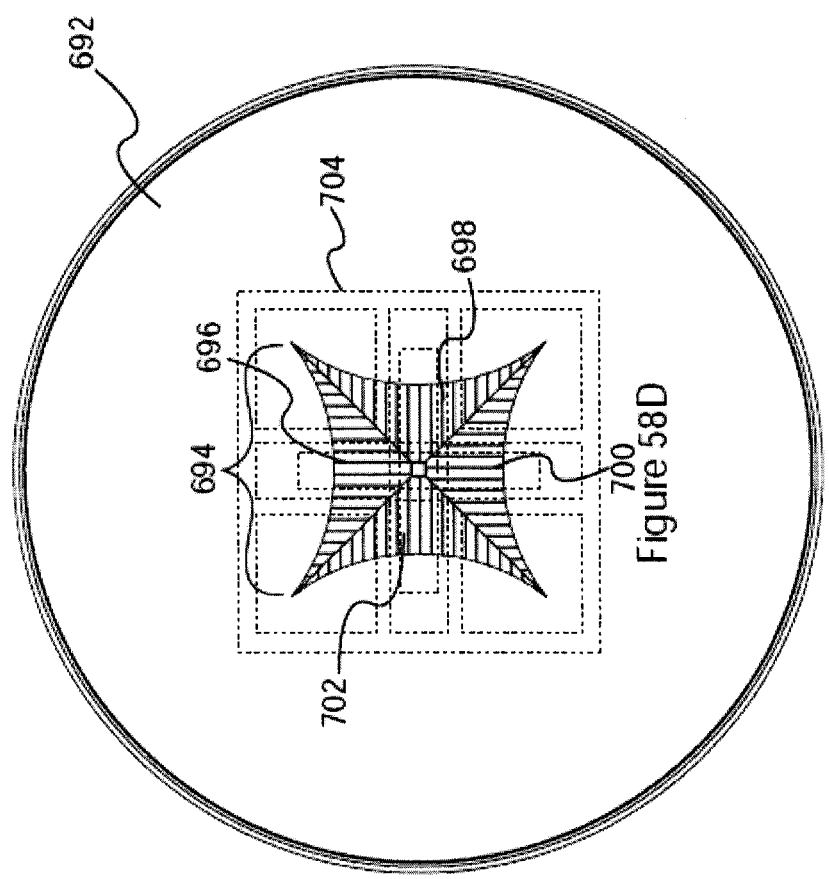

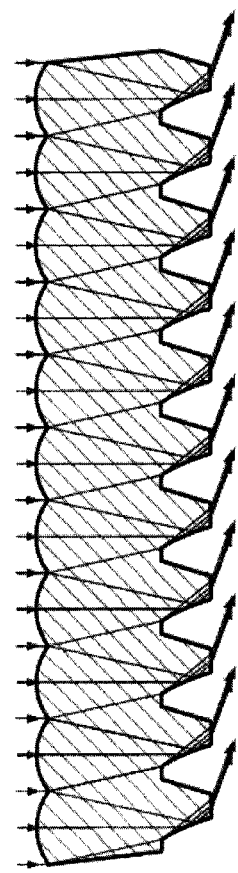
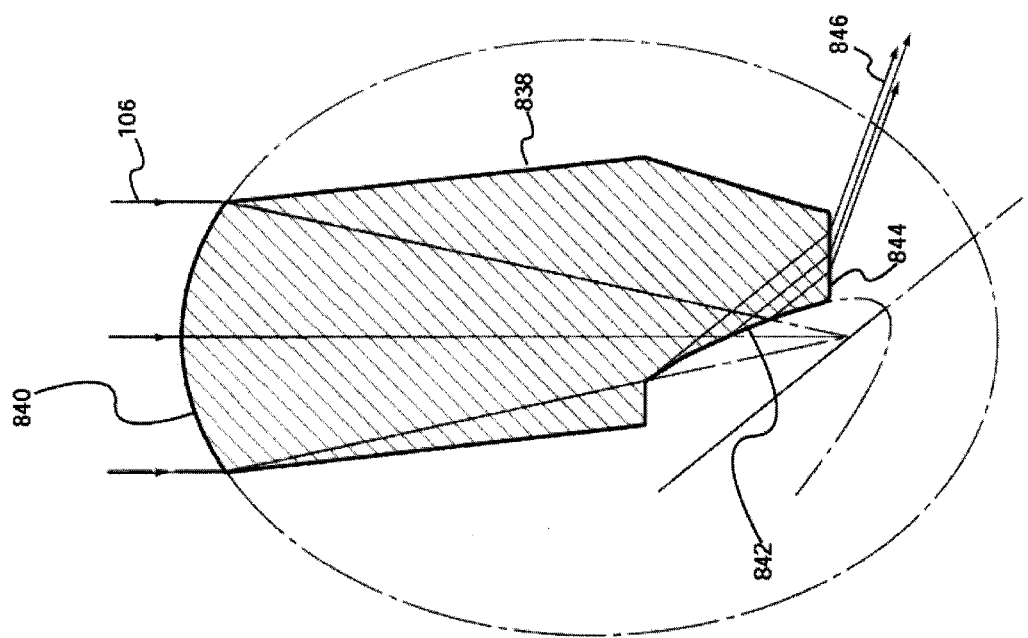
Figure 69B
Figure 69A

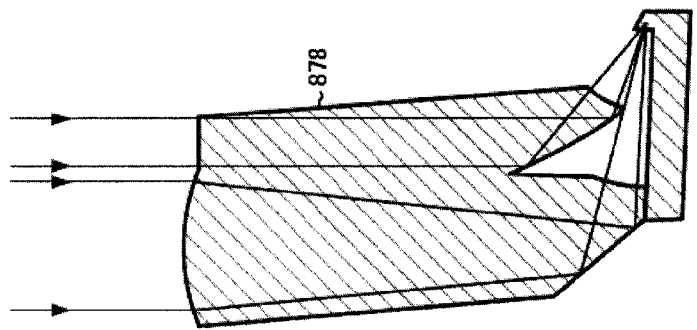
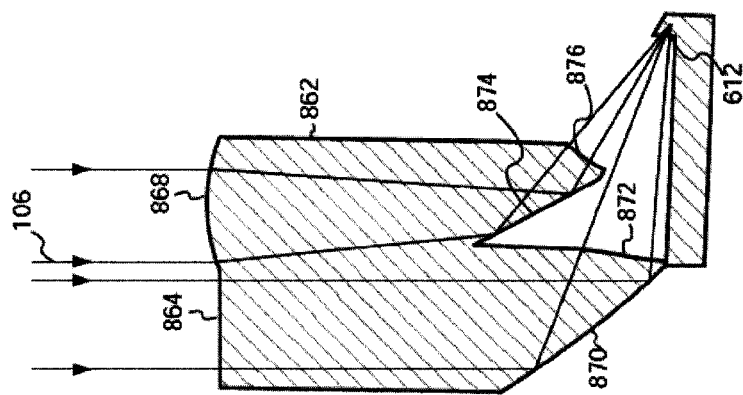
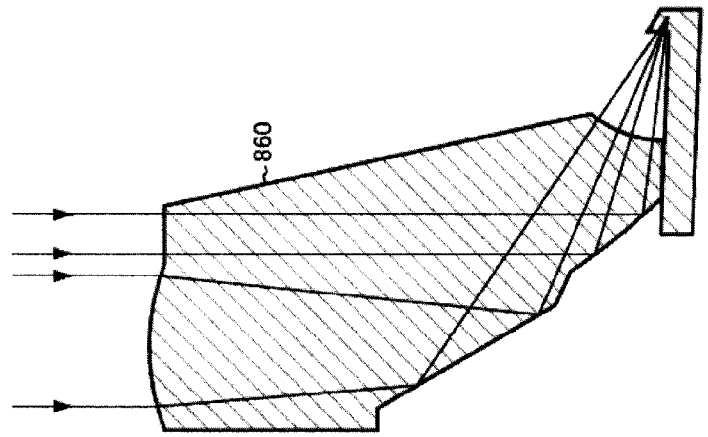
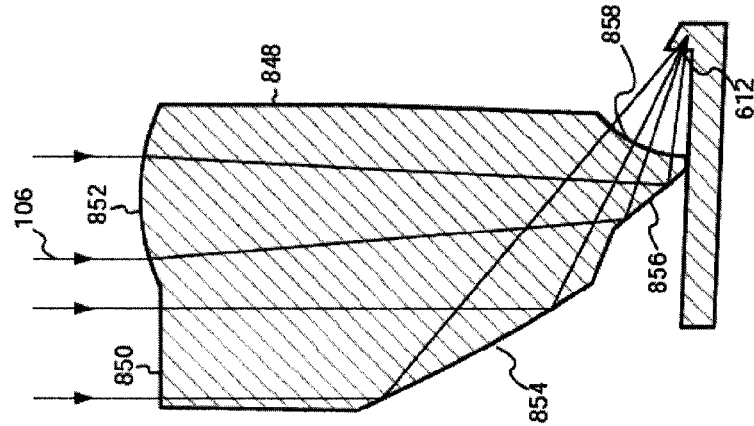

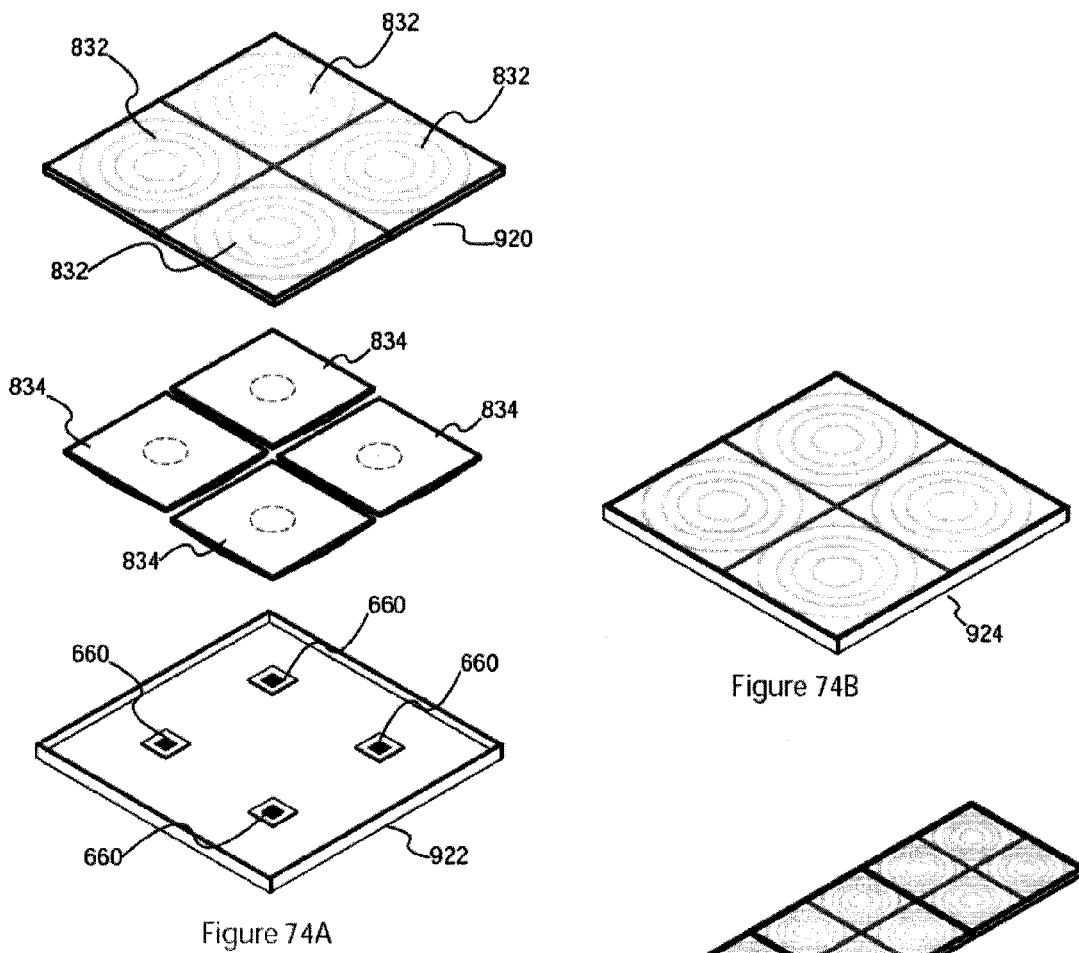
Figure 74B
Figure 74A
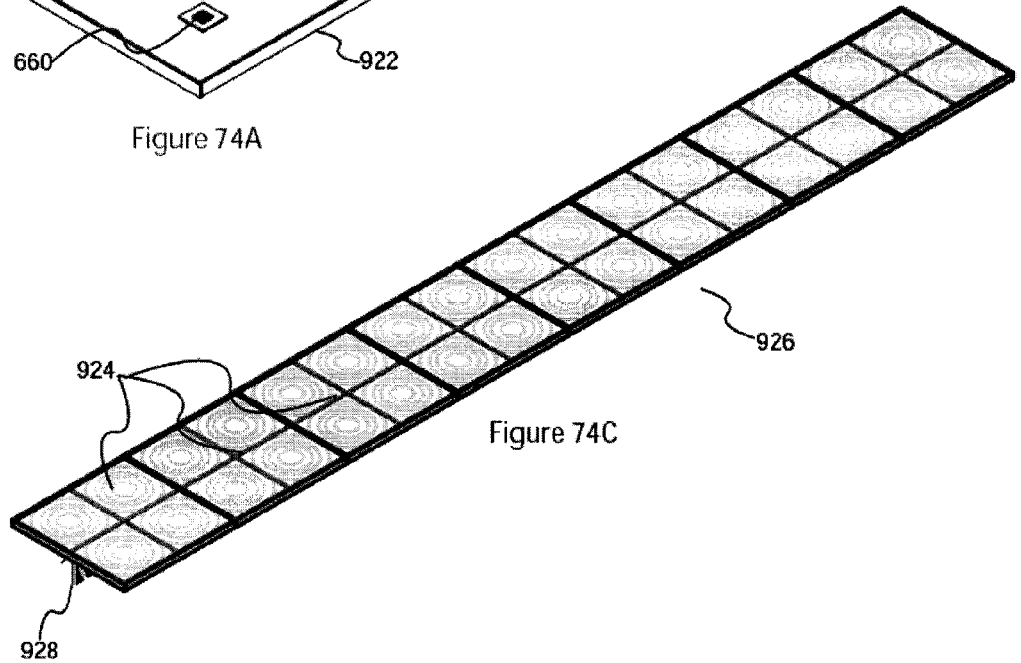
Figure 74C

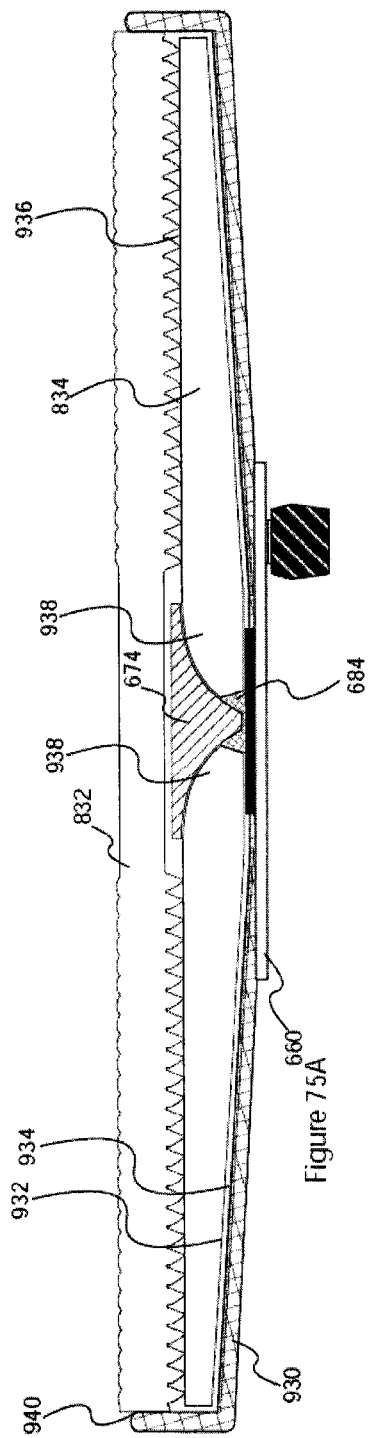
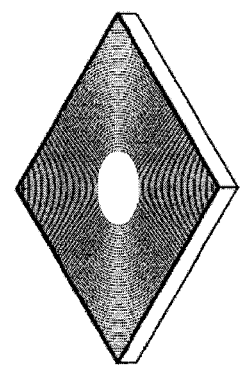
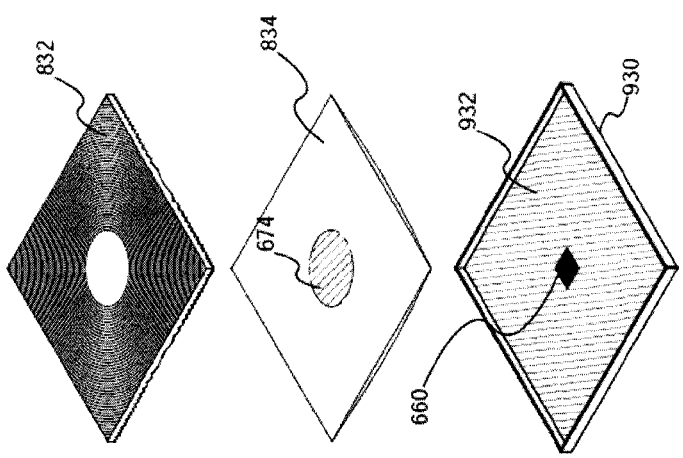
Figure 75A
Figure 75B
Figure 75C

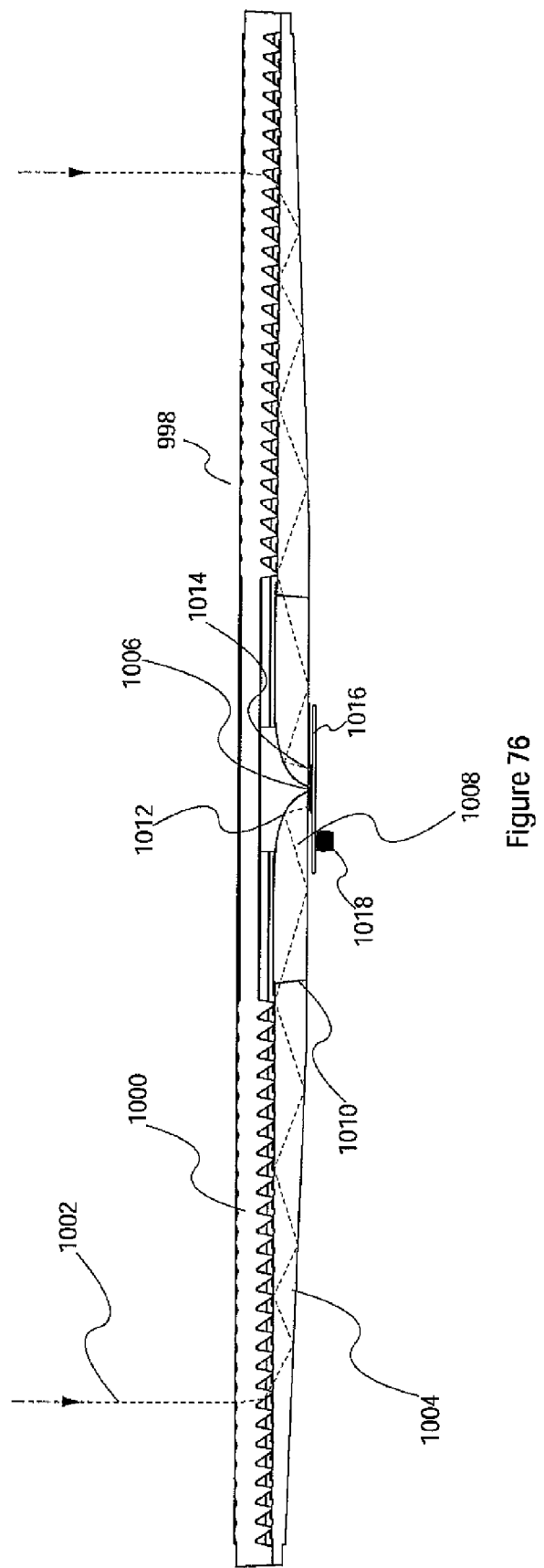

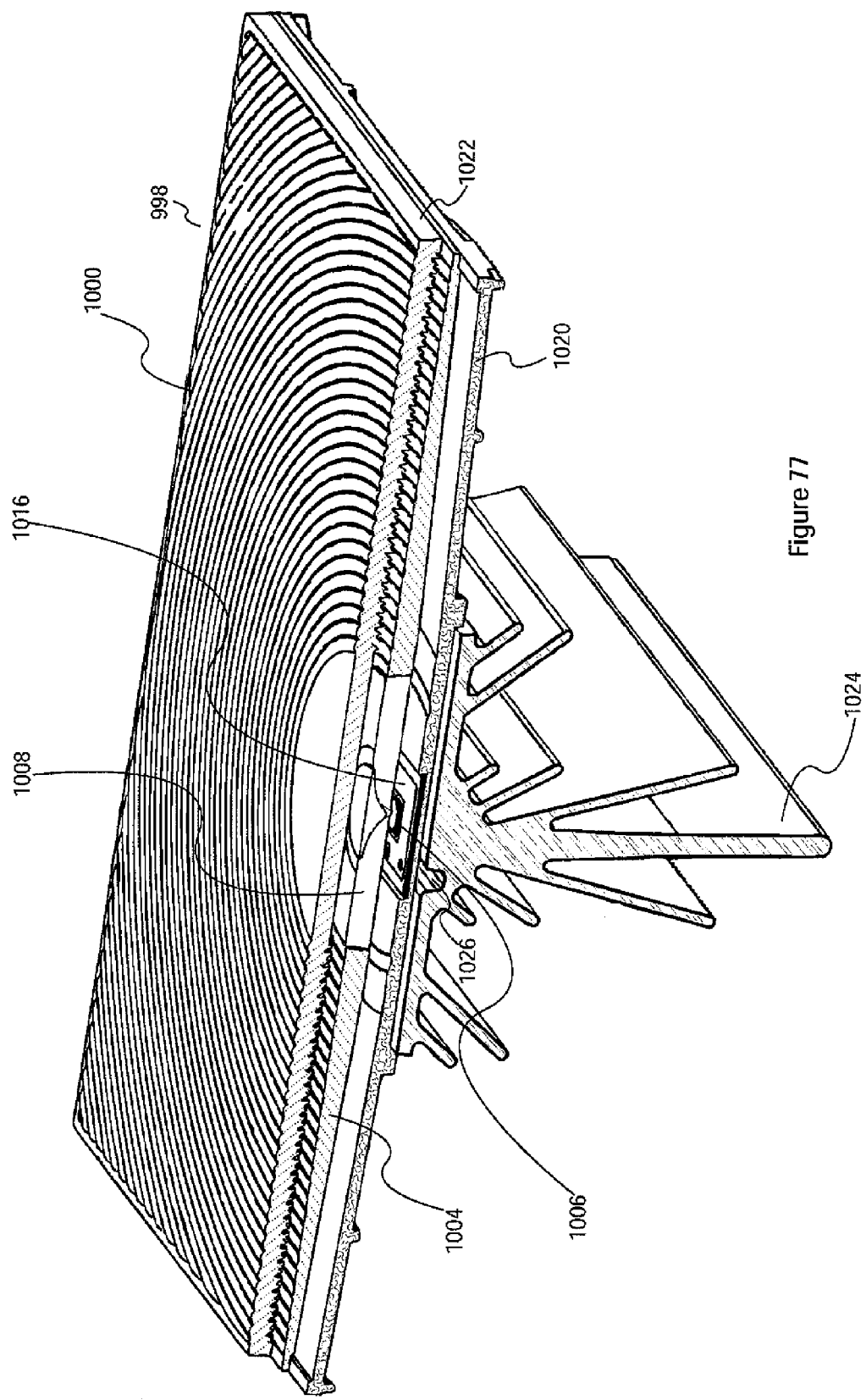

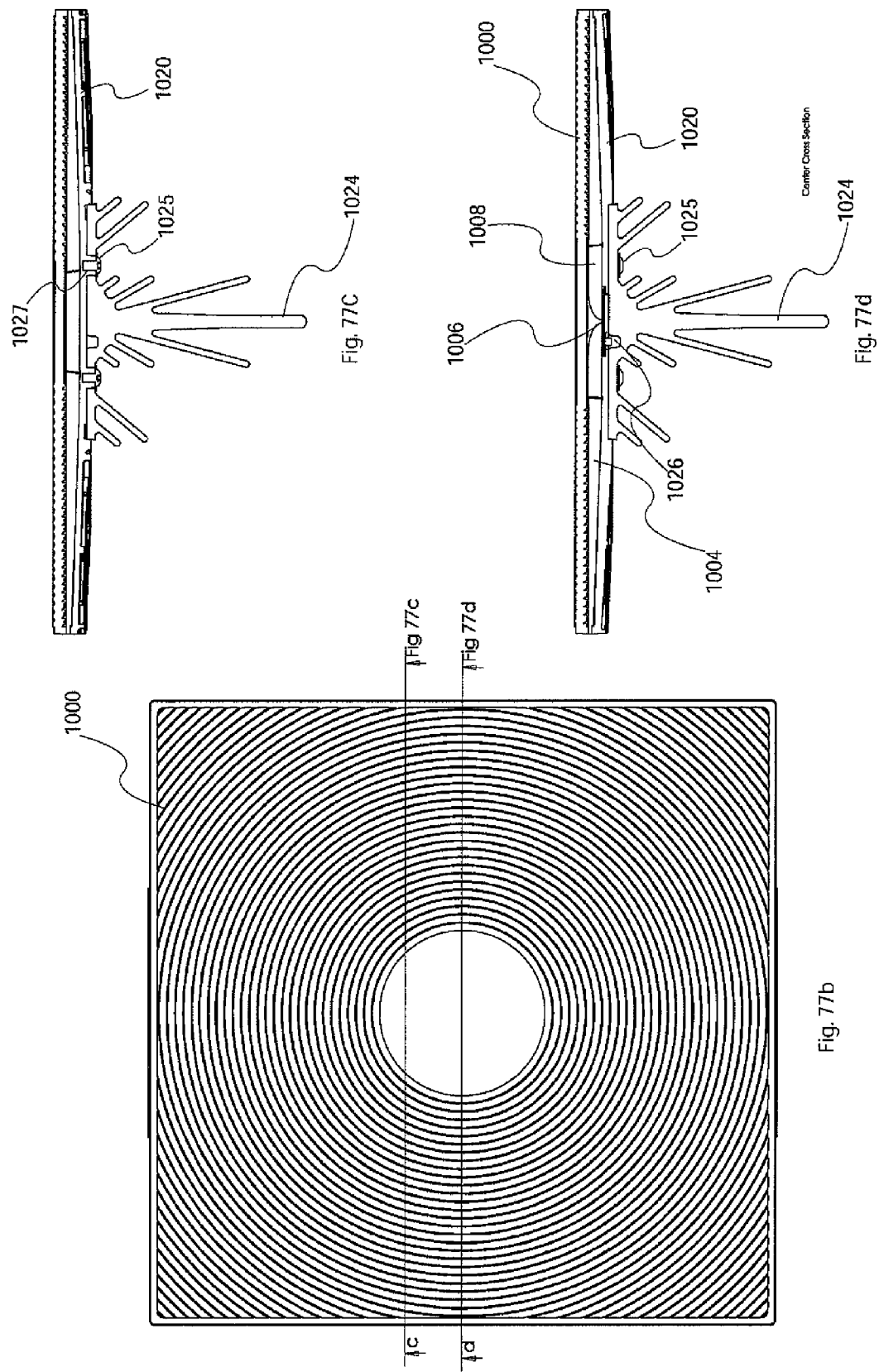

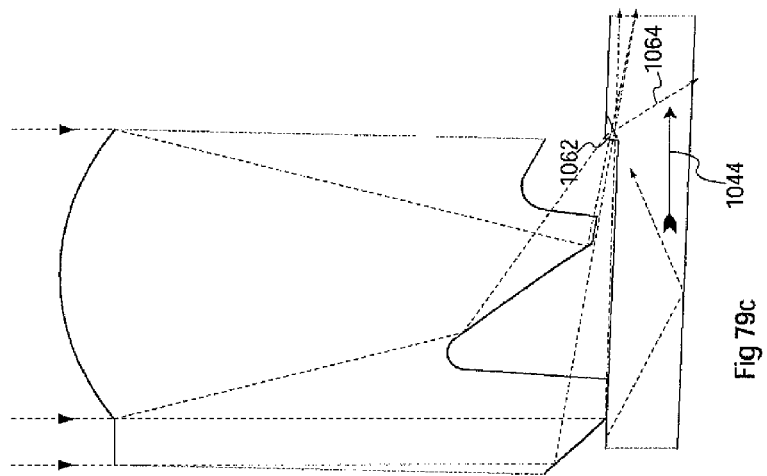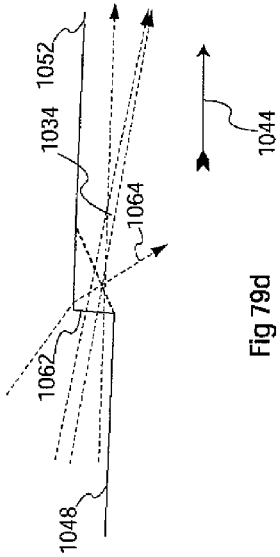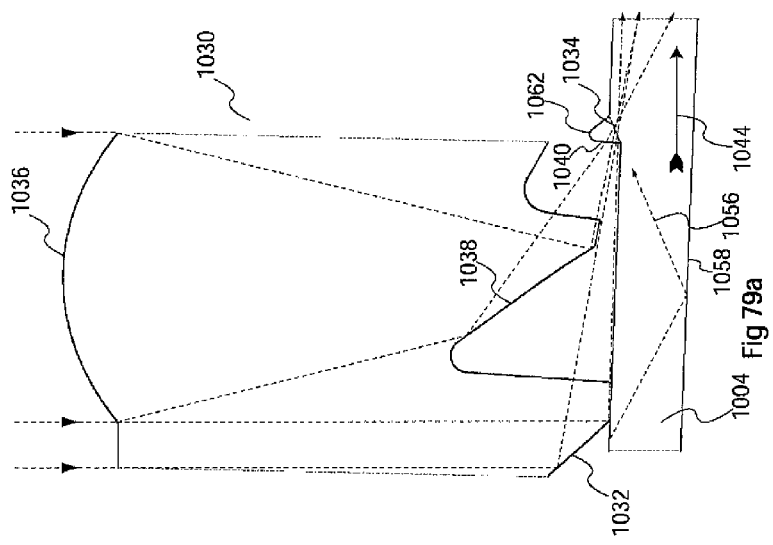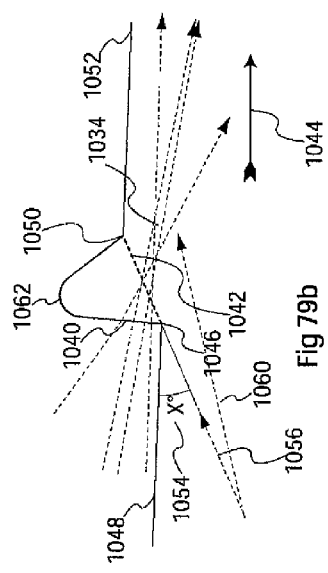

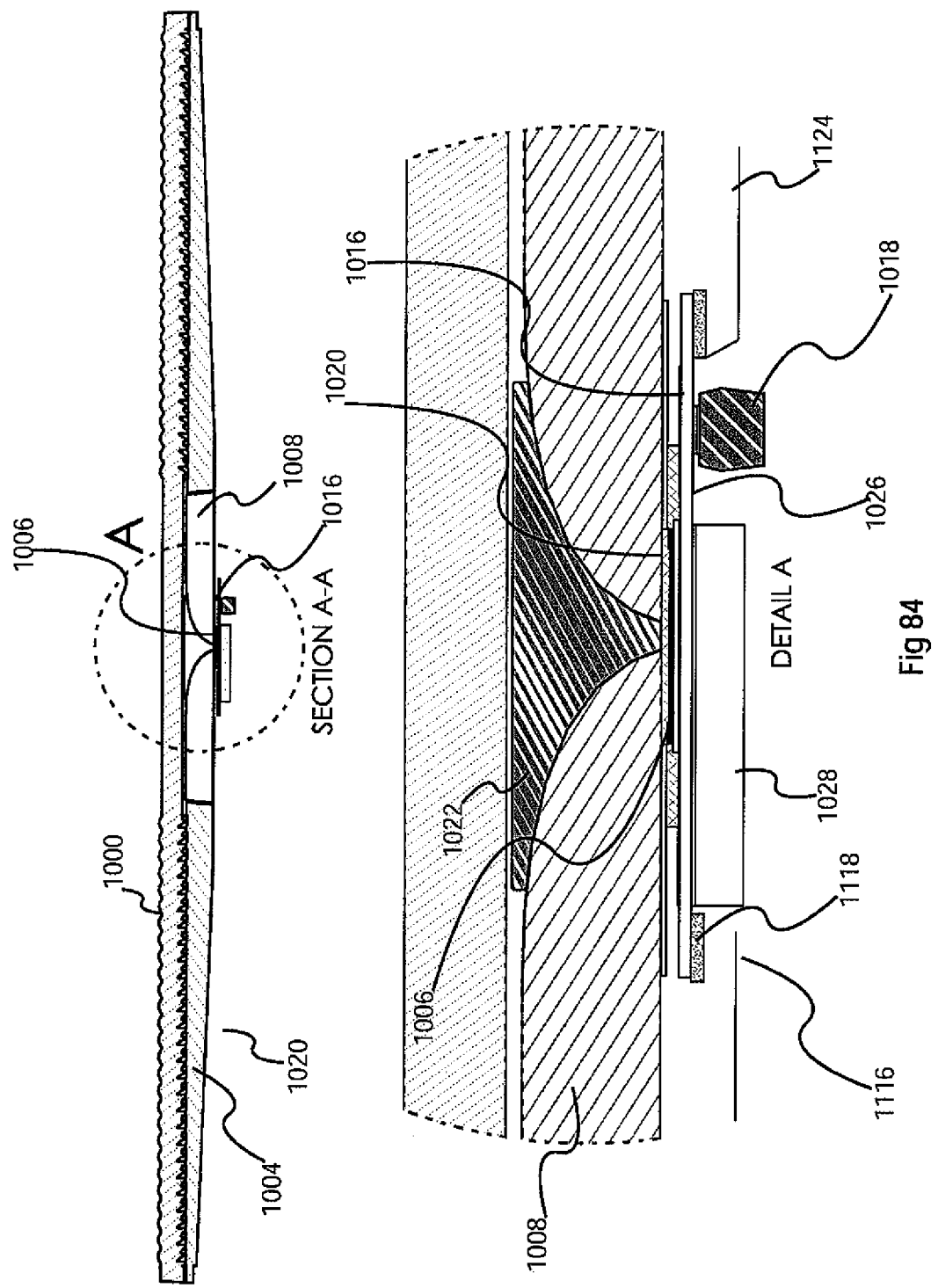

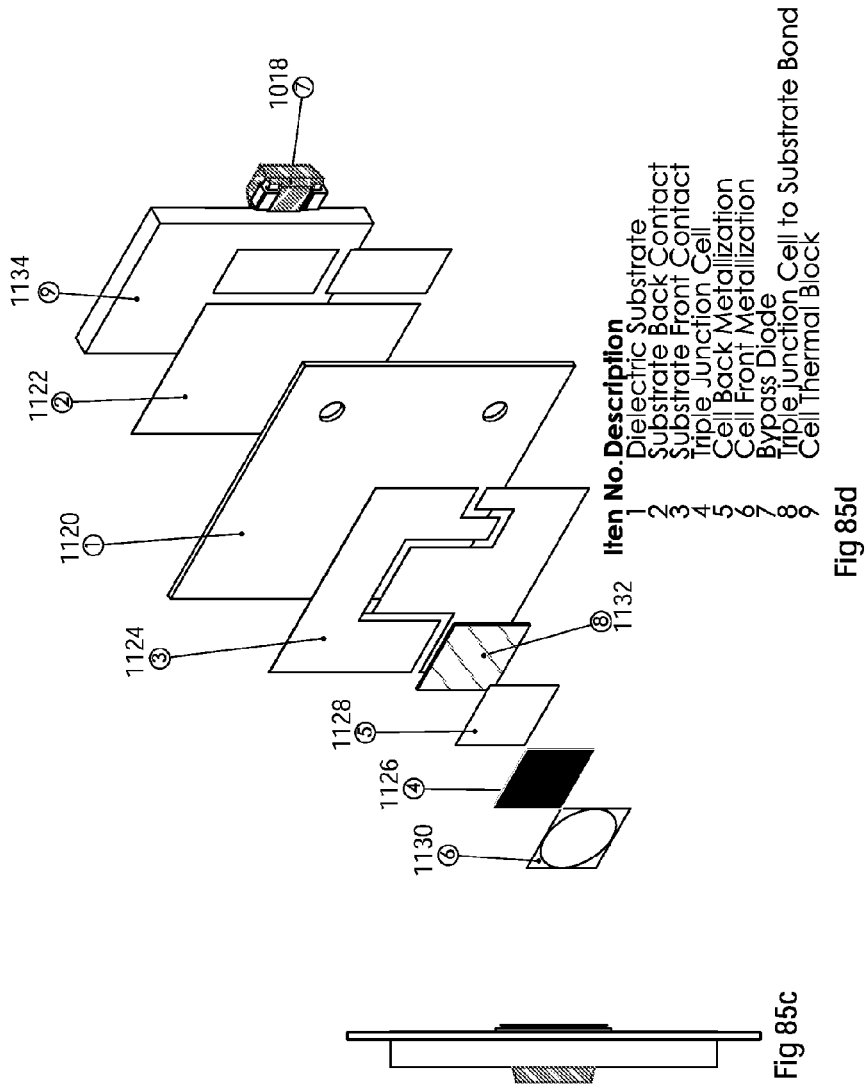
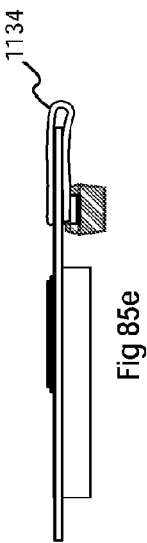
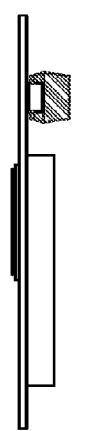
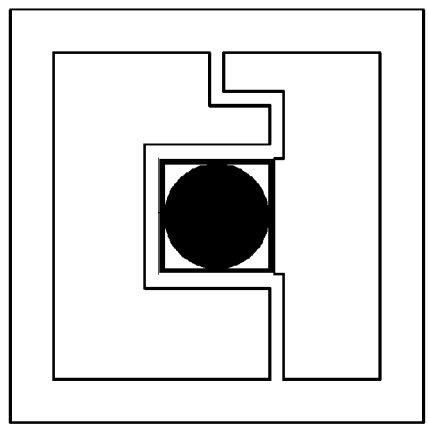
| Item No. | Description |
|---|---|
| 1 | Dielectric Substrate |
| 2 | Substrate Back Contact |
| 3 | Substrate Front Contact |
| 4 | Triple Junction Cell |
| 5 | Cell Back Metallization |
| 6 | Cell Front Metallization |
| 7 | Bypass Diode |
| 8 | Triple Junction Cell to Substrate Bond |
| 9 | Cell Thermal Block |
Fig 85a
Fig 85b
Fig 85c
Fig 85d
Fig 85e

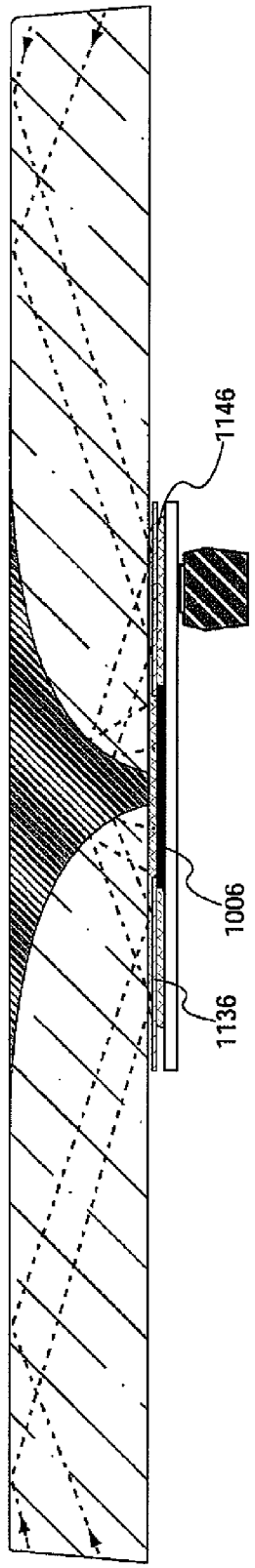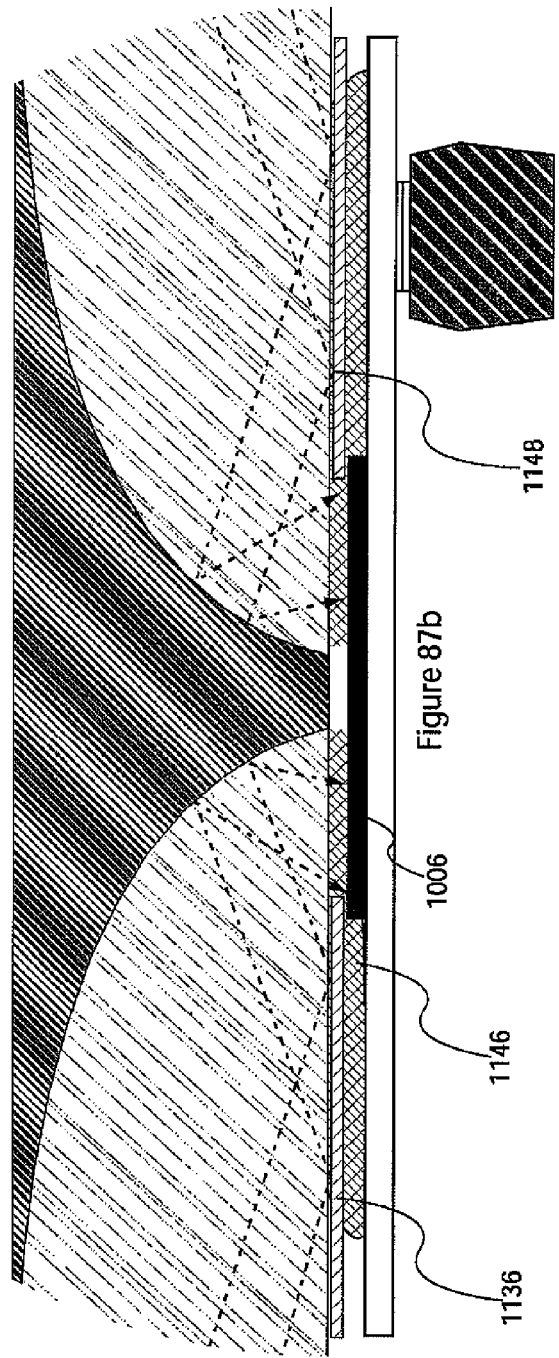

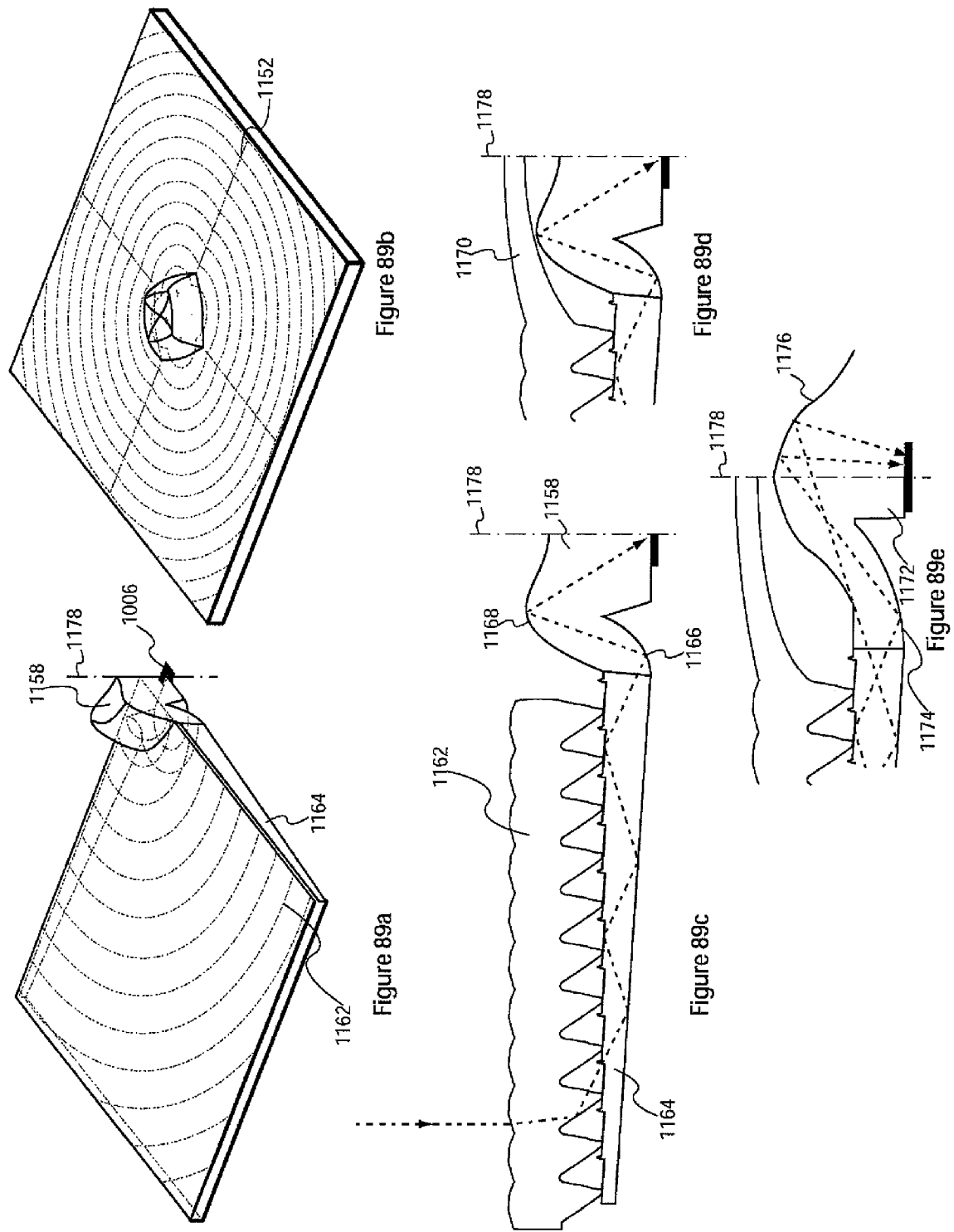

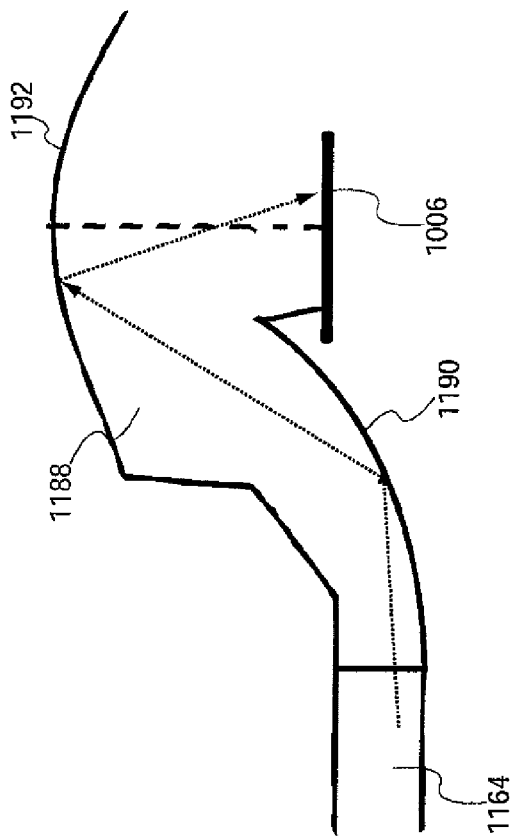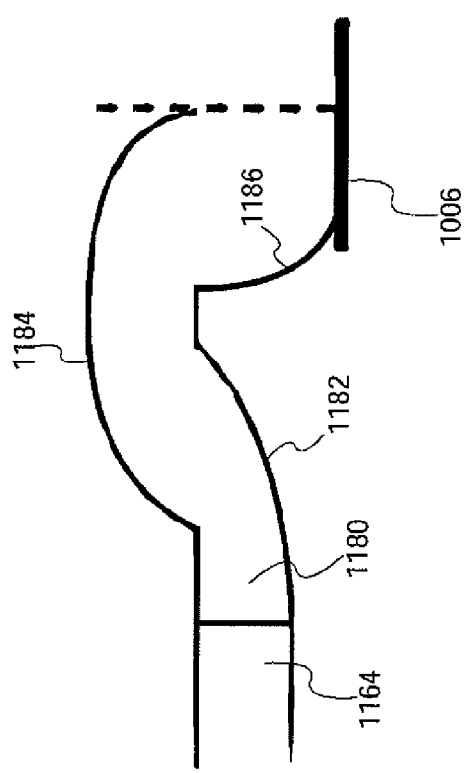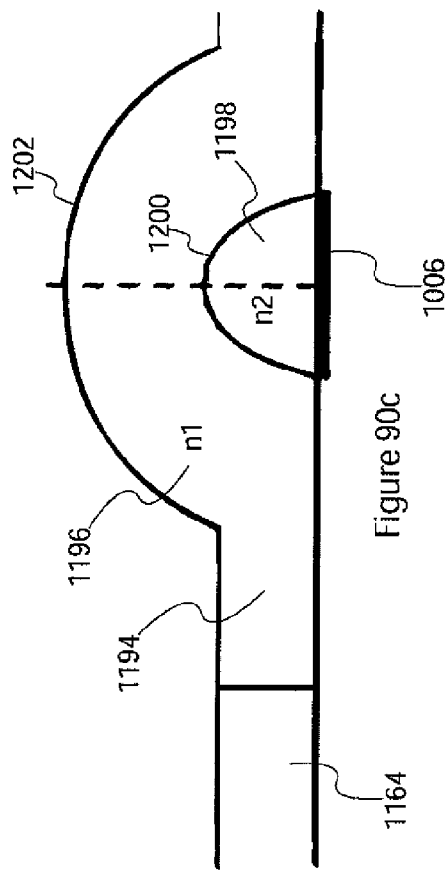

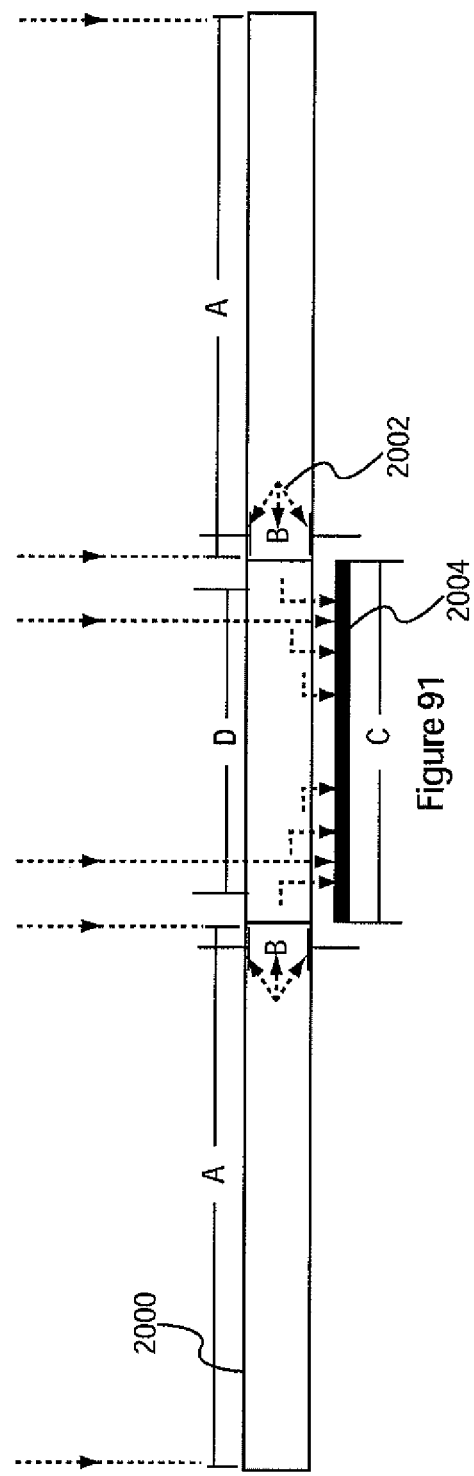

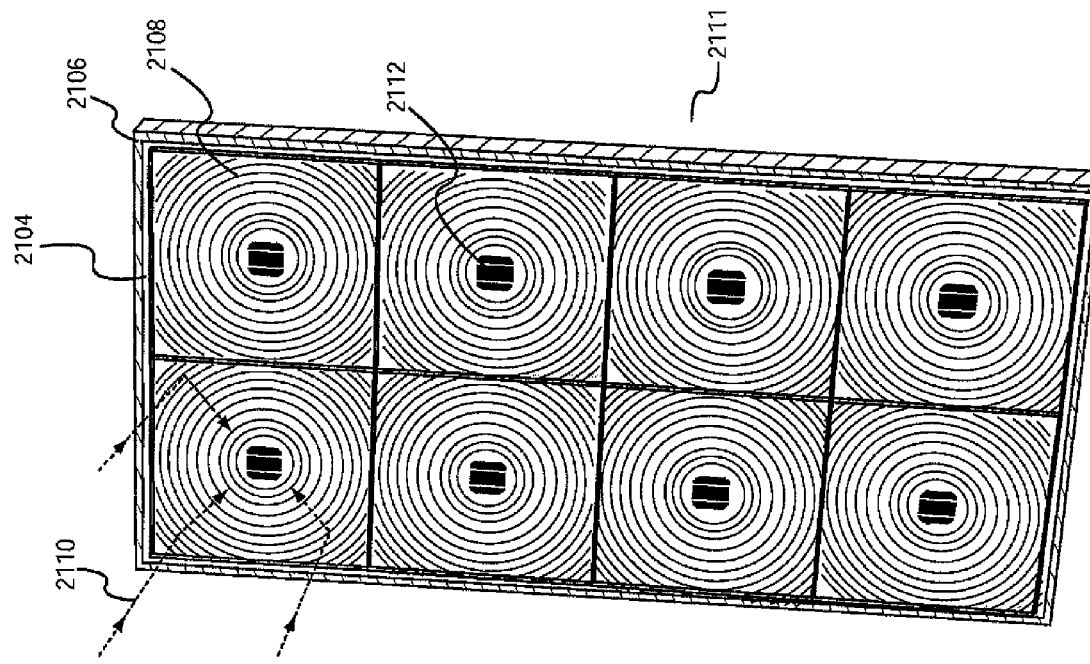
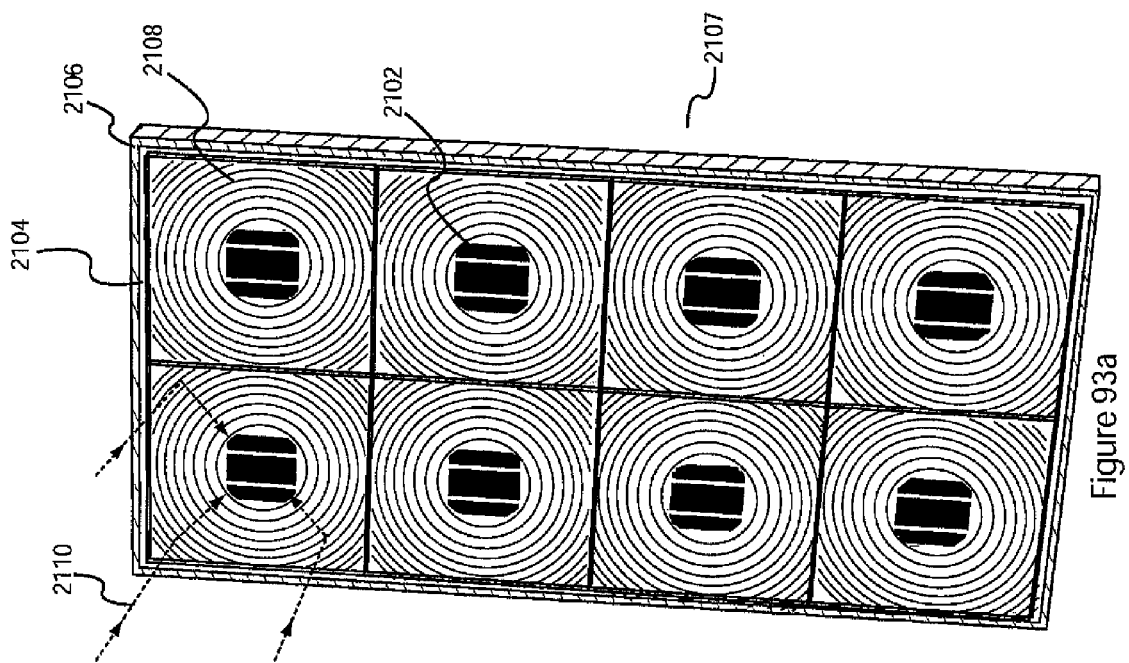

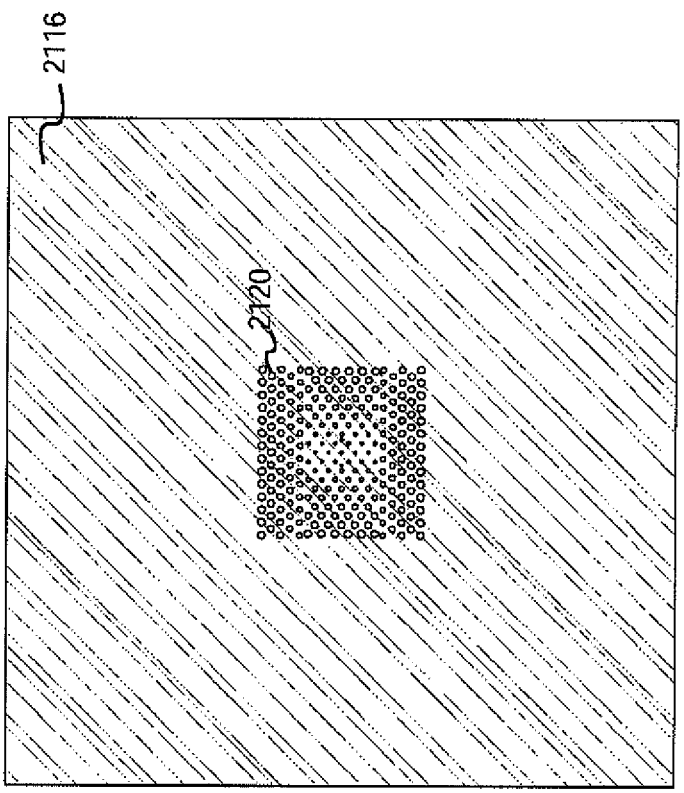
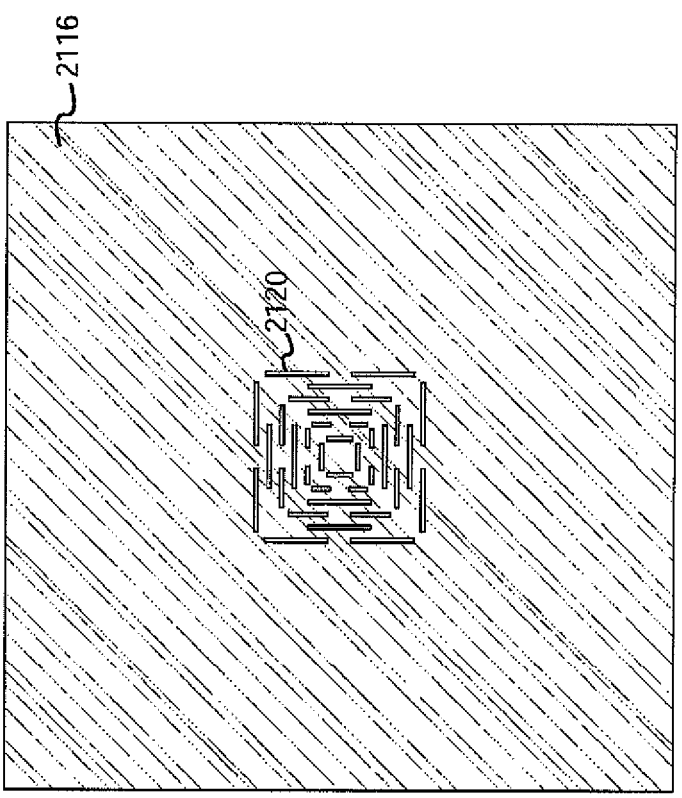

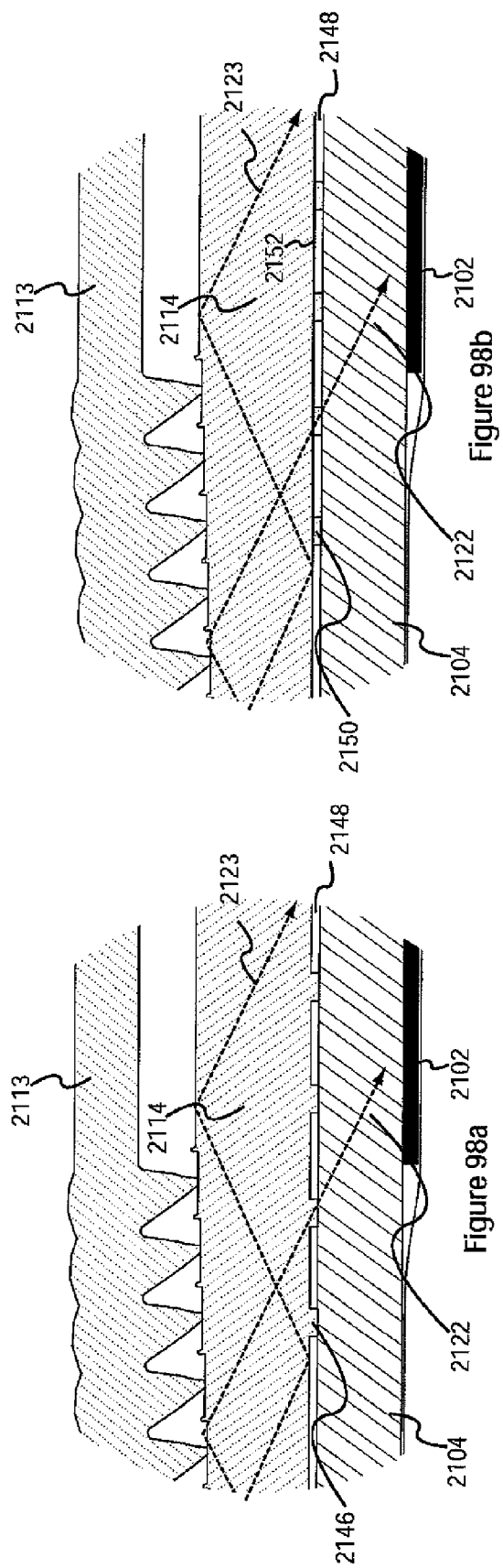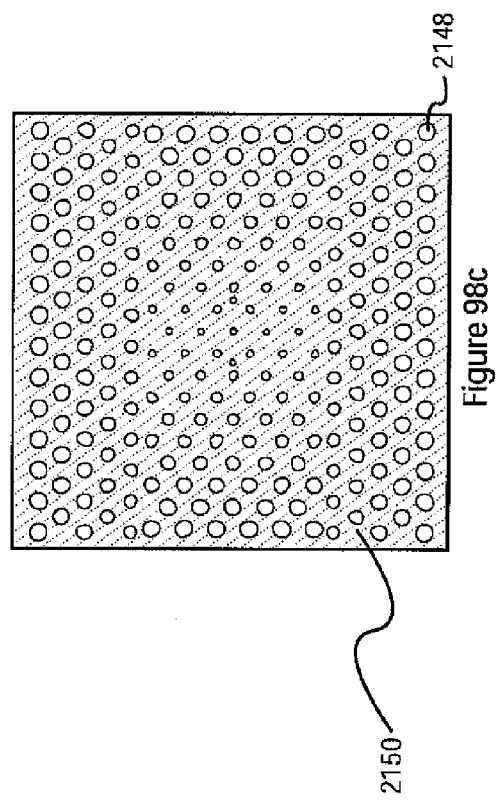

LIGHT-GUIDE SOLAR PANEL AND METHOD OF FABRICATION THEREOF

CROSS REFERENCE

The present application claims priority to U.S. Provisional Application No. 61/151,006, filed on Feb. 9, 2009 and to U.S. Provisional Application No. 61/229,542, filed on Jul. 29, 2009. The present application is also a Continuation-in-Part of U.S. patent application Ser. No. 12/113,705, filed on May 1, 2008. Through the '705 application, this application claims priority to U.S. Provisional Application No. 60/951,775, filed on Jul. 25, 2007, to U.S. Provisional Application No. 60/942,745, filed on Jun. 8, 2007 and to U.S. Provisional Application No. 60/915,207, filed on May 1, 2007. The entirety each of the foregoing applications is incorporated herein by reference in their entirety.

FIELD OF THE INVENTION

The present invention relates generally to solar panels. More particularly, the present invention relates to light-guiding concentrator solar panels.

BACKGROUND OF THE INVENTION

Solar panel assemblies having photovoltaic (PV) cells arrayed over a large surface area directly exposed to the sun are known. However, PV cell material is expensive and solutions have been sought to reduce the amount of PV cell material required in solar panels. One of these solutions makes use of concentrating optical elements, such as lenses and mirrors, to concentrate sunlight on a smaller surface area occupied by a correspondingly smaller PV cell. Given that the concentrating optical elements all have a non-zero focal length, they make for concentrated photovoltaic (CPV) modules that are typically bulkier than their non-concentrating counterparts. This bulkiness is disadvantageous not only in terms of the handling of the CPV modules, but also in terms of material costs. It is possible to obtain less bulky CPV modules while maintaining the same concentration factor by reducing the size of the PV cell; however, dicing PV cells into smaller cells increases the complexity and cost of the modules.

Additionally, present CPV modules typically require that the concentrating optical elements by secured in a complex structural enclosure to hold all the elements in place. This invariably adds to the weight and cost of the CPV modules, and makes for either stricter shipping requirements to mitigate risk of breakage of the assembled CPV modules or, requires that the CPV modules be shipped disassembled to their destination, thereby requiring assembly time and effort at the receiving destination.

Therefore, it is desirable therefore to provide a CPV module that is less bulky than existing CPV modules. It is also desirable to provide a CPV module that requires relatively less PV cell material than known CPV modules. Additionally, it is desirable to provide a CPV module that requires a less voluminous and complex structural enclosure for concentrating optical elements than in known CPV modules.

Improvements in CPV modules are therefore desirable.

SUMMARY OF THE INVENTION

It is an object of the present invention to obviate or mitigate at least one disadvantage of previous solar panels.

In a first aspect, the present invention provides a light-guide solar panel that comprises a light-insertion stage having an input surface for receiving light, optical elements and at least one optical output aperture, the optical elements being formed between the input surface and the at least one optical output aperture to direct the light from the input surface to the at least one optical output aperture. The panel further comprises an optical waveguide stage having an output surface, the optical waveguide stage being optically coupled to the at least one optical output aperture to receive the light therefrom, the optical waveguide stage for guiding the light towards the output surface.

The solar panel can have the optical elements spaced-apart from each other along substantially parallel lines and the output surface can be substantially non-orthogonal to the input surface.

The solar panel can have the optical elements spaced-apart from each other along substantially concentric circle arcs, and the output surface can be shaped as a circle arc substantially concentric with the optical elements.

The solar panel can have the optical elements include at least one of parabolic reflectors, cubic reflectors, hyperbolic reflectors, elliptical reflectors, flat reflectors, Cassegrain optics, Winston cone optics, round reflectors, lenses, a hologram and prismatic ridges.

The solar panel can have the optical waveguide stage wedge-shaped. The solar panel can have the optical waveguide stage at least partially cone-shaped.

The solar panel can have the optical waveguide stage include a first surface off of which the light received from the at least on optical output aperture goes through a first total internal reflection. The solar panel as claimed can have at least one of the input surface and the first surface with a cladding layer formed thereon.

The solar panel as claimed can have the optical waveguide section with a plurality of reflector elements formed opposite the first surface, the plurality of reflector elements for receiving totally internally reflected light from the first surface and for reflecting the totally internally reflected light towards the first surface. The plurality of reflector elements can include planar reflectors. The planar reflectors can be substantially parallel to the first surface. At least one reflecting element can have total internal reflection surface. The at least one optical output aperture can be located in between adjacent reflector elements.

The solar panel as claimed can be such that substantially no light is coupled from the optical waveguide stage to the light-insertion stage through the at least one optical output aperture.

The solar panel can be such that the optical waveguide stage guides the light towards the output surface through a series of total internal reflections. The solar panel can be such that the input surface has a light input area and the output surface has a light collecting area, the light collecting area being smaller than the light input area.

The solar panel can comprise a solar energy collector optically coupled to the output surface. The solar energy collector can include at least one of a photovoltaic solar cell and a heat collector. The solar panel of can further comprise an optical prism for optically coupling the output surface to the solar energy collector.

The solar panel can be such that the optical waveguide stage has at least one parabolically-shaped interface adjacent the output surface, the at least one parabolically-shaped interface for concentrating the light on the output surface. The solar can comprise a tapered optical element adjacent the output surface, the tapered optical element for spacing the solar energy collector from the optical waveguide stage and for concentrating the light onto the solar energy collector. The tapered optical element can have a refractive index different than that of the optical waveguide stage.

The solar panel can have the optical waveguide stage include a plurality of waveguides, each waveguide being optically coupled to one of the at least one optical output aperture, each waveguide for receiving the light from a corresponding optical output aperture and for propagating the light along the waveguide in a direction determined at least by the optical elements. Each waveguide can have a waveguide output surface, the waveguide stage output surface comprising the waveguide output surface of each waveguide. The optical elements can direct the light to propagate in only one direction along each waveguide or in two opposite directions along each waveguide. The optical elements can include a volume phase hologram. The optical elements can include a plurality of prismatic ridges.

The solar panel can be such that the light-insertion stage can include a plurality of tapered light channels and the optical waveguide stage can include a plurality of waveguides, at least one of the tapered light channels being optically coupled to at least one waveguide through one of the at least one optical output aperture, each waveguide for guiding the light along the waveguide in a propagation direction determined at least by the optical elements. The at least one waveguide can include waveguides of different diameters. The optical elements can include at least one of a volume phase hologram and prismatic ridges for imparting the propagation direction to the light. The optical elements can further include at least one of parabolic reflectors, cubic reflectors, hyperbolic reflectors, elliptical reflectors, flat reflectors and round reflectors.

The light-insertion stage can be formed in a first slab of optically transmissive material and the optical waveguide stage can be formed in a second slab of optically transmissive material. The first slab can include the input surface and the optical elements, and can have an output profiled surface opposite the input surface. The second slab can include an input profiled surface adjacent the output profiled surface, with the output profiled surface of the first slab and the input profiled surface of the second slab being complementary to each other and defining the at least one optical output aperture.

The solar panel can be such that the light-insertion stage is formed in first and second layers of optically transmissive material, and the optical waveguide stage is formed in a third layer of optically transmissive material. The first layer can include the input surface and further include a first profiled surface opposite the input surface. The second layer can include a second profiled surface adjacent and complementary to the first profiled surface, with the second layer further including a third profiled surface opposite the second profiled surface. The third layer can include a fourth profiled surface adjacent and complementary to the third profiled surface, the third profiled surface and the fourth profiled surface defining the at least one optical output aperture.

The solar panel can be such that the light-insertion stage and the optical waveguide stage are formed in a same optically transmissive material.

The solar panel can be such that the light insertion stage has a first section having a first set of optical elements spaced-apart from each other along a first set of substantially concentric circle arcs and a second section having a second set of optical elements spaced-apart from each other along a second set of substantially concentric circle arcs. The first set of optical elements can direct a first portion of the light in a first direction and the second set of optical elements can direct a second portion of the light in a second direction distinct from the first direction. The second direction can be opposite the first direction. The first section of the light-insertion stage can have at least one first section optical output aperture and the second section of the light-insertion stage can have at least one second section optical output aperture, the optical waveguide stage having a first section optically coupled to the at least one first section optical aperture and a second section optically coupled to the at least one second section optical aperture.

In a further aspect, there is provided a light-guide solar panel that comprises a light-insertion stage having an input surface for receiving light, optical elements and at least one optical output aperture, the optical elements being formed between the input surface and the at least one optical output aperture to direct the light from the input surface to the at least one optical output aperture; an optical waveguide stage having an output surface, the optical waveguide stage being optically coupled to the at least one optical output aperture to receive the light therefrom, the optical waveguide stage for guiding the light towards the output surface; and a photovoltaic cell optically coupled to the output surface.

In yet a further aspect, there is provided a method of fabricating a light-guide solar panel. The method comprises steps of forming a light-insertion stage having an input surface for receiving light, optical elements and at least one optical output aperture, the optical elements being disposed between the input surface and the at least one optical output aperture to direct the light from the input surface to the at least one optical output aperture; forming an optical waveguide stage having an output surface; and optically coupling the optical waveguide stage to the at least one optical output aperture to receive the light therefrom, the optical waveguide stage for guiding the light towards the output surface.

Other aspects and features of the present invention will become apparent to those ordinarily skilled in the art upon review of the following description of specific embodiments of the invention in conjunction with the accompanying figures.

In a first aspect, the present invention provides light guide solar panels and methods of fabrication thereof.

In a second aspect, the present invention provides a solar cell receiver assembly.

In a third aspect, the present invention provides a light guide solar panel for medium concentration of sunlight.

BRIEF DESCRIPTION OF THE DRAWINGS

Embodiments of the present invention will now be described, by way of example only, with reference to the attached Figures, wherein:

FIG. 23A shows a perspective view of a two-layer embodiment of the light-guide solar panel of the present invention;

FIG. 23B shows an exploded view of the embodiment of FIG. 23A;

FIG. 23C shows an enlarged view of the embodiment of FIG. 23A;

FIG. 25A shows a perspective view of a two-layer embodiment of the light-guide solar panel of the present invention;

FIG. 25B shows an exploded view of the embodiment of FIG. 25A;

FIG. 25C shows an enlarged view of the embodiment of FIG. 25A;

FIG. 33A shows a prism;

FIG. 33B shows a perspective view of a revolved geometry embodiment of the light-guide solar panel of the present invention with the prism of FIG. 33A;

FIG. 33C shows a top view of the embodiment of FIG. 33A;

FIG. 33D shows a perspective view of an assembly of light-guide solar panel sections;

FIG. 33E shows a side view of the assembly of FIG. 33D;

FIG. 33F shows an exploded view of the assembly of FIG. 33E;

FIG. 44A shows a cross-sectional view of an element of an embodiment of the light-guide solar panel of the present invention;

FIG. 44B shows a top view of embodiment of FIG. 44A;

FIG. 44C shows a side view of the embodiment of FIG. 44A;

FIGS. 51A-51D show an embodiment of a light guide solar panel of the present invention;

FIGS. 52A and 52B show a cropping of a light guide solar panel of the present invention;

FIGS. 53A-53E show an embodiment of a secondary optic that can be used with the light guide solar panel of the present invention;

FIGS. 54A-54F show an embodiment of the secondary optic to which a solar cell is mounted;

FIGS. 55A-55C show further embodiments of the secondary optic that can be used with the light guide solar panel of the present invention;

FIGS. 57A-57D show another embodiment of the secondary optic;

FIG. 58A-58E show yet another embodiment of the secondary optic;

FIGS. 69A and 69B show another embodiment of a basic unit, and an array of such basic units that can be used in the deflecting layer of the light guide solar panel of the present invention;

FIGS. 70A-70D show further exemplary embodiments of basic units that can be used in the deflecting layer of the light guide solar panel of the present invention;

FIGS. 74A-74C show assemblies of solar modules; and

FIGS. 75A-75C shows another embodiment of a light guide solar panel of the present invention.

FIG. 76 shows a detailed cross section of a light guide solar panel,

FIG. 77 shows a cut away view of a light guide solar panel in three dimensions,

FIG. 77B shows a top view of the light guide solar panel shown in FIG. 77,

FIG. 77C shows a cross-section of the light guide solar panel shown in FIG. 77 taken along the line 77C-77C in FIG. 77, FIG. 77D shows a cross-section of the light guide solar panel shown in FIG. 77 taken along the line 77D-77D shown in FIG. 77, FIGS. 79A-79D show fabrication considerations for a single functional unit of a light guide solar panel, FIG. 84 shows details regarding the PV cell receiver assembly, FIGS. 85A-85E show further details regarding the PV cell receiver assembly, FIGS. 87A-87B show how the mask functions to stop light loss, FIGS. 89A-89E show details regarding the four quadrant design, FIGS. 90A-90C show details regarding secondary optic designs, FIG. 91 shows a block diagram of a medium concentration design using a light guide solar panel, FIGS. 93A-93B show two embodiments of light guide solar panels for medium concentration, FIGS. 95A-95B show a perforated low index film, FIGS. 98A-98C show close up cross sectional views of another embodiment of a single optic and a single PV cell and describes operation.

DETAILED DESCRIPTION

Generally, the present invention provides a solar energy system that uses a light-guide solar panel (LGSP) to trap light inside a dielectric or other transparent panel and propagates the light to one of the panel edges for harvesting by a solar energy collector (SEC). This allows for very thin modules whose thickness is comparable to the height of the SEC, which can be, for example, a PV cell, at the edge of the module, thus eliminating the depth requirements inherent in traditional solar energy systems such as CPV systems. Light striking the LGSP is redirected and trapped internally so that it exits the panel through one of its edges where a SEC receives it.

LGSPs of the present invention can be combined in clusters to make modules. The LGSP optics can be designed structurally to be largely self-supporting, meaning that they do not require any substantial external enclosure to maintain their shape and orientation. A full enclosure can be added to the LGSP. As will be described below, to minimize material use and cost, LGSP modules can be supported by an axle-and-rib configuration.

Concentrated sunlight may be harnessed for a purpose other than creating electricity with (PV) cells. One alternate use is the heating of an element. The modules can also be configured to heat water while simultaneously generating electricity. It is also possible to couple the concentrated light into a fiber optic or other light-guide to propagate it to another location for some other use, such as to a lighting fixture to provide solar lighting.

Figure 1:
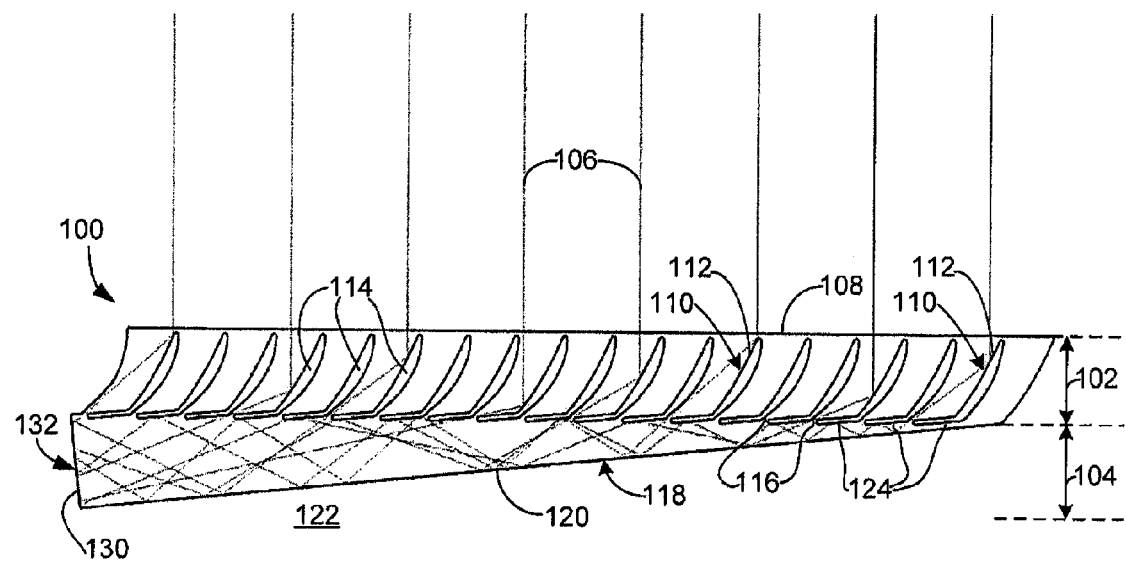
FIG. 1 shows a first embodiment of the light-guide solar panel of the present invention.
Figure 2:
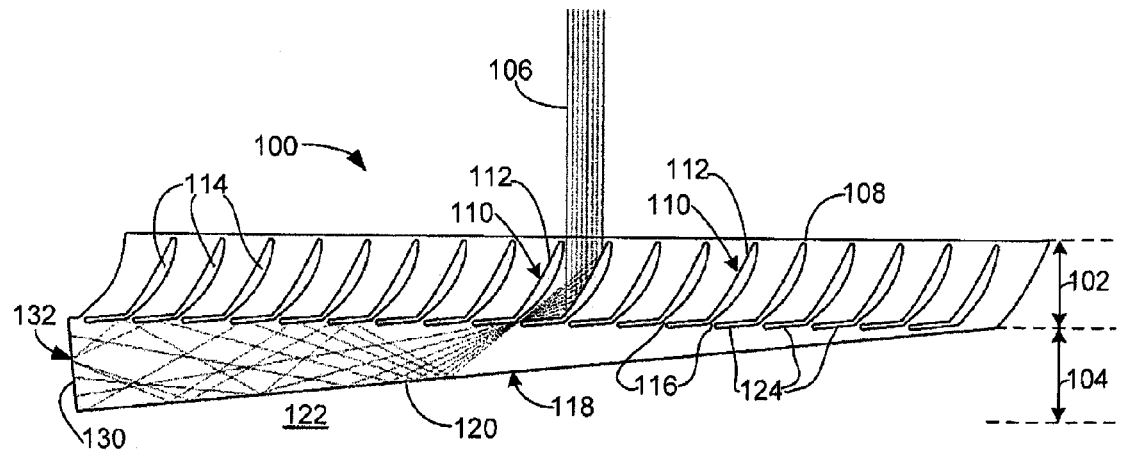
FIG. 2 shows the embodiment of FIG. 1 with a plurality of light rays being focused by a single reflector.

FIGS. 1 and 2 shows a cross-sectional view of a first embodiment of a LGSP 100 of the present invention. The panel 100 has a light-insertion stage 102 and an optical waveguide stage 104, which can both be made of any suitable optically transmissive material. The light-insertion stage 102 receives sunlight 106 at its input surface 108 and from there, the sunlight 106 is guided towards optical elements such as, for example, a series of reflectors 110. The reflectors 110 are defined by the interfaces 112 between the optically transmissive material of the light insertion stage 102 and the material making up areas 114. The angle at which the interfaces 112 lie with respect to the impinging sunlight 106 and the ratio of the refractive index of the optically transmissive material of the light-insertion stage 102 to the refractive index of the material of areas 114, are chosen such that the sunlight 106 impinging on the interfaces 112 goes through total internal reflection. Typically, the material 114 is air or any other suitable gas; however, any other suitable material can also make up the material 114. The materials of the light-insertion stage 102 and of the optical waveguide stage 104 can include, for example, any type of polymer or acrylic glass such as poly (methyl-methacrylate) (PMMA), which has a refractive index of about 1.49 for the visible part of the optical spectrum. Any other suitable material can also be used. The angle at which the interfaces 112 lie with respect to the impinging sunlight 106 ranges from the critical angle to 90°, as measured from the surface normal of the interface 112 (e.g., for a PMMA-air interface, the angle is comprised substantially between about 42.5° and 90°).

The reflectors 110 are shaped as parabolic reflectors; however, they can be of any other suitable shape. If the spacing between the reflectors is "A" and the origin of the system of coordinates is an aperture 116, then an exemplary equation of the corresponding parabola is $y=(1/2A)x^2-1/4$. As shown at FIG. 1, each reflector 110 directs the sunlight 106 toward a respective output optical aperture 116 by focusing the sunlight 106 at the output optical aperture 116. FIG. 2 shows the focusing of sunlight 106 by a same reflector 110. The sunlight 106 so focused enters the optical waveguide stage 104, which includes a wall 118 towards which the sunlight 106 propagates. The wall 118 has a first surface 120 between the optically transmissive material of the optical waveguide stage 104 and the material 122, which lies on the other side of the wall 118. The angle at which lies the interface 118 can lie with respect to the horizontal is in the range of 1-5°; however, any other suitable angle will also work. The orientation of the wall 118 with respect to the sunlight 106 coming from the apertures 116, and the ratio of the refractive index of the optically transmissive material of the optical waveguide stage 104 to the refractive index of the material 122, are chosen such that the sunlight 106 impinging on the first surface 120 goes through total internal reflection. The material 122 can be air or any other suitable gas; however, any other material having a refractive index lower than that of the optical waveguide stage 104 can also make up the material 122. As for the materials of the light-insertion stage 102 and of the optical waveguide stage 104, they can include, for example, any type of polymer or acrylic glass such as PMMA. Any other suitable material can also be used.

Figure 3:
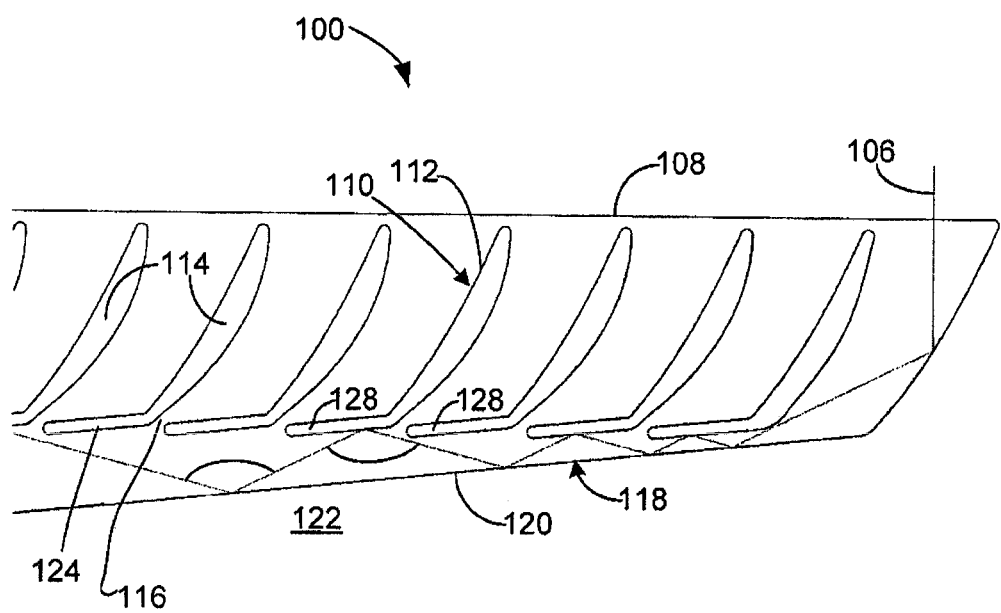
FIG. 3 shows details of the embodiment of FIG. 1.

Once the sunlight 106 is totally internally reflected at the first surface 120, it propagates in the optical waveguide stage 104 towards as series of reflecting elements 124 that reflect the sunlight 106 towards the first surface 120 where the sunlight 106 once again goes through total internal reflection. As shown at FIG. 3, each reflecting element 124 is defined by an interface 126 between the optically transmissive material of the optical waveguide stage 104 and the material making up area 128, which can be the same material as that of areas 114. The orientation of the reflecting elements 124 with respect to the sunlight 106 coming from the first surface 120, and the ratio of the refractive index of the optically transmissive material of the optical waveguide stage 104 to the refractive index of the material 128, are chosen such that the sunlight 106 impinging on reflecting elements 124 goes through total internal reflection. However, the function of the reflecting elements 124, the first surface 120 and the reflectors 110 need not be based on total internal reflection and can include, for example, a suitable type of mirror.

As shown in the exemplary embodiments of FIGS. 1-3, each reflecting element 124 is planar and lies at a non-parallel angle (e.g., 1-5°) to the input surface 108. Additionally, each reflecting element 124 lies at a substantially same distance from the input surface 108 and is substantially parallel to the first surface 120. As such, the optical waveguide stage 104, as shown at FIGS. 1-3, generally has the shape of a wedge, which acts to propagate the sunlight 106 being input in the optical waveguide stage 104 through the optical output apertures 116 in the direction where the wedge widens, which is referred to as the downstream direction. Therefore, the optical waveguide stage 104 is such that after multiple successive total internal reflections at the first surface 120 and at the reflecting elements 124, the sunlight 106 reaches an output surface 130 (FIGS. 1 and 2), which is part of a sidewall 132, where a SEC (not shown) of any suitable type can be disposed to harvest the energy carried by the sunlight 106.

FIGS. 1 and 2 show the sidewall 132 as being non-perpendicular to the input surface 108; however, the sidewall 132 can lie at any suitable angle from the input surface 108. Further, as will be understood by the skilled worker, the LGSP 100 can have any suitable number of reflecting elements 124 and any suitable number of output optical apertures 116.

FIG. 3 shows that in the embodiment where the each reflecting element 114 is parallel to the wall 118. In this embodiment, the angle of incidence remains constant as a ray of sunlight 106 propagates in the downstream direction.

Figure 4:
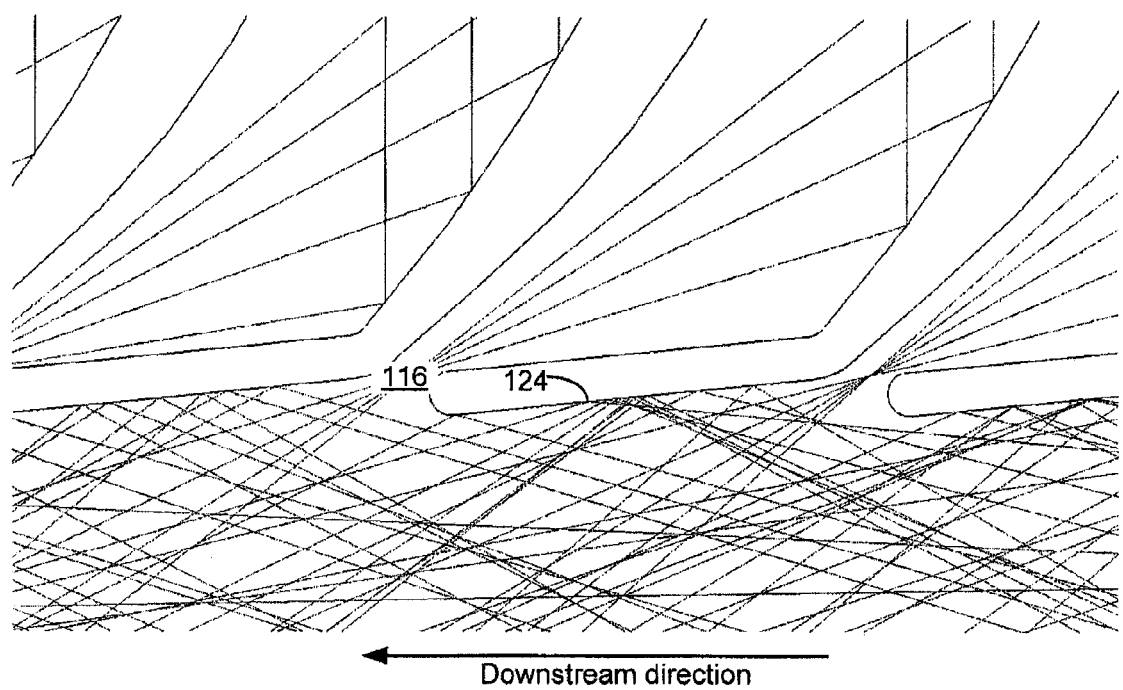
FIG. 4 shows an enlarged view of the embodiment of FIG. 1.

FIG. 4 shows that the reflecting elements 124 can be formed such that sunlight 106 coming from the first surface 120 (FIG. 1) and propagating towards the light-insertion stage 102 will be reflected off a reflecting element 124 and not impinge on an output optical aperture 116.

Figure 5:
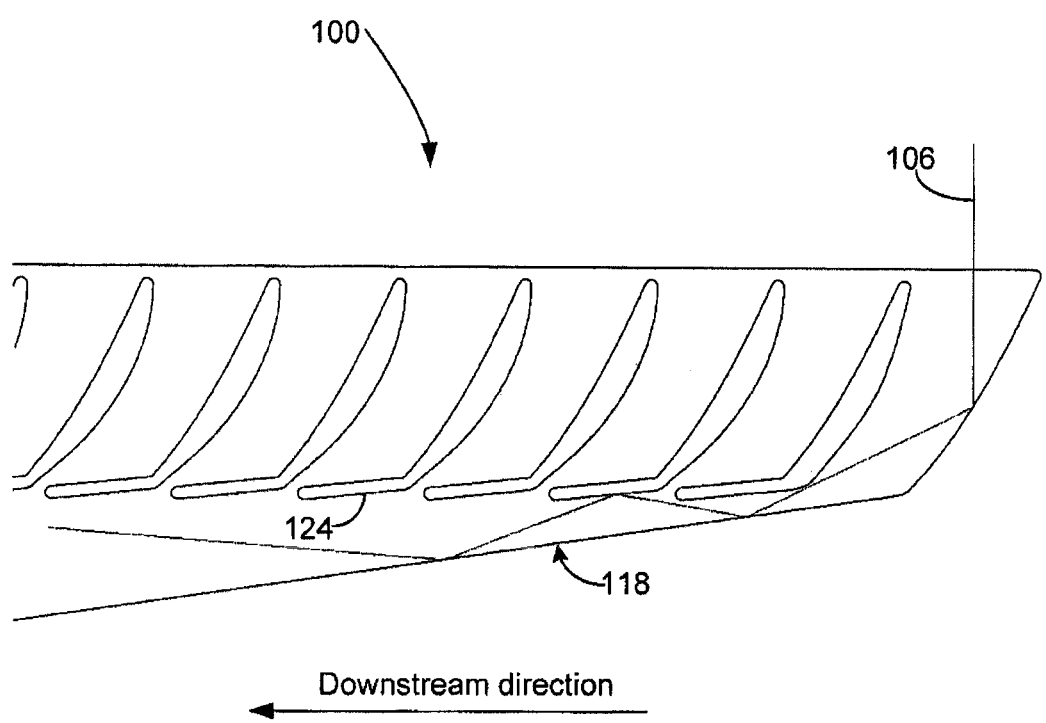
FIG. 5 shows the light-guide solar panel where light rays remain trap in an optical waveguide stage.
Figure 6:
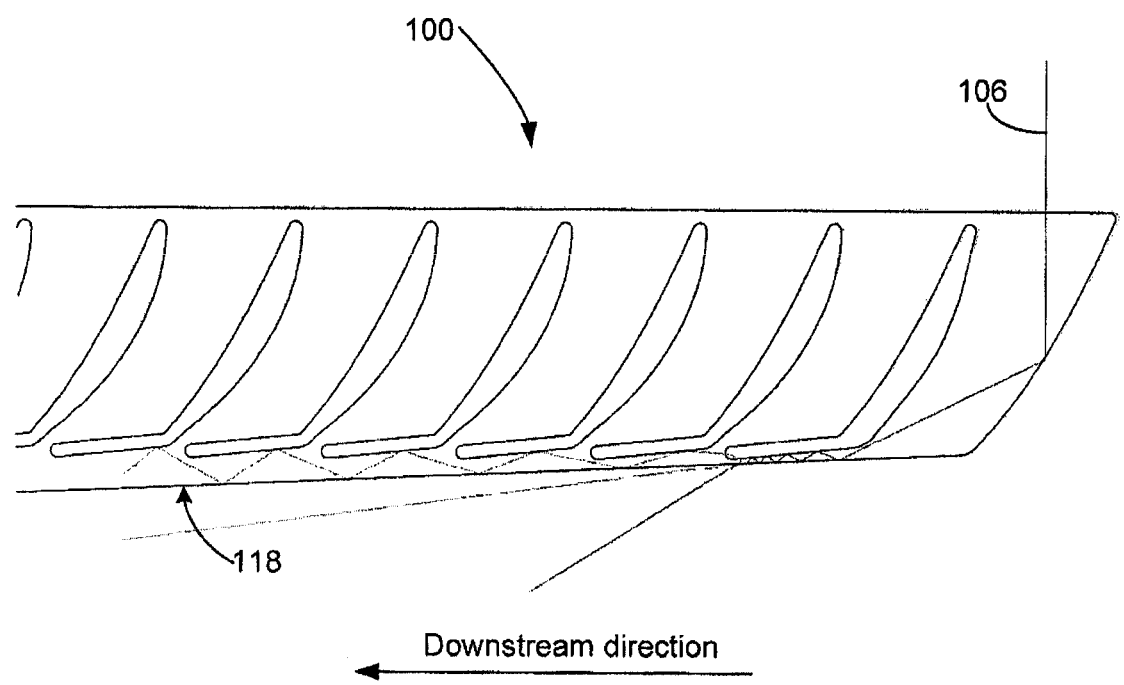
FIG. 6 shows a light-guide solar panel where light rays escape from the optical waveguide stages.

FIG. 5 shows another embodiment of the present invention where the angle between the wall 118 and the reflecting elements 124 is not parallel but opens in the downstream direction. In this embodiment, it can be shown that the sunlight 106 will remain trapped in the optical waveguide stage 104. FIG. 6 shows an embodiment where the angle between the wall 118 and the reflecting elements closes in the downstream direction. In this embodiment, it can be shown that the sunlight 106 eventually transmits out of the optical waveguide stage 104.

Figure 7:
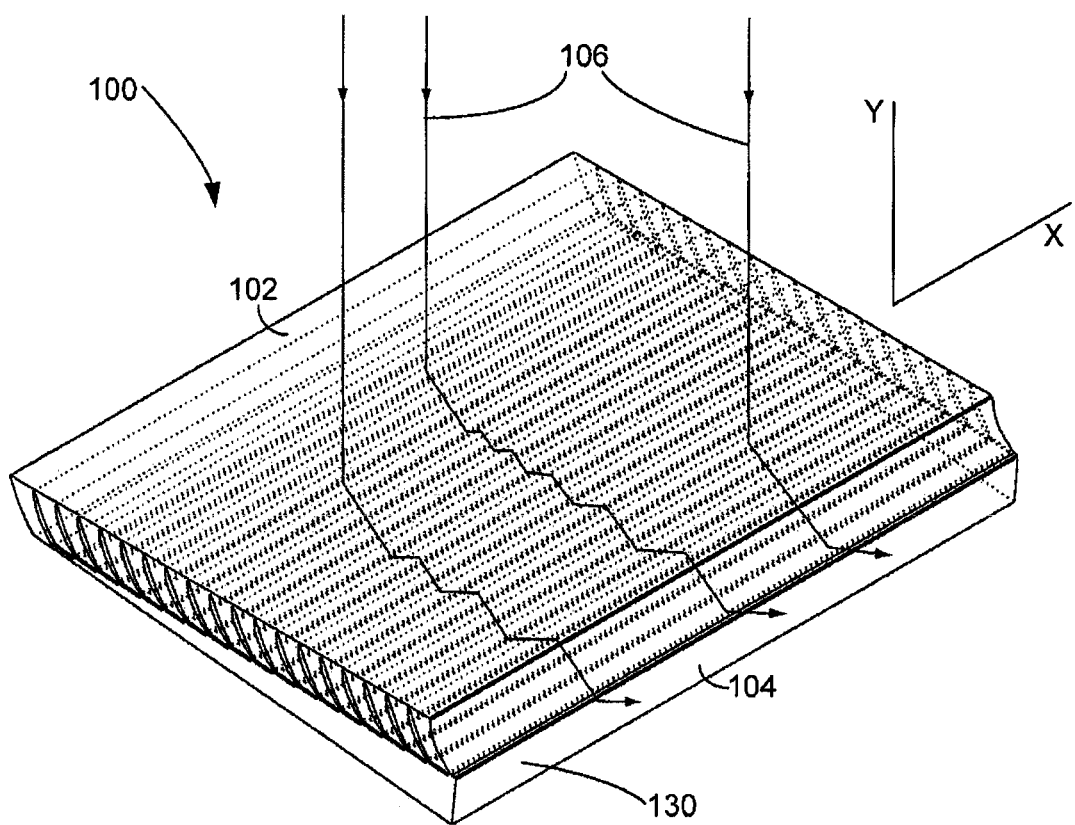
FIG. 7 shows a perspective view of a linear geometry embodiment of the light-guide solar panel of the present invention.

FIG. 7 shown a perspective view of a LGSP 100 that can have the cross-section shown at FIG. 1. The LGSP 100 of FIG. 7 concentrates the sunlight 106 on the sidewall 132. The embodiment of the LGSP 100 of FIG. 7 can be referred to as having a linear geometry sine the reflectors 110 all lie along parallel lines.

Figure 8:
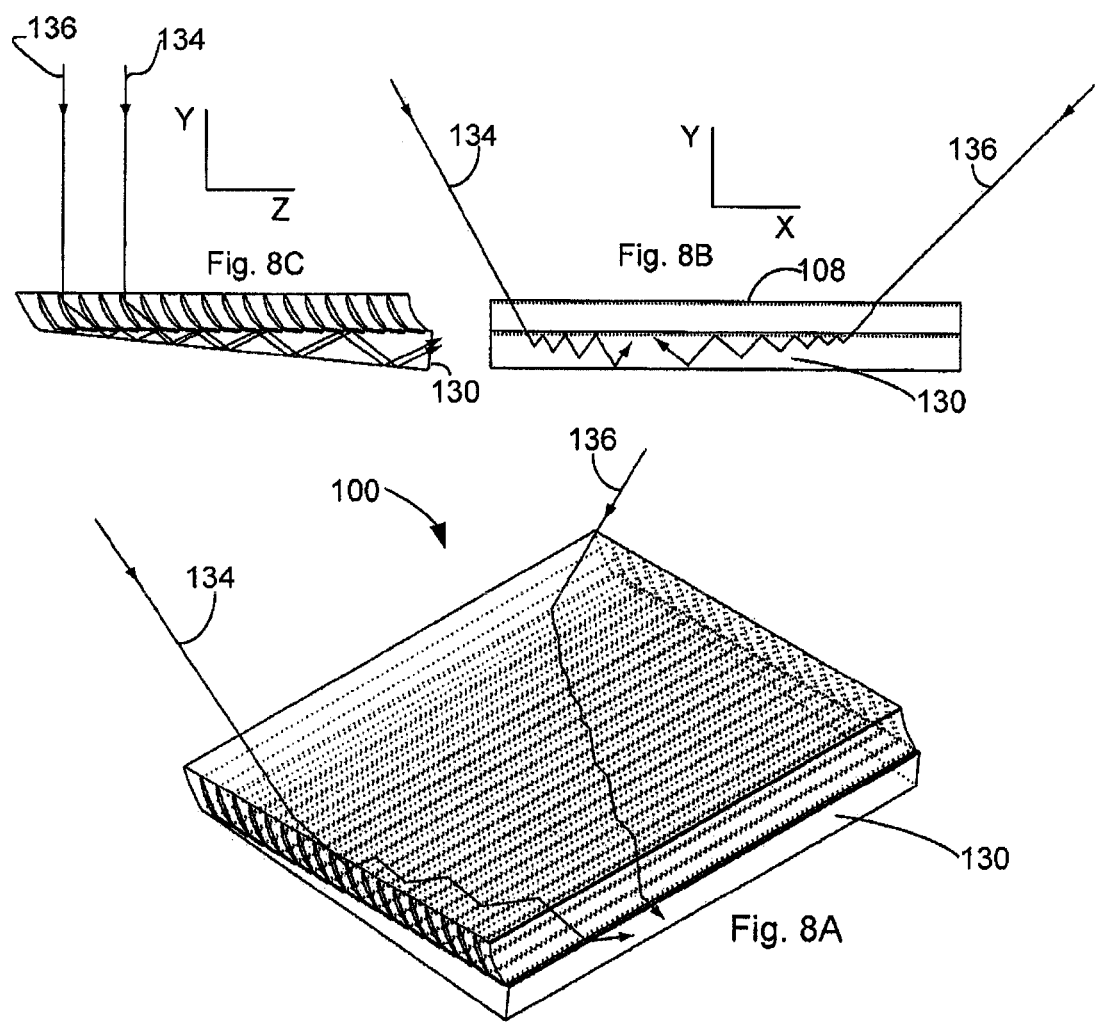
FIG. 8A shows a side view of the embodiment of FIG. 7 with two light rays propagating therein.
FIG. 8B shows a front view of the embodiment of FIG. 7 with two light rays propagating therein.
FIG. 8C shows a perspective view of the embodiment of FIG. 7 with two light rays propagating therein.

The performance of the LGSP 100 of FIG. 7 is substantially invariant to changes in the angle of incidence of the sunlight 106 in the plane defined by the X and Y axes. This invariance is shown at FIGS. 8A-8C where rays 134 and 136, respectively incident on the input surface 108 at 30° and 45° are directed to the optical waveguide stage 104 by the light-insertion stage 102, and propagate downstream in the optical waveguide stage 104 towards the output surface 130. Because of this invariance to angle of incidence in the X-Y plane, the LGSP 100 of FIG. 7 can be used in conjunction with any suitable single axis sun tracker to effectively concentrate the sunlight 106 to an edge of the panel, i.e., to the output surface 130. As will be understood by the skilled worker, a single axis tracker keeps the panel in a constant alignment with the sun so as to maximize the amount of sunlight captured by the LGSP 100.

Figure 9:
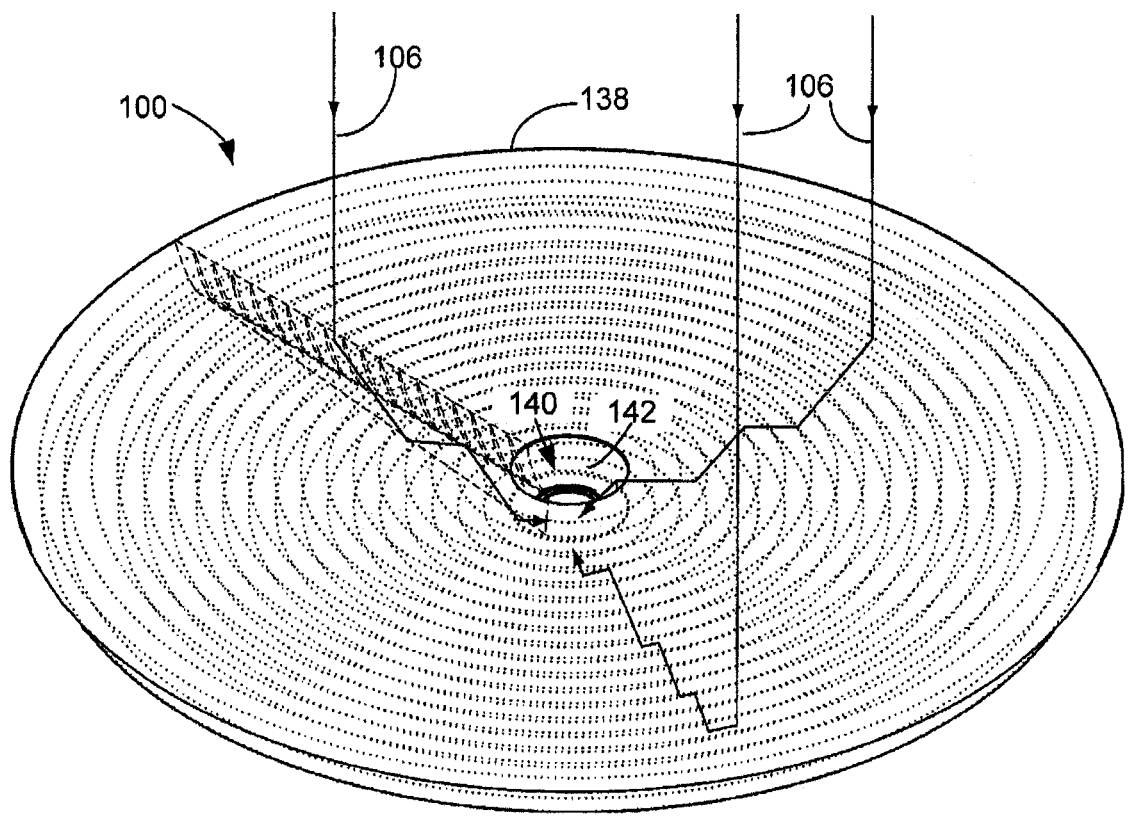
FIG. 9 shows a perspective view of a revolved geometry embodiment of the light-guide solar panel of the present invention.

FIG. 9 shows a perspective view of another LGSP 100 that can have the cross-section shown at FIG. 1. The LGSP 100 of FIG. 9 is substantially shaped as a discus 138 and concentrates the sunlight on an inner wall 140 formed in the hub region of the discus 138, the inner wall 140 acting as an output surface 142, which can be optically coupled, through any suitable way, to any suitable SEC. Examples of how the sunlight 106 can be coupled to a SEC are discussed further below. The embodiment of the LGSP 100 of FIG. 9 can be referred to as having a revolved geometry since the reflectors 110 lie on concentric circles. SECs include, for example, photovoltaic detectors, solar cells, fiber-optic collectors which gathers incident sunlight and transmits it by fiber-optics to the interior of a building for use in lighting fixtures and thermal collectors such as for heating water, or any combination thereof.

Figure 10:
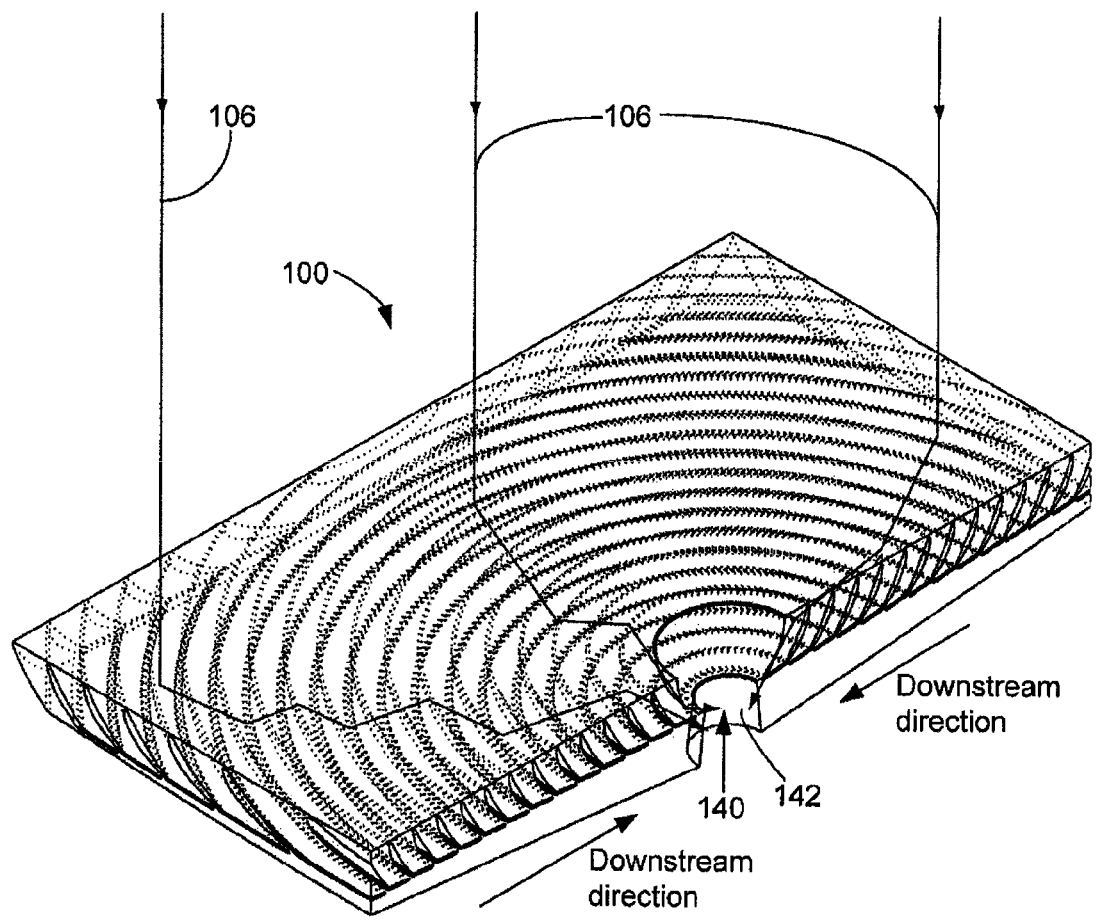
FIG. 10 shows a perspective view of a rectangular section of the embodiment of FIG. 9.
Figure 11:
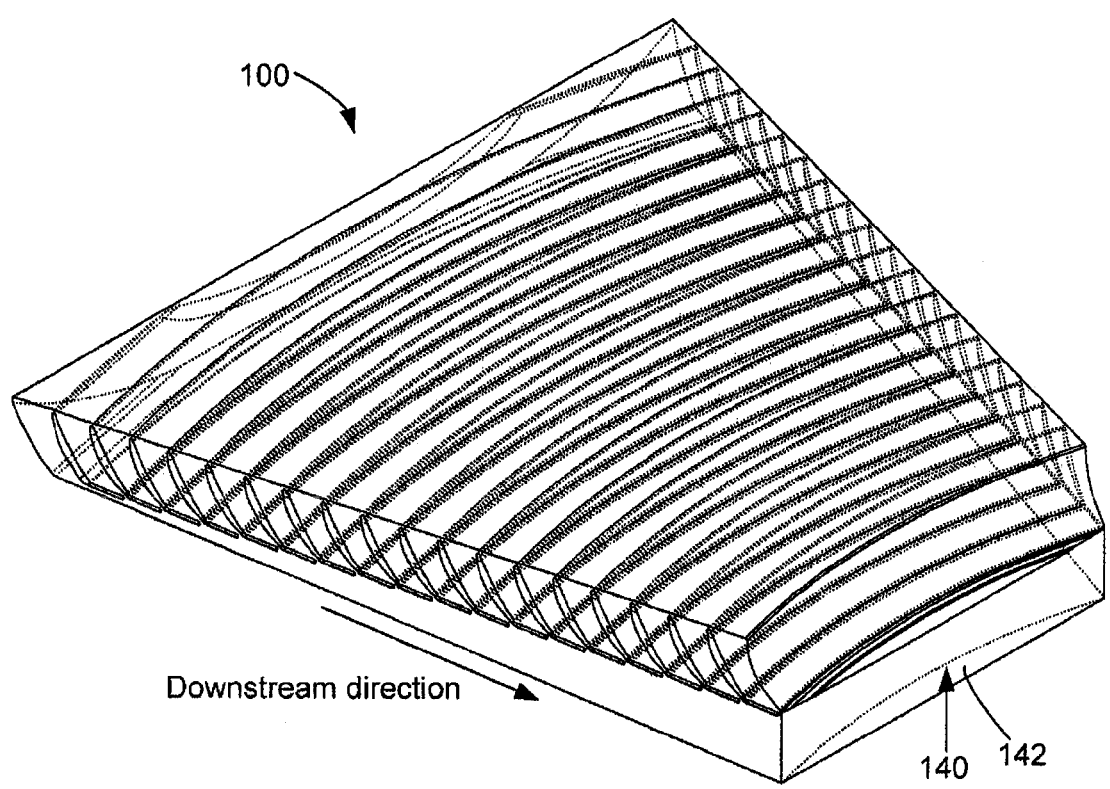
FIG. 11 shows a perspective view of an slice section of the embodiment of FIG. 9.

The LGSP 100 of FIG. 9 can be sectioned off in rectangular panes, as shown at FIG. 10, or in angular slices, as shown at FIG. 11, or in any other suitable shape, in order to adapt to any desirable mounting bracket or structure (not shown).

As will be understood by the skilled worker, the LGSPs 100 shown at FIGS. 7-11 can be mounted to any suitable type of sun tracking systems such as, for example, single axis tracking systems and dual axis tracking systems. For the LGSPs 100 of FIGS. 7-11, design tradeoffs can be made between concentration and angular sunlight acceptance, which in turn determine the required alignment and tracking precision. The LGSP 100 of FIG. 7 can achieve, for example, concentrations of 20-50 suns and require single axis solar tracking of approximately 1°. The LGSP 100 of FIG. 10 can achieve, for example, concentrations of approximately 500-1000 suns and require dual axis tracking of approximately 1°. Having a larger hub region at the center of the LGSP 100 of FIG. 10, i.e., having a larger opening at center of the LGSP 100, will produce less concentration than if the hub region were smaller and will require less accurate tracking.

As will be understood by the skilled worker, the ratio of the width of the optical output aperture 116 to the horizontal span of the reflector 110 determines the concentration. If the ratio is made very small, such that the optical output aperture 116 is extremely tight then the concentration can be made very high however the angular acceptance will be very small. The ratio between the width of 116 and the horizontal span of 110 also affects the angle of the first surface 120, as a tighter aperture allows for the angle between the surfaces 118 and 108 to be smaller, such as, for example, 1°. This in turn can leads to a smaller sidewall 132, and hence a smaller SEC.

Figure 12:
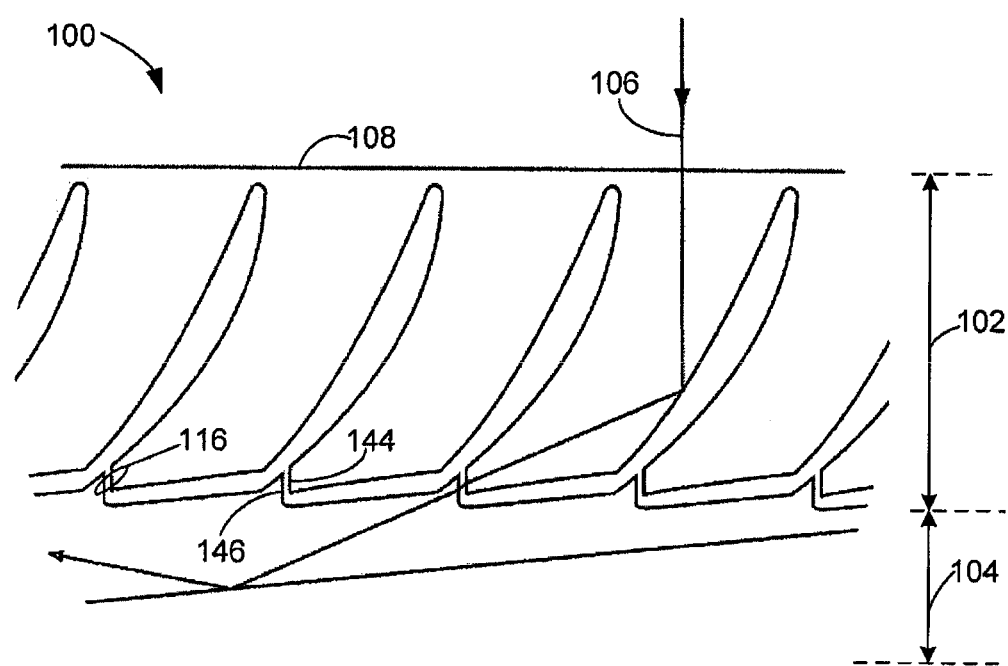
FIG. 12 shows a portion of a two-layer light-guide solar panel embodiment of the present invention.

For fabrication purposes, the light-insertion stage 102 and the optical waveguide stage 104, for the LGSP 100 of, for example, FIGS. 7 and 10, can form distinct layers as shown at FIG. 12. This creates an exit face 144 in the light-insertion stage 102 and an injection face 146 in the optical waveguide stage 104. The exit face 144 and the injection face 146 need not be parallel or flat. The exit face 144 and the injection face 146 are part of the optical output aperture 116.

Figure 13:
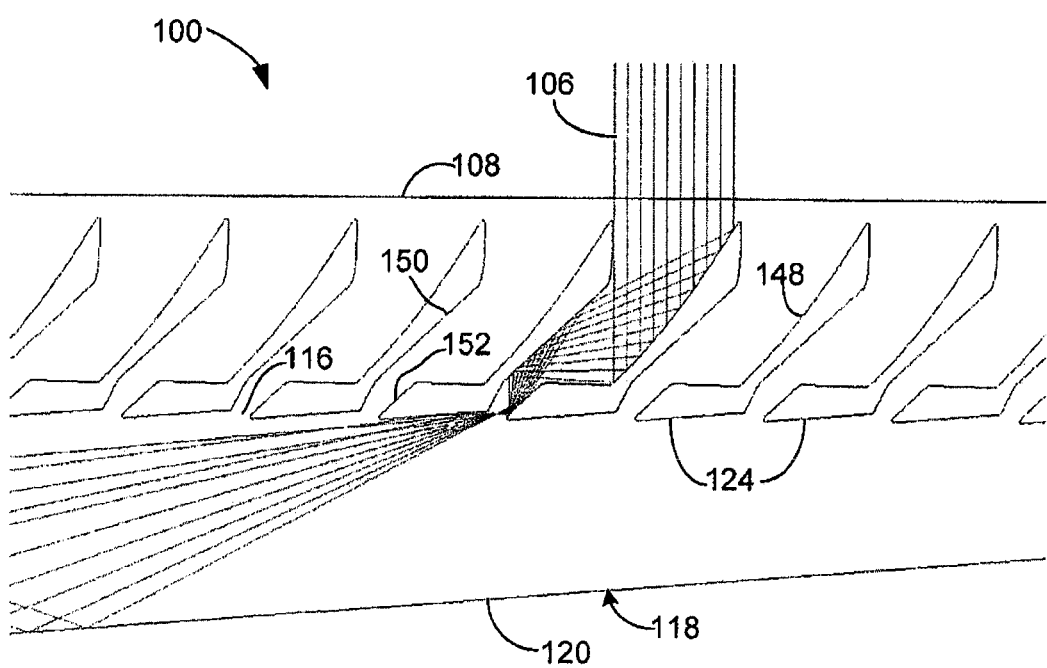
FIG. 13 shows a portion of an embodiment of the light-guide solar panel of the present invention where three reflections occur in the light-insertion stage.

FIG. 13 shows a cross-section of another embodiment of a LGSP of the present invention. In the embodiment of FIG. 13, the sunlight 106 bounces off a first reflector 148, a second reflector 150 and a third reflector 152 before being input into the optical waveguide stage 104 at the output optical aperture 116. The first, second and third reflectors are optical elements and can have any suitable shape such as, for example, flat, parabolic, hyperbolic, elliptical and round surfaces.

Further, any suitable optical elements such as, for example, lenses, Fresnel lenses, parabolic troughs, Cassegrain optics, Winston cones and tapered prisms can also be included in the light-insertion stage 102. The optical elements need only be able to deliver the sunlight 106 to the optical output apertures 116 in the general downstream direction of the optical waveguide stage. The optical waveguide stage 104 can be independent of the embodiment of the light-insertion stage 102, i.e., a same optical waveguide stage 104 can be used for different embodiments of the light-insertion stage 102.

Figure 14:
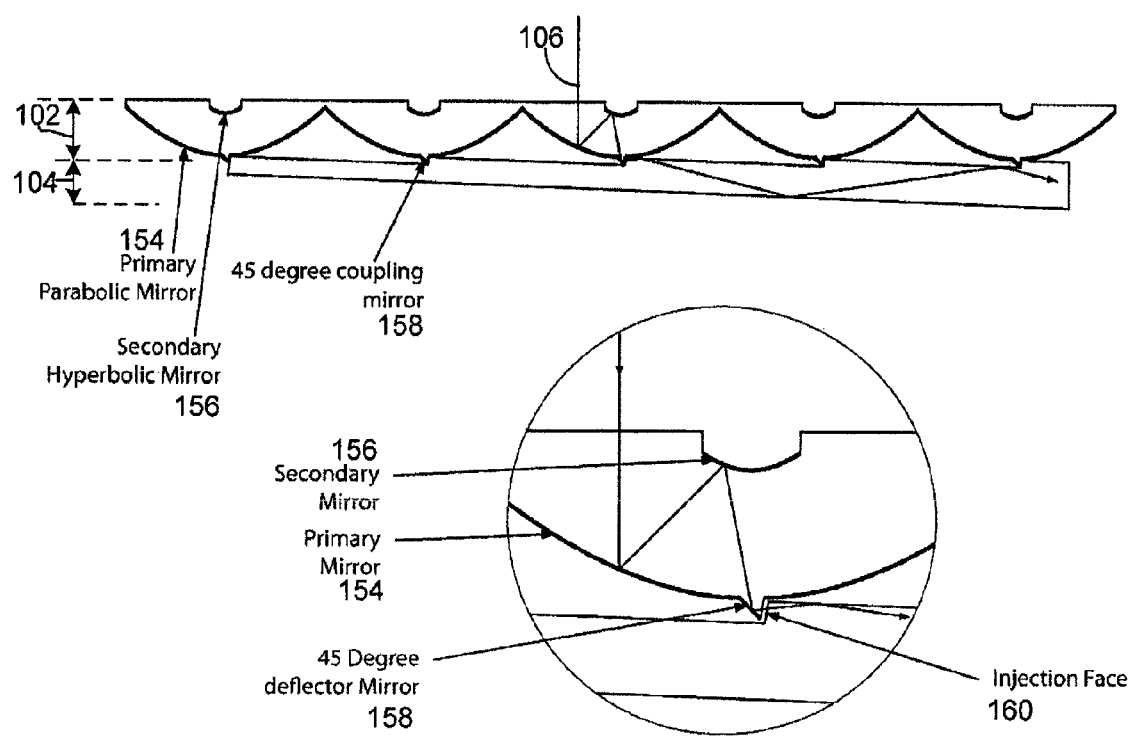
FIG. 14 shows an embodiment of the light-guide solar panel of the present invention where Cassegrain optics are used in the light-guide stage.

FIG. 14 shows an embodiment of the light-insertion stage 102 having a Cassegrain optic design. In this embodiment, a parabolic primary mirror 154 and a hyperbolic secondary mirror 156 are used to focus and direct the sunlight 106 at a flat reflector 158. The sunlight 106 reflects off the reflector 158 and enters the optical waveguide stage 104 at the injection face 160, which acts as an optical output aperture of the light-insertion stage 102. The embodiment of FIG. 14 can be used in a linear or revolved geometry LGSP. The Cassegrain optics of FIG. 14 require mirrored surfaces on the primary and secondary mirrors (154 and 156 respectively), as well as on the flat reflector 158.

Figure 15:
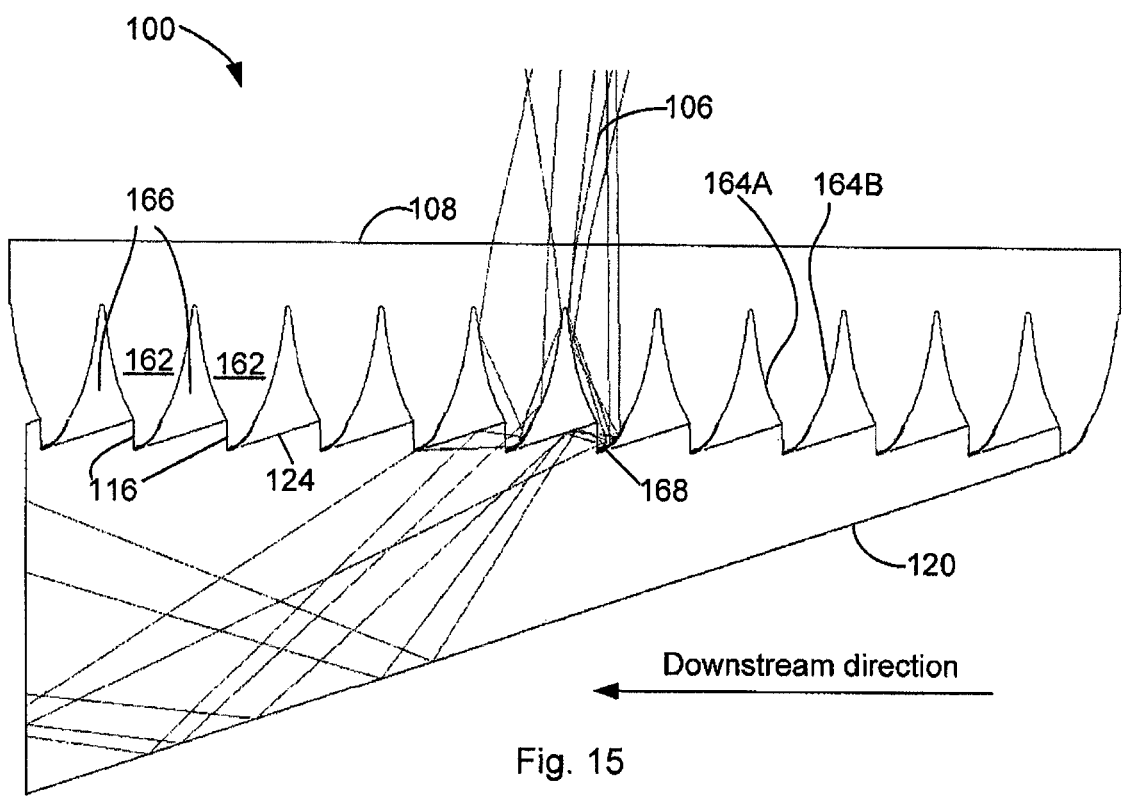
FIG. 15 shows an embodiment of the light-guide solar panel of the present invention where Winston cone optics are used in the light-guide stage.

FIG. 15 shows a light-insertion stage 102 having a series of Winston cones 162 defined by the interfaces 164A and 164B that lie between the optically transmissive material of the light-insertion stage 102 and the material 166, which can be air or any other suitable gas; however, any other suitable material can also make up the material 166. The geometry of the interfaces 164 with respect to the impinging sunlight 106 and ratio of the refractive index of the optically transmissive material of the light-insertion stage 102 to that of the refractive index of the material 166, are chosen such that the sunlight 106 impinging on the interfaces 164 goes through total internal reflection. For a given cone 162 defined by interfaces 164A and 164B, the sunlight 106 impinging on the interface 164A is reflected towards a reflector 168, which in turn directs the sunlight 106 at the optical output aperture 116. As for the sunlight 106 impinging on the interface 164B, depending on where on the interface 164B it reflects, it will either be reflected directly to the optical output aperture 116 or to the reflector 168, which will reflect it towards the optical output aperture 116. As for the sunlight 106 impinging directly on the reflector 168, it is also directed at the output optical aperture 116. After having entered the optical waveguide stage 104 through the optical output aperture 116, the sunlight 106 can either impinge on the first surface 120 or on the reflecting element 124, either way, the sunlight 106 undergoes total internal reflection and is propagated in the downstream direction. The reflector 168 can have any suitable geometry such as, for example, a rounded geometry, and can include any suitable type of mirrored coating. The light-insertion stage 102 of FIG. 15 can be used in a linear or revolved geometry LGSP. The light-insertion layer 102 of FIG. 15 can be used in non-tracking solar panels due to its relatively wide sunlight acceptance angle.

In the embodiments described above, increased concentration can be obtained by reducing the height of the optical waveguide stage 104 adjacent the output optical aperture of the optical waveguide stage. As described in the embodiments above, the optical waveguide stage 104 propagates the sunlight 106 by total internal reflection of the sunlight. In general, if the optical waveguide stage tapers or converges downstream as shown at FIG. 6, the sunlight will escape from the optical waveguide stage. However, this limitation does not apply to the last reflection within the optical waveguide stage since at this point, the sunlight is about to exit the optical waveguide stage 104. Immediately prior to harvesting of the sunlight by a SEC, the sunlight can be reflected at any suitable angle provided it still reaches the optical output aperture of the optical waveguide stage. Because the SEC will harvest the sunlight, the angle of incidence of the light matters less and, as such, the light can be pinched, or concentrated further, immediately prior to being harvested. The additional concentration achievable in this way depends upon the angular spread of the sunlight 106 within the optical waveguide stage 104, with greater concentration being achievable the more collimated the light within the light guide layer is. In typical embodiments the extra concentration can range, for example, between 1.5 times and 2 times.

Figure 16:
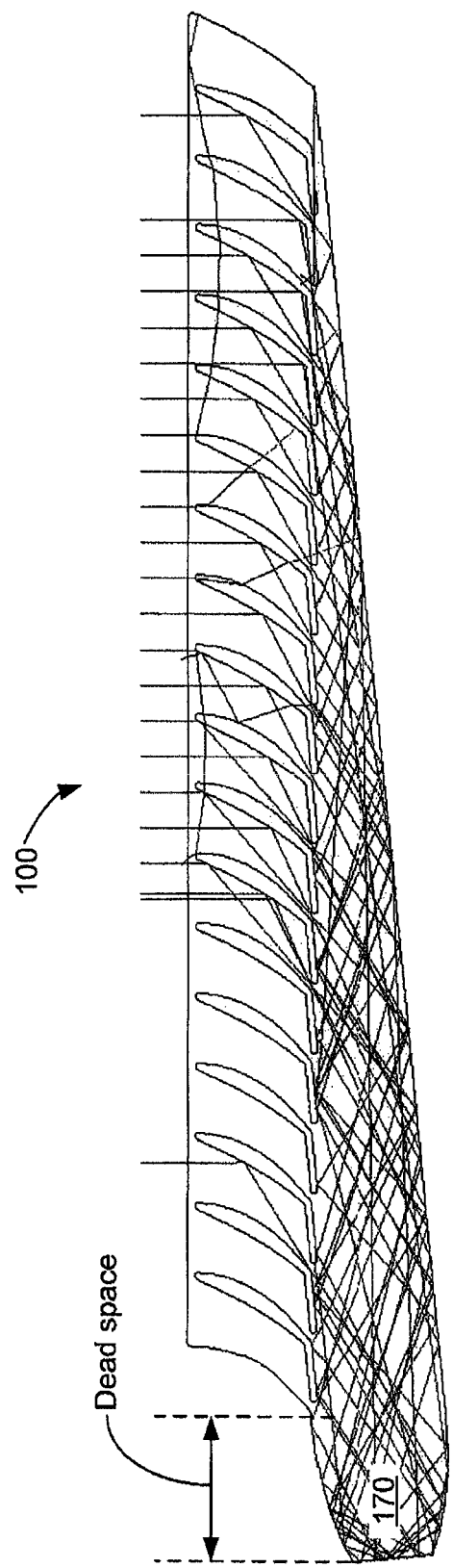
FIG. 16 shows an embodiment of the light-guide solar panel of the present invention where Winston cone optics are used in the optical waveguide stage.

The simplest way to add this extra concentration is to taper the light-guide layer close to the SEC. A good taper for concentration is a Winston Cone, which is an off-axis paraboloid, an example of which is shown at reference numeral 170 at FIG. 16. However, the inclusion of such a Winston cone 170 introduces dead space (defined as LGSP surface exposed to sunlight which does not capture and transmit light to the SEC) in the LGSP 100 because light incident on the Winston cone from above is substantially not captured. Such dead space leads to reductions in overall system efficiency in the use of space for converting solar energy to useful energy.

Figure 17:
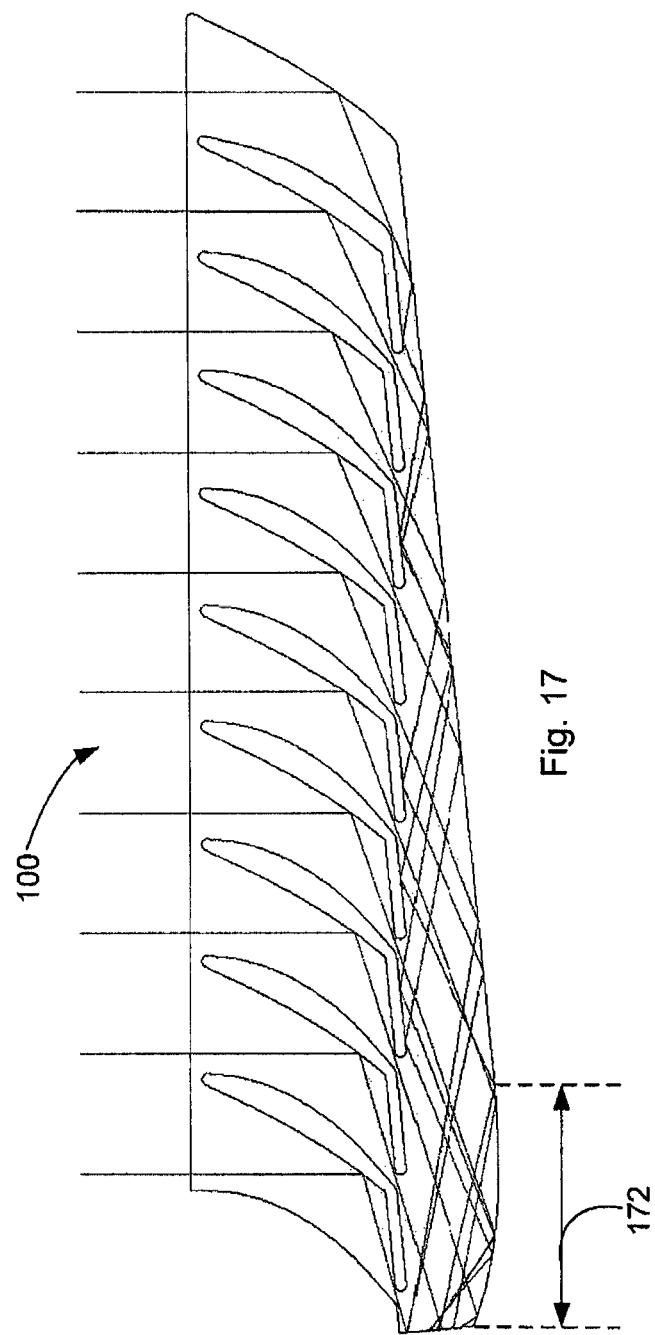
FIG. 17 shows an embodiment of the light-guide solar panel of the present invention where Winston half-cone optics are used in the optical waveguide stage.
Figure 18:
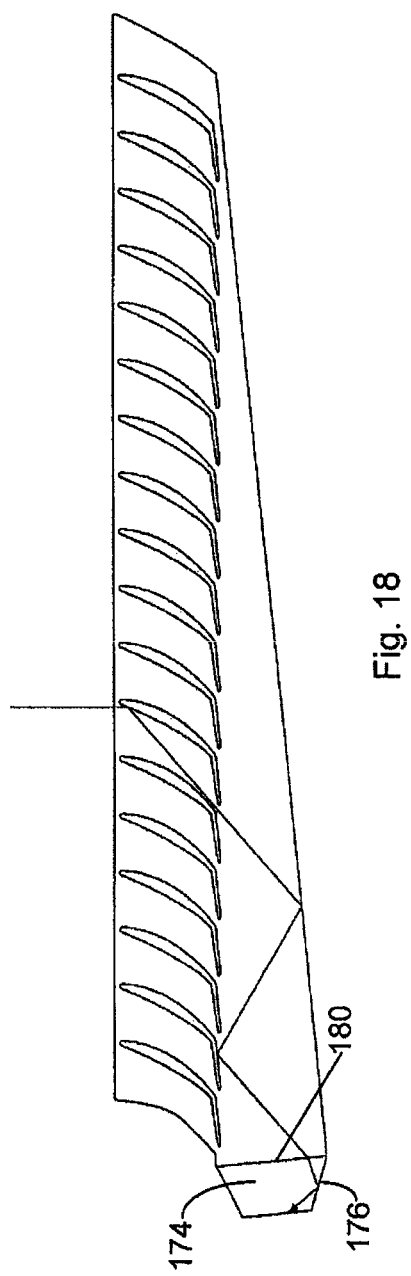
FIG. 18 shows an embodiment of the light-guide solar panel of the present invention where a flat-faceted concentrating element is used in the optical waveguide stage.

A compromise between extra concentration and dead space can be achieved by using a half Winston Cone 172 shown at FIG. 17. As another alternative, a flat faceted taper 174, as shown at FIG. 18, can be used to approximate the effect of a Winston cone. However, the flat faceted taper does not provide the same additional concentration that can be provided by a Winston cone. Despite this fact, and because flat elements are easier to fabricate than curved elements, the approach shown at FIG. 18 can be interesting.

The increased concentration described above can be achieved using a separate optical element, a pinch, which is made of an optically transmissive material and can be secured between the optical waveguide stage and the SEC (not shown). Such a pinch is shown at reference numeral 176 at FIG. 18. If the refractive index of the pinch 176 is greater than that of the optical waveguide stage, then further additional concentration can be gained. The additional concentration occurs because sunlight deflection occurs at the interface 180 between the optical waveguide stage and the pinch 176, and because the critical angle with a high index material (pinch 176) is lower.

An advantage of placing an optical element such as, for example, a pinch 176, between the optical waveguide stage and the SEC is that it can insulate the optical waveguide stage against heat accumulation at the SEC. This becomes important if the SEC becomes hotter than what can be withstood by the material of which the optical waveguide stage is made during worst-case operation.

Figure 19:
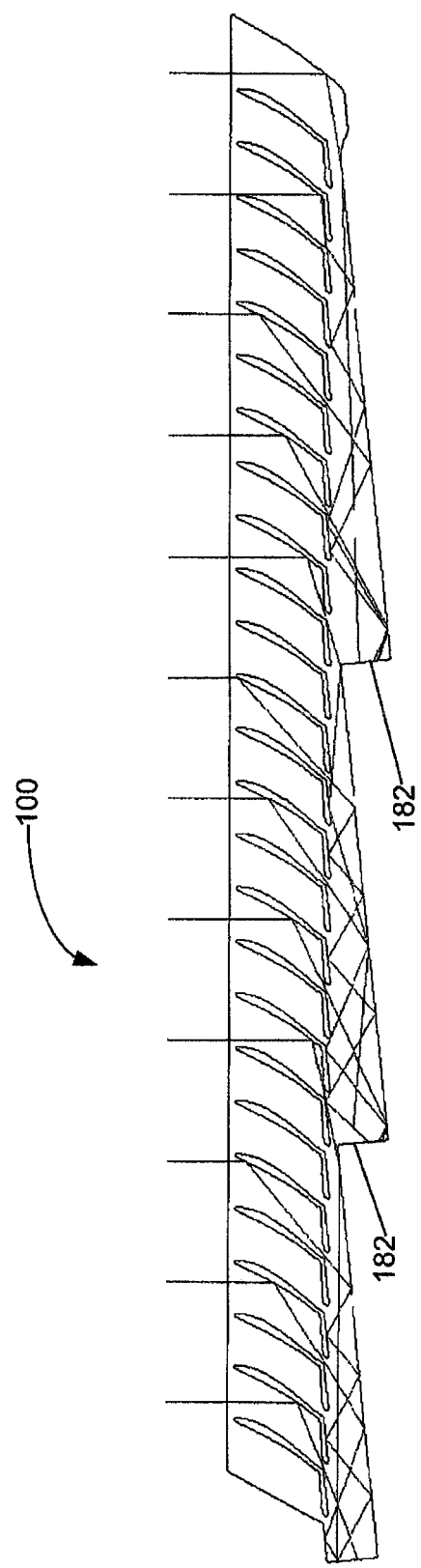
FIG. 19 shows an embodiment of the light-guide solar panel of the present invention where multiple output surfaces are present on the optical waveguide stage.

Another embodiment of the LGSP 100 of the present invention is shown at FIG. 19. This embodiment allows the optical waveguide stage 104 to provide sunlight to a series of SECs secured to a series of walls 182 defined by the optical waveguide stage 104. As will be understood by the skilled worker, the use the plurality of walls 182 make for a thinner optical waveguide stage 104.

Figure 20:
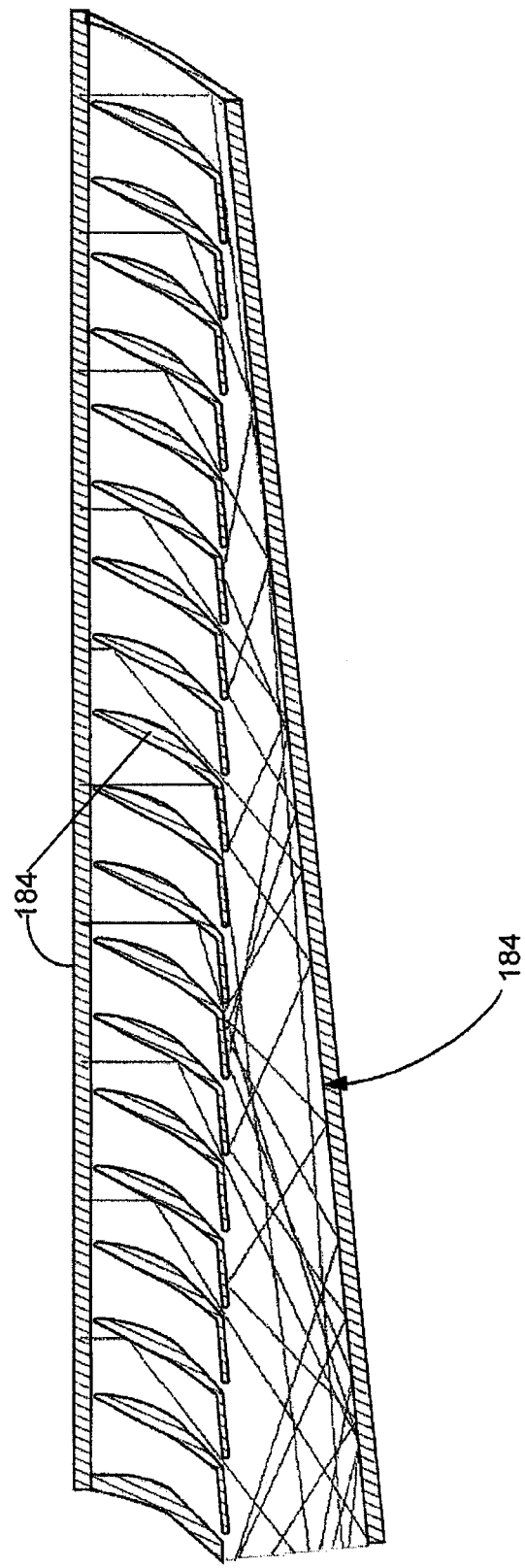
FIG. 20 shows an embodiment of the light-guide solar panel of the present invention where a cladding layer surround the panel.

To protect the input surface 108 of the light-insertion stage 102 and the first surface 120 of the optical waveguide stage 104, a cladding layer 184, shown at FIG. 20, can be applied to the input surface and/or to first surface. The cladding layer can have a refractive index lower that the refractive index of the light-insertion stage and lower than that of the optical waveguide stage. Further, the cladding layer 184 can also be applied to all spaces within the LGSP 100 that is usually occupied by air or gas.

The advantage of having such a cladding layer 184 is that it can protect the integrity of the LGSP. With such a cladding layer 184 present, the outer surface of the cladding may become dirty or scratched without compromising the function of the LGSP. The cladding layer 184 can be made of any suitable material such as, for example, fluorinated ethylene propylene. As will be understood by the skilled worker, the thickness of the cladding layer can relatively thin and still be effective.

The LGSP embodiments presented above are scalable. That is, their dimensions can all change by a common factor without affecting the functioning of the optics, provided that the optics do not become so small that interference effects dominate. Such interference effects can become important when the spacing between staggered optical elements is on a scale comparable to the optical wavelengths. The most energetic wavelength portion of the solar spectrum is between 0.2 microns and 3 microns. Accordingly, the staggering period of the optical elements and the apertures as well as the size of the apertures can be kept larger than 3 microns to mitigate interference effects.

In order to use a minimum of material and keep costs low, it is desirable to make the optical elements small to minimize the thickness of LGSPs and to enable maximum area coverage with minimal material. The thickness of the optical waveguide stage (light-guide layer) will largely be limited by the size of the SECs (e.g., the size of PV cell strips) disposed to harvest the sunlight. In the case of PV cell strips, their size can vary, for example, from 1 millimeter to 1 centimeter, although larger or smaller PV cells would work equally well. The light-insertion stage (insertion layer) on the other hand can be made as thin as interference effects and fabrication methods can allow.

The LGSPs of the present invention can be fabricated by molding techniques such as injection molding, compression molding, injection-compression molding or by any other suitable methods. Generally speaking, parts made by molding cannot have undercuts, and as such it is not possible to mold the entire light-guide panels described above at once using conventional molding. However, the LGSP can be manufactured by dividing them into sections that can be molded individually. Two exemplary approaches for sectioning a LGSP for purposes of manufacturing are described below.

Figure 21:
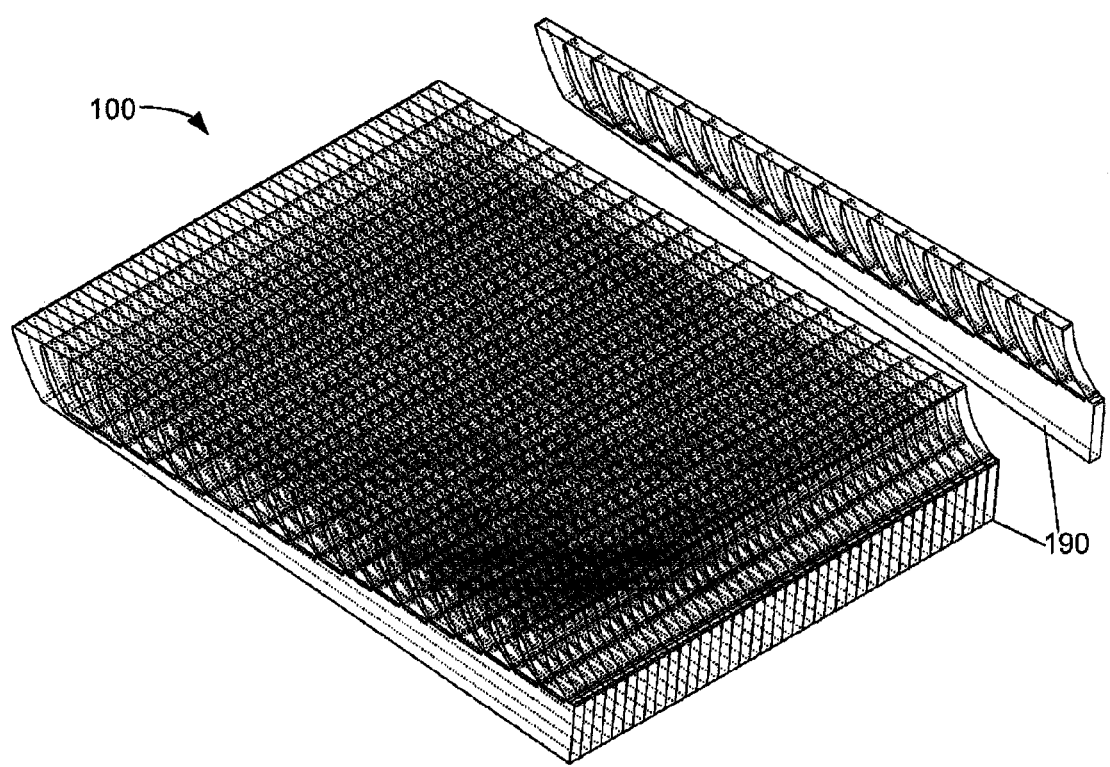
FIG. 21 shows an embodiment of the light-guide solar panel of the present invention made by assembling slices side by side.
Figure 22A:
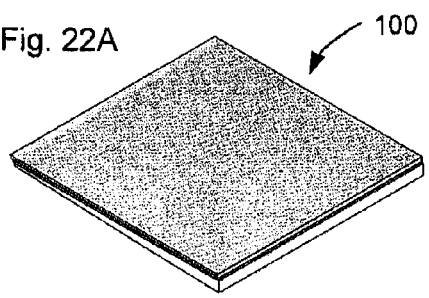
FIG. 22A shows a perspective view of a three-layer embodiment of the light-guide solar panel of the present invention.
Figure 22B:
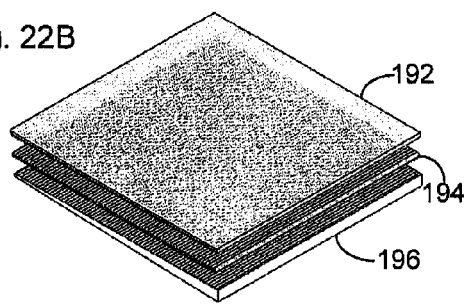
FIG. 22B shows an exploded view of the embodiment of FIG. 22A.
Figure 22C:
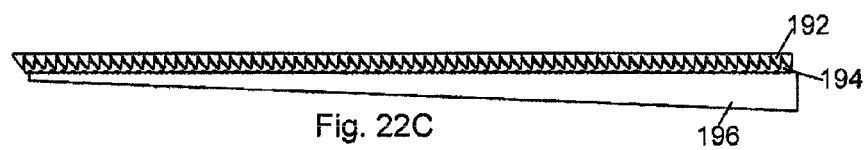
FIG. 22C shows a side view of the embodiment of FIG. 22A.
Figure 22D:
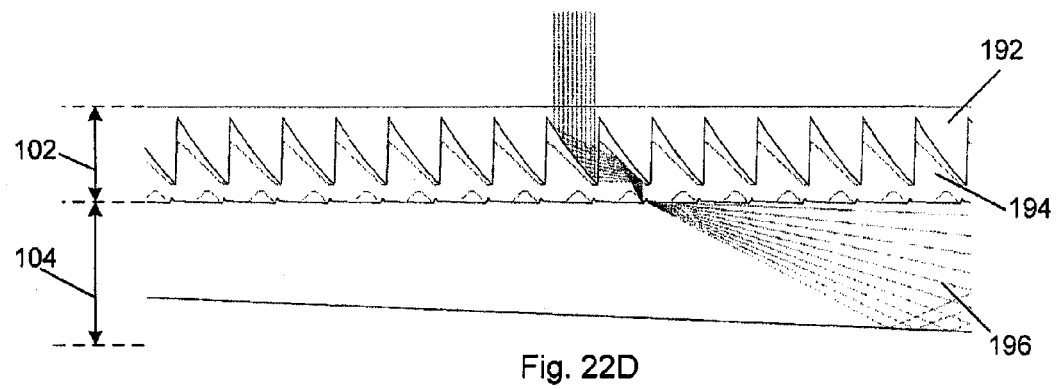
FIG. 22D shows an enlarged view of FIG. 22C.

A first approach it to manufacture thin vertical sections, or slices, of the LGSP and assemble them side by side as shown at FIG. 21. The separate slices 190 of the panel can be held together by an external bracing (not shown), or they can be glued or otherwise bonded together. This first approach (slice approach) is suitable for the linear geometry LGSPs.

A second approach is to fabricate horizontal slabs that can be stacked one on top of the other to make a LGSP. Such panels can be self-supporting, requiring little in the way of framing and enclosures, and can be such that no gluing or bonding is necessary. The slabs make up the functional layers previously described (light-insertion stage and optical waveguide stage); however, a given functional layer can be made up of any number of slabs.

FIGS. 22A-22D show one way to divide the LGSP 100 into three sheets with no undercuts. The top two sheets 192 and 194 act in concert to form the insertion layer (light-insertion stage 102), and the bottom sheet 196 forms the light-guide layer (optical waveguide stage 104). The embodiment shown at FIGS. 22A-22D is similar to that shown at FIG. 13. In the top slab 192, the sunlight 106 reflects by total internal reflection (TIR) off a parabolic reflector, it then exits the top slab 192 and enters the middle slab 194, then reflects by TIR off two flat facets before exiting the middle slab 194 and entering the bottom slab 196, which acts as the light-guide layer (optical waveguide stage 104).

Figure 24A:
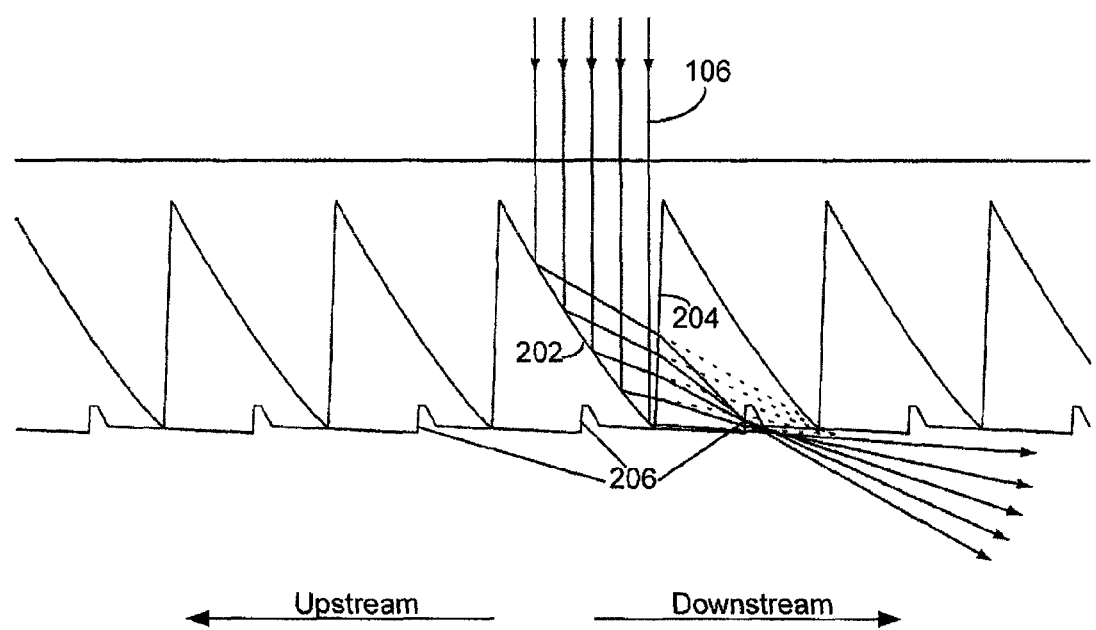
FIG. 24A shows an enlarged view of an embodiment of the light-guide panel of the present invention.
Figure 24B:
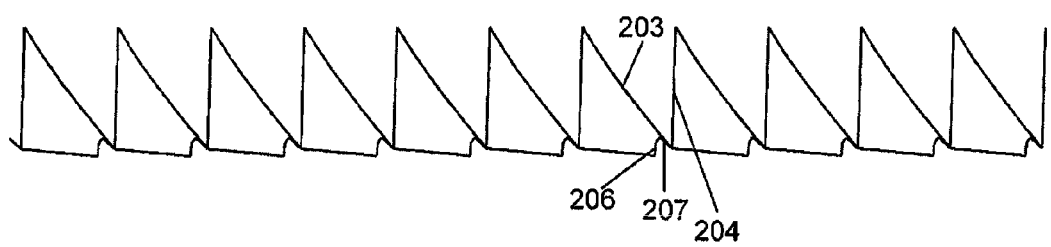
FIG. 24B shows an enlarged view of an embodiment of the light-guide panel of the present invention.

FIGS. 23A-23C show another potential division of the LGSP 100 into two slabs 198 and 200. The insertion layer and the light-guide layer are made with one slab each, slabs 198 and 200 respectively. As shown at FIG. 24A, sunlight 106 totally internally reflects off a parabolic surface 202 and then exits through a flat facet (exit surface) 204 into the air before encountering an injection face 206 of the light-guide layer (optical waveguide stage). Deflection at the exit surface 204 of the insertion layer slab alters the focal point of the parabolic reflector; it moves the focal point slightly upstream, which in turn requires moving the apertures of the light guide layer upstream. There is an advantage to the slight shift of the focal point: it allows for tight packing of the parabolic reflector faces with very little dead-space between them. However, a disadvantage of using deflection rather than only reflection to concentrate the sunlight is that the resulting embodiment will not function optimally under single axis sunlight tracking. As such, the two-slab approach of FIG. 24A is well-suited for a revolved geometry LGSP. This is because this embodiment requires, for optimal performance, two axis tracking in any event. The shift of the focus by a flat facet introduces some small astigmatism to the focusing parabolic optic. This spreads the sunlight 106 at the focus slightly and limits, to a small degree, the achievable concentration. It is possible to compensate somewhat for the astigmatism by tilting the parabola slightly. If the flat facet 204 is tilted 2° counter clockwise from the vertical, then tilting the parabolic reflector 110 by 5° clockwise from the vertical can somewhat compensates the astigmatism. FIG. 24B shows another embodiment of a light-guide solar panel similar to the one of FIG. 24A but instead with a cubic surface 203 abutting the projection 207 formed by the injection face 206.

Figure 24C:
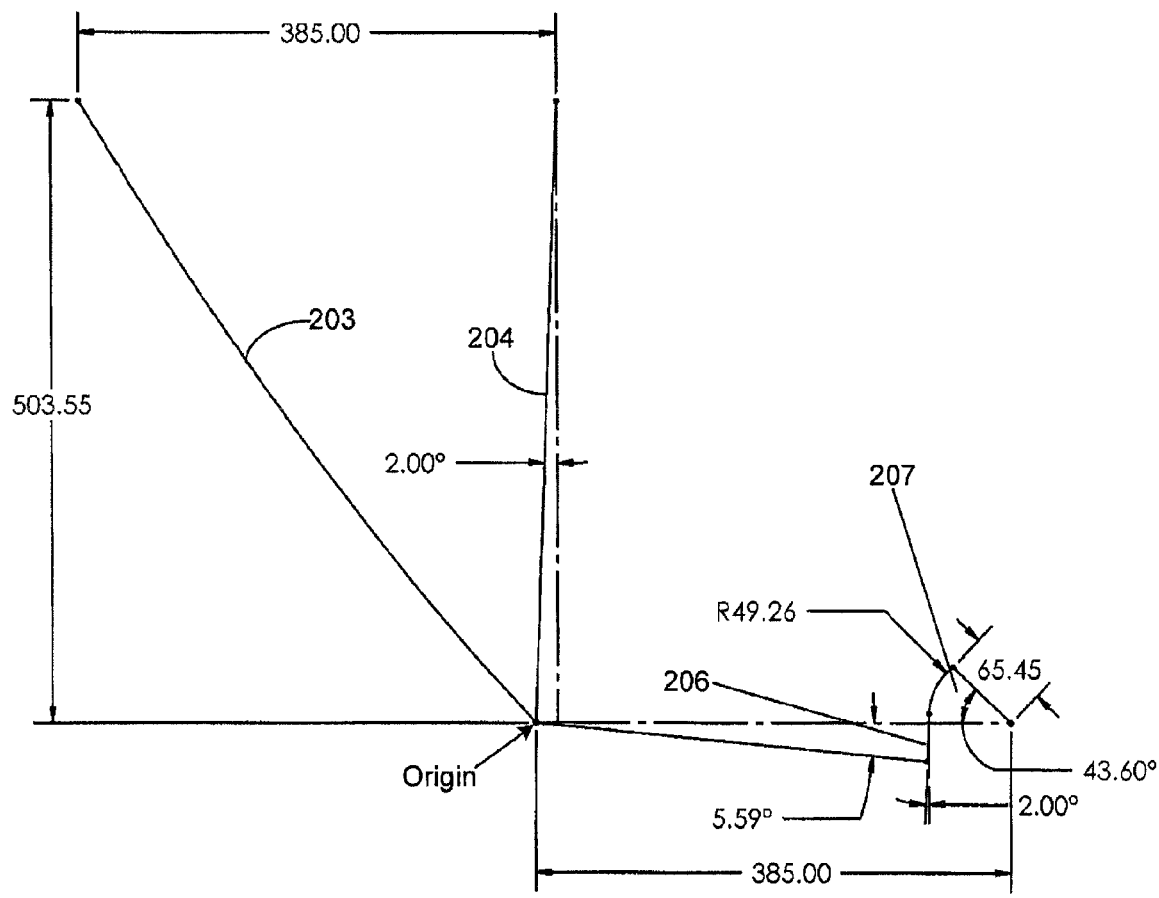
FIG. 24C shows geometrical details of the embodiment of FIGS. 24B and 33D.

FIG. 24C shows exemplary dimensions for the periodic unit of the light-insertion stage of FIG. 24B, the unit in question comprising the cubic reflector 203, the flat facet 204, the injection face 206 and the projection 207. The lengths are in microns and the equation of the cubic reflector 203 is $y=-1.049388x+9.1781775\times10^{-4}x^2+1.19193\times10^{-7}x^3$.

Figure 26:
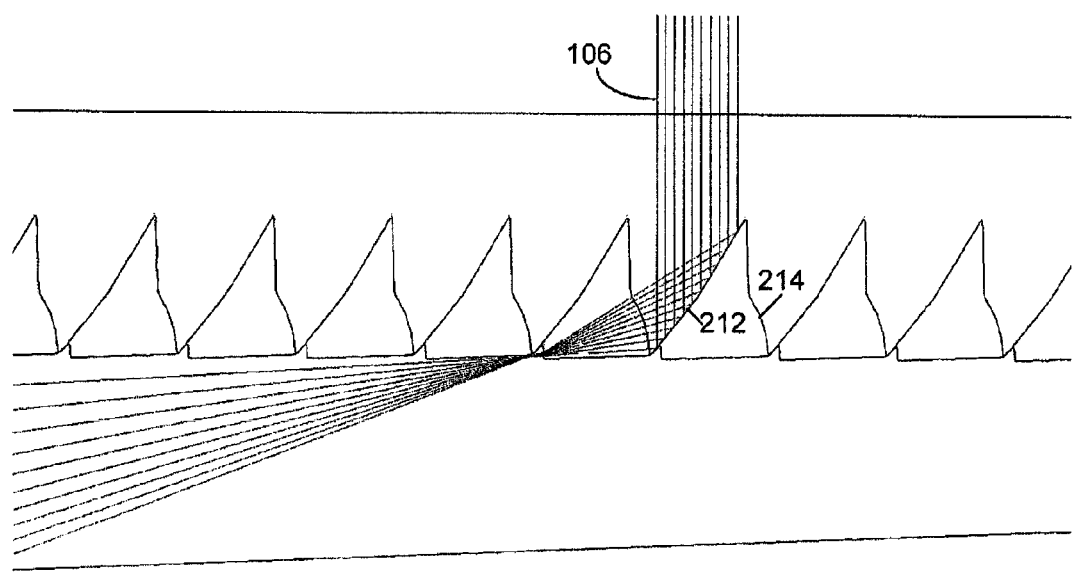
FIG. 26 shows an enlarged view of an embodiment of the light-guide panel of the present invention.

FIGS. 25A-25C shows yet another division of the LGSP 100 into two slabs 208 and 210 which improves on the limitation of the embodiment of FIG. 24A with respect to non-optimal single axis tracking, and allows for the fabrication of a linear geometry LGSP that does not use deflection to concentrate sunlight. As shown at FIG. 26, sunlight 106 is totally internally reflected off the parabolic reflector 212, but in this embodiment it exits the insertion layer slab at an exit face 214 that is the arc of a circle centered on the focus of the parabolic reflector 212. The sunlight rays that are converging on the focus of the parabolic reflector each encounter the arc exit face at substantially a right angle, and so no deflection occurs.

All the above-mentioned slabs can be molded with assembly features that ease the alignment between them when they are assembled into LGSPs. The assembly features can have minimal or no interference with the optical performance. In particular, embodiments of the LGSP of the present invention can be designed so that the backside of upstream apertures rests against the bottom of parabolic reflectors; this is the embodiment with the embodiment shown at FIG. 25C. Other assembly features can include small nubs, scattered over the surface of the light-guide layer, which hold the parabolic reflectors in place with respect to the optical waveguide stage 104. The space between the slabs should substantially clear of dust and moisture. The slabs can be sealed to each other using silicone or any other suitable material, or by using a gasket or any other suitable seal. A small amount of desiccant can be added between the slabs to absorb moisture. A dust jacket or full envelope can be added to the LGSP to keep it clean and allow for color matching with architecture.

Figure 27:
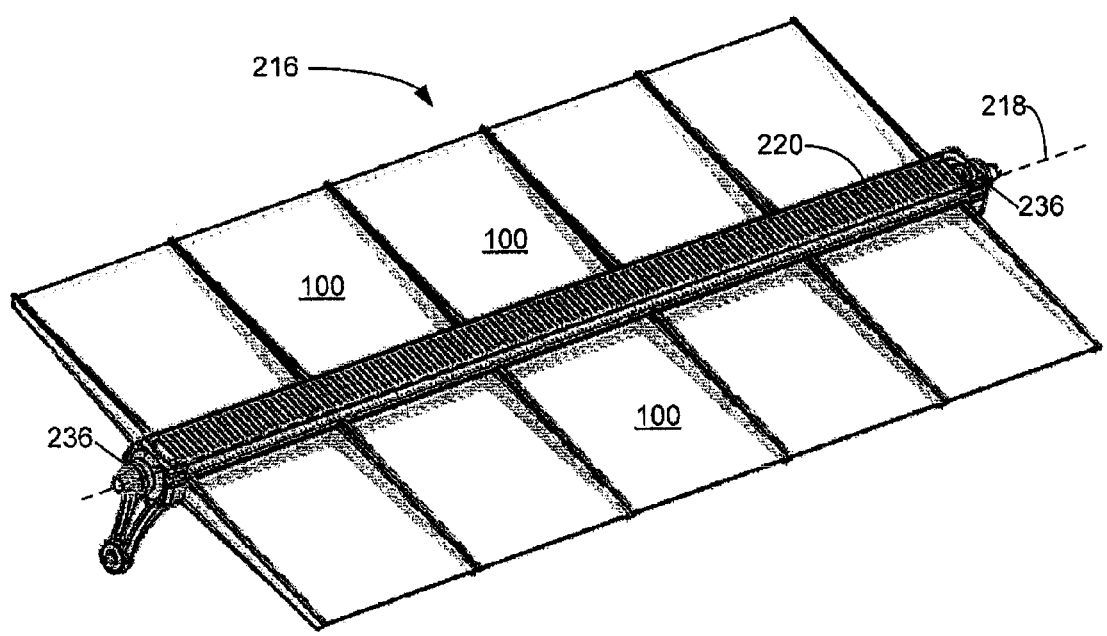
FIG. 27 shows an assembly often light-guide solar panels embodiments of the present invention.

A single axis tracking solar panel system 216 is shown at FIG. 27. The solar panel system 216 can use LGSPs 100 manufactured using the two-slab approach described above, and can be assembled to tilt about the axis 218. The LGSPs 100 can be made in squares, 125 millimeters each side. The light-guide layer (light-insertion stage) can use a half Winston Cone to concentrate the light onto PV cells that are 3 mm tall. The optical concentration of such a system is roughly 30 suns.

The system 216 is formed using several solar panels 100, for example 10, arranged in two parallel rows on either side of a heat sink 220, which can be made of aluminum of any other suitable material, and in such a way as to concentrate light towards the inner edge of the panels where they connect to the heat sink 220. PV cells are placed between the optical panels 100 and the heat sink 220.

Figure 28:
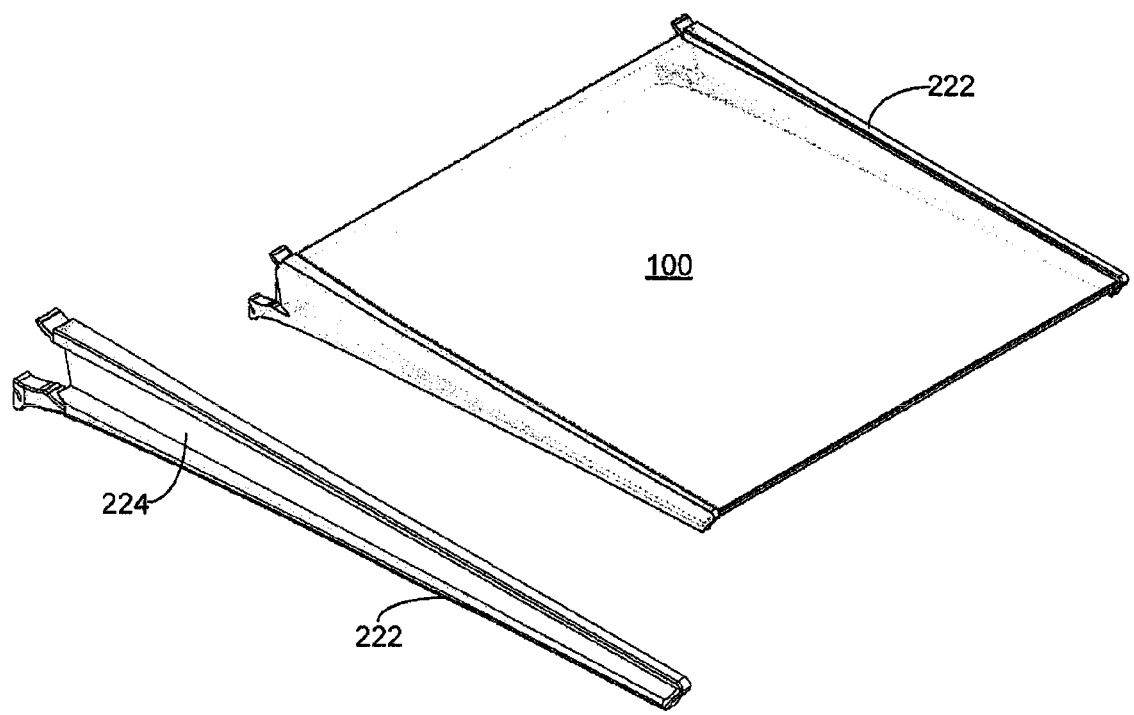
FIG. 28 shows a light-guide solar panel of the present invention assembled held between ribs.
Figure 29:
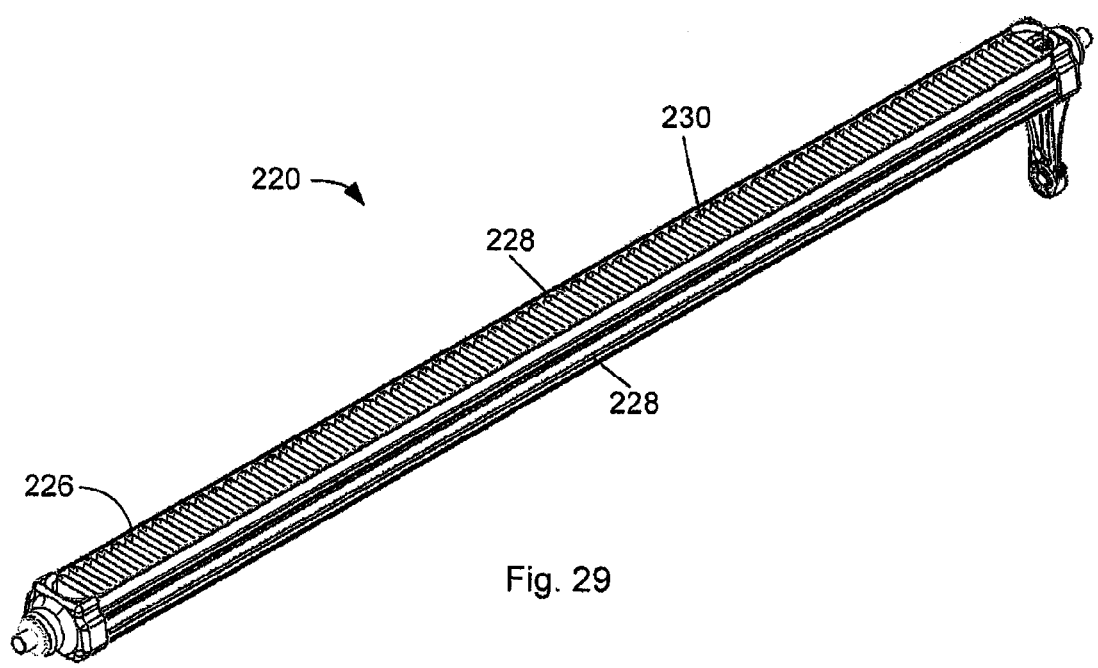
FIG. 29 shows a heat sink.

The solar panels 100 can be kept in alignment, for example, by ribs 222 shows at FIG. 28. The ribs can be made of injection-molded polymer, although machined aluminum or any other material can be used. The ribs 222 mechanically hold the panels 100 in position against the heat sink 220 and features on both the ribs 222 and the heat sink 220 can be included to facilitate assembly. Such features (e.g., recess 224) and details of the rib 222 and heat sink 220 are shown at FIGS. 28 and 29 respectively. The ribs 222 can be held in place against the heat sink using mechanical fasteners, adhesives, or any other suitable means.

This heat sink 220 can serve two functions: (1) it aids in dissipating heat from the PV cells and (2) it creates a rigid supporting axel for the LGSPs 100. The weight of the panels is balanced on either side of the heat sink 220 and the heat sink 220 is where the panel connects to an external supporting frame. To aid in dissipating heat, and as shown at FIG. 29, the heat sink 220 can have fins 226 made of a folded aluminum piece bonded between two extruded aluminum rails 228. The fins are connected to the two rails and create vertical air channels 230 in heat sink 220. The bond between the fins and the two rails can be made by brazing, epoxy, swaging or by any other means. This open heat-sink embodiment allows heat to be dissipated by natural convection as hot air can rise out of the heat-sink 220 and cooler air may enter into the heat-sink 220 from below.

Figure 30:
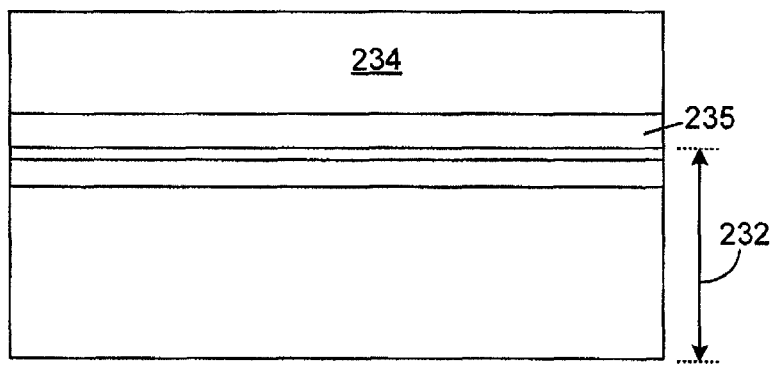
FIG. 30 shows photovoltaic cell assembly.

PV cells used in the system 216 can be of any size, such as 125 millimeters by 125 millimeters, and can be cut into strips of any height, for example, 3 mm tall for use with this embodiment. The PV cells can be encapsulated in any conventional way. For example, they can be soldered together in series and then encapsulated with ethylene vinyl acetate (EVA) or any other suitable material. Alternately, the electrical connections of the PV cells can be made by soldering, adhering or bonding the PV cells to a patterned circuit on a thermally conductive dielectric substrate. Insulated metal substrates (IMSs) such as those sold by The Bergquist Company of Chanhassen Minn. would be appropriate. FIG. 30 shows an IMS substrate 232 soldered to a PV cell 234; the solder layer is shown at 235. The IMS 232 can be connected to the aluminum heat sink 220 by epoxy or adhesive, or by any other suitable means.

A typical IMS 232 has electrical patterning of copper on top of a polymer insulating layer which is bonded to an aluminum or copper base. It is possible to forgo the base and affix the electrically patterned polymer-insulating layer directly to the heat sink 220. This process can be done in an oven by heat curing. An advantage of this approach is that it eliminates the base element and can reduce costs. The PV cell 234 can be bonded to the IMS 232 through a conductive ribbon or mesh that is connected to the entire length of the topside connector (not shown) of the PV cell 232. The backside connector of the PV cell 232 can be bonded over its entire length and/or surface as well. For PV cells 232 that are long and narrow and fragile, using the connection method described above allow the PC cells to break in sections without losing their functionality or substantially affecting the power production.

PV cells can be encapsulated to protect against moisture to avoid corrosion. This can be done using any suitable encapsulant such as, for example, ethylene vinyl acetate (EVA). However, EVA requires heat curing and so, the parts requiring sealing need to be placed in an oven. Another approach is to use an encapsulant, which cures in place at room temperature. Certain optically clear adhesives, such as the silicone Sylgard184 by Dow Corning, can serve this purpose and can be poured in a thin layer on top of the PV cells after soldering. As an added benefit, the panels can be fixed in place before the silicone has begun curing. This seals the space between the panels and the PV cells and creates an optical bond between them. The optical bond between the optical panels and the PV cells diminishes Fresnel losses at the exit edge of the optical panel.

Figure 31:
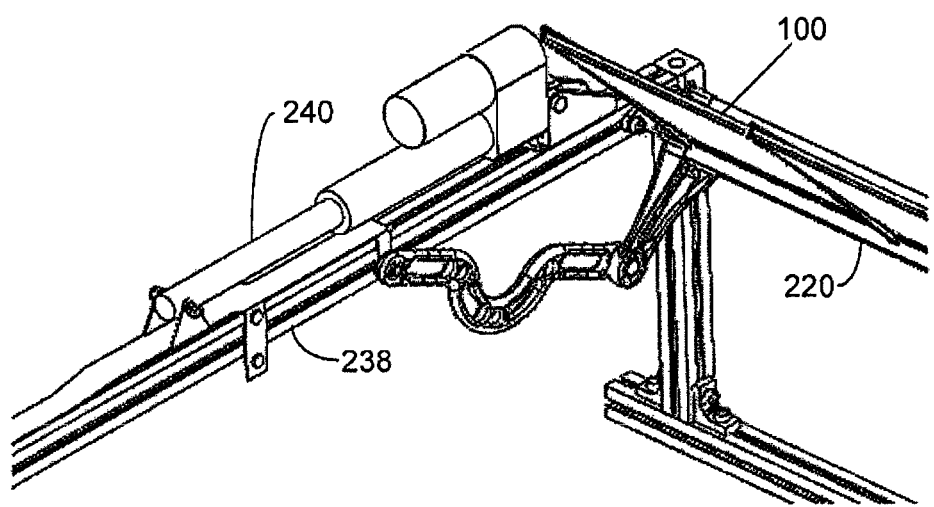
FIG. 31 shows details of a single axis sun tracking mechanism.

The LGSPs can be arranged on a mounting frame to form a solar power system. The heat sinks can connect with bearings on the mounting frame, which allows for free rotation of the panel about the axel made by the heat-sink 220 (see axis 218 at FIG. 27). The heat sink 220 can connect to the bearings by way of injection molded end caps (236, FIG. 27), which are joined to the ends of the heat sink 220. These end caps 236 can have any suitable features that allow connection to the bearings on the frame. The end caps 236 can be joined to the heat-sink either mechanically, with epoxies, adhesives, with adhesive tape, or through any other suitable means. The end caps 236 of the heat-sink 220 are also coupled to a mechanism that allows an actuator to control the rotation of the LGSPs 100. For example, as shown at FIG. 31, three bar linkages can connect all the modules to a single rail 238 that is driven by a linear actuator 240. Alternately, each LGSP can have a pinion gear which attaches to a rack, which is again driven by a linear actuator. With either system, a single linear actuator moving the single rail can drive the motion of all the panels, so that they will tilt in unison and maintain alignment.

Full sunlight tracking solar panel system can be made using a LGSP having a revolved geometry and manufactured using the two-layer approach exemplified at FIGS. 23A-23C. The external appearance of the such full tracking systems can be similar to those described for the single axis tracking system above in that LGSPs can be arranged along either side of a central heat-sink and supported by ribs.

Figures 32A, 32B:
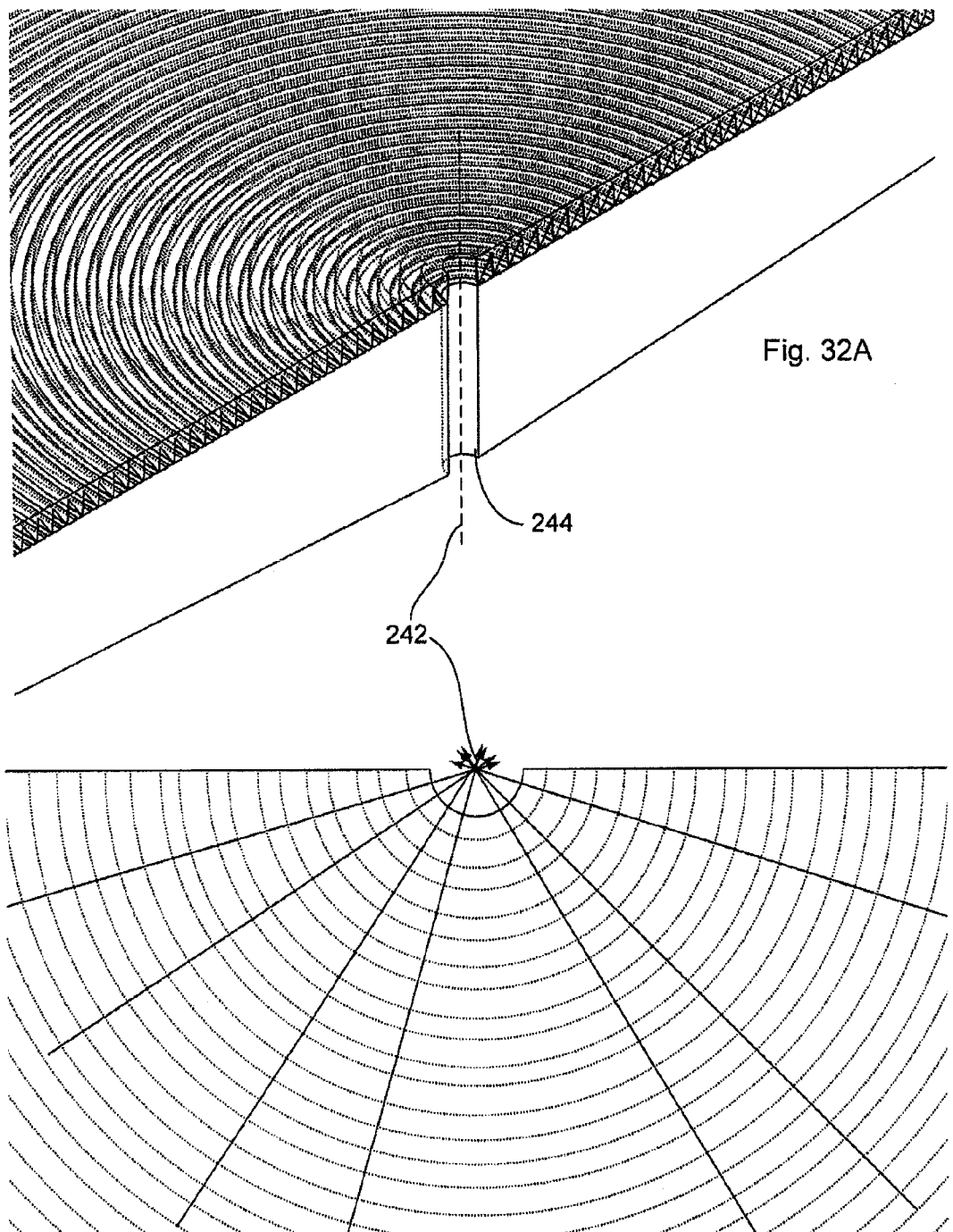
FIG. 32A shows a perspective view of a revolved geometry embodiment of the light-guide solar panel of the present invention.
FIG. 32B shows a top view of the embodiment of FIG. 32A.

The external dimensions of the panels can be 125 millimeters by 250 millimeters. Sunlight is concentrated to a line 242 at the center of the inner edge of the LGSP as shown at FIGS. 32A and 32B. Sunlight exits the solar panel 100 at a half cylindrical facet 244 enters an air gap. While in principle a thin PV cell could be placed along the line 242, such an arrangement would have limited angular acceptance.

Figure 33G:
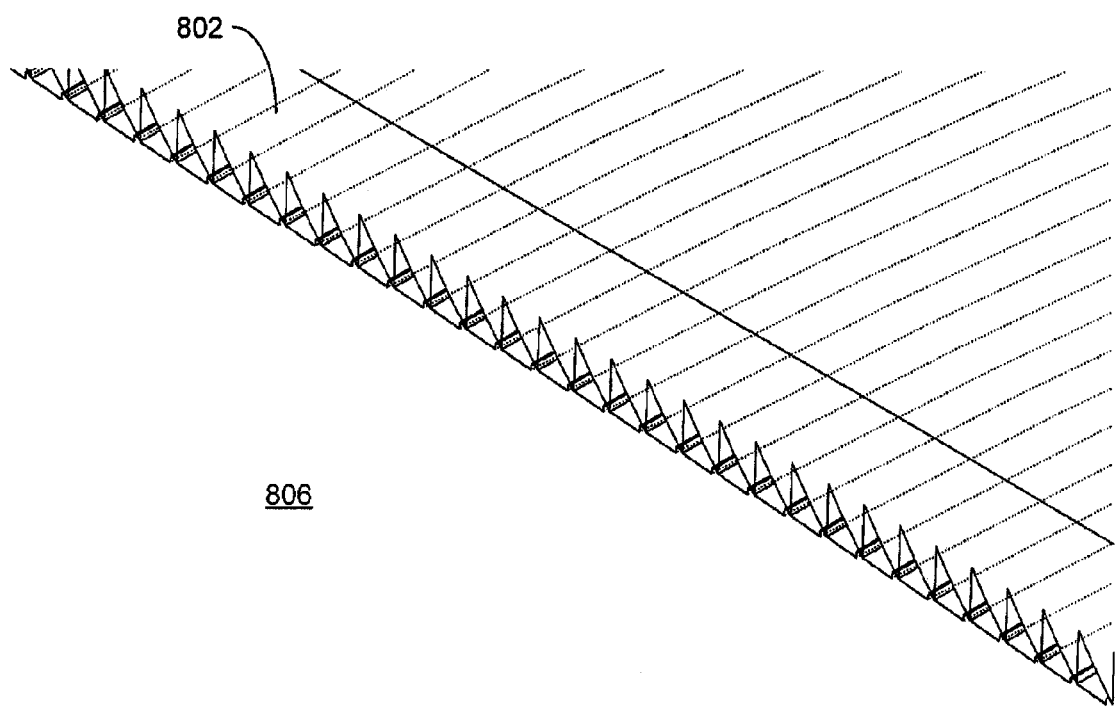
FIG. 33G shows details of the light-insertion stage and the optical waveguide stage of the embodiment of FIG. 33D.

In practice, a wider angular acceptance is achieved by placing a 90° roof prism 246 into the half cylindrical facet, as shown at FIGS. 33A-33C. This roof prism 246 can be made of glass or of any other suitable material, and can have an index of refraction greater than 1.4. High efficiency PV cells, such as triple-junction cells, can be bonded optically to the base 248 of the roof prism using a silicone encapsulant or another optical epoxy. FIGS. 33D-33G show how a rectangular light-guide solar panel 800 can be made using two light-insertion stage sections 802 and 804 each having a revolved geometry and a corresponding optical waveguide stage section 806 and 808. Sunlight impinging on the light-insertion stage 802 is coupled to the optical waveguide stage 806, which propagates the sunlight to the surface 810. As for sunlight impinging on the light-insertion stage 804, it is coupled to the optical waveguide stage 808, which propagates the sunlight to the surface 812. The surfaces 810 and 812 can be flat surfaces and any suitable SECs can be secured thereto. By not having to use a prism to couple the light exiting from the optical waveguide stages 806 and 808, Fresnel reflections losses can be avoided. The optical waveguides 806 and 808 can have half-Winston cone profiles 816 and 818 such as shown at FIG. 33E. FIG. 33F shows that the light-guide solar panel 800 can be made in a two-layer process by laying the light-insertion stages 802 and 804 over the optical waveguide stages 806 and 808. FIG. 33G shows an exploded view of the assembly of FIG. 33E. Given that sunlight emerges from both sides of the optic, heat sinks can be placed on respective opposite sides of the panel. Because this panel of FIG. 33D does not have a coupling prism, the portion of the optical waveguide stages 806 and 808 that is adjacent the surface 810 and 812 can be made of an insulating material, which can withstand more heat, such as, for example, fused silica, while the remainder is made out of PMMA.

While the arrangement described above in relation to FIGS. 33A-33C (with respect to sunlight exiting a half cylindrical facet 244 and then being directed to the PV cell by a prism 246) does introduce Fresnel losses to the system, it also places a layer of gas, either air or any other suitable gas such as, e.g., argon, between the prism 246, which is directly touching the PV cell and the LGSP. The advantage of this arrangement is that it protects the optics (the LGSP) from heat that can accumulate on the PV cell. The PV cell can become extremely hot under high concentration, perhaps reaching 120° C. or higher, and this would adversely affect the optical panel if it were made out of PMMA. The layer of gas can insulate and protect the optical panel from heat accumulation on the PV cell.

As mentioned previously, LGSPs using a revolved geometry and designed for high solar concentration offer better performance when used in conjunction with full tracking of the sun, maintaining the sun's rays parallel to the normal vector of input surface of the solar panel to within +/−1°. The full tracking can be achieved several ways, but two methods in particular lend themselves to the system.

Figure 34:
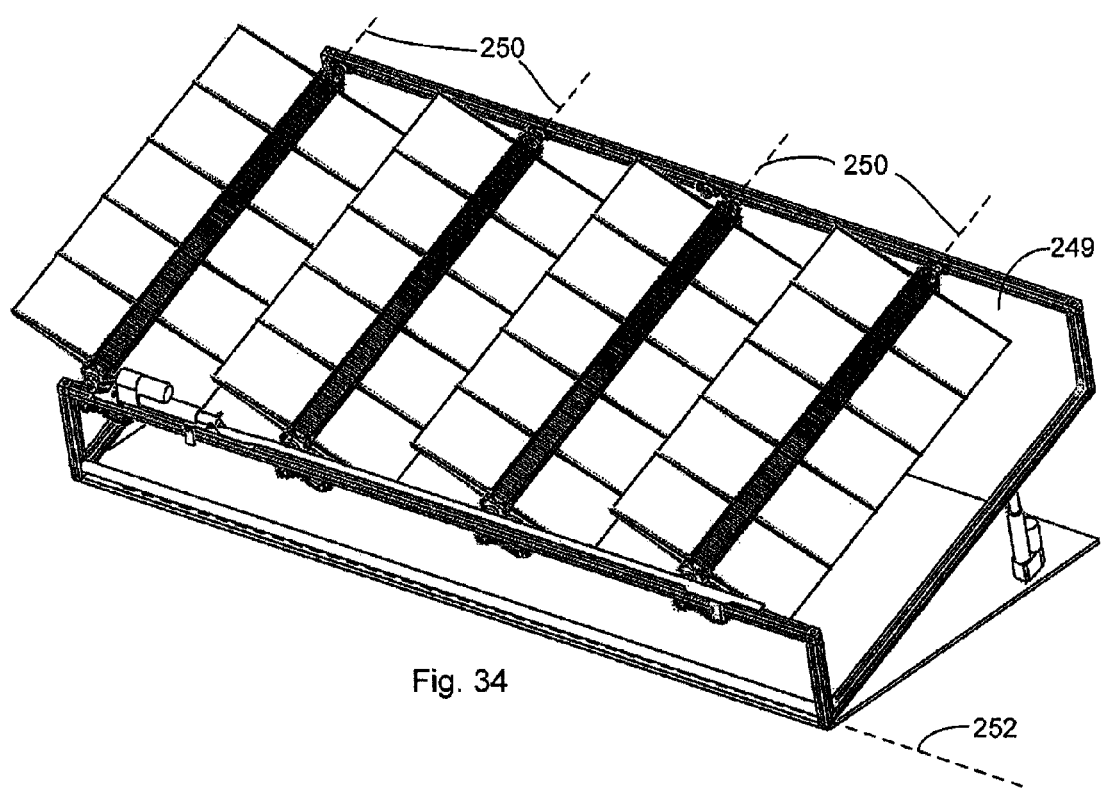
FIG. 34 shows a dual axis sun tracking mechanism.

The first full tracking method is shown at FIG. 34 where the LGSPs 100 are mounted in a frame 249 to tilt about a first series of axes 250 and the frame 249 can tilt about an axis 252, which is substantially orthogonal to the axes 250. As such, the LGSP can roll east-west to track the sun's movement over the course of the day and the frame can tilt north-south to adapt to the seasonal variation of the sun.

Figure 35:
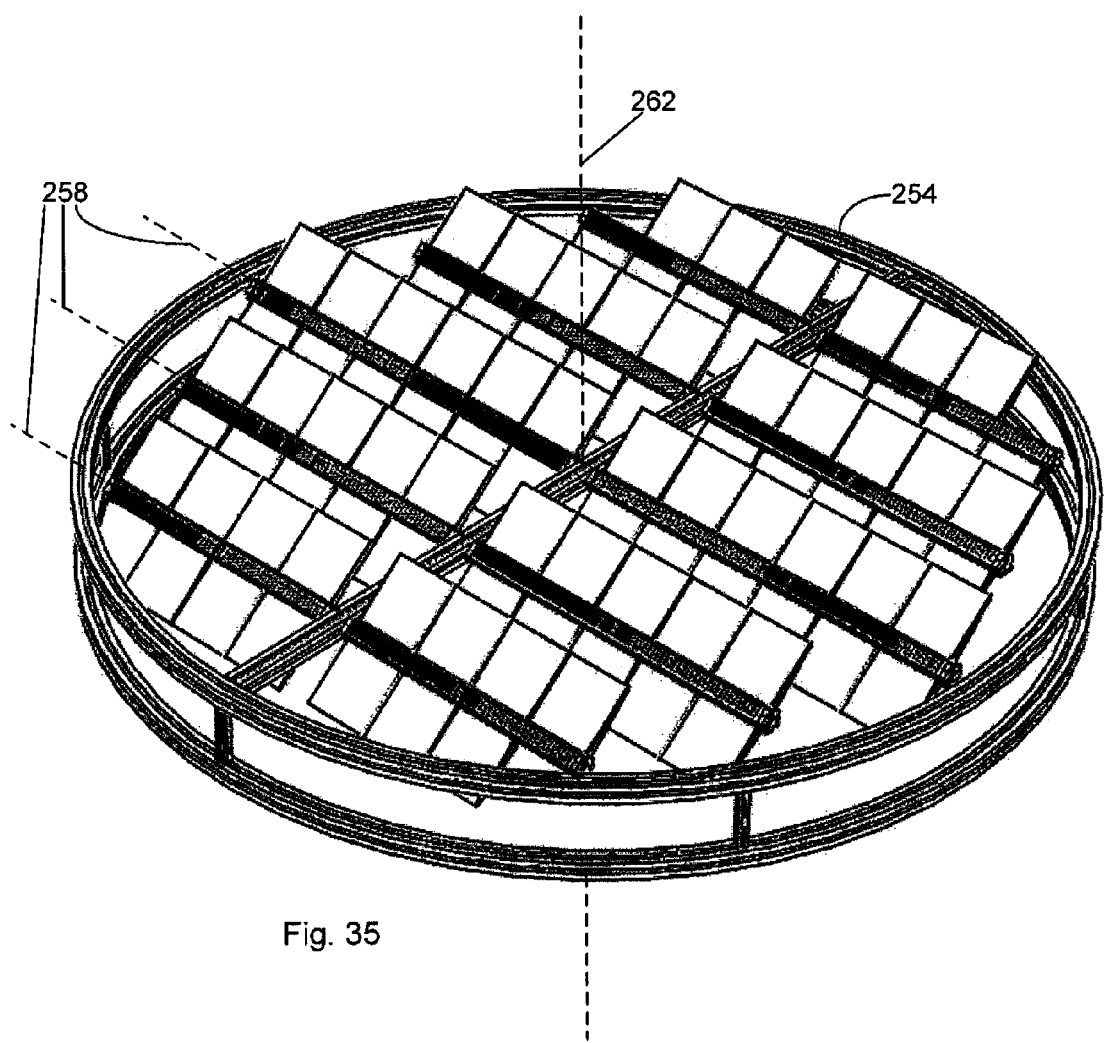
FIG. 35 shows another dual axis sun tracking mechanism.
Figure 36:
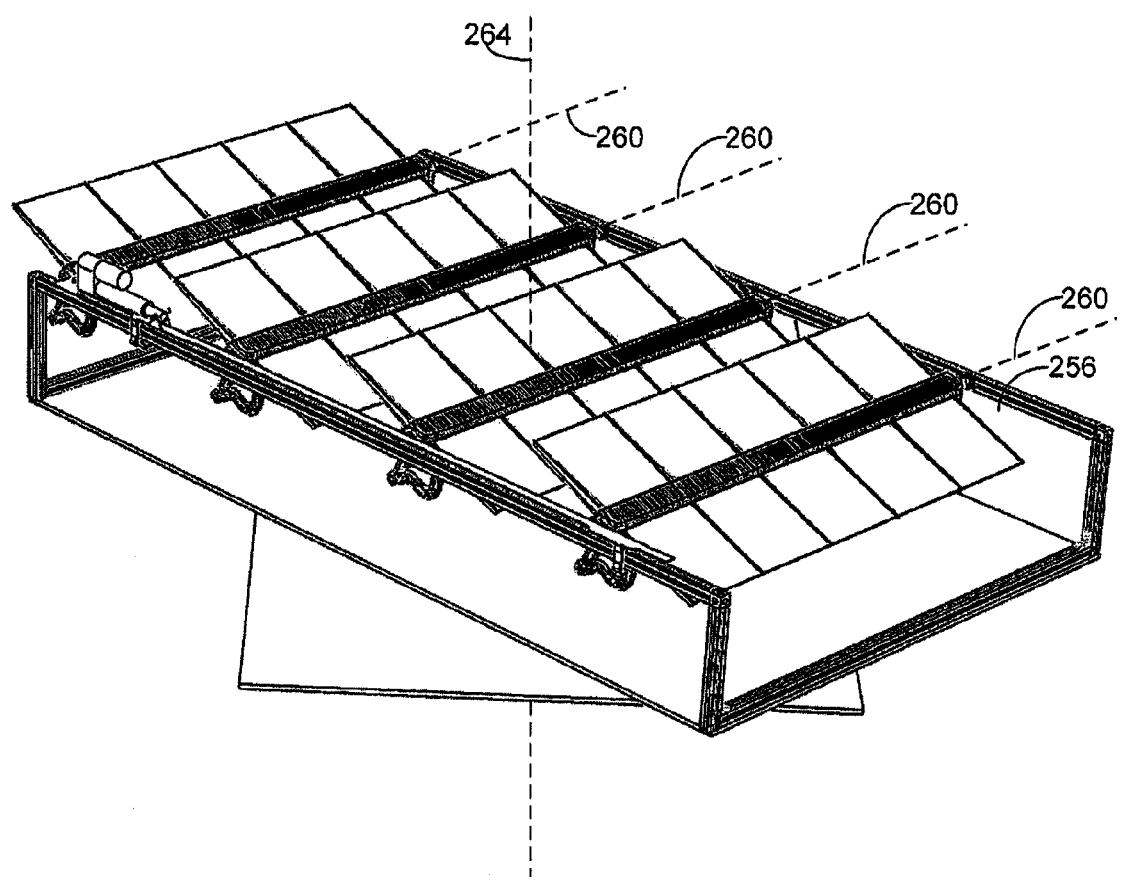
FIG. 36 shows yet another dual axis sun tracking mechanism.

A second full tracking approach that allows to maintain a lower profile is shown at FIGS. 35 and 36. The LGSPs 100 can be arranged in frames 254 or 256 and can tilt about the axes 258 and 260 respectively. Further, the frames 254 and 256 can be made to rotate about the axes 262 and 264 respectively.

Figure 37:
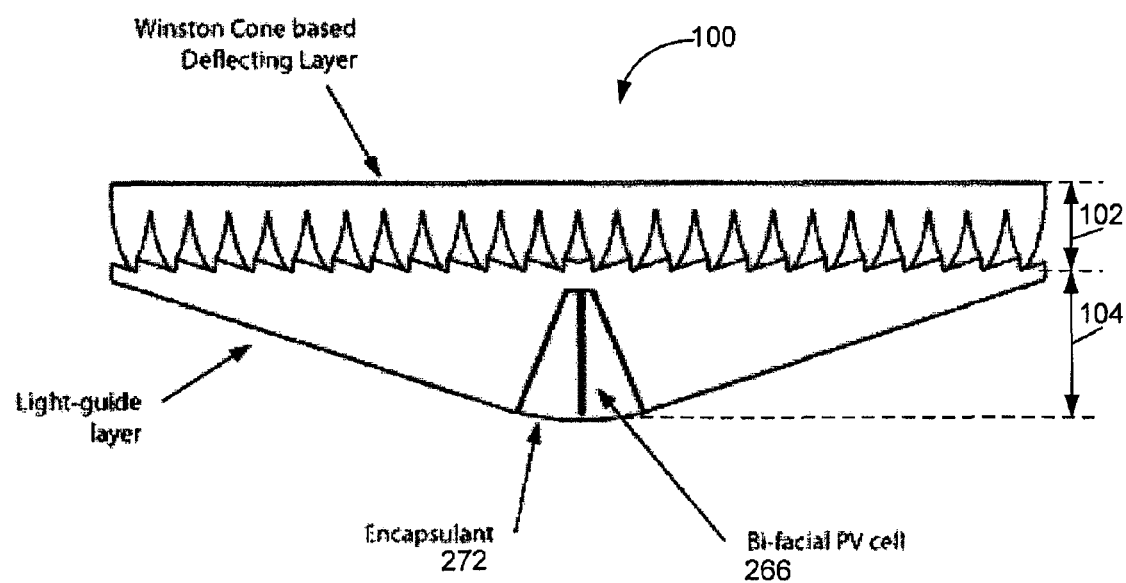
FIG. 37 shows another embodiment of the light-guide solar panel of the present invention.

FIG. 37 shows a variant of the LGSP employing Winston cones in the insertion layer (light-insertion stage 102), as shown at FIG. 15. The embodiment of FIG. 37, which is a linear geometry embodiment, is well suited for non-tracking applications because it has a wide angular acceptance because of the Winston cones. In order to improve the concentration achievable, it is possible to employ a bifacial PV cell 266 positioned between two optical panels; this embodiment doubles the concentration.

Figure 38:
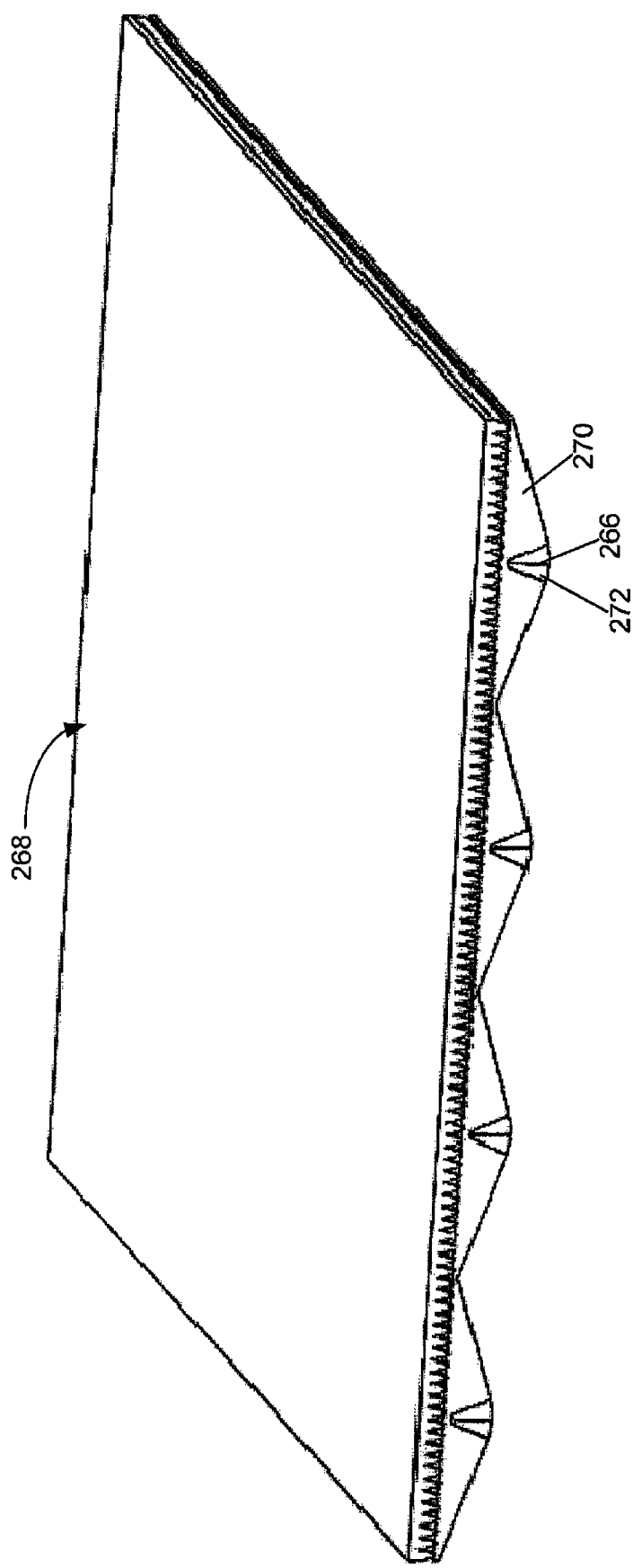
FIG. 38 shows another embodiment of the light-guide solar panel of the present invention.

The LGSP 100 of FIG. 37 can be made in a two part stack, but rather than molding an solar panel for each PV cell strip, a cluster of panels can be molded, a cluster of optical panels being a grouping of a number of concentrator optics into fewer pieces. FIG. 38 shows how a cluster LGSP 268 can be made to accommodate four PV cells 266.

The slab 270 that forms light-guide layers (optical waveguide stages 104) can have grooves 272 molded into it to accommodate bifacial PV cells 266. The PV cells 266 can be soldered and then encapsulated before being placed in the groove, or they can be only soldered together to form a circuit and then placed in the groove and encapsulated in place using a cast in place encapsulant such as clear silicone or any other optical epoxy.

Attaching a number of cluster panels together makes for a full solar panel module. Numerous methods exist for combining the LGSPs together. One method is to use an aluminum framing grill to tie all the panels together. Another method is to array and bond the optical panels by any suitable means onto a stiff superstrate of glass or of any other suitable material.

Figure 39:
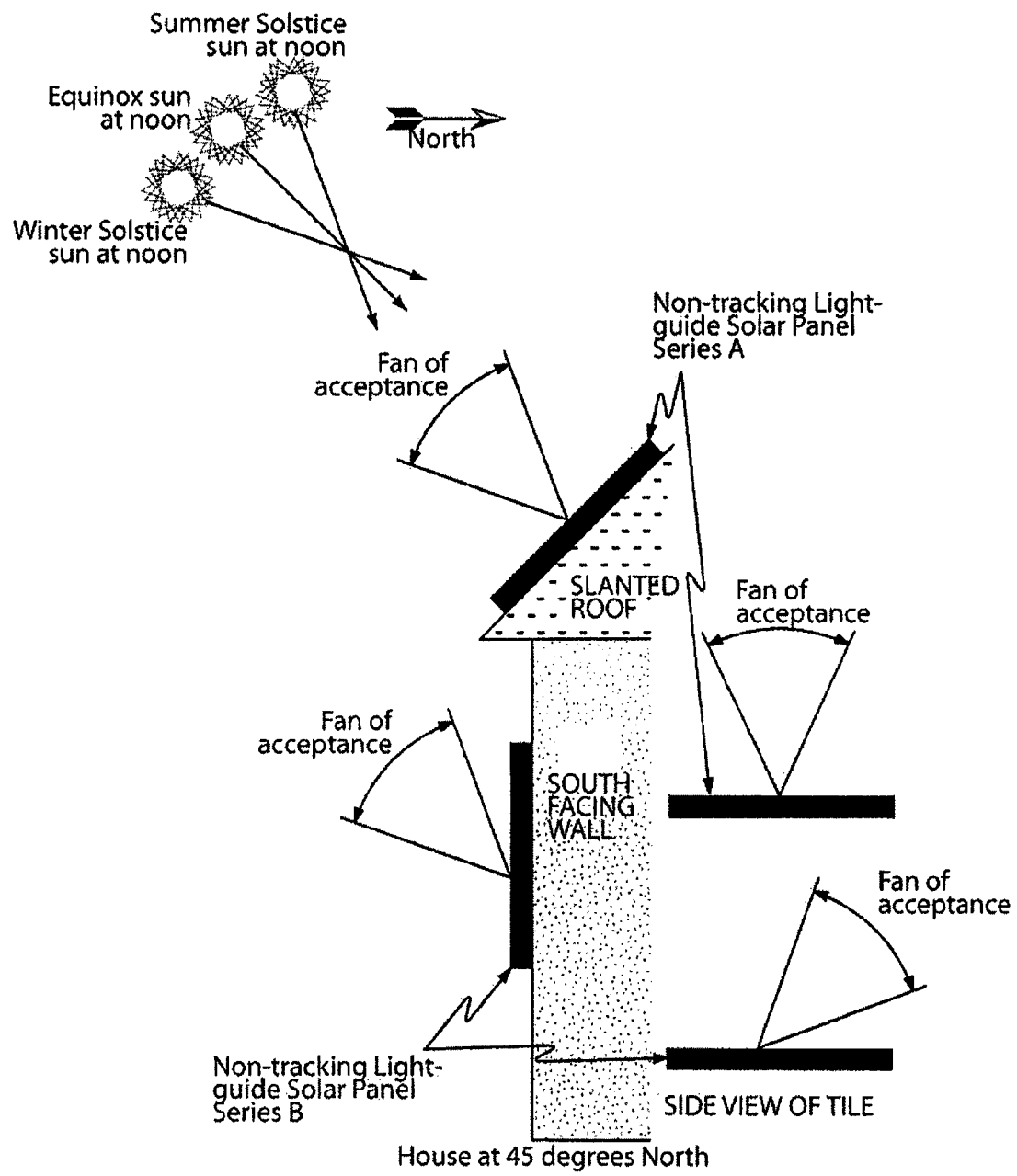
FIG. 39 shows various embodiments of light-guide solar panels having different light acceptance angles.

The non-tracking LGSP 268 will generally not have 180° of angular acceptance in the cross sectional plane of the optics as seen at FIG. 37. The cone of acceptance of the LGSP 268 can be +/−30° from the normal of the panel, which is sufficient to accommodate the seasonal variation of the sun's position in the sky. As such, the non-tracking LGSP 168 should be installed at a tilt which matches the latitude of the installation location; this would ensures that the normal to the panel's input surface is parallel with the sun's rays at equinox. However, this does limit the installation configurations of the non-tracking LGSP 268. In fact, the LGSP 268 can be designed with their cone of acceptance tilted off the normal as shown at FIG. 39 for northern hemisphere locations. In practice, a finite number of non-tracking LGSPs 268 series can be designed to accommodate any installation configuration.

In order to make the LGSP of the present invention as cost efficient as possible, roll-to-roll continuous casting or embossing can be used to fabricate the light-insertion stage optics as films. It is possible to use roll-to-roll manufacturing methods because all of the above solar panels are composed of a stack of slabs that have no undercuts. The wedge-shaped light-guide layer (optical waveguide stage) can be made separately, and the light-insertion stage can be applied to the optical waveguide stage using a lamination process or any other suitable process.

Figure 40:
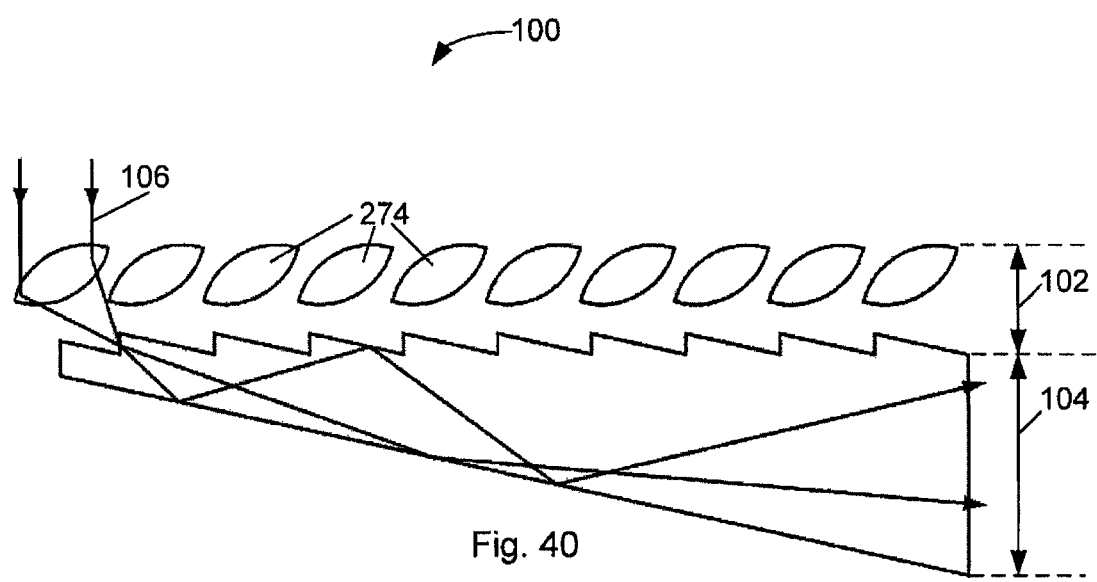
FIG. 40 shows another embodiment of the light-guide solar panel of the present invention.
Figure 41A:
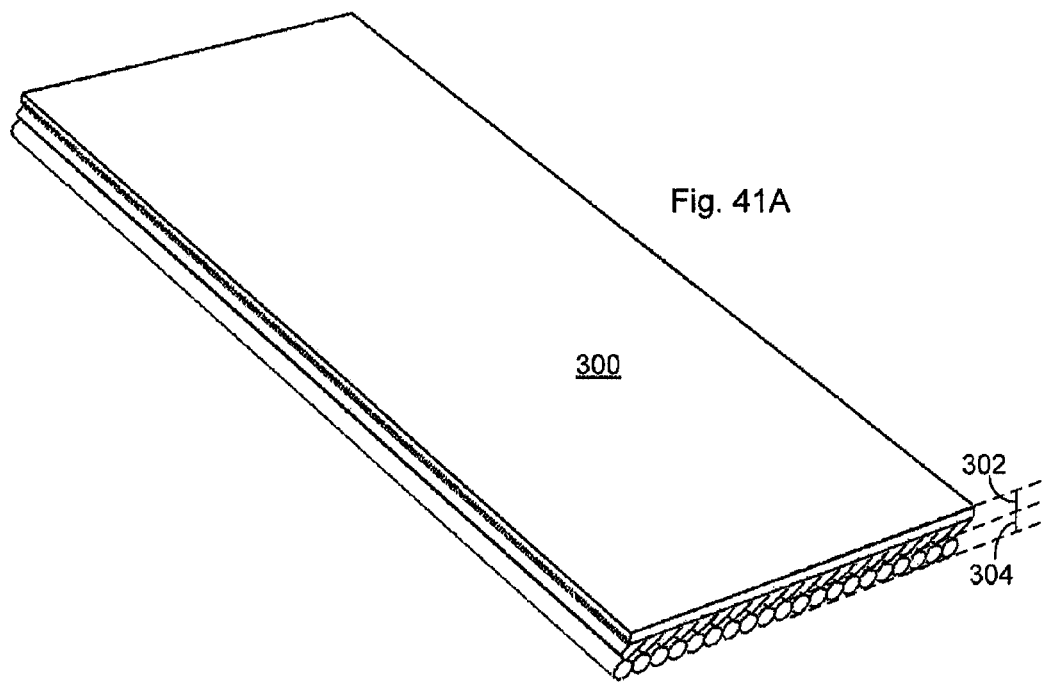
FIG. 41A is a perspective view of another embodiment of the light-guide solar panel of the present invention.
Figure 41B:
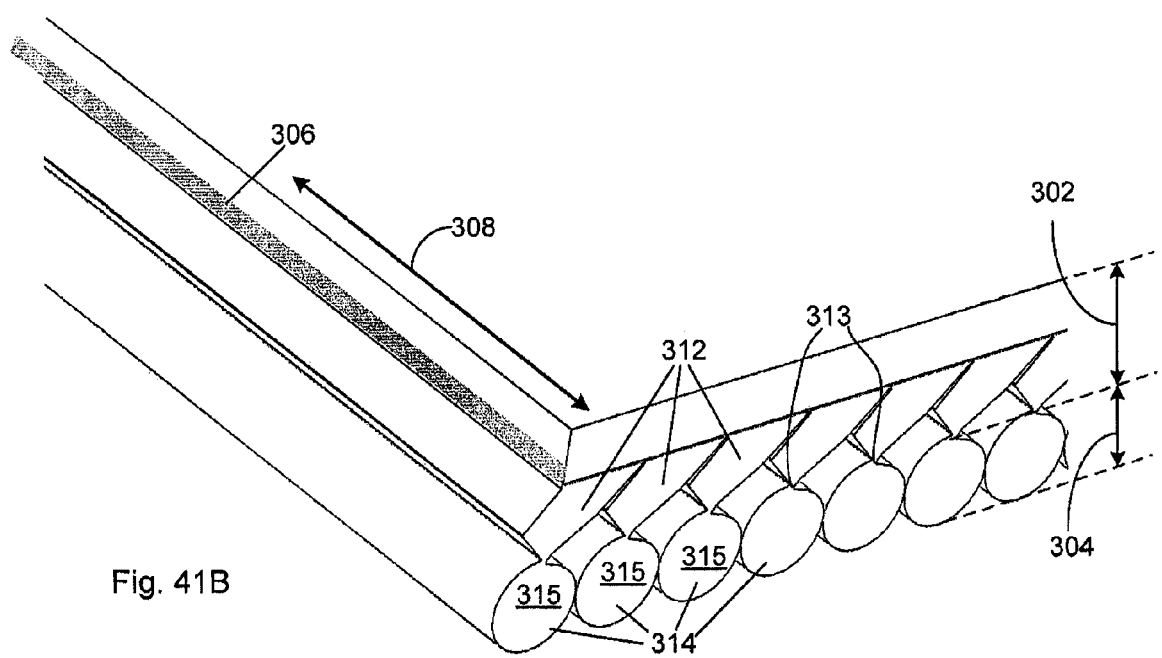
FIG. 41B is a detailed view of the embodiment of FIG. 41A.

As will be understood by the skilled worker, the light-insertion layer 102 of the LGSP of the present invention can also use any suitable type of lenses as optical elements instead of just the focusing TIR interfaces described above. FIG. 40 shows a LGSP 100 having a series of lenses 274 that focus and optically couples the sunlight 106 to the optical waveguide stage 104.

Another embodiment of the LGSP of the present invention is shown at FIGS. 41A, 41B, and 42A-42D. The LGSP 300 has an insertion layer (light-insertion stage 302) and a light-guide layer (optical waveguide stage 304). The light-insertion stage 302 has optical elements in the form of a deflector section 306 and reflector sections 312. The deflector section 306 deflects impinging sunlight 106 in one or both of the directions indicated by the double-arrow 308. The deflected sunlight is directed towards the optical elements that are the reflector sections 312, which are shaped as a series of focusing tapered light channels. The tapered light channels are optically coupled, through a series of optical output apertures 313 to a series of waveguides 314 that form the optical waveguide stage 304.

Figure 42A:
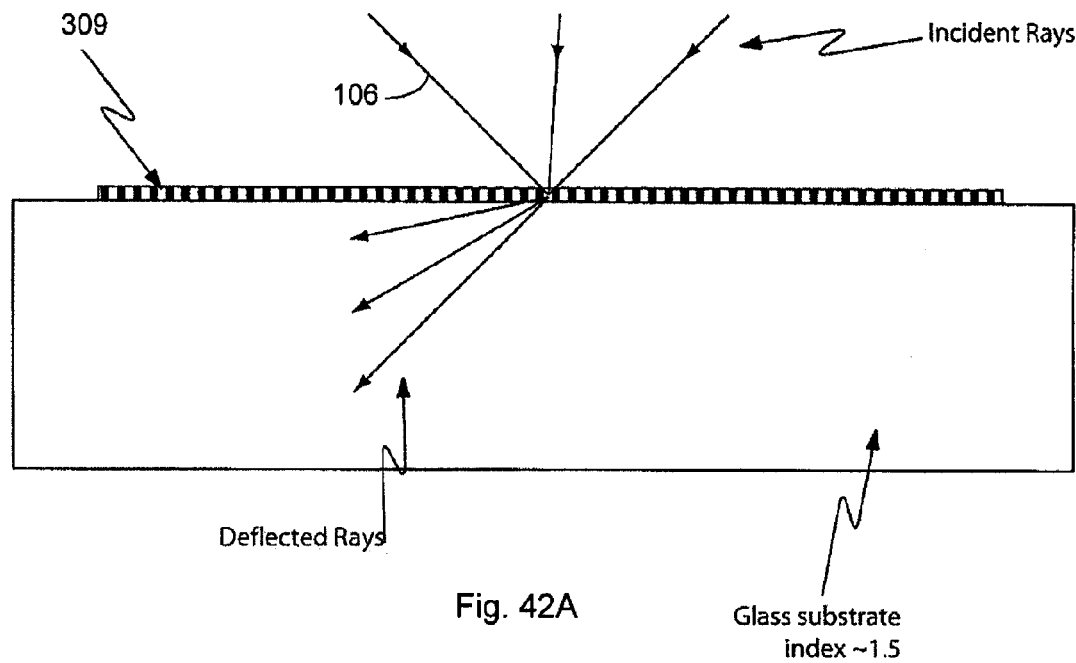
FIG. 42A shows a hologram on a glass substrate.

The deflector section 306 can include an optical directing layer in the form of a Volume Phase Hologram (VPH). Fringes in the VPH hologram are formed in any suitable manner, using the interference between two coherent UV light sources. The fringe spacing and angle can be designed such one or more modes of diffraction can fall within 45 degrees of the plane of the solar panel 300. FIG. 42A shows an example of how such a VPH 309 operates. The resulting deflection is exemplified at FIGS. 42B to 42D.

Figure 43:
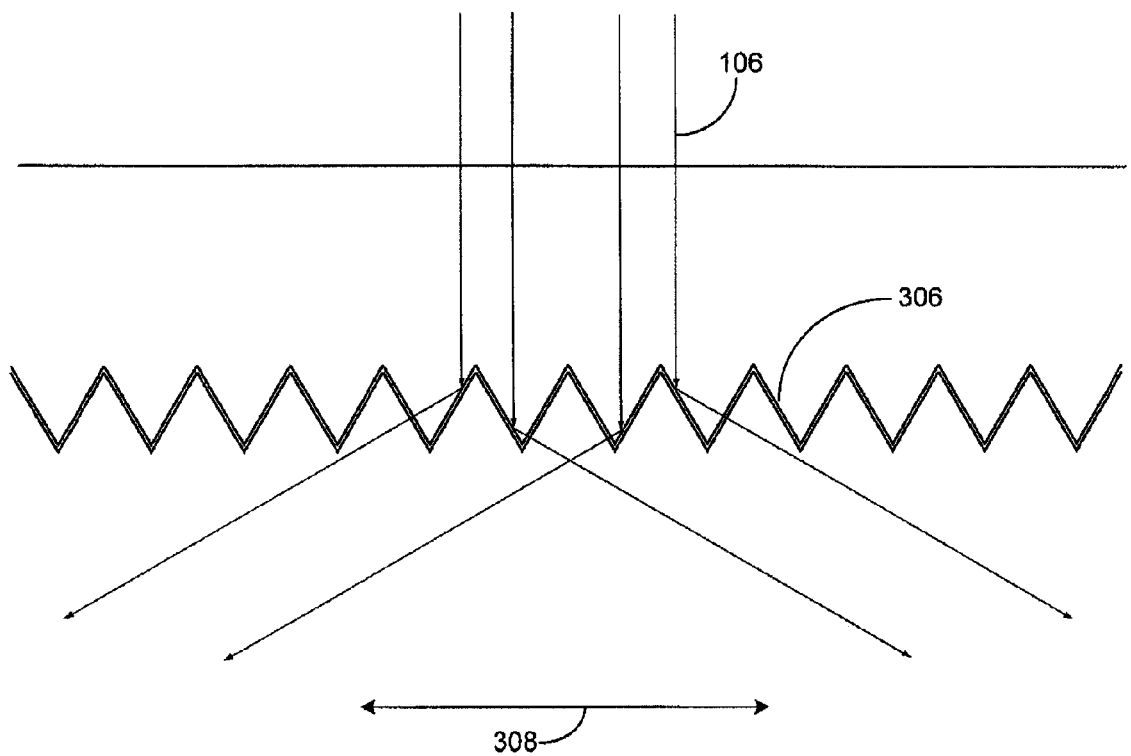
FIG. 43 shows a deflection layer made of prismatic ridges.

The deflector section 306 can also be made using non-interference optics, such as, for example, flat faceted optics like prisms. For instance, an array of 60° prisms arranged in an interlocking manner with a small air gap in between them would split light incident into the plane of the panel in two directions. This bi-directional deflection would lead to light accumulating on two opposite edges of the solar panel 300. Such directing optics are shown at FIG. 43.

Figure 42B:
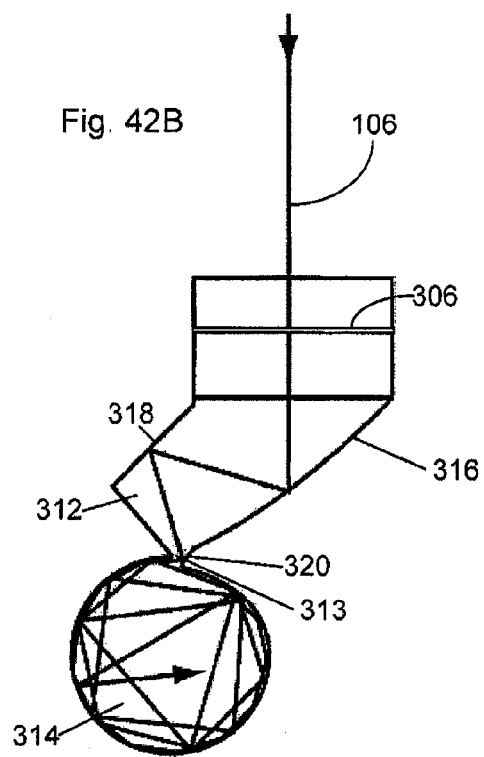
FIG. 42B shows a detailed cross-sectional view of the embodiment of FIG. 41A.
Figure 42D:
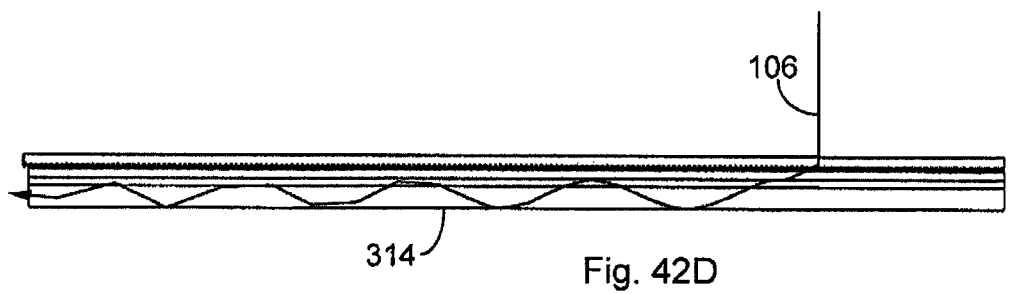
FIG. 42D shows an elevation view of the detailed view of FIG. 42B.
Figure 42C:
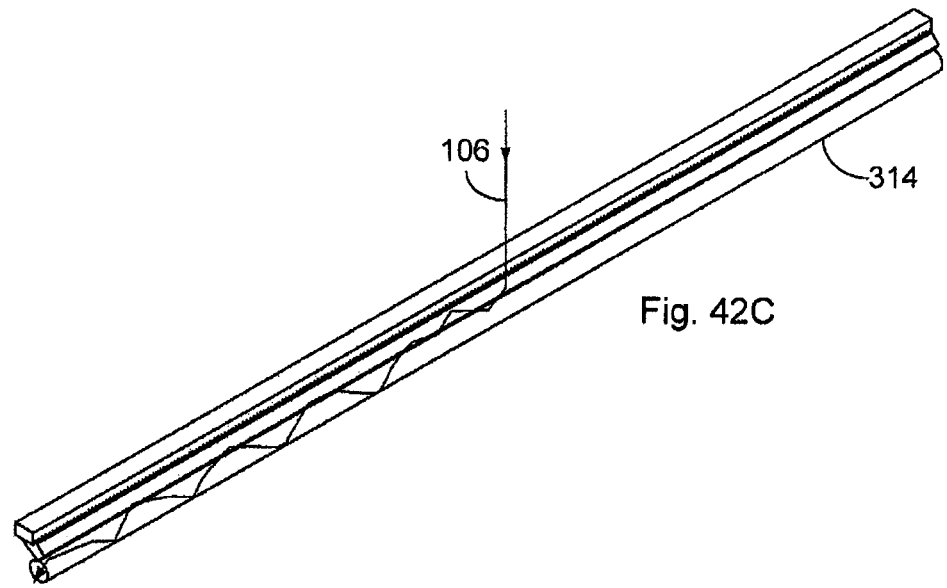
FIG. 42C shows a perspective view of the detailed view of FIG. 42B.

The optical waveguide stage 304 has a linear geometry and can have a plurality of waveguides 314 that receive light from their respective tapered light channels (reflector section 312) and that trap light by total internal reflection. The waveguides 314 act as delay lines whereby light enters from above, at optical output apertures 313, travels for some distance and then can exits out the top through the optical output apertures 313. A potential channel embodiment is shown at FIGS. 42A-42C. Light entering a tapered light channel (reflector section 312) is reflected off a first parabolic section 316, then off a flat face 318 and off a second parabolic section 320 before entering into a cylindrical section, which defines the waveguide 314. The light can travel within the waveguide 314 in a spiral manner for some distance before escaping out. Provided that the length of the waveguide 314 is less than the mean travel distance of the trapped light rays, light coupled into the waveguide 314 will emerge concentrated from the end of the channel where it can be harvested by any suitable SEC. As an example, if the optical waveguide stage 104 is 1 cm tall, and the waveguides 314 are 150 cm long then 75% of the light incident on the LGSP 300 will reach the two ends of the waveguide for harvesting by an SEC. If light is incident evenly on the LGSP 300 then light will be distributed evenly between the two ends of the waveguide channel.

The LGSP 300 can include any number of waveguides 314 and tapered light channels 312 and each waveguide 314 can form a unit with a respective tapered light channel 312. The units formed by the tapered light channel 312 and their respective waveguides 314 can be made by molding.

In the LGSP 300, each waveguide 314 has an output surface 315, and the sum of the output surface 315 form the total output surface of the optical waveguide stage 304. Any suitable SEC can be placed at the output of the plurality of optical output apertures 315 to harvest the sunlight 106.

Other geometries of tapered light channels/waveguide can be used. For example, FIGS. 44A-44C shows a tapered light channel 322 having a plurality of waveguides 326 formed thereon, with the diameter of the waveguide decreasing as the width of the tapered light channel decreases. The staggering of the waveguides vertically allows for two or more channels to be positioned closely side by side with little dead space in between them.

Figures 45A, 45B:
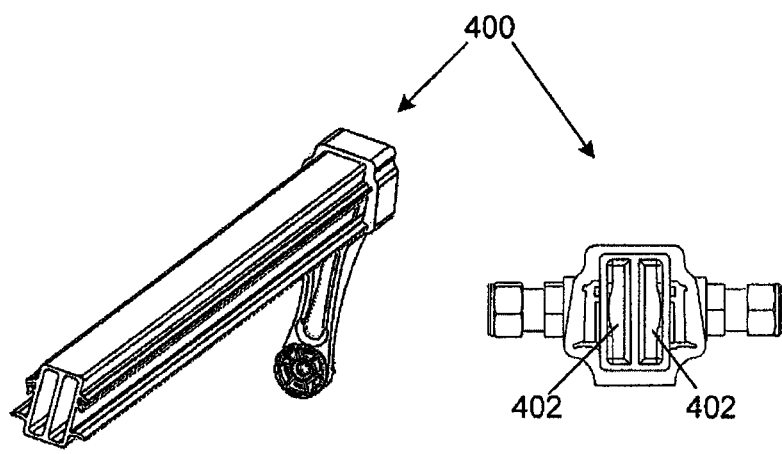
FIG. 45A shows a perspective view of a heat sink.
FIG. 45B shows a cross-sectional view of the heat sink of FIG. 45A.

The heat sink 220 previously described can be used in conjunction with single axis tracking systems and the full tracking high concentrator systems to shed excess heat from the SEC (e.g., PV cells) into the surrounding air. However, the excess heat can instead be used to heat water. This functionality can be accomplished with the heat sink 400 shown at FIGS. 45A and 45B. The heat sink 400 can be made of aluminum of any other suitable material. In contrast to the heat sink 220, which features fins to shed excess heat into the air, the heat sink 400 has one or more channels 402 for flowing water which extracts excess heat generated at the SECs.

Figure 46:
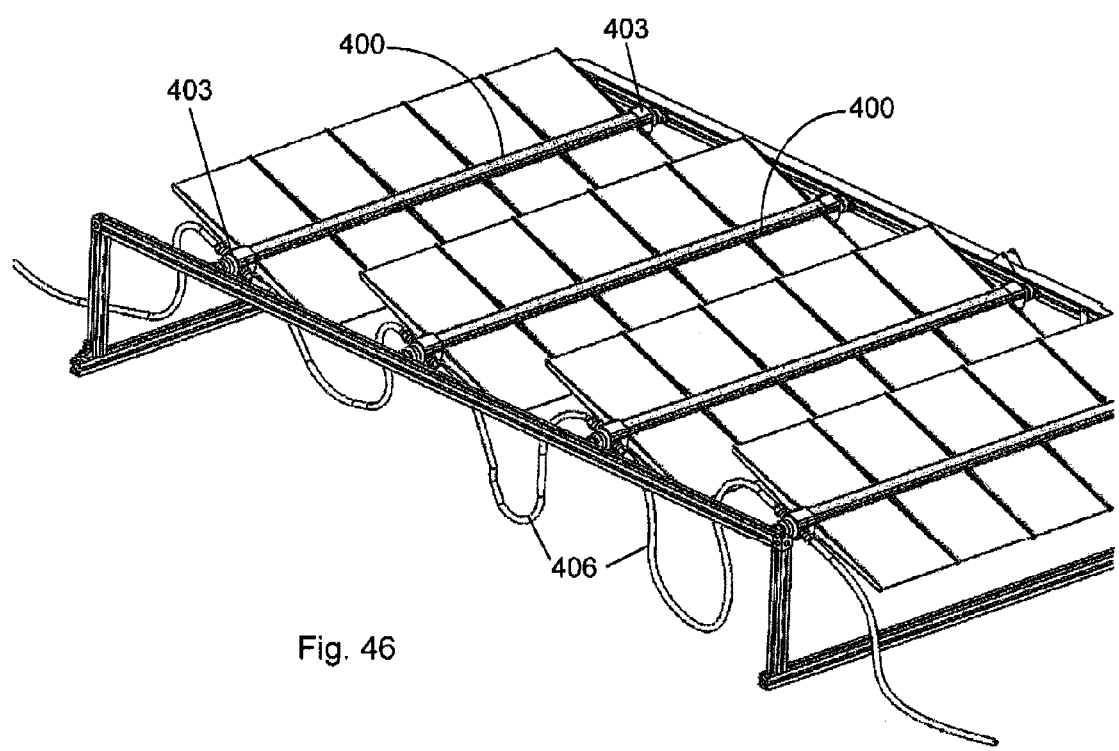
FIG. 46 shows a solar panel single axis tracking assembly.

As seen at FIG. 46, end caps 403 can be affixed to the heat sink 400 and serve the dual purpose of securing LGSPs to a mounting frame via bearings, and they also serve as inlet and outlets to a heat exchanger (not shown). Water could either flow straight through a heat sink 400, with an inlet on one end cap and an outlet on the other, or it could flow in and out of the heat sink 400 through the same end-cap, with the opposite end cap serving as a u-bend. This embodiment can simplify hose routing between many modules in an extended system. The number of channels in the extrusion could be increased so as to have a larger surface area of contact between the water and the aluminum of the heat sink 400. The rate of water flow through the heat sink 400 can be used to control the temperature of the SECs and be used to keep the LGSPs within their operating temperature range. A system using heat sinks 400 interconnected through hoses 406 is shown at FIG. 46. As will be understood by the skilled worker, a heat exchange fluid other than water can be used in the system of FIG. 46.

Figure 47:
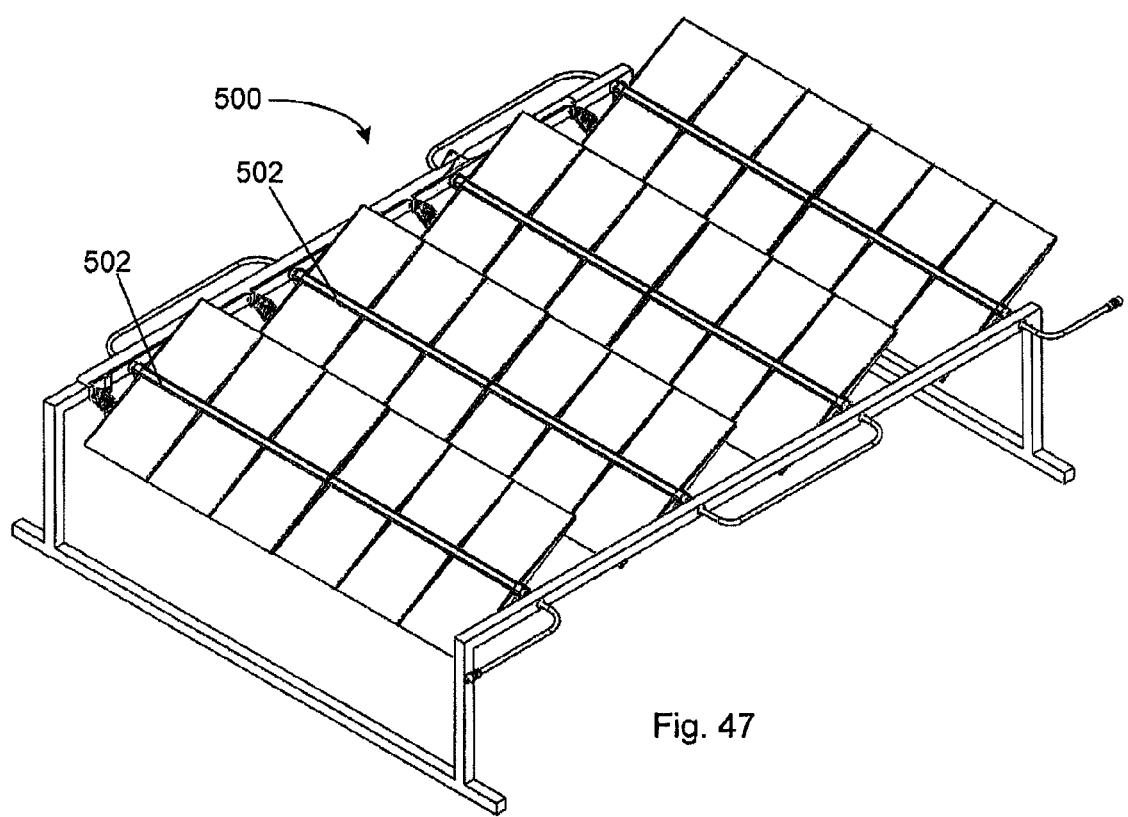
FIG. 47 shows a solar thermal single axis tracking assembly.

Sunlight captured by the LGSP of the present invention can be used in a solar thermal system that does not use PV cells. An example of such a solar thermal system 500 is shown at FIG. 47. The system 500 can use a double walled tube 502 that has its outermost tube transparent. An insulating gas, such as argon, would separate the inner tube from the outer tube. The inner tube can be black so as to absorb incident sunlight. Through the central tube a heat absorbing liquid, such as water, oil, or any other suitable liquid flows.

The tube 502 is placed in the position previously occupied by heat sinks in the above-described embodiments. The concentrated sunlight, passes through the clear outer tube, and the insulating gas layer, and is absorbed by the inner tube. This causes the liquid in the inner tube to heat. The fluid carrying tubes can remain fixed in position while the optics rotate about them.

It is possible to fabricate some of small optical structures of the LGSP of the present invention using a technique known as silicone on glass. Thin clear silicone rubber, similar to the Sylgard™ 184 by Dow, is formed into the necessary shapes on a glass substrate. It is also possible to mold silicone on its own with no glass substrate.

Advantageously, the LGSP of the present invention is relatively insensitive to thermal expansion or contraction. This is possible because all the optical components of the solar panels are made of similar, if not the same, materials. Because of this, they will expand by the same degree and the function of the optical element will not change significantly. Specifically, as the reflectors 110 expand, so too will the waveguide section 104. This maintains the same focus for light 106 reflecting of 110 and focusing on 116 from FIG. 1 as the unit expands and contracts with changes in temperature.

For single axis tracking, the panel is tilted to maintain alignment in one plane with incident sunlight. It is also possible to add an optical device on top of the optics that preconditions the light, altering the angle of the incident light to align the incident light to the optics. Such preconditioning optics could employ moving mirrors, prisms, or electro-optics.

Tracking can be accomplished manually by occasionally tilting the single axis tracking panel, or the non-tracking panel. A manual-tracking panel would be one with a wide enough angular acceptance, say, for example, plus or minus 5 degrees in the cross-sectional plane, so that it would only need to be re-aligned slightly by hand every few weeks. Electronic alignment sensors could assist in the alignment, but actuators would not be needed.

Figure 48:
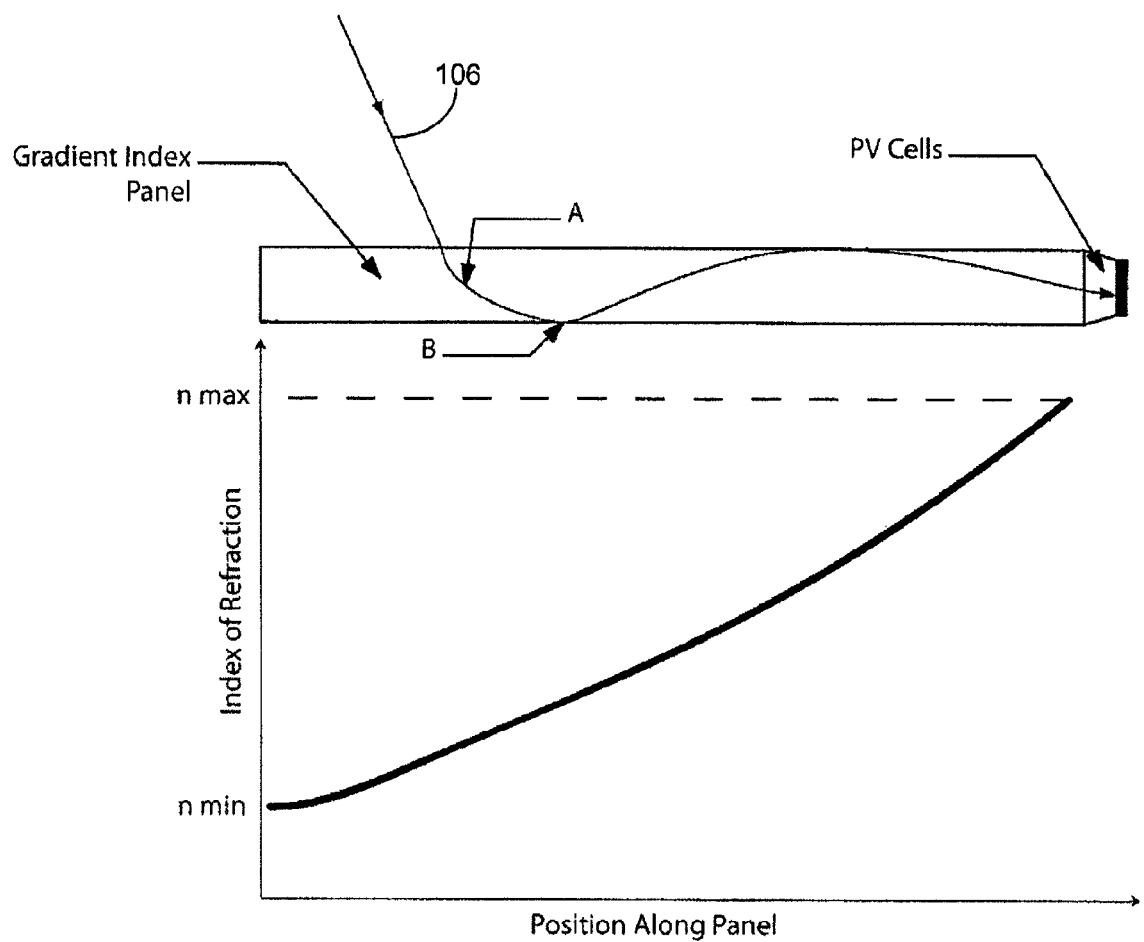
FIG. 48 shows a gradient index solar panel embodiment.
Figure 49:
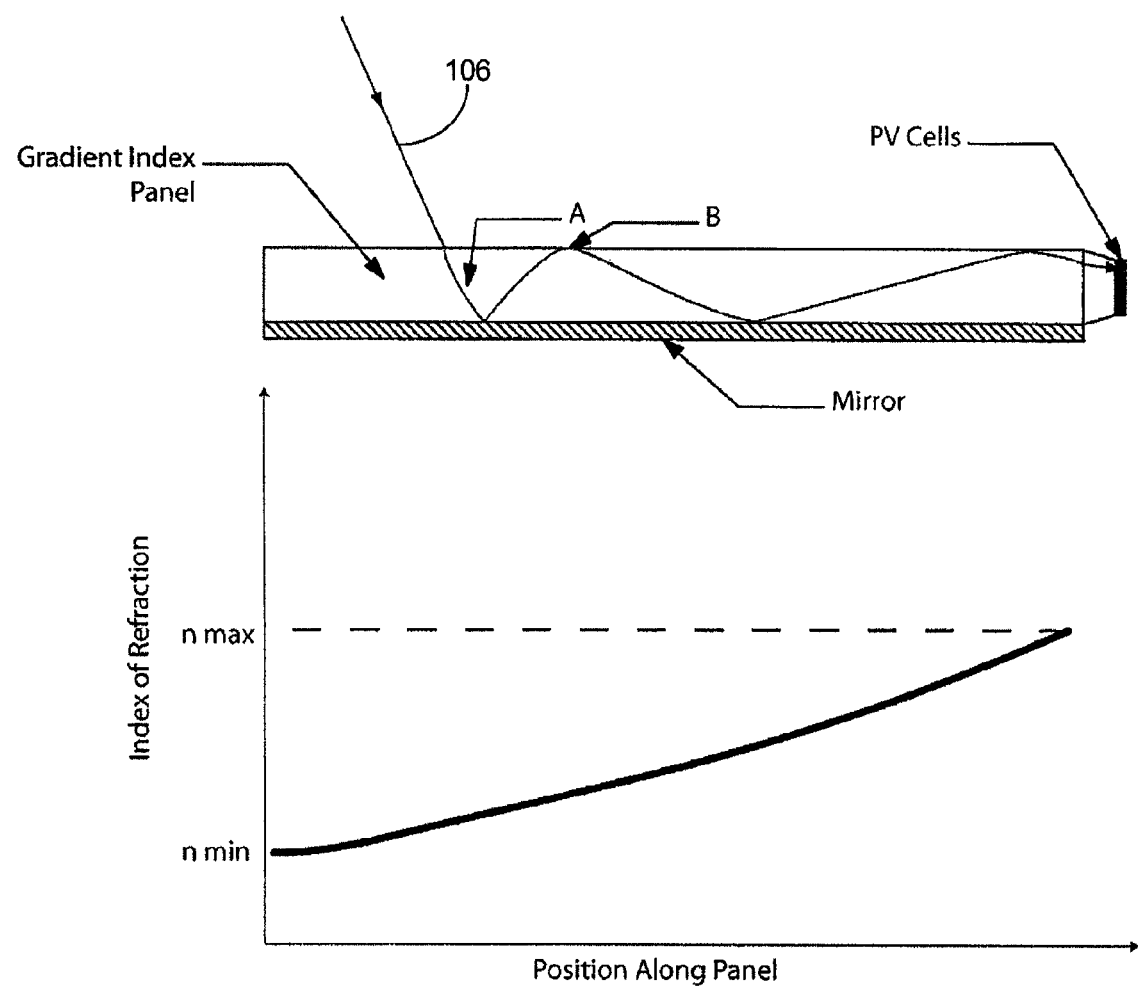
FIG. 49 shows another gradient index solar panel embodiment.

A LGSP using a different mechanism can be made using a panel with a gradient index of refraction. The refractive index gradient increases in the downstream direction of the LGSP, so that light incident on the panel would deflect towards the downstream direction. If the gradient was sufficient to cause enough deflection for TIR to occur at the bottom face of the panel then the light would be trapped and would become conducted down to the edge of the panel as shown at FIG. 48. With less of a gradient, a mirror may be required for the first reflection if light exits the bottom face of the panel, and further deflection while traveling back up through the panel to the top surface would increase the angle of incidence on the top face enough for TIR to occur. This is shown at FIG. 49.

Figure 50A:
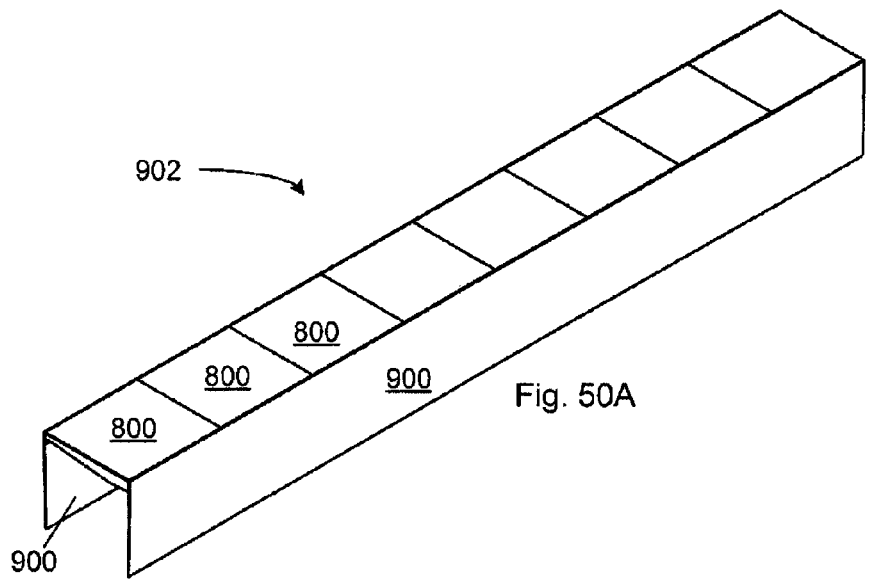
FIGS. 50A-50B show an assembly of the solar panels shown at FIGS. 33D-33F.
Figure 50B:
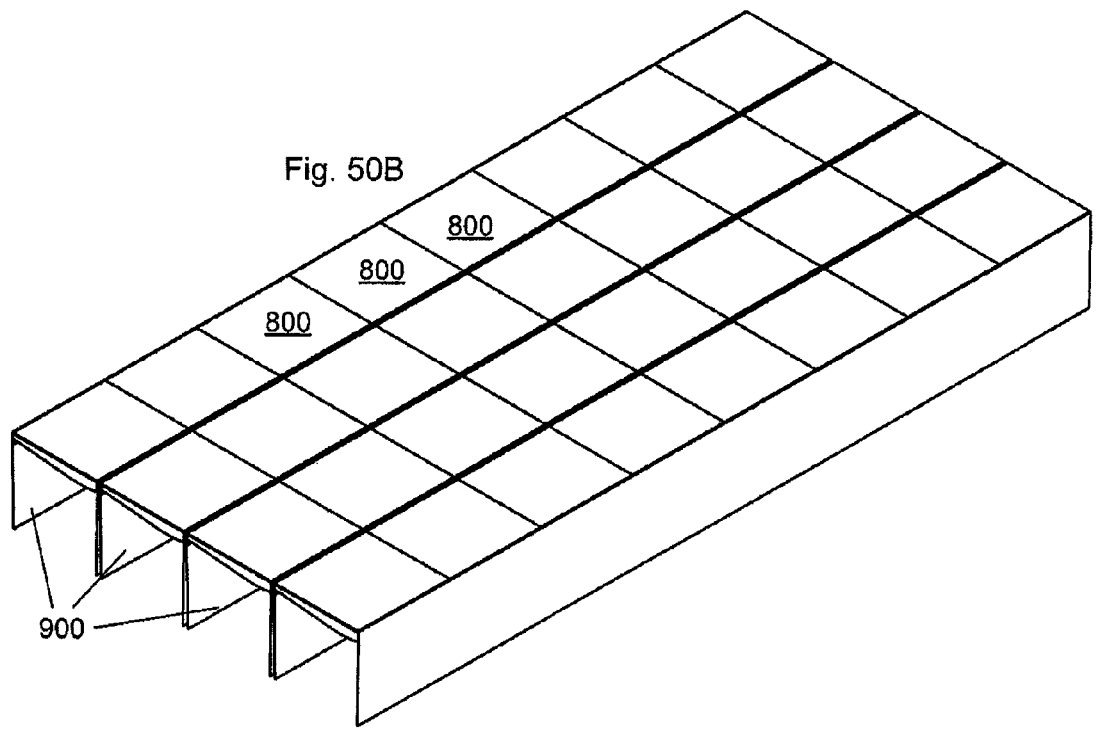

FIGS. 50A and 50B shows how light-guide solar panels such at the light-guide solar panel 800 of FIG. 33D can be grouped together. The light-guide solar panels 800 can be placed between two vertically oriented aluminum heat sinks 900 to form a linear assembly 902 of light-guide solar panels 800. Larger groups of light-guide solar panels 800 can be assembled by joining together the linear assemblies 902.

Further, consider the light guide solar panel described above with respect to FIG. 9. The round optic shown in FIG. 9 can be cropped, or squared off, to make a square optic guiding light to a to it's center as well.

A light guide solar panel designed using a deflecting layer slab and a light guide layer slab with a similar periodic unit as in FIG. 24B is shown in FIG. 51A-51D. Shown in FIG. 51A, the periodic unit 600 consists of an optical material 602 where incident light 106 enters the top surface 108 and reflects by total internal reflection 604 off a focusing facet 606. The light then deflects 608 at an exit facet 610 and is focused to an insertion facet 612 where it is coupled into the light guide layer 614. The component comprised of the focusing facet is the called the deflecting layer (or equivalently an insertion layer) 616. FIG. 51B shows a cross section 618 of an optic made by repeating this periodic unit along a line. This cross section 618 can be revolved about an axis 620 to make an two slabs with circular symmetry as shown in FIG. 51C. There is a deflecting layer slab 622 and a light guide layer slab 624. As shown in FIG. 51D, the light guide layer slab 624 has a hole 626 in the center. If nothing is placed in this hole, then light propagating through the light guide layer will escape at the facet 628 bordering this hole exactly as in FIG. 9 or 10 where a round exit facet from the light-guide layer permits light to escape.

Note that a circular optic such as one made using a round deflecting layer slab 622 and a round light guide layer slab 624 can be awkward to arrange into a module. Therefore it should be noted that the round optic could be squared off, as shown in FIGS. 52A and 52B. FIG. 52A shows the same thing as 51C except that dashed lines 630 have been added to indicate where the round optic would need to be cropped off in order to make a square optic. FIG. 52B shows a rendering of a square optic 632 that would result from such a cropping. The cropped optic is comprised of a deflecting layer slab 622 and a light guide layer slab 624 as before (they have just been trimmed to make a square), and there is a hole in the center of the light guide layer slab. A secondary optic 634 has been positioned in this hole and is described in the next paragraph.

In the hole 626 at the center of the light guide slab 624 can be positioned a secondary optic 634 that redirects light downwards. Such an optic would enable a flat photovoltaic cell mounted facing up to receive light form the light guide solar panel. An exemplary secondary optic is shown in FIGS. 53A-53D. The light guide layer exit facet 628 is aligned with an entry facet 636 on the secondary optic 634. As shown in FIG. 53B, light that is trapped in the light guide layer 638 (bold lines) enters the secondary optic 634. The light is conducted by the secondary optic and can undergo reflections off the top 640 and bottom 642 surfaces of the secondary optic. A curved surface 644 on the secondary optic 634 reflects light downward onto a photovoltaic cell 646. The photovoltaic cell can be bonded to the secondary optic 634 with an optical bonding agent 648 (a similar bond can exist between the light guide layer and the secondary optic but this is not shown). The bonding agent 648 has an index of refraction near that of the secondary optic 634, so that total internal reflection does not occur before the light strikes the photovoltaic cell 646. If the optical bonding agent has an index of refraction in between the indices or the secondary optic and the photovoltaic cell then Fresnel back reflection losses will be minimized. As shown in FIGS. 53C and 53D, the curved face 644 can have a mirror coating applied to it; this mirror coat can either be a metallic mirror or a multi-layered dielectric stack.

Figure 53E:
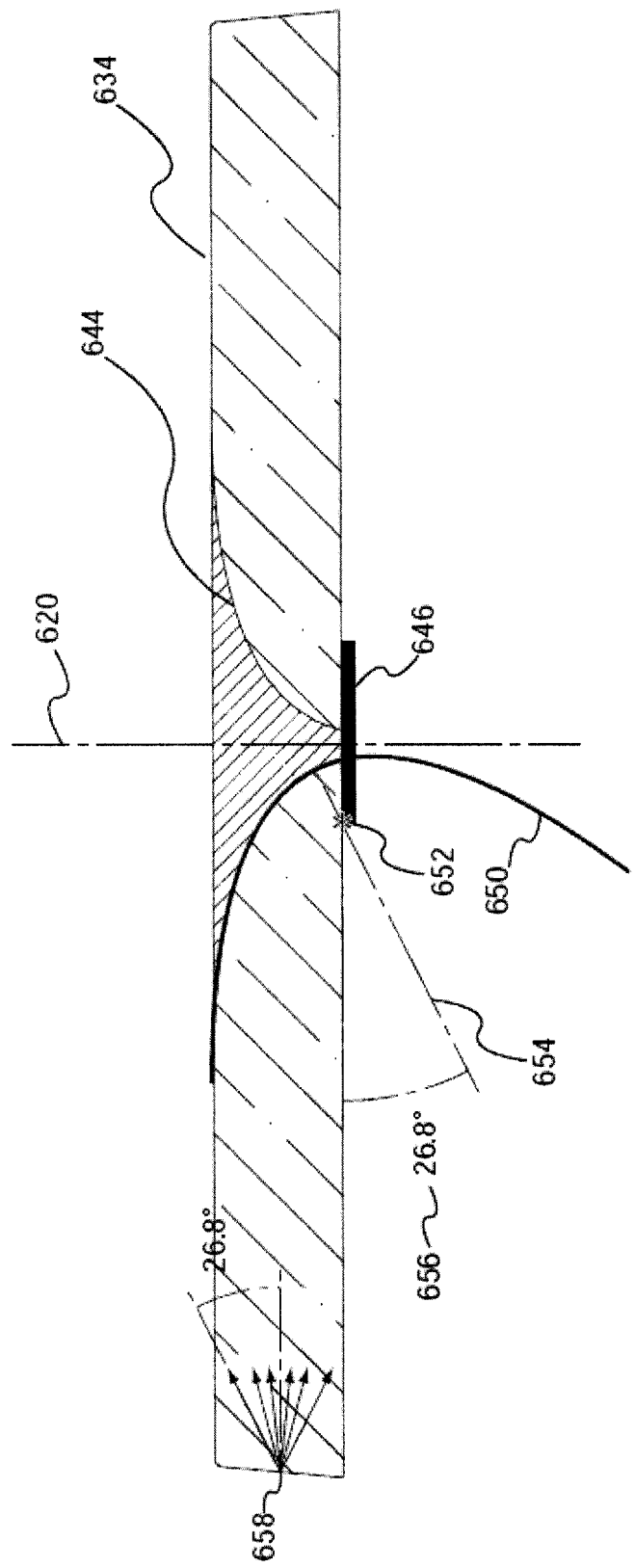

FIG. 53E shows the design of the secondary optic. The curved face 644 follows the curve of an off axis parabola 650 revolved about a central axis 620 (coincident with the axis of revolution for the deflecting layer and light guide layer). The focus of the parabola 652 (marked with an asterix) is fixed at or near the edge of the photovoltaic cell 646. The axis of the parabola 654 is at an angle 656 to the horizontal; in the case of FIG. 53E this angle is 26.8°. In order to design a secondary optic that redirects all the rays being conducted inside the secondary optic to the photovoltaic cell, the angle 656 between the axis of the parabola 654 and the horizontal must be equal to the angle of the steepest ray in the secondary optic. The secondary optic 634 shown in FIG. 53E will redirect any rays of light inside the fan or rays 658 described by plus or minus an angle of 26.8° to the horizontal onto the photovoltaic cell 646. In designing a secondary optic, the steepest ray in the secondary optic should be used to guide the angle of the axis of the parabola. It is possible to achieve different ray steepness's by varying the design of the light guide layer and the deflecting layer preceding the secondary optic. Because the secondary optic in FIG. 53A-53E is based on a revolution of a parabola, the position of the focus describes a circle when revolved. As such, this secondary optic 634 can be placed onto a photovoltaic cell with a circular active area. If it is instead placed onto a photovoltaic cell with a square active area, the corners of the square will not be illuminated. There is a small hole 659 in the center of the secondary optic shown in FIGS. 53 and 54. This hole 659 would be centered on the photovoltaic cell 646.

Figure 54C:
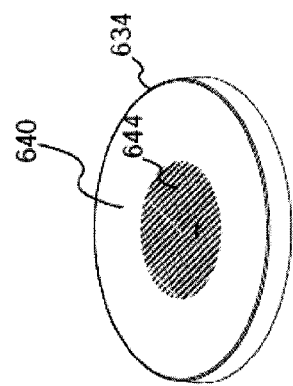
Figure 54E:
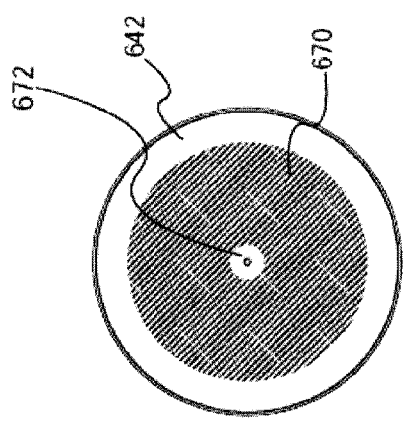
Figure 54D:
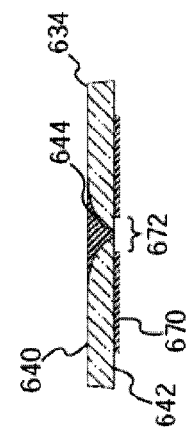
Figure 54F:
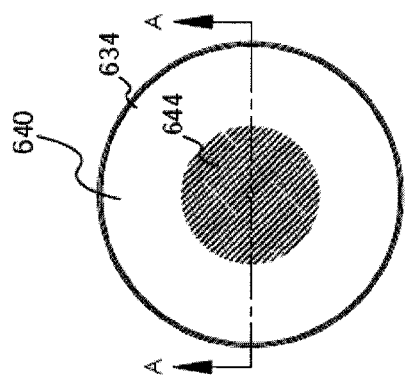

As shown in FIGS. 54A and 54B, the photovoltaic cell 646 can be mounted on a circuit board 660. This circuit board can be double sided and house other needed elements, such as a diode 662, on the opposite side as the photovoltaic cell. The optical bonding agent 648 connecting the secondary optic 634 to the photovoltaic cell 646 can spill beyond the active area of the photovoltaic cell during assembly and onto the circuit board 660. Light 664 inside the secondary optic that strikes the top face 640 or bottom face 642 of the secondary optic 634 will totally internally reflect 666. However, when that light 664 strikes the optical bonding agent it will transmit into the bonding agent. In FIG. 54A, some rays 664 transmit into the optical bonding agent 648 and hit the circuit board 660 on which the cell 646 is mounted. These rays will obviously not generate electricity. In order to avoid this premature escape of light, a mirror 670 can be positioned at the bottom face 642 of the secondary optic 634. This can be applied as a mirror coating directly on the secondary optic as shown in FIG. 54C-54F. The secondary optic 634 has two mirror coatings; one applied to the curved surface 644 on the top face 640 and a second mirror coat 670 applied to bottom face 642. There must be an aperture 672 in the center of the mirror to allow light to pass through to the photovoltaic cell. This aperture can be a round hole in the mirror or another shape. The mirror can either be a metallic mirror, or a multi-layered dielectric stack mirror or some other mirror.

The mirror coatings can either be applied on the secondary optic or they can be applied onto separate elements. The mirror coat on the curved face 644 can be replaced by an external part as well. As shown in FIG. 55A, an insert piece 674 can be made that has the necessary shape to fit inside the curved face 644 on the secondary optic 634. To this insert piece 674 an external mirror coat could be applied and then it could be dropped in place. A thin sheet of glass 676 could have a mirror coat 678 applied to it that could be then attached to the circuit board where the photovoltaic cell is mounted. The mirror coat would have an aperture in the center 680 over where the PV cell would be positioned.

Shown in FIG. 55B, if an insert piece 674 is made such that it has the desired shape of the curved mirror and has an external mirror coating, then a simplified secondary optic can be made. A simplified secondary optic 682 can be made instead. When the insert piece 674 is placed in the secondary optic, the intervening space can be filled with an optical bonding agent 684, such as optical silicone.

Figure 56A:
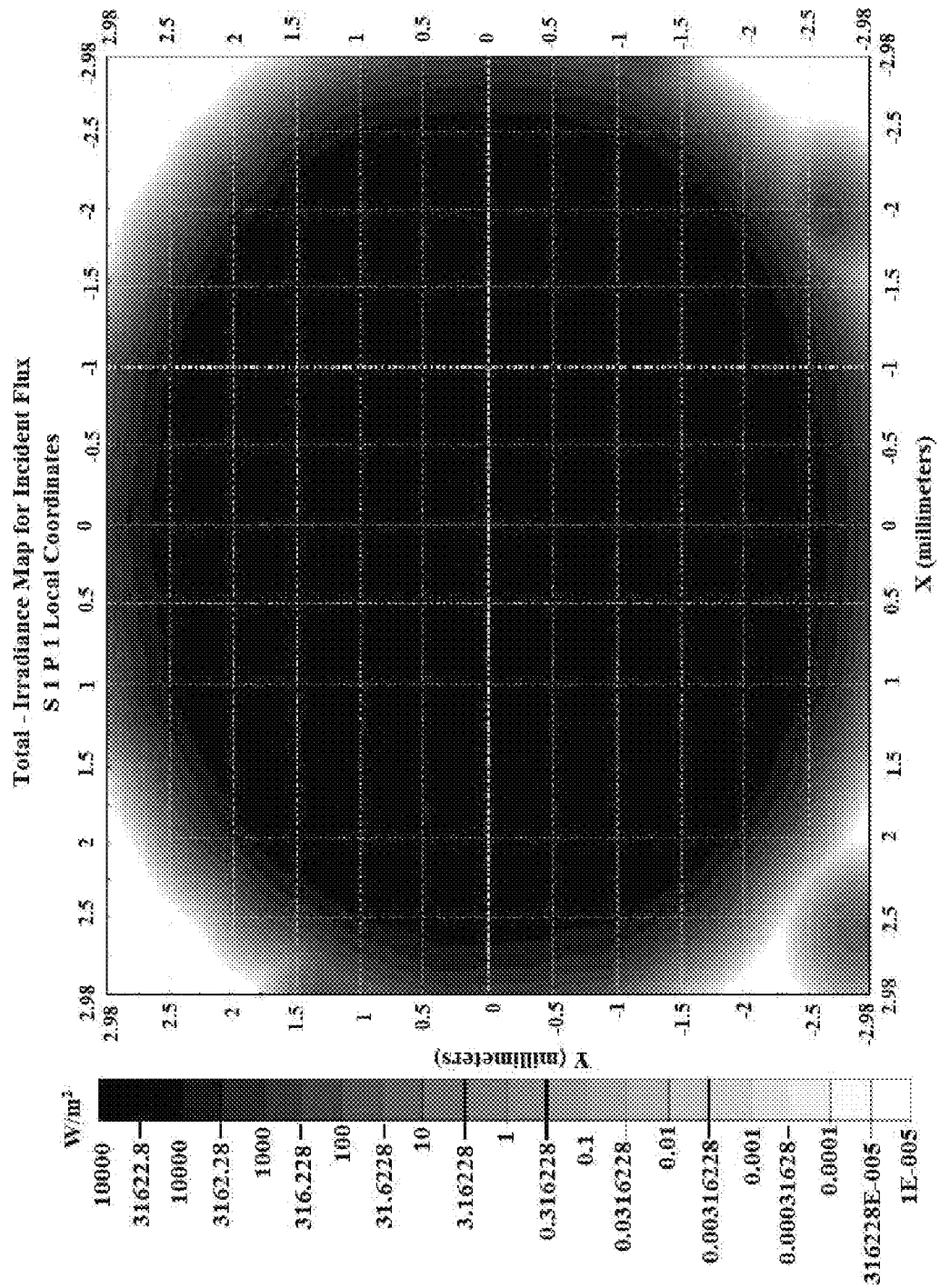
FIGS. 56A and 56B show a light intensity profile that can be obtained at the output of the secondary optic of FIG. 55B.
Figure 56B:
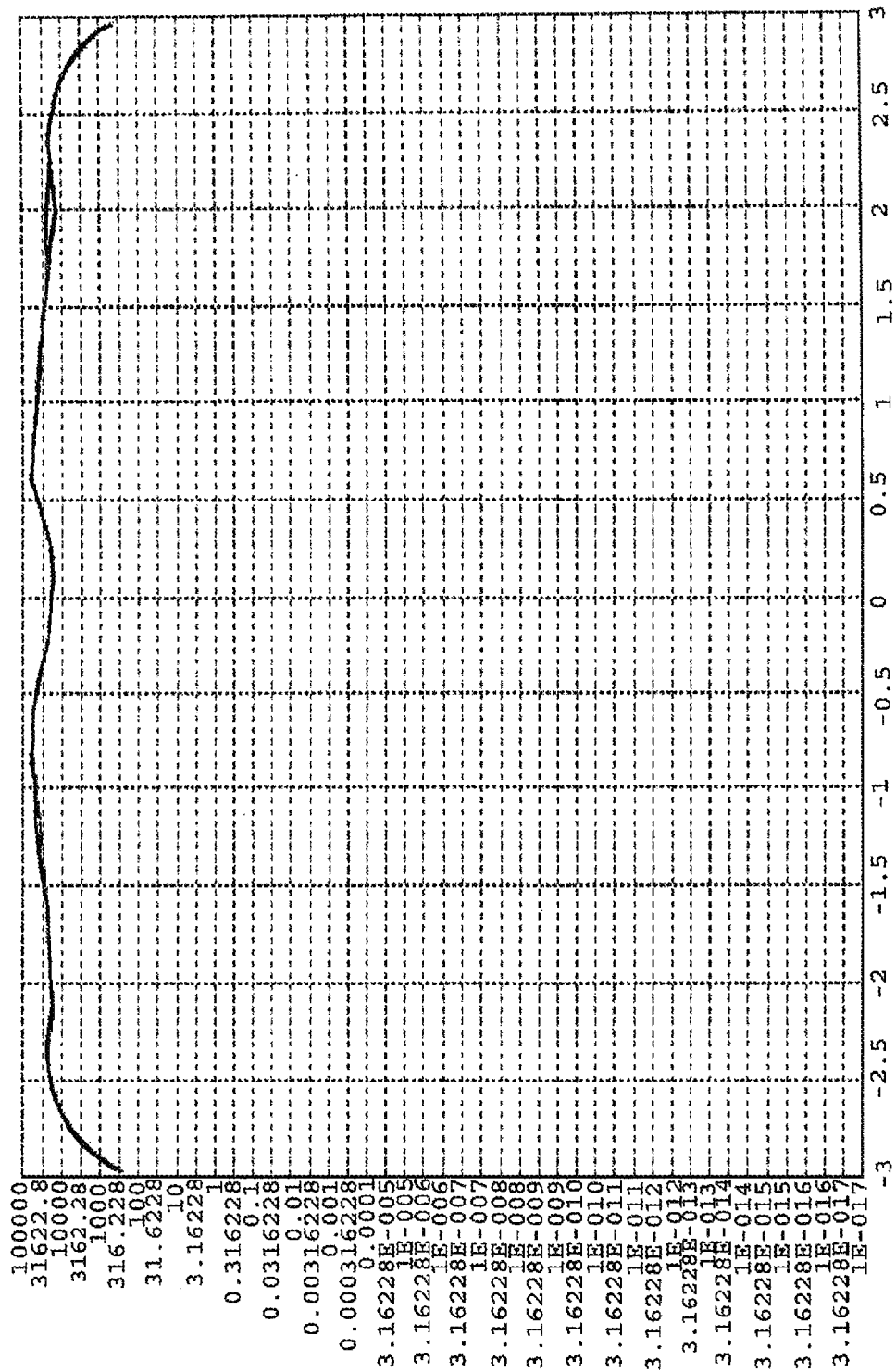

The above secondary optics all will create round, even light profile on a photovoltaic cell. FIGS. 56A and 56B show the light profile resulting from a ray trace. FIG. 56A shows a grayscale image showing light intensity on the cell, and FIG. 56B shows profiles across the cell. The light profile is very even.

There are other potential designs for secondary optics, such as a secondary optic 686 where the curved section 644 is replaced with a flat facet 688 as shown in FIG. 57. Mirror coatings can be applied to this secondary optic or to external components as for the previous secondary optic. The flat facet reflects light 690 downwards.

Rather than making a circularly symmetric optic, consider a secondary optic 692 with another form shown in FIG. 58A-58D. The portion of the secondary optic 694 that was previously a revolved curve facet is divided into four quadrants 696, 698, 700 and 702. Each quadrant focuses light onto an individual photovoltaic cell. A single circuit board 704 on which four cells 706, 708, 710, and 712 are mounted could be configured with this secondary optic 692.

Figure 59A:
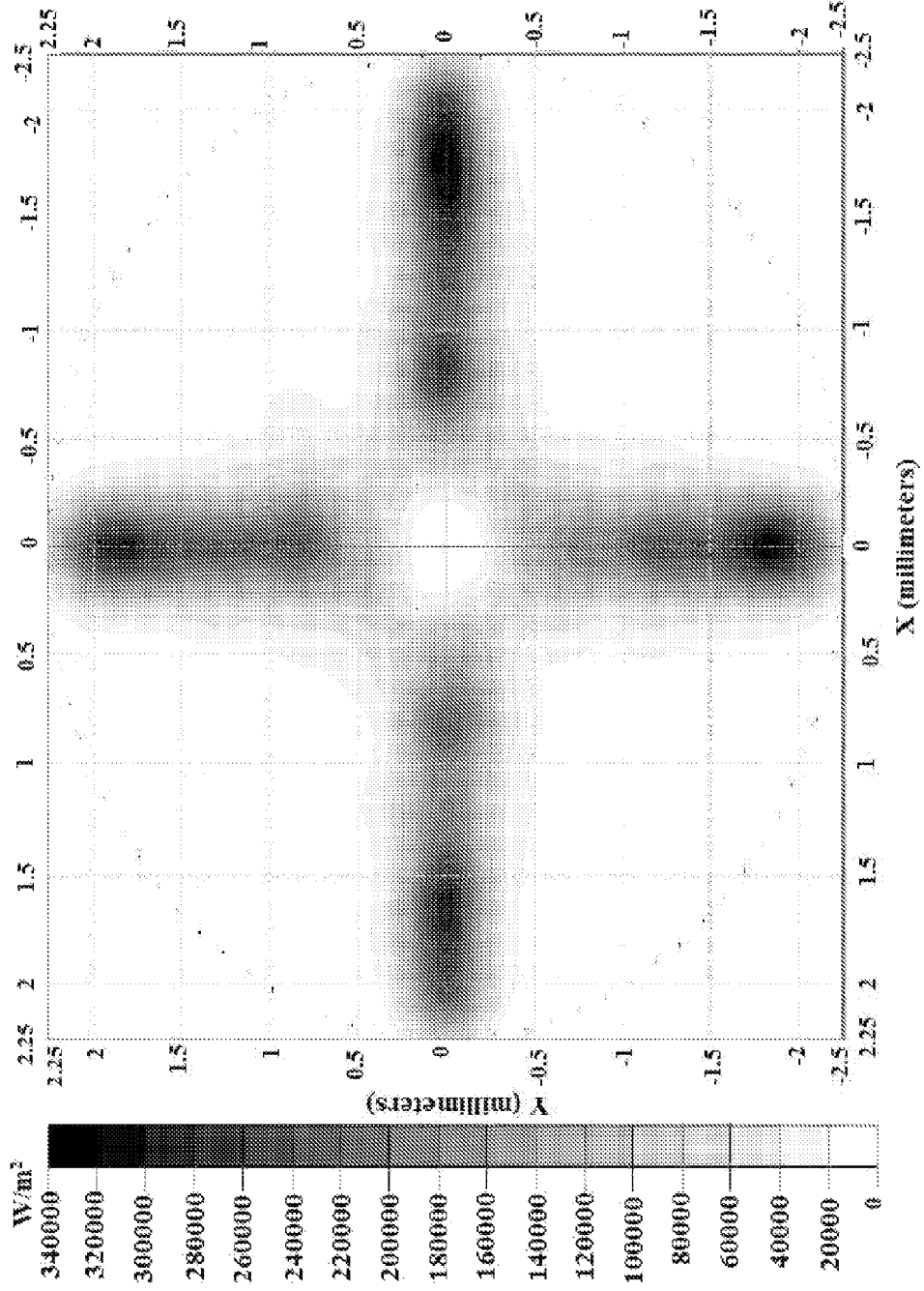
FIGS. 59A and 59B show a light intensity profile that can be obtained at the output of the secondary optic of FIG. 58A.
Figure 59B:
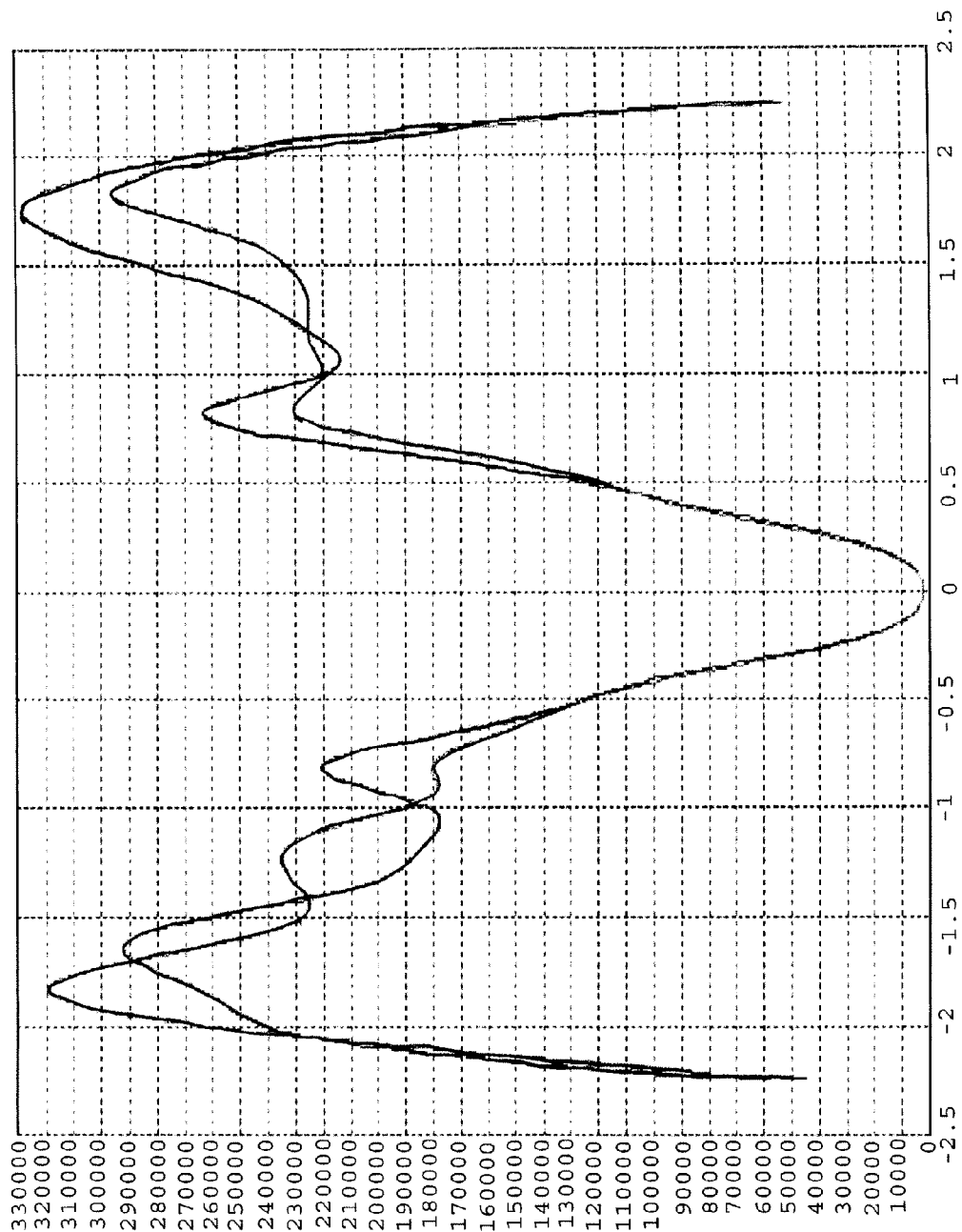

FIG. 58E shows an arrangement between the secondary optic 692 and the circuit board 704 beneath it. FIGS. 59A and 59B show the light profile resulting from a ray trace using a light guide solar panel optic and the secondary optic 692. FIG. 59A shows a grayscale image showing light intensity on the cell, and FIG. 59B shows profiles across the cell. This arrangement, with four PV cells and four reflecting quadrants on the secondary optic can have a higher concentration factor than the arrangement where the secondary optic has circular symmetry.

A tray can be made to support the deflecting layer and the light guide layer and the secondary optic. This tray can be made of injection moulded plastic, and in fact can be made out of the exact same material as the deflecting layer slab and light guide layer slabs. The tray can have alignment features enabling the drop in place assembly of the light guide layer, the deflecting layer, the secondary optic and the PV cell.

If the Deflecting Layer, the Light Guide Layer, and the Tray are all made of PMMA, then the secondary optic can be made of glass. The secondary optic creates a thermal barrier between the photovoltaic cell and the light guide layer and will protect the PMMA optics from high heat, because the highest heat in the system occurs at the photovoltaic cells where all the light is concentrated. In addition, the highest flux density in the system will occur at the PV cell. It is thought that extremely high flux density might damage PMMA, so using a glass material as a secondary optic is potentially a good optic to withstand the highest flux density in the system. This is because the highest flux density in the system occurs where the light converges at the PV cell, which is in the secondary optic. Lastly, the curved facets of the secondary optic reflect and focus the light in the light guide layer, increasing concentration. The secondary optic can be made out of moulded glass, ground glass, moulded silicone, or polymer or another suitable material or any combination of materials.

Figure 60:
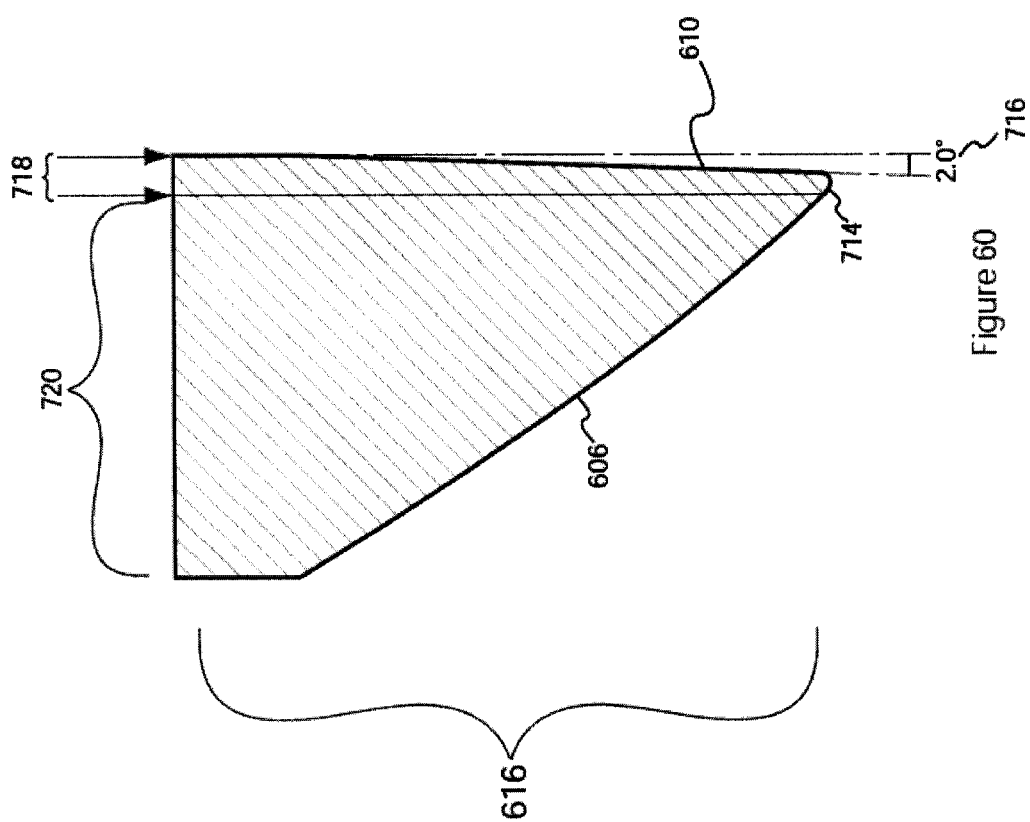
FIG. 60 shows a deflecting layer component of the light guide solar panel of FIG. 51A.

The deflecting layer in FIG. 51 has dead-space. Consider FIG. 60, which shows the deflecting layer component 616 of FIG. 51A. Because fabrication of absolutely sharp corners is difficult, a radius has been added to the bottom tip 714 and the exit face 610 has a draft angle 716 of 2° (smaller draft angles are possible and this is exemplary only). All the rays in the area 718 that hit either the drafted exit face 610 or that hit the round tip 714 will not likely couple into the light guide layer. Only those rays hitting the area 720 will strike the curved facet 606 and become subsequently focused onto the insertion face the light guide layer. The area 718 is called dead-space, because sunlight that strikes this area does not contribute to electricity generation.

Figures 61A, 61B:
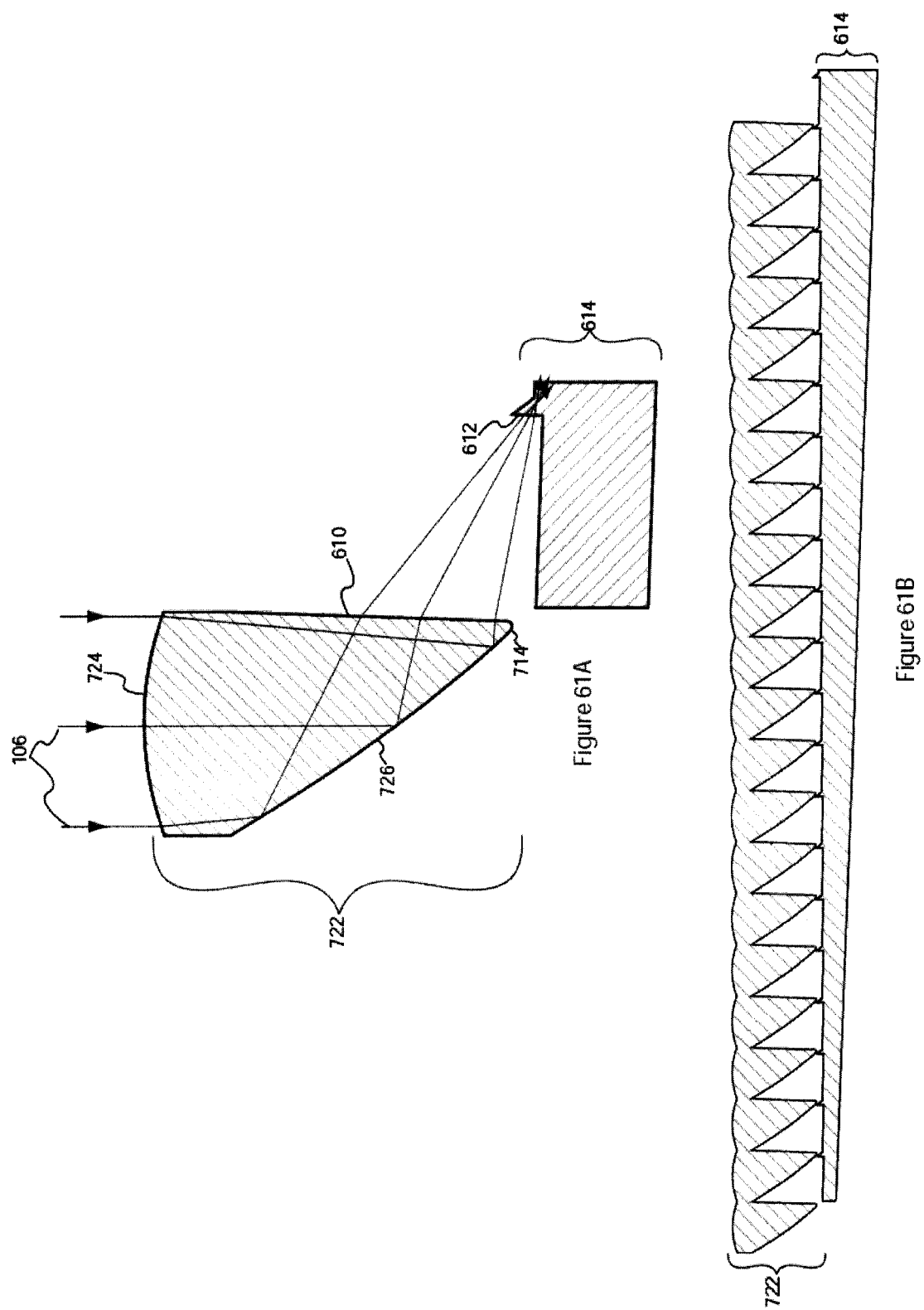
FIGS. 61A and 61B show an embodiment of a deflecting layer of the light guide solar panel of the present invention.

It is possible to design a deflecting layer that has no such dead-space. Consider FIGS. 61A and 61B. The deflecting element 722 is very similar to 616 from FIG. 51. However, there is an elliptical focusing element 724 that acts in diffraction to focus the incident light 106. The light then strikes a second focusing element 726 and exits the deflecting element through an exit face 610 and is focused onto an insertion face 612 of a light guide layer 614. FIG. 61B shows the basic unit from FIG. 61A arrayed along a line. Deflecting layer and light guide layers thus designed can be extruded, revolved and made into slabs to make a light guide solar panel exactly as the previous design. The focusing element 724 causes the light to converge so that it cannot strike the exit face 610 or the radius at the tip 714. Because all the light that strikes the top surface of the deflecting layer couples to the light guide layer, this design has no dead-space.

Figure 62A:
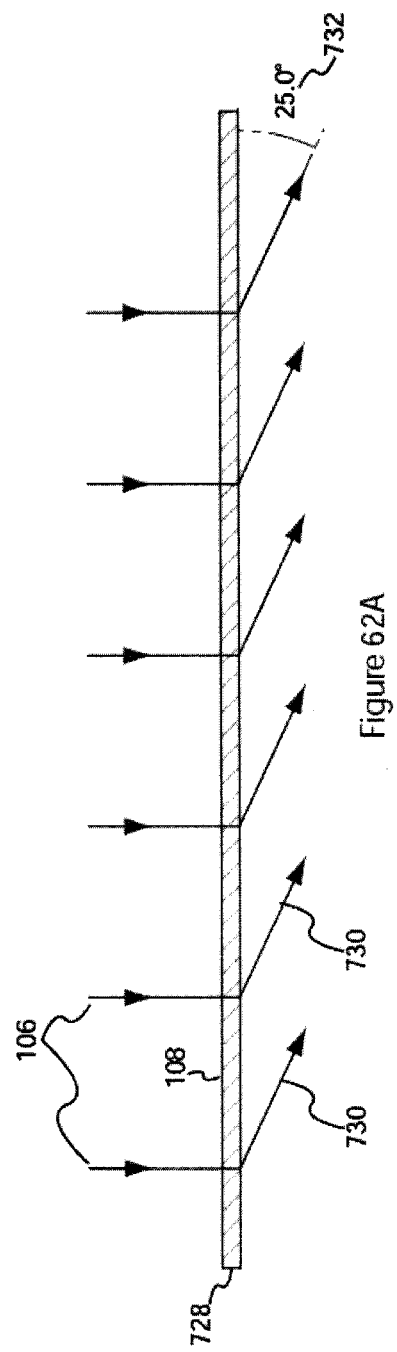
FIGS. 62A and 62B show exemplary deflecting layers of the light guide solar panel of the present invention.
Figure 62B:
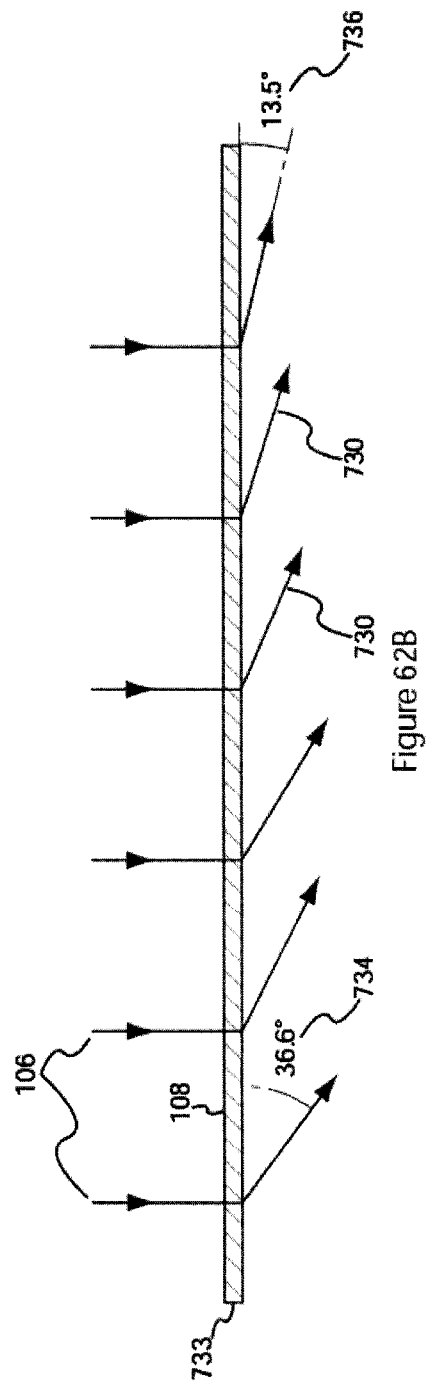

Consider the deflecting layers shown in FIGS. 62A and 62B. This deflecting layer 728 deflects incident light 106 sideways so that the output light 730 travels oblique to the input surface 108. The output light 730 can either all be traveling with substantially the same angle 732 to the input surface 108 as in FIG. 62A. With a different deflecting layer, 733, all the output rays 730 are traveling at an angle between some maximum angle 734 and some minimum angle 736 with the input surface 108. The angles shown in FIGS. 62A and 62B are exemplary only, and the deflecting layer could be designed to deflect light to almost any angle. Note that previously designed deflecting layers such 616 and 722 from FIGS. 51 and 61 have output light that acts like the deflecting layer 728 in 62A, all the rays exit the deflecting layer traveling obliquely to the collector surface 108 and have trajectories whose angle to the collector surface has a maximum and a minimum. Some other designs for deflecting layer with the above characteristics will be described in a later section.

Figure 63:
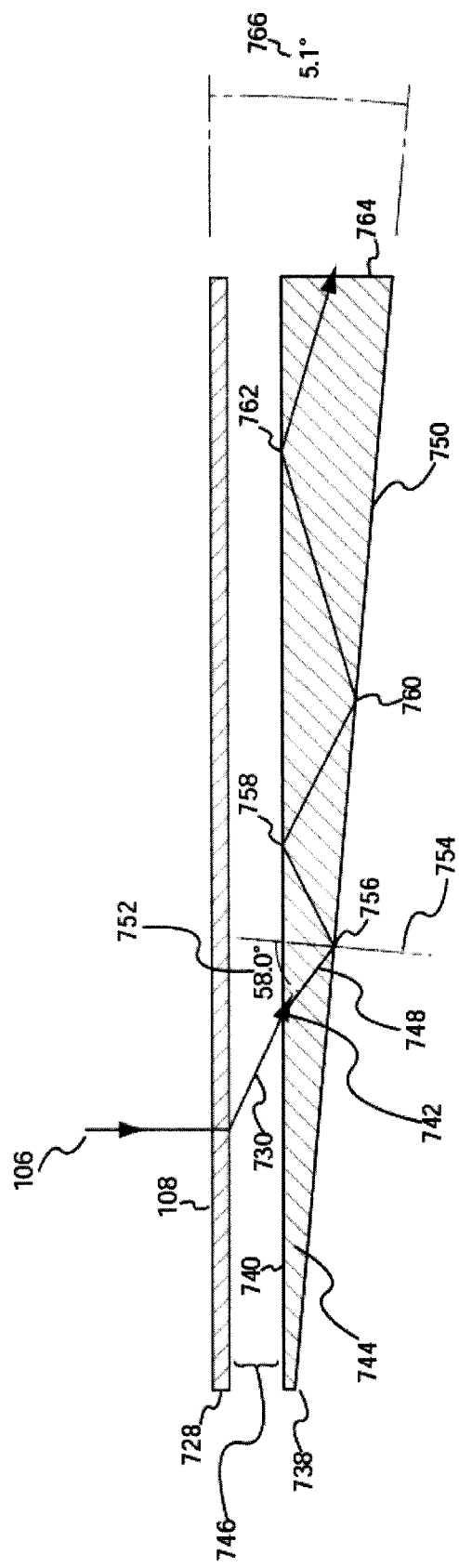
FIG. 63 shows an embodiment of a light guide of the light guide solar panel of the present invention.

If this kind of deflecting layer is oriented above a different kind of light guide layer such as that shown in FIG. 63. This light guide layer 738 is wedge shaped in cross section and has smooth sides with no insertion features as previous light guide layers have had. The insertion surface 740 of the light guide layer is the top most surface and this may have an antireflection (AR) coating applied to it. AR coatings will be discussed in detail in a later section as there is a particular kind of AR coating that is optimal for the solar powered application being described.

Consider a single ray of incident light 106. It strikes the deflecting layer and the output of the deflecting layer 730 is traveling obliquely to the deflecting layer. The light 730 enters the light guide layer and is deflected 742 because the material 744 that comprises the light guide layer has an index greater than the material 746 in between the light guide layer and the deflecting layer. For example, the light guide layer can be made out of glass or polymer with an index of around 1.5 and air can be in between the deflecting layer and the light guide layer with an index of around 1.0.

When the ray inside the light guide layer 748 strikes the bottom surface of the light guide layer 750, it is at an angle of incidence to 752 measured to the normal of the bottom surface 754 that is greater than the critical angle for that material. If the material has an index of refraction of 1.5, and underneath the light guide layer there is air, then the critical angle for total internal reflection is 41.81°. The ray shown 748 will totally internal reflect 756 because it's angle of incidence is greater than the critical angle and then it will be conducted by the light guide layer and will totally internally reflect more times at points 758, 760, and 762 before reaching the output face 764 of the light guide layer 738. At the output face, a photovoltaic cell can be positioned or a secondary optic that conducts light to a photovoltaic cell such as those described previously.

If the collector surface of the deflecting layer 108 is parallel to the insertion face 740 of the light guide layer, then there is a simple mathematical relationship between the angle of the output rays 730 from the deflecting layer and the wedge angle 766 of the light guide layer. The wedge angle is related to the concentration that can be achieved by the system, because a sharper wedge will have a smaller output face 764 than input face 108. If this design is used to make a linear concentrator, such as in FIG. 7, then the concentration ratio is just the ratio of the input face 108 to the output face of the light-guide layer 764. When a circularly symmetric revolved design is employed such as in FIG. 9 or FIG. 51 the concentration factor is clearly much higher than this ration. It can be approximated as the ratio between the square of the input face 108 and the square of the output face 764, but this is an approximate measure.

Figure 64:
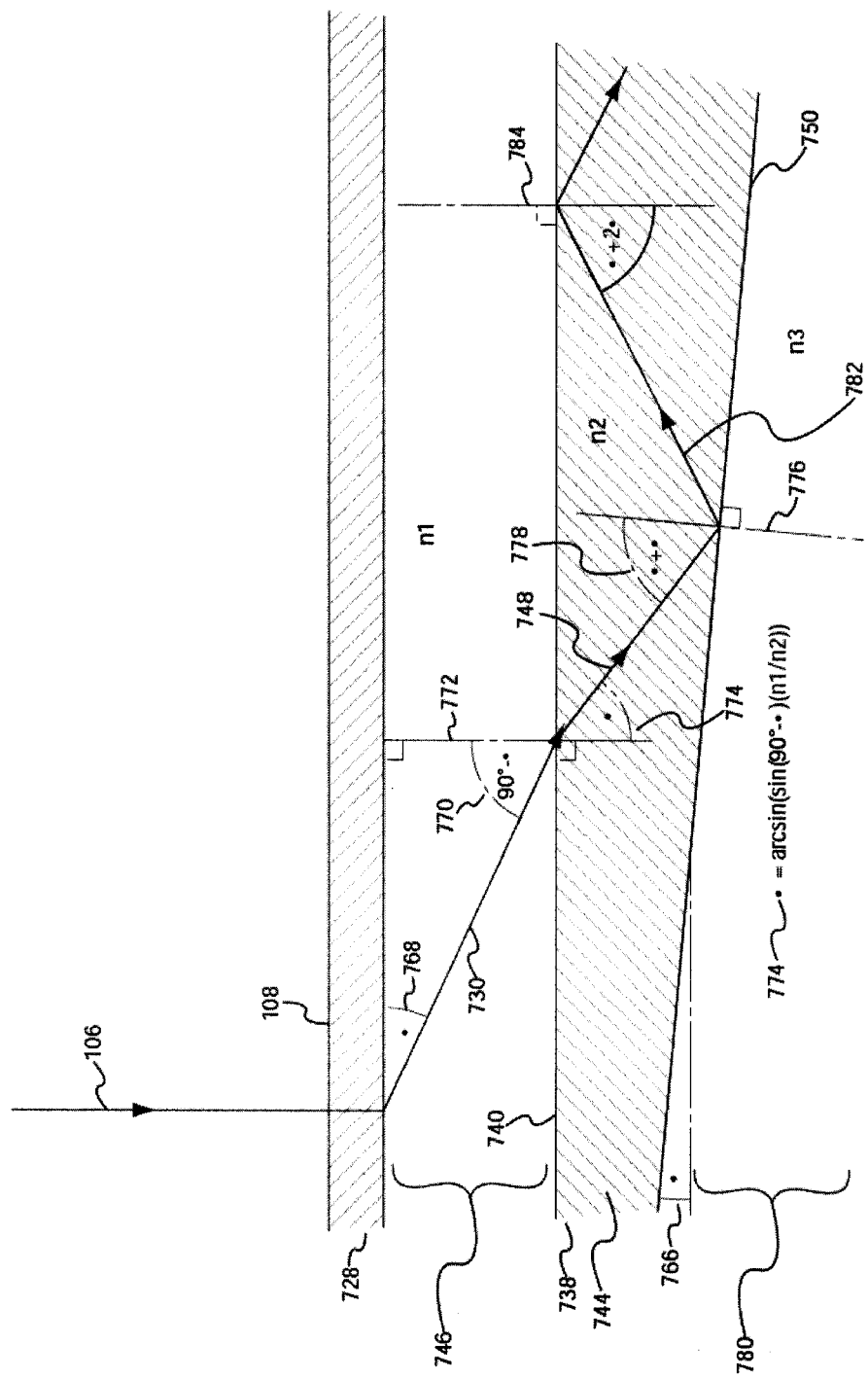
FIG. 64 shows an embodiment of a light guide of the light guide solar panel of the present invention.

The mathematical relationship between the output angle of light from the deflecting layer and the wedge angle in the light guide layer is given in FIG. 64. The deflecting layer 728 deflects incident light 106 to an output ray 730 at an angle θ (768) with the collector surface of the deflecting layer 108. Because the top surface of the deflecting layer 108 and the top surface of the light guide layer 740 are parallel, the light makes an angle 90°−θ (770) to the normal vector 772 of the light guide layer top 740. This ray is deflected on entry to the light guide layer. The deflected ray 748 makes an angle β (774) with the normal vector 772. The relationship between the angle β (774) and the incident angle 90°−θ (770) is determined by Snell's Law. Snell's Law depends on the indices of refraction the material between the deflecting layer 746, call it n1, and the material out of which the light guide layer is made 744, call it n2. The angle β (774) can be calculated from Snell's Law as:

$$\beta = \arcsin(\sin(90°-\theta)(n1/n2))$$

The angle 778 that the ray 748 makes with the normal vector 776 of the bottom face 750 of the light guide layer 738 depends on the wedge angle α (766) of the light guide layer. The angle 778 is equal to β+α. If β+α is greater than or equal to the critical angle, then light will totally internally reflect at that interface 750.

The critical angle for total internal reflection depends on the index of refraction for the material that makes up the light guide layer, n2, and the index of refraction for material underneath the light-guide layer 780. Call the index of the material under the light guide layer refraction n3. The critical angle for total internal reflection equals arcsin(n3/n2). If the angle 778 of the ray 748 on the interface 750 is greater than or equal to the critical angle then it will totally internally reflect.

The reflected ray 782 makes an angle of β+2α with the surface normal 784 of the top face 740 of the light guide layer 738. The critical angle for total internal reflection at this interface is arcsin(n1/n2) and if the angle β+2α is greater than or equal to this interface then the ray will totally internally reflect.

Once a ray has totally internally reflected off both surfaces, it will remain trapped until it reaches the exit face of the light guide layer 764 as the angle of incidence of any given ray with measured from the normal of either the top or bottom surface increases by a with each successive bounce.

If the light guide layer 738 is made of an optical material with an index of n2, and the surrounding material, top 746 and bottom 780 is the same (n1=n3) then the relationship between deflected angle θ 768 at the deflecting layer 728 and the minimum light guide layer wedge angle α 766 that allows for total internal reflection to occur at the interface 750 on the first bounce (and therefore for immediate trapping of light) can be calculated easily by the equation $$\alpha \geq \arcsin(n1/n2) - \arcsin((n1\cos(\theta))/n2)$$

Figure 65:
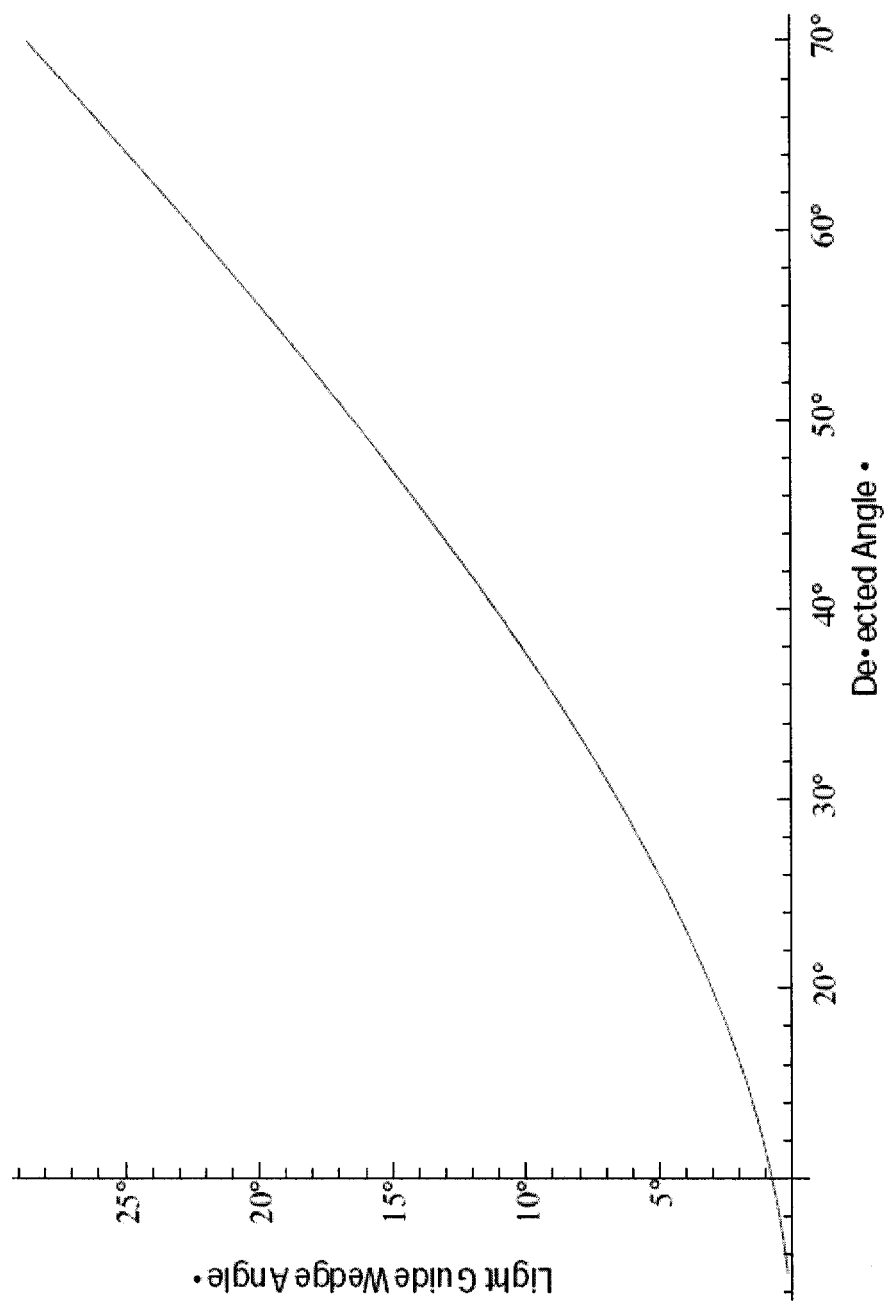
FIG. 65 shows a plot of light guide wedge angle as a function of deflected angle.

A plot of this relationship between deflected angle θ 768 and wedge angle α 766 is given in FIG. 65 for the case when n1=1.0 (air) and n2=1.5 (approximate index for most glass). In the event that the deflecting layer being employed is like the one in FIG. 62A, then this relationship holds true provided that the deflected angle θ 768 is the steepest deflected ray. The wedge angle can also be greater than or equal to a calculate by the above formula.

Figure 66:
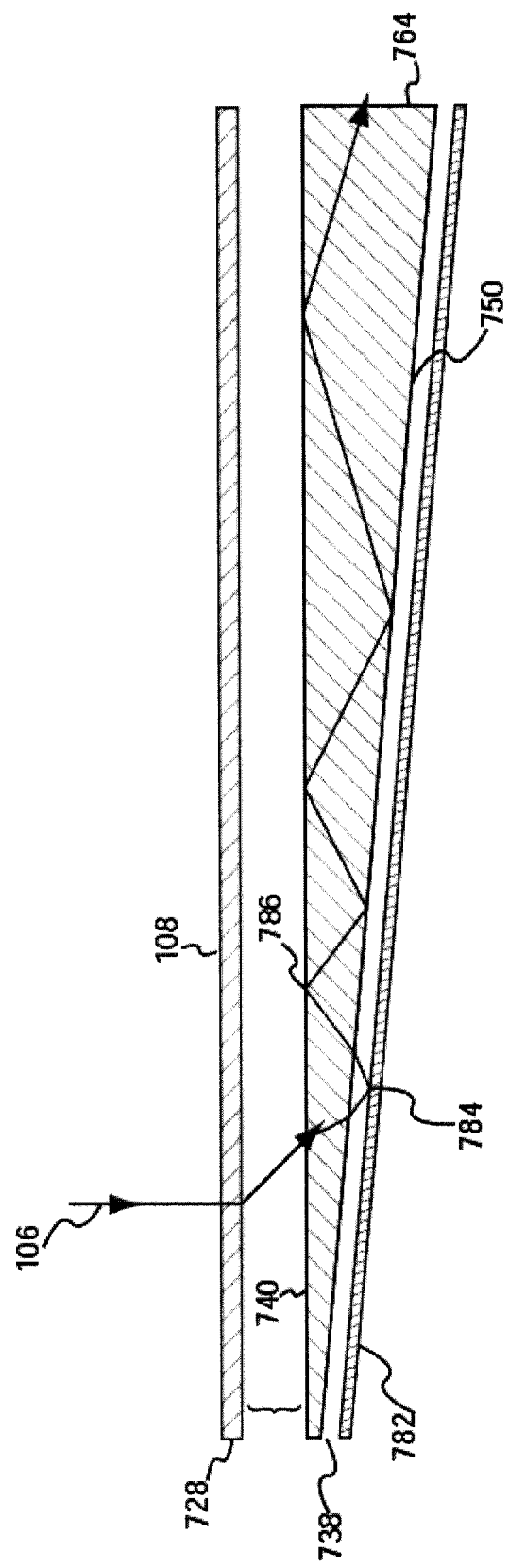
FIG. 66 shows an embodiment of a light guide solar panel which employs a mirror to reduce the wedge angle of the light guide layer.

If, as in FIG. 66, a mirror 782 is added underneath and parallel to the bottom surface 750 of the light guide layer 738 then the situation is slightly different. The mirror 782 assures the first reflection 784 off the bottom face and only the second reflection 786 must satisfy the angle of incidence for total internal reflection. As was said before, the critical angle for total internal reflection at this interface is arcsin(n1/n2) and if the angle β+2α is greater than or equal to this interface then the ray will totally internally reflect. The wedge angle of the light guide layer required to satisfy this relationship for a given deflected angle θ is given by the equation $$\alpha \geq 0.5(\arcsin(n1/n2) - \arcsin((n1\cos(\theta))/n2))$$

this is half the wedge angle required to satisfy trapping if no mirror is present.

It is clear that the smaller the wedge angle of the light guide layer, the higher the potential concentration. However, small wedge angles require that the deflecting layer deflect the incident light so that it is very oblique. This causes it to strike the top surface of the deflecting layer at a very steep angle that can lead to Fresnel back reflections. Looking at figure, a wedge angle of 3° is possible if the deflected angle is 20°. However, a deflection angle of 20° leads to an angle of incidence on the top surface of the light guide layer of 70°. If the light guide layer top surface is comprised of a smooth glassy surface and the light guide layer material has an index of refraction of 1.5, then the Fresnel back-reflections at 70° incidence angle will amount to a 17% loss (the loss at 0° incidence angle is about 4%). In order to achieve tighter wedge angles, such as 1°, the deflected angle needs to be 11.4° and the angle of incidence on the top surface of the light guide layer of 78.6°. This leads to a Fresnel back reflection loss of 34%.

Since the purpose of the optic is to collect light for concentration onto photovoltaic cells, having such a large component of the light being lost to back reflections is not acceptable or practical. As such, some form of anti-reflection coating or texture should be applied or imprinted to the top surface of the light guide layer if high levels of concentration are sought.

The optimal anti-reflection technology is an imprinted nanostructure called a moth eye antireflection coating. Moth eye nanostructures are a texture made of tightly packed cones whose dimensions are smaller than the wavelength of the light in question. They described in the 1982 paper by Wilson, S. J. and M. C. Hutley entitled "*The Optical Properties of 'Moth Eye' Antireflection Surfaces*" published in the Journal of Modern Optics, volume 29(7), pages 993-1009. Moth eye nanostructures are perhaps the most useful anti-reflection coating for this application because sunlight is very broadband in nature and moth eye anti-reflection coatings are not spectrally selective to a great degree, they work equally well across a wide band of wavelengths. Multi-layered anti-reflection coatings could also be employed, but these tend to be more angularly and spectrally selective than moth eye anti-reflection coatings.

Figure 67B:
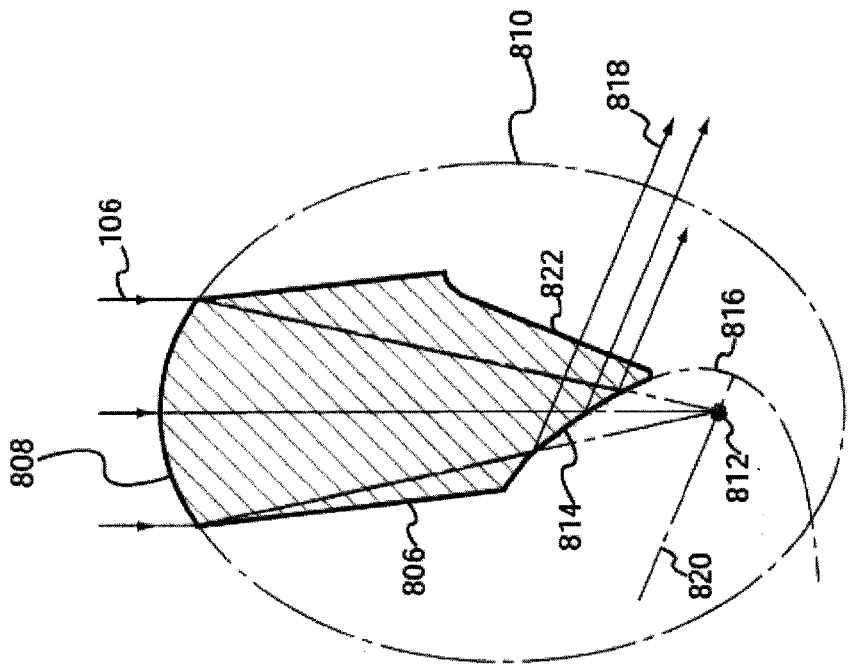
FIGS. 67A and 67B show embodiments of basic units that can be used in the deflecting layer of the light guide solar panel of the present invention.
Figure 67A:
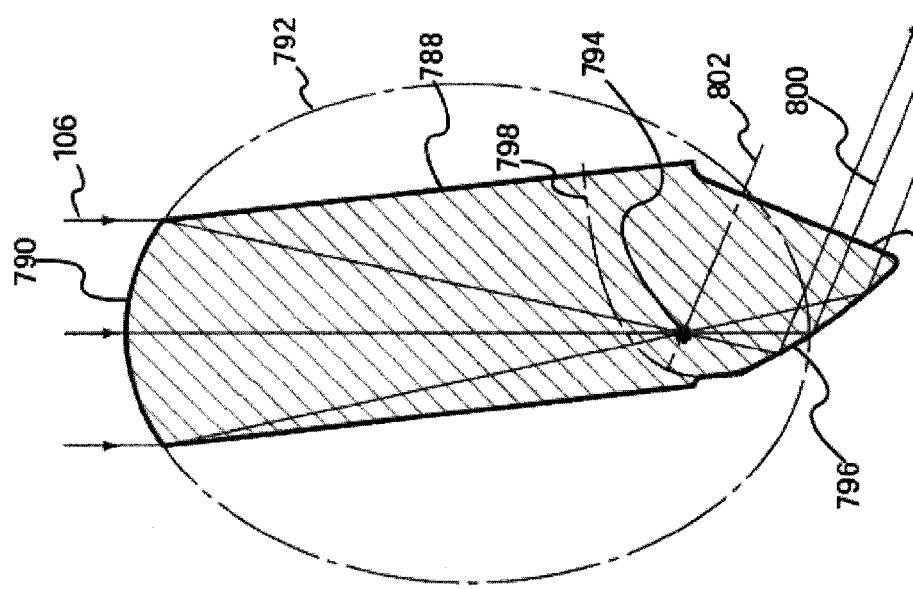

FIG. 67A and FIG. 67B shows described a light guide solar panel which employed a deflecting layer and light guide layer and which employed a mirror 782 in order to reduce the wedge angle of the light guide layer. FIG. 67A shows an element 788 with an entry facet 790 that is a section of an ellipse 792. The ellipse is shaped such that incidence light 106 focuses to a point 794. After the focus, the light strikes a facet 796 and reflects by total internal reflection. The facet 796 is a section of a parabola 798 which has its focus at the same point 794 as the elliptical entry facet 790. Light 800 that reflects off the parabolic facet 796 travels parallel to the axis of the parabola 802. There is an exit facet 804 that is perpendicular to the reflected rays 800, but it could also make another angle to the rays.

FIG. 67B shows a similar element 806 with an entry facet 808 that is a section of an ellipse 810. The facet 808 deflects the incident light 106 such that is converges to a point 812. Before converging completely, the light is reflected by total internal reflection at a facet 814. This reflecting facet 814 is a section of a parabola 816 that has its focus 812 coincident with the focus of the elliptical element 808. The reflected rays 818 travels parallel to the axis of the parabola 820. There is an exit facet 822 that is shown to be perpendicular to the deflected rays 818, but could also make another angle to the rays.

Figure 68A:
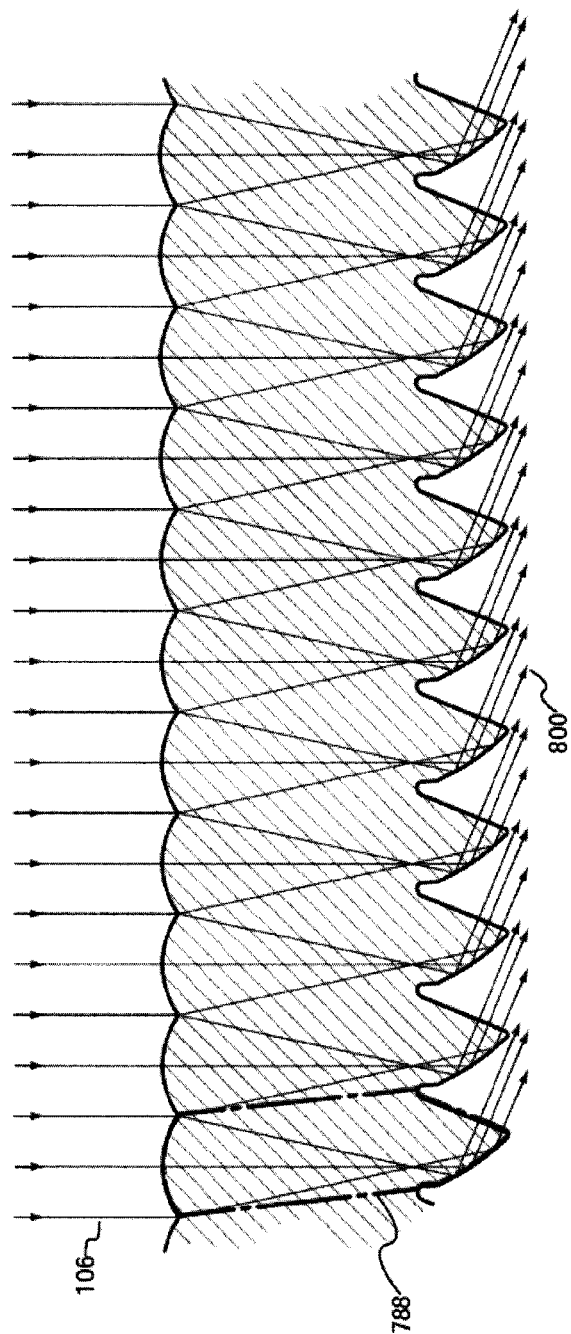
FIGS. 68A-68C show an array of the basic unit of FIG. 67A.

Either of these elements, 788 or 806 can be arrayed to make a deflecting layer. FIG. 68A shows a side view of a part of such a array. The deflecting layer thus made 824 is placed above a light guide layer 826 with an appropriate wedge angle. The light guide layer 826 shown incorporates a secondary optic 828 as well. The entire profile is revolved about an axis 830 to make a round optic that can be square off as before. The final product is a square optic made of a deflecting layer slab 832 and a light guide layer slab 834. There is a secondary optic at the center that redirects the light in the light guide layer down onto a photovoltaic cell. It should be noted that the secondary optic can be made out of the same material as the light guide layer and that the two parts can also be one single part. Furthermore, the light guide layers top surface 836 should have a moth eye anti reflection texture.

If the deflecting slab and the light guide layer slab are pieces made out of injection moulded PMMA, it is possible to directly mould the moth eye texture into the top surface of the light guide layer slab during fabrication. Alternatively, moth eye anti-reflection structures can be added to a part after fabrication.

Another kind of deflecting layer basic unit is shown in FIG. 69A. The element 838 is very similar to the element 806. Incident light 106 hits a elliptical deflecting element 840 and converges on a parabolic element 842. There it is reflected by total internal reflection and travels parallel to the axis of the parabola. The exit face 844 is horizontal and the light refracts very strongly when it passes through the exit face, so that the emerging rays 846 are traveling obliquely to the input face of the optic. In order to realize such strong refraction high angles of incidence are required and therefore anti-reflection coatings would be needed to keep back reflections at the interface 844 from becoming a limiting factor. In particular, moth eye anti-reflection coatings could be applied at the interface 844. This deflecting layer could be arrayed to create a deflecting layer as is shown in FIG. 69B.

All of the deflecting layer elements shown up until now have consisted of a single input facet, single deflecting facet acting in total internal reflection and a single output facet. These elements were then arrayed to create a deflecting layer. FIG. 70A-70D shows some examples of deflecting elements that could be arrayed to make a deflecting layer but which have multiple input facets, deflecting facets, and exit facets. FIG. 70A shows a deflecting layer element 848 that has two collector facets for incident light. There is a flat facet 850 and a curved facet 852. Light that passes through the flat facet 850 is reflected by total internal reflection off a curved facet 854 and focused through a exit face 858 onto the light guide layer insertion face 612. Incident light 106 that passes through the curved facet 852 is refracted and converges onto a facet 856 where it is deflected and passes through the exit face 858 and focuses onto the light guide layer insertion face 612. The element 860 in FIG. 70B is identical except that the curved collector face and the flat collector facets are reversed.

FIG. 70C shows an element 862 that has two collector facts, one flat facet 864 and a curved facet 868. Incident light 106 striking the flat facet 864 is then reflected by total internal reflection and focused through an exit face 872 onto the insertion face 612 of the light guide layer. Incident light 106 striking the curved collector facet 868 is refracted and then totally internally reflects off a facet 874 and is then passes through an exit facet 876 before converging on the insertion face 612 of the light guide layer. FIG. 70D is identical except that the curved collector facet and the flat collector facet have been reversed.

Figure 71:
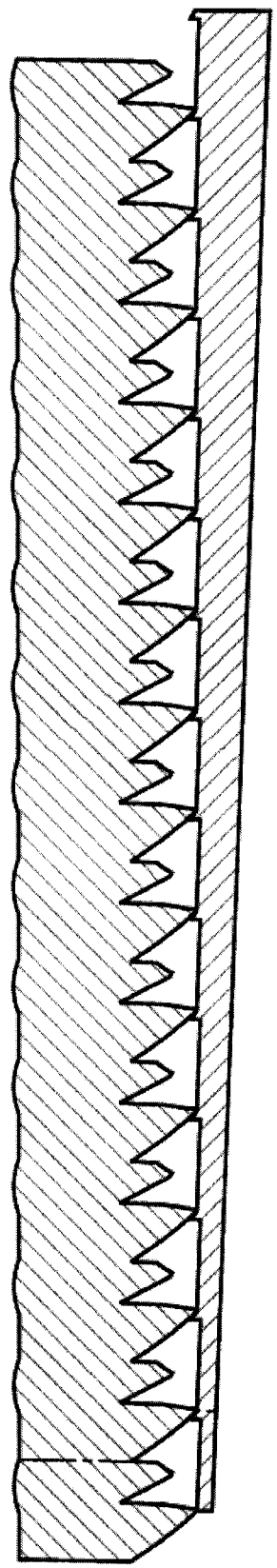
FIG. 71 shows an array of the basic unit of FIG. 70C.

Any of the four elements shown in FIGS. 70A-70D can be arrayed to make a deflecting layer and a light guide layer for designing of parts. FIG. 71 shows the example of element 862 from FIG. 70C arrayed to make a deflecting layer and a light guide layer.

The light guide solar panel described above can be used to make solar energy modules. One way to make solar modules is show in FIG. 72A-72G. A deflecting layer 616 and a light guide layer 614, and a tray 900 are all made out of injection moulded PMMA. Glass moulding of B270 or anther glass is used to make a glass secondary optic 634. The glass secondary optic 634 is placed in the hole at the center of the light guide layer 614, and bonded there using some sort of optical bonding agent. The light guide layer is sandwiched between the deflecting layer 616 and the tray 900, and the seam between the tray and the tray is sealed using dichloromethane or another suitable solvent for bonding acrylic parts together. A small amount of desiccant is placed inside the enclosure in order to keep water vapor from condensing on the inside surfaces of the light guide layer or deflecting layer. A photovoltaic cell receiver assembly 660 is connected at the bottom of the tray to the glass secondary optic. It is possible to a glass window the photovoltaic cell and the secondary optic. This window can be made an integral part of the tray.

Figure 72C:
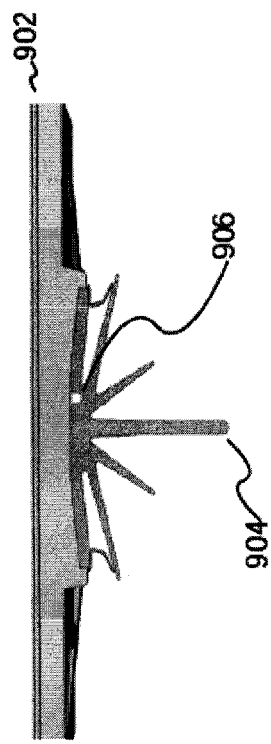
FIGS. 72A-72F show how to make a solar module with a tray to hold the light guide solar panel of the present invention.
Figure 72B:
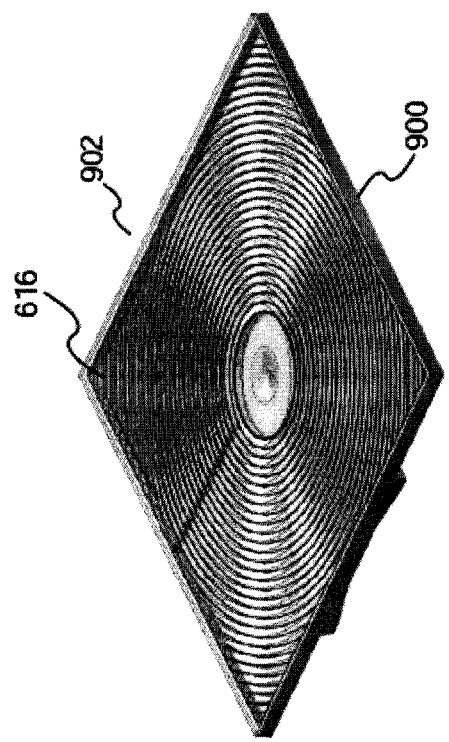
Figure 72A:
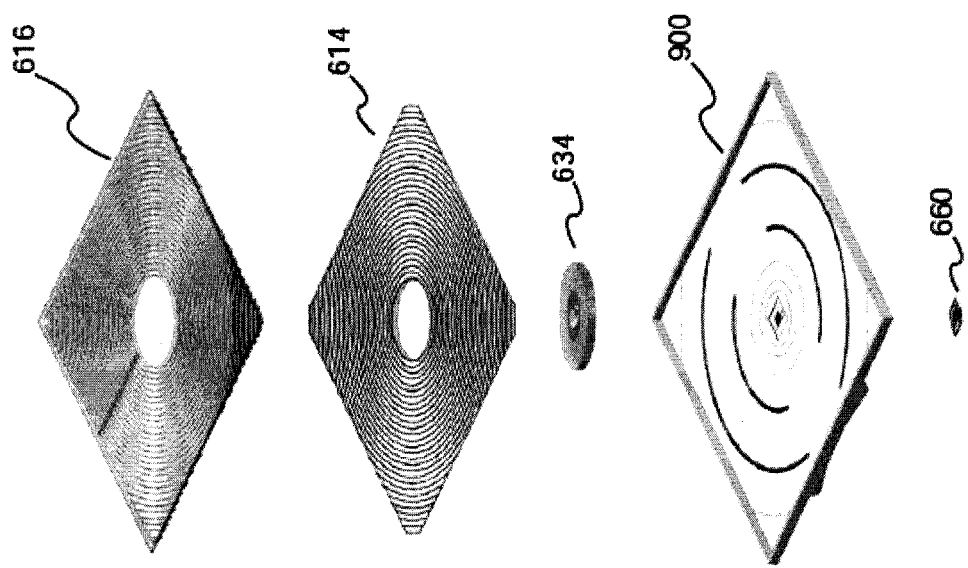

The combination of the light guide layer, the deflecting layer, the tray, the secondary optic, and the photovoltaic cell receiver is called an optical subassembly 902 and is shown in FIG. 72B. Shown in FIG. 72C, the optical subassemblies 902 are connected to a heat sink 904, which sheds excess heat generated at the photovoltaic cell. The heat sink 904 is an aluminum extrusion, and a small groove 906 in the extrusion. This grove is to accommodate the diode 662 shown in FIG. 54. The groove also accommodates wires to connect the photovoltaic cell receivers. The optical subassemblies 902 are connected to the heat sink 904 using a bonding agent such as a thermally conductive silicone, or a urethane based epoxy, a cyanoacrylate bonding agent, or another bonding agent.

The optical subassembly is not affected by thermal expansion because the tray, the light guide layer, and the deflecting layer are all made from PMMA. As such, these parts will expand and contract at the same rate and they will not deform or misalign form one another. Because the photovoltaic cell is positioned in the center of the subassembly, the PMMA parts of the subassembly will expand and contract symmetrically about the cell, and will put very little stress on the photovoltaic cell.

Figure 72D:
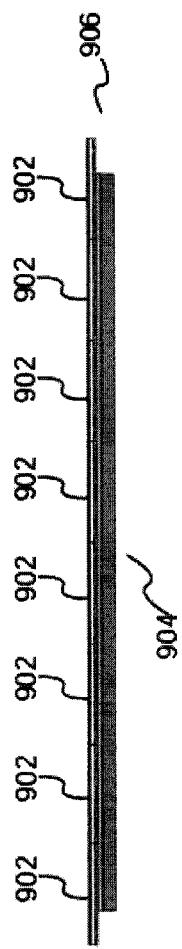
Figure 72F:
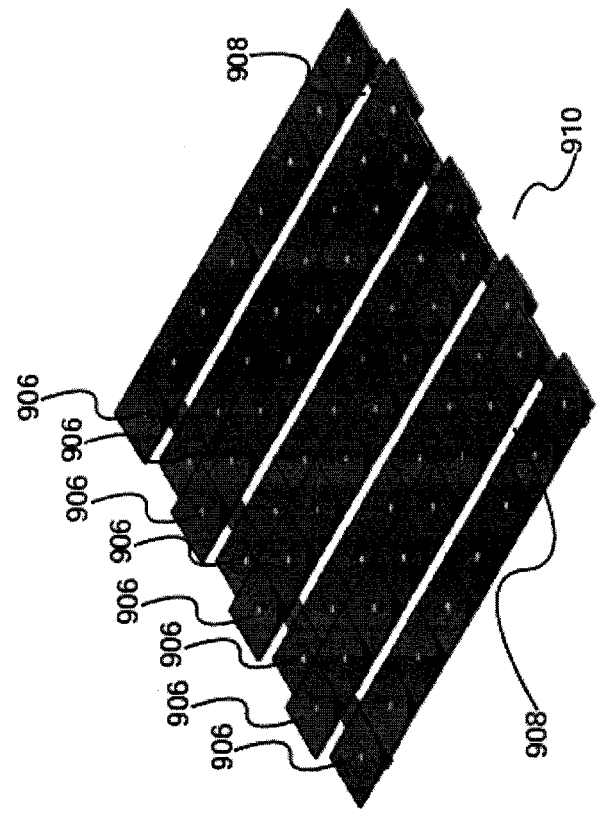
Figure 72E:
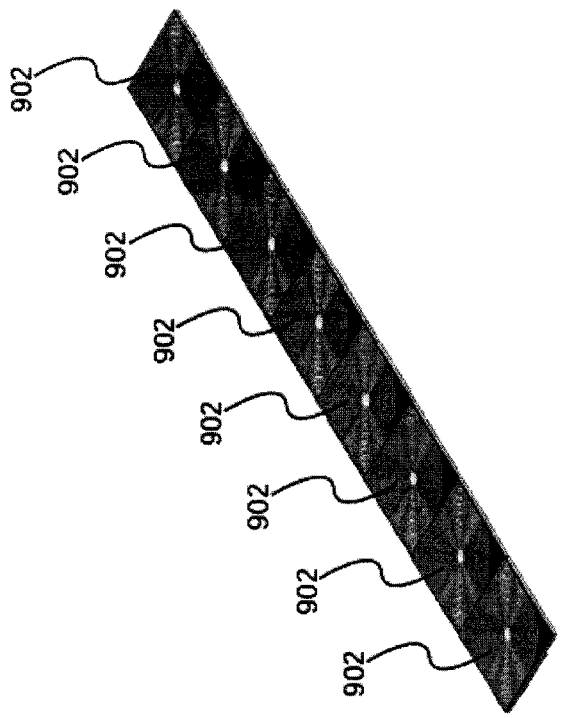

Eight optical subassemblies 902 are attached the heat sink 904 in FIG. 72D. This creates a string 906, in which the photovoltaic cell receivers are interconnected electrically so that there are two wires that emerge from the string which represent the positive and negative terminals of the series connected photovoltaic cell receivers in the string. Arranging strings 906 side by side by side by side as shown in FIG. 72F makes a module 910. The strings 906 can be staggered with a small vertical gap 908 in between them. This gap allows heat to shed off the heat sink 904 more easily and also creates less wind blockage when the modules are mounted onto a tracker.

Figure 73:
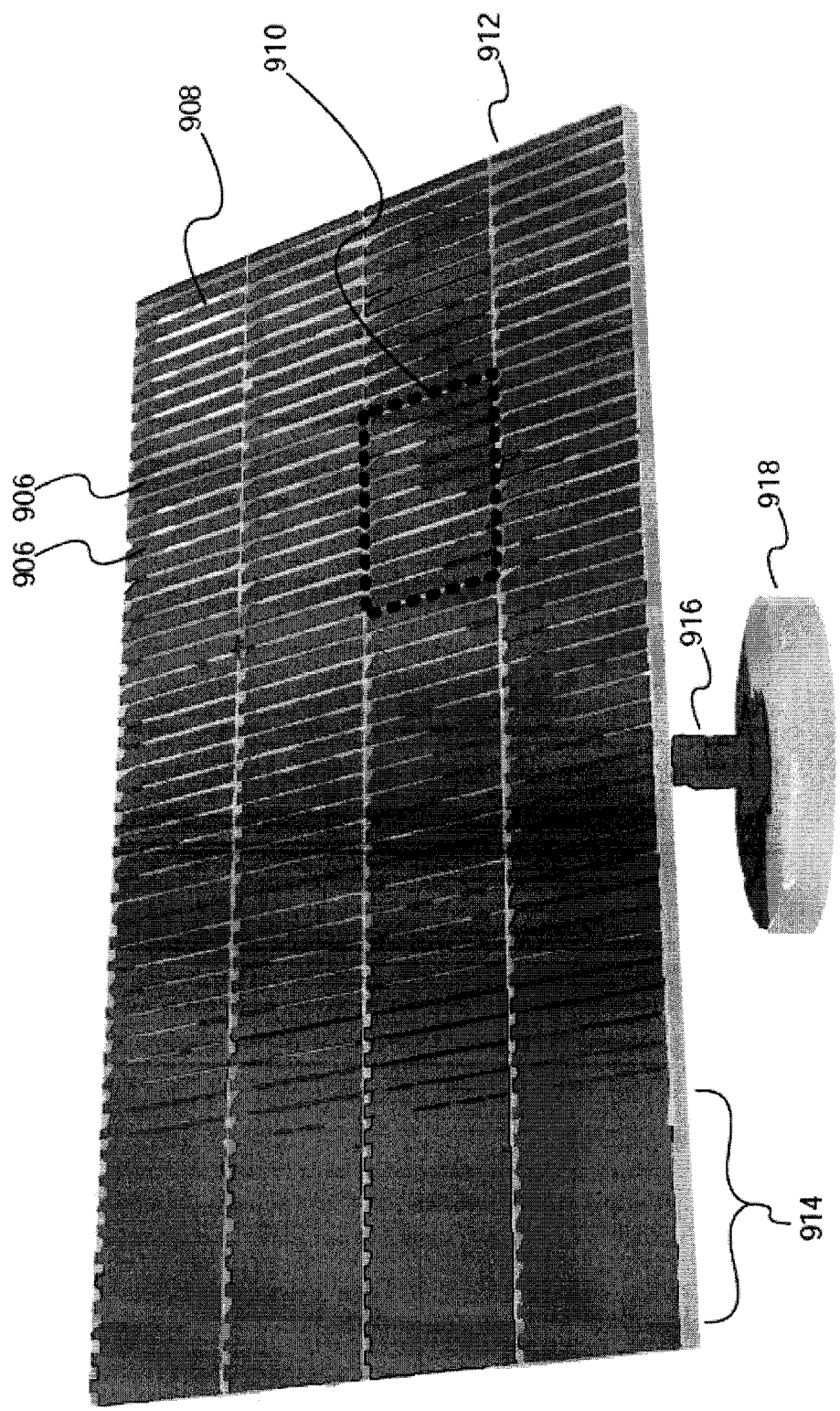
FIG. 73 shows solar modules mounted to a sun tracking device.

FIG. 73 shows such a tracker mounting arrangement. One module 910 is highlighted on a tracker 912 that is six modules across and four modules tall. The modules are mounted on a steel frame, not shown. The small vertical gaps 908 between the strings 906 allow for wind to pass through the module, which prevents this tracker from acting like a big sail. Because this figure is a rendering with perspective, the modules in the area 914 on the left of the FIG. 73 are being viewed straight on and no gaps are evident in between them. The tracker has a supporting post 916 that is anchored to the ground using a concrete foundation 918.

In addition to making strings and optical subassemblies as described above, one can make each optical subassembly contain several light guide layers and photovoltaic cell receiver assemblies. For example, each optical subassembly can contain several deflecting layers, light guide layer, and photovoltaic cell receivers all connected to one single tray. The deflecting layers can be combined into large sheets made up of many individual deflecting layers, so that the seal between the deflecting layer and the tray need only be made around the outermost edge.

Figure 68C:
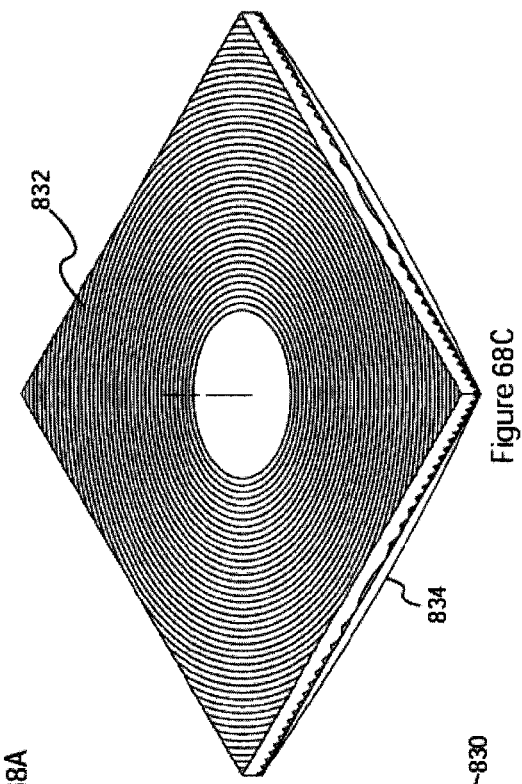
Figure 68B:
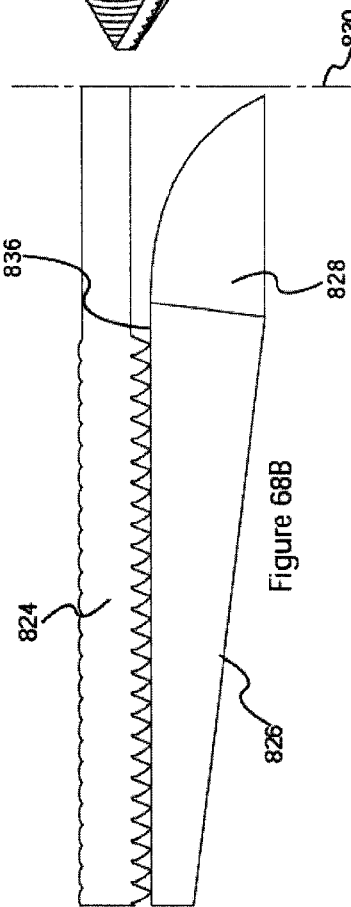

An example is shown in FIG. 74, using the deflecting layer 832 and the light guide layer 834 from FIG. 68. FIG. 74A shows four deflecting layers 834 combined into one piece, the deflecting layer sheet 920. These are assembled with four light guide slabs 834 with a single tray 922 to which four photovoltaic cell receivers 660 are attached. The photovoltaic cell receivers can either be placed on the tray as shown, or they can be placed underneath the tray as shown before. If they are placed on the tray as shown, then the bottom of the tray could be made of a metal or another thermally conductive material so that any heat generated will be conducted to the heat sink. The optical subassembly 924 shown in FIG. 74B can be used, as shown in FIG. 74C, to make strings 926 supported by a single extruded heat-sink 928.

FIG. 66 described a light guide solar panel which employed a deflecting layer and light guide layer and which employed a mirror 782 in order to reduce the wedge angle of the light guide layer. This mirror can be a coating applied to the tray provided the tray is conformal to the light guide layer. This approach is applied to the design from FIG. 68 and is shown in FIG. 75A-75C.

FIG. 75A shows a cross section view, showing the deflecting slab 832 and the light guide layer slab 834 and the tray 930 that conforms to the bottom face of the light guide layer 932 and has a mirror coating 934. The seam 940 between the deflecting layer 832 and the tray 930 is sealed using a solvent bonding agent such as dimethylchloride or another bonding agent. This mirror coating served the role of the mirror 782 from FIG. 66. The top surface of the light guide layer 936 has a moth-eye anti-reflection texture, and this can be formed during injection moulding of the part. The secondary optic 938 is shown being made of the same material as the light guide layer; it is one solid piece in the figure. The secondary optic can also be made as a separate piece of glass. A mirror-coated component 674 is inserted into the center of the secondary optic as was described in FIG. 55. An optical bonding agent 684 connects the mirror component 674, the light guide layer slab 834 and the photovoltaic cell 660. FIG. 75B shows these components in an isometric view, and FIG. 75C shows the assembled optical subassembly. This can then be attached to a heat sink in a string, and used to make a module as before.

A tray that supports multiple light guide layers such as 922 from FIG. 74 can also be mirror coated and functions in the same was provided that the tray surface conforms to the bottom of the light guide layers.

The present invention is that of a solar energy system that uses a LGSP to trap light inside a dielectric or other transparent panel and propagates the light to one of the panel edges for harvesting by a SEC. This allows for very thin modules whose thickness is comparable to the height of the SEC, for example a PV cell, at the edge of the module, thus eliminating the depth requirements inherent in traditional solar energy systems such as CPV systems. Light striking the LGSP is redirected and trapped internally so that it exits the panel through one of its edges where a SEC receives it.

LGSPs can be combined in clusters to make modules. The LGSP optics can be designed structurally to be largely self-supporting, meaning that they do not require an external enclosure to maintain their shape and orientation. A full enclosure can be added to the embodiment. As will be described below, to minimize material use and cost, LGSP modules can be supported by a minimal axle-and-rib configuration.

Concentrated sunlight may be harnessed for a purpose other than creating electricity with PV cells. One alternate use is the heating of an element. The modules can also be configured to heat water while simultaneously generating electricity. It is also possible to couple the concentrated light into a fiber optic or other light-guide to propagate it to another location for some other use, such as to a lighting fixture to provide solar lighting. Furthermore, the LGSP optics of the present invention can be used to reduce the thickness of optics in a other applications including, for example, lamps and lighting. Other aspects and uses of the present invention will become apparent to those ordinarily skilled in the art upon review of the following description of specific embodiments of the invention in conjunction with the accompanying figures.

The present invention is that of a solar energy system that uses a LGSP to trap light inside a dielectric or other transparent panel and propagates the light to one of the panel edges for harvesting by a SEC. This allows for very thin modules whose thickness is comparable to the height of the SEC, for example a PV cell, at the edge of the module, thus eliminating the depth requirements inherent in traditional solar energy systems such as CPV systems. Light striking the LGSP is redirected and trapped internally so that it exits the panel through one of its edges where a SEC receives it.

LGSPs can be combined in clusters to make modules. The LGSP optics can be designed structurally to be largely self-supporting, meaning that they do not require an external enclosure to maintain their shape and orientation. A full enclosure can be added to the embodiment. As will be described below, to minimize material use and cost, LGSP modules can be supported by a minimal axle-and-rib configuration.

Concentrated sunlight may be harnessed for a purpose other than creating electricity with PV cells. One alternate use is the heating of an element. The modules can also be configured to heat water while simultaneously generating electricity. It is also possible to couple the concentrated light into a fiber optic or other light-guide to propagate it to another location for some other use, such as to a lighting fixture to provide solar lighting. Furthermore, the LGSP optics of the present invention can be used to reduce the thickness of optics in a other applications including, for example, lamps and lighting. Other aspects and uses of the present invention will become apparent to those ordinarily skilled in the art upon review of the following description of specific embodiments of the invention* in conjunction with the *accompanying figures.

An exemplary embodiment of the light guide solar panel of the present invention is shown at reference numeral 998 of FIG. 76. The light guide solar panel is made using a deflecting layer 1000 made of a moulded polymer for receiving incident sunlight 1002 and inserting it into the light guide layer 1004, which is made of a moulded polymer for trapping light and conducting it in a slab light-guide towards a central photovoltaic cell 1006. In the center near the cell, in place of the light guide layer there is a secondary optic 1008. This secondary optic is either made of a material capable of withstanding high flux densities such as glass, moulded silicone, or a moulded polymer. The interface 1010 between the glass secondary optic and the light guide layer is made using an optical bonding agent, such as transparent silicone, in order to minimize the Fresnel back reflections that can occur at this interface. Alternately, the secondary optic and the light guide layer can be moulded during the same step in a co-moulding operation. The secondary optic has a curved face 1012 that, on reflection, focuses light traveling in the secondary optic down onto the photovoltaic cell. This face can be mirrored, or, a mirror coating can be applied to an adjacent component that conforms to the face 1012. The interface between the secondary optic and the PV cell 1014 is made using an optical encapsulant. This performs the dual function of protecting the PV cell from moisture or contamination by encapsulating it and minimizes Fresnel back reflections at this interface. The optical encapsulant can be made out of silicone, especially a silicone that does not harden significantly in order to avoid creating stress on the PV cell due to mismatched coefficients of thermal expansion between the secondary optic and the cell. The PV cell sits on a printed circuit board 1016. This printed circuit board can be made using ceramic which is matched in terms of coefficient of thermal expansion with the PV cell. Often with triple junction cells, the cells are mounted on a printed circuit board with a bypass diode. Because there is very little space between the PV cell and the optics, the bypass diode 1018 can be mounted on the backside of the printed circuit board.

A practical realization of the design from FIG. 76 is shown in a perspective cross-sectional view in FIG. 77. The deflecting layer 1000, the light guide layer 1004, the secondary optic 1008, and the printed circuit board 1016 are all held in place by a tray 1020. The tray can be made by moulding, and it can be made out of a polymer with the same coefficient of thermal expansion as the deflecting layer and the light guide layer. In this way, the three largest components will have the same coefficient of thermal expansion, which will enable them to expand at the same rate and maintain alignment with each other while also not experiencing excessive stress. Furthermore, if the three components are made of the same material, or of materials that are compatible, they can be welded or bonded at their outer flange 1022. All three moulded pieces, the deflecting layer, the light guide layer, and the tray, can have flanges that allow them to be ejected from the mould and this same flange can be used to bond the components together. The light guide layer can also be smaller than the other components so that the deflecting layer bonds directly to the tray effectively sandwiching the light guide layer in place and sealing it in place. The panel 998 made of optics, a tray and cell can be mounted on a heatsink 1024. The heatsink shown is an extruded aluminum heatsink. A channel 1026 is left for the diode on the bottom of the PCB and can also be used to conduct wires between neighboring light guide solar panels 998. The bottom of the PCB passes through a hole in the tray and makes contact with the heatsink. The PCB is connected to the heatsink using a thermally conductive agent, such as a thermal epoxy, thermally conductive silicone, thermal grease, or another thermal conductive agent. The remaining gap between the heatsink and the tray can be filed with gap filler that has adhesive properties, such as a urethane or silicone based material. Additional hardware, such as screws, rivets, or bolts, can be used to join the panels 998 to the heatsink 1024. For example, fasteners are shown in FIG. 77*c* and FIG. 77*d* 1025 that go through holes 1027 in the heatsink.

Figure 78:
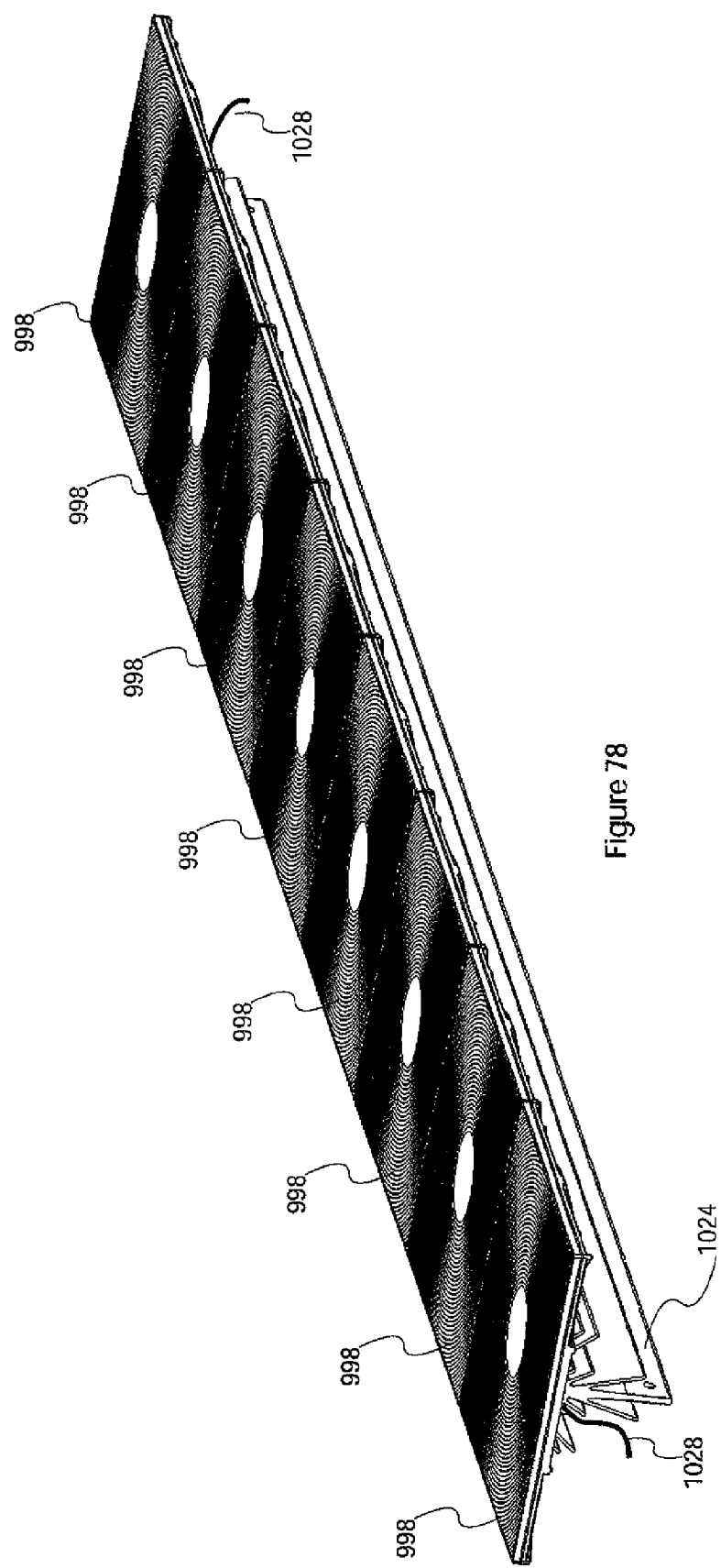
FIG. 78 shows a string of light guide solar panels.

Multiple panels 998 can be so mounted onto a single heat sink 1024 to make a row of panels or a string, such as shown in the exemplary embodiment of FIG. 78. The groove in the heatsink that allows for the diodes can be used to conduct wires from one printed circuit board to the next so that at the ends of the string electrical leads 1028 may come out for electrical interconnection with more strings and into larger solar panel arrays.

During the assembly of the light guide solar panel, it is key that the deflecting layer and the light guide layer are maintained in close contact at all points along their facing surfaces. This is because the functional units on the light guide layer and on the deflecting layer must work together, the light deflecting layer must focus the light so that it is incident on the insertion facets of the light guide layer and so that it passes through the exit apertures into the light guide layer.

Consider the functional units from FIG. 79. The functional unit 1030 consists of a deflecting component 1032 acting in total internal reflection (TIR) that takes incident light 1002 and focuses it to near a point 1034. A convex element 1036 partially focuses the incident light 1002 onto a deflecting surface 1038 acting in TIR, which focuses the light to near the same focal point 1034.

This point 1034 is inside the light guide layer 1004, and just beyond an insertion facet 1040. Note that the aperture that the light must pass through to enter the light guide layer is denoted by the dashed line 1042 and not by the insertion facet 1040. Denoting the downstream direction by the arrow 1044 the aperture is defined by an imaginary line 1042 drawn from the end-point 1046 of one the top facet 1048 of the light guide layer to a point 1050 on the next downstream top facet 1052 of the light guide layer. The acute angle X degrees 1054 that the line 1042 makes with the top facets 1048 and 1052 (which are parallel with each other) is chosen such that the steepest ray 1056 traveling in the light guide layer (the ray which reflects of the bottom facet 1058 and the top facets the closest to normal) makes an acute angle with the top facets less than or equal to the angle made by the line defining the aperture. An exemplary ray 1056 is shown which is parallel to the line defining the aperture; a second exemplary ray 1060 is shown whose acute angle with the top or bottom facets is less than that of the line defining the aperture. Having a ridge 1062 on the insertion facet 1040 of the light guide layer is important. If there is no ridge, such as is shown in FIGS. 79*c* & 79*d* then the effective aperture is reduced to the size of the insertion facet 1062 which is smaller than the effective aperture 1042 when there is a positive ridge such as in FIGS. 79*a* & 79*b*. The effect of shrinking the aperture is that some rays, such as for example 1064, which were previously coupling into the light guide layer will now strike the top facet 1052 instead of an insertion facet (1040 or 1062) and as such will be at an angle such that it will not TIR inside the light guide layer and will instead escape. Shrinking the aperture also reduces the angular acceptance of the system.

Using an insertion element on the light guide layer that features a ridge 1062 or a bump is advantageous from a manufacturing perspective. Consider FIGS. 80*a*-80*g*. FIG.

Figure 80A:
FIGS. 80A-80H show further fabrication considerations for the light guide layer.
Figure 80B:
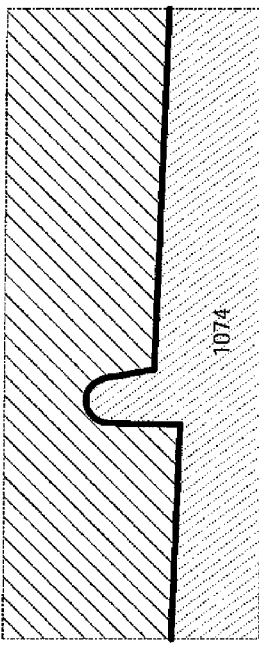
Figure 80C:
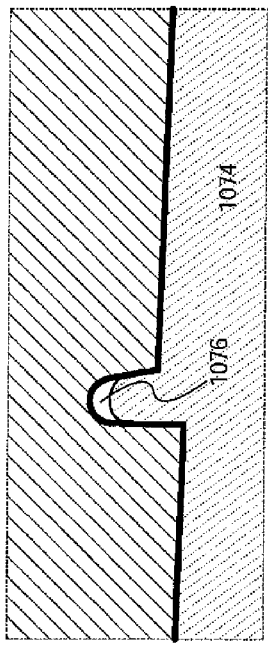
Figure 80D:
Figure 80E:
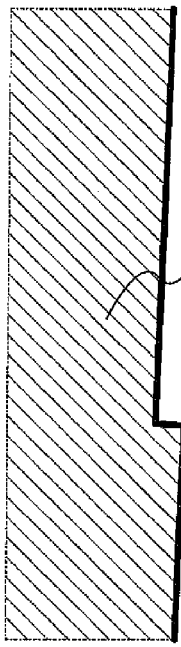
Figure 80F:
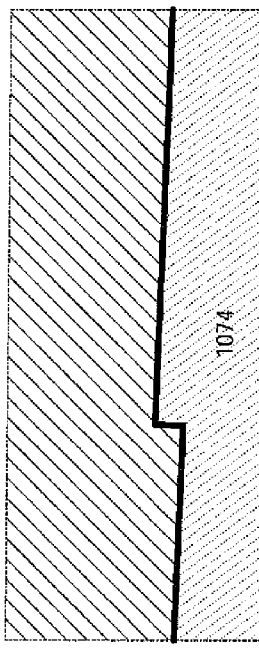
Figure 80G:
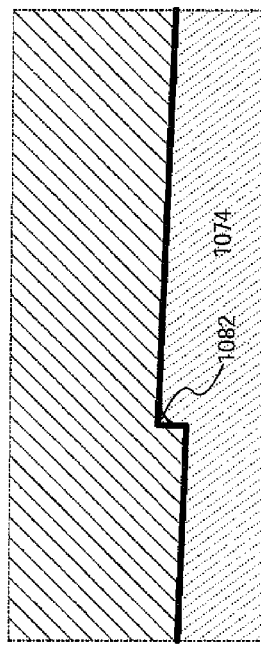
Figure 80H:
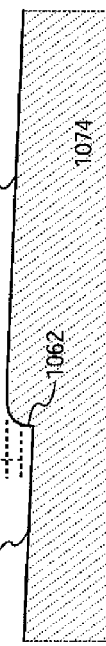

80a shows a portion of a mould 1066 to make a light guide layer. The mould features optically polished surfaces 1068 and 1070 to produce the top of the light guide layer that correspond to the surface 1048 and 1052 from FIG. 79b. The mould also features an optically polished surface 1072 to produce the insertion facet 1040. FIG. 80b shows how the mould would appear if the polymer, 1074, completely filled the mould. However, as is well understood in injection moulding it is typical for air to become trapped inside the mould, as is shown at 1076 in FIG. 80c. This deforms the produced part 1078 shown in FIG. 80d when compared with the mould. However, as shown in FIG. 80d, the functional portions, being the top facets 1048, 1052, the insertion facet 1040, and the aperture 1042, are still properly formed. By contrast, consider the mould 1080 in FIG. 80e which attempts to produce a square step. When the polymer 1074 fills the mould if a small amount of air 1082 is trapped it will round off the insertion facet 1062. This shrinks the effective portion of the insertion facet 1062 by an amount indicated by 1084. This reduction in insertion facet size increases the required manufacturing tolerances and reduces angular acceptance by requiring that light focus through a very small window. When a bump or ridge is used, by contrast, the aperture for insertion into the light guide layer remains wide irrespective of manufacturing.

Figure 81C:
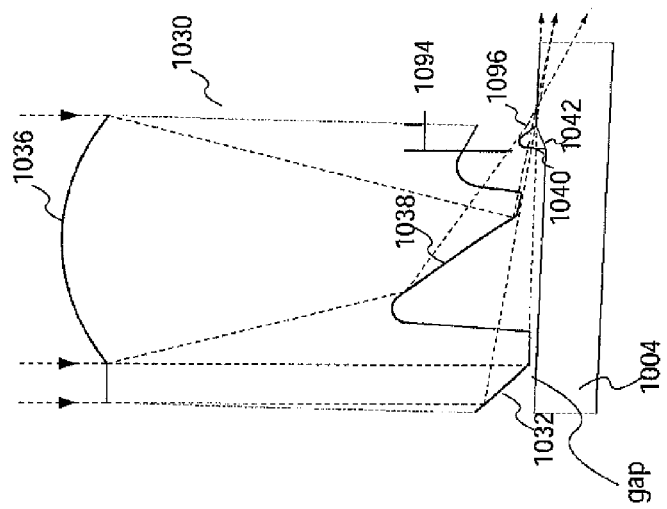
FIGS. 81A-81C show issues related to misalignment of the light guide solar panels layers.
Figure 81B:
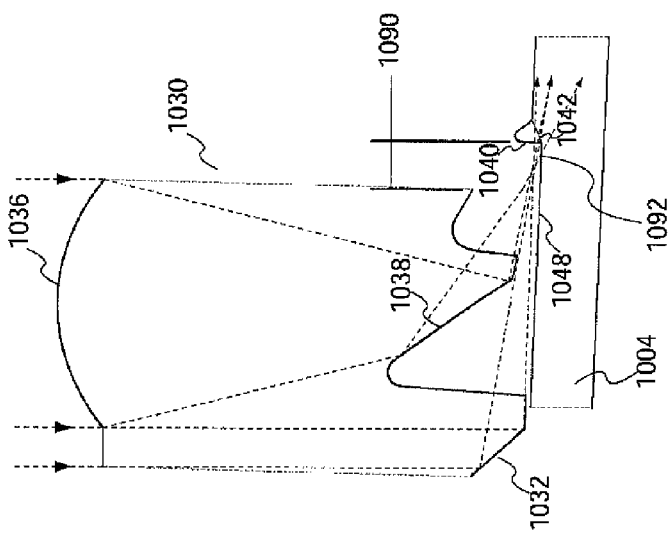
Figure 81A:
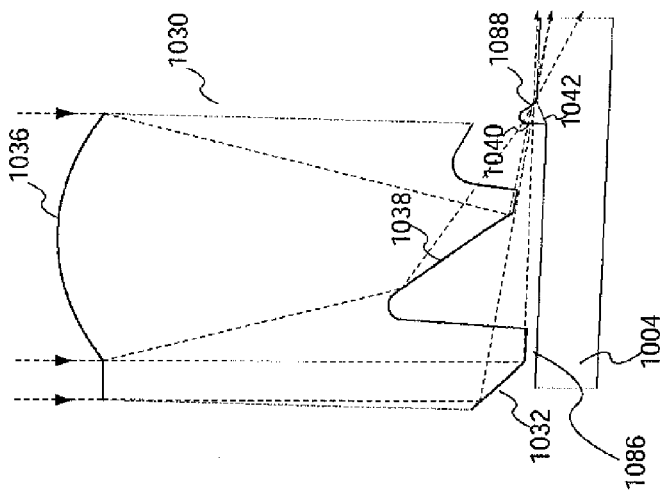

It is important for the light guide layer and the deflecting layer to be in close contact with each other for purposes of alignment. This is because each functional unit, as shown in FIG. 79, consists of a set of deflecting elements aligned with a light insertion facet and aperture on the light guide layer. In an actual part there may be a large number of functional units. Each deflecting element in the functional unit must focus light through the corresponding insertion facet and entrance aperture on the light guide layer. If the separation distance or the lateral positioning between the light guide layer and the deflecting layer falls outside of the tolerances of design then the light which is deflected and focused by the deflecting layer will not enter into the light guide layer via the insertion facets. FIGS. 81a-81c shows the same functional unit as shown in FIG. 79 but with misalignments between the deflecting layer and the light guide layer functional unit. FIG. 81a shows a vertical offset 1086 which leads to some of the light entering the light guide layer to strike the facet 1088 which could potentially lead to it's failure to couple into the light guide. FIG. 81b shows a lateral offset 1090 that can lead to some rays striking the top of the light guide layer 1042 at the point 1092. This can lead to a failure to couple light into the light guide. FIG. 81c shows a lateral offset 1094 that can lead to some rays 1096 missing the insertion facet 1040 and the aperture 1042. In all cases, excessive offsets can lead to light not passing through the insertion aperture 1042 and not coupling into the light guide, however there is clearly a tolerance to small displacements and imperfections that occur during fabrication.

Figure 82A:
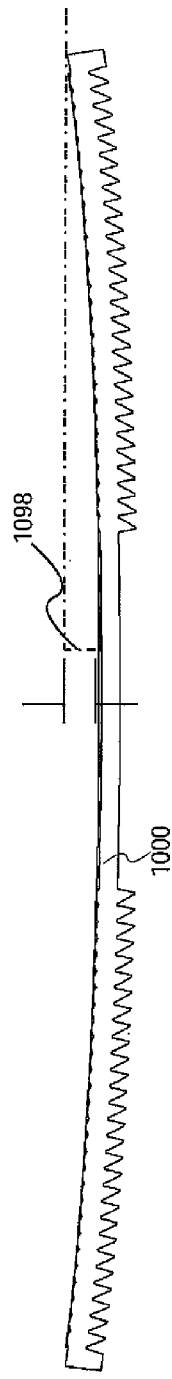
FIGS. 82A-82D show how prestressed parts can help maintain alignment, FIGS. 83A-83B further show how shows how prestressed parts can help maintain alignment.
Figure 82B:
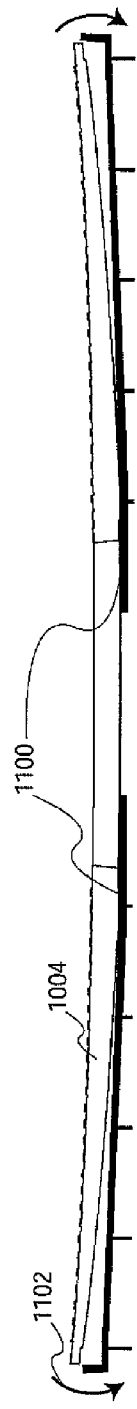
Figure 82C:
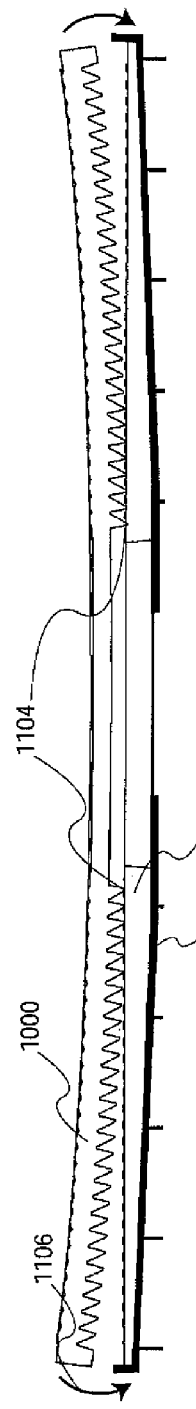
Figure 82D:
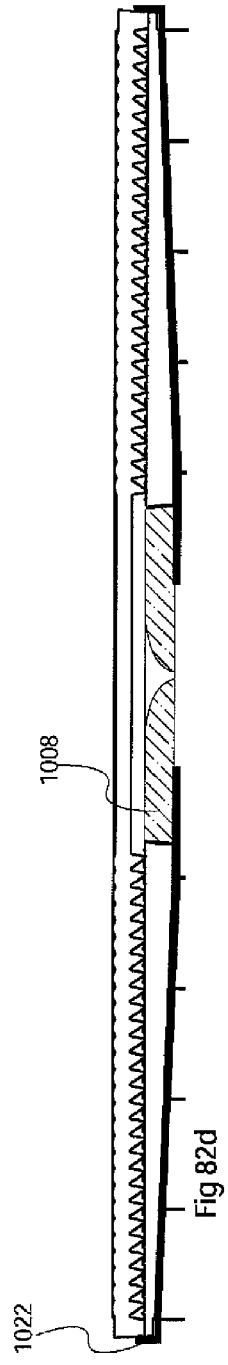

In order to maintain all the elements on the light guide layer and all the elements on the deflecting layer in proper alignment, one can take advantage of certain characteristic of the injection moulding process. FIGS. 82a-82d shows an example of how. During injection moulding it is challenging to produce very flat parts however one can very easily make parts with a bow 1098, and one can chose the direction of that bow such as is shown in FIG. 82a. The deflecting layer 1000, the light guide layer 1004 and the tray 1020 are all made with varying degrees of bow, with the tray being the flattest part and the deflecting layer being the most curved. The tray can be made extremely flat because it does not have to be transparent, whereas the deflecting layer and the light guide layer need to be optically clear and therefore material and processing choices are more limited. The light guide layer 1004 is brought into contact with the tray such that it touches at the points 1100. It is pulled down 1102 such that it conforms to the tray. The deflecting layer 1000 is brought into contact with the light guide layer at the points 1104 and it is similarly pulled down 1106 so that it conforms to the light guide layer. The seam 1022 where the three parts meet can be welded or fastened mechanically, and all three parts will maintain their alignment. Although not shown in FIGS. 82a-82c the secondary optic 1008 can be bonded to the light guide layer 1004 prior to this assembly process so that the final assembly includes the secondary optic 1008 as well.

Figure 83A:
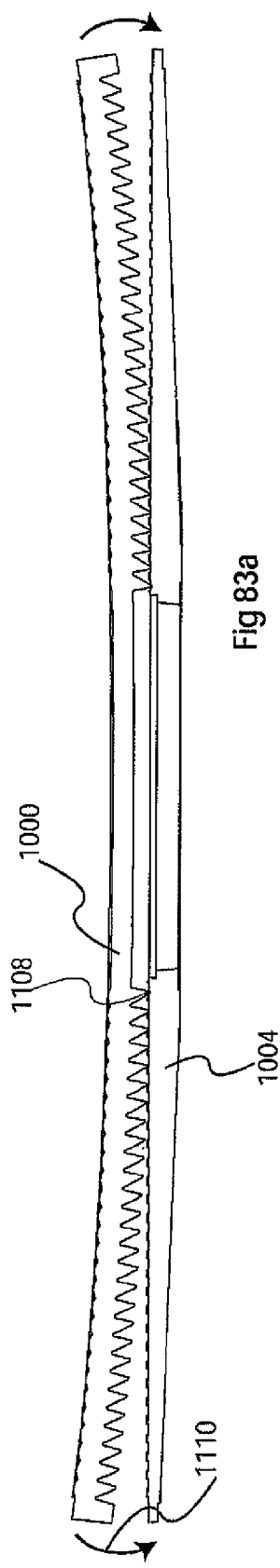
Figure 83B:
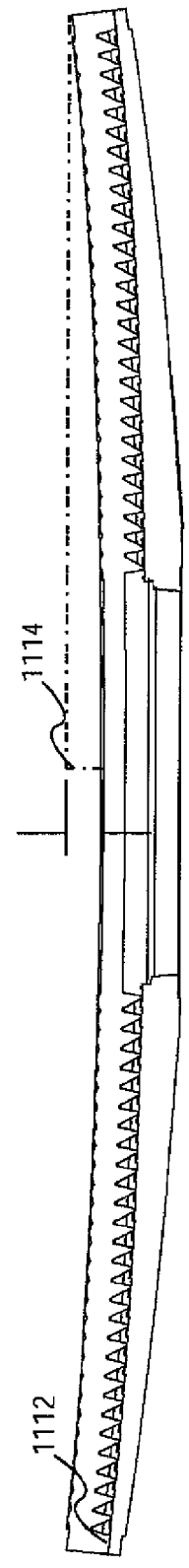
Figure 86C:
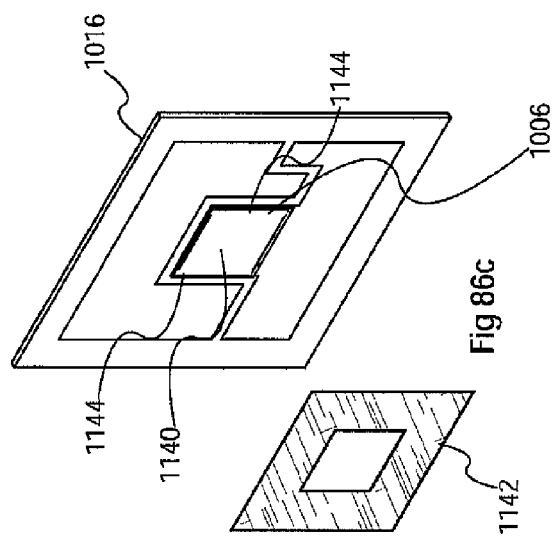
FIGS. 86A-86D show a mask on the PV cell made of a low index film.
Figure 86D:
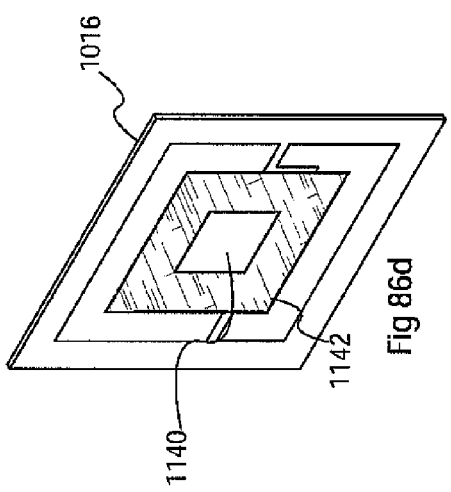
Figure 86A:
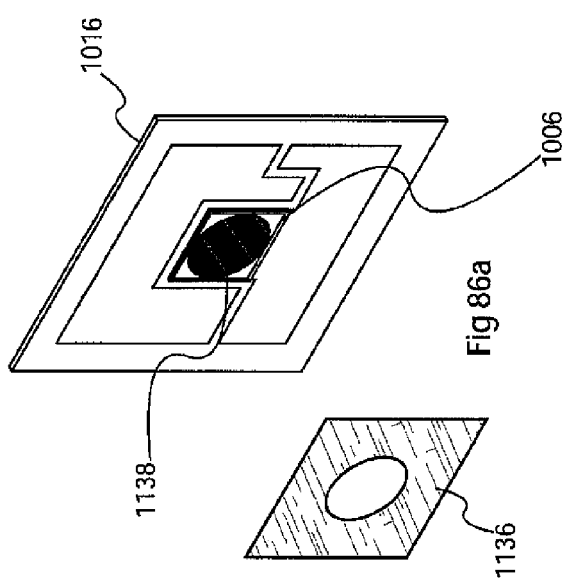
Figure 86B:
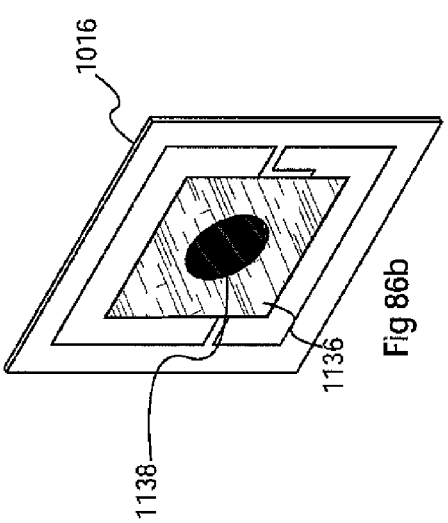

It is possible to achieve good parallelism between the deflecting layer and the light guide layer in the absence of the tray by a similar means. As shown in FIGS. 83a-83b the deflecting layer 1000 can be bowed in a similar manner as before. The parts can brought into contact 1108 and pulled together 1110, with the seams 1112 bonded in any suitable manner. The combined parts will have good parallelism and maintain contact throughout, but might maintain a slight bow 1114.

A photovoltaic cell, mounted on a cell receiver assembly, is connected to a light guide solar panel. This connection is shown in FIG. 84. The tray 1020 can have a ledge 1116 for the PCB 1016 to sit on. A butyl based sealant 1118, or another sealant, can be applied in the space between the PCB and the tray to seal the unit. A silicone encapsulant 1020 is used to bond the PV cell 1006 to the secondary optic 1008. The same silicone can hold the mirrored insert component 1022 in position. Because the tray's bottom 1024 is lower than the bottom of the PCB 1026, in order to make it simpler to thermally bond the PCB to the heat-sink so that heat due to light absorbed at the PV cell can be dissipated, a block of thermally conductive material, such as a block of copper 1028, can be attached to the bottom of the PCB. This can be attached by way of reflow soldering, welding, brazing, epoxy or another means.

FIG. 85a-85d shows details on one PCB design including the following components: a Dielectric Substrate 1120, a Substrate Back Contact 1122, a Substrate Front Contact 1124, a Triple Junction Cell 1126, a Cell Back Metallization 1128, a Cell Front Metallization 1130, a Bypass Diode 1018, a Triple junction Cell to Substrate Bond 1132, and a Cell Thermal Block 1134.

In addition to vias in the ceramic substrate, interconnection between the front and back sides of the PCB can be made by way of jumpers, such as bands of copper, that loop around the edge of the PCB. This can create a problem for sealing the PCB and the Tray together, but this problem can be overcome. For example, if copper bands are used as jumpers, these bands can be insert moulded into the Tray. An example of a jumper 1134 is shown in FIG. 85e.

The glass secondary optic (or a secondary optic made of another material such as silicone, co-polymers, or another glass replacement material) can be bonded to the PV cell. This is in order to allow light to leave the secondary optic and be absorbed by the PV cell; if there is no optical bond then the rays may totally internally reflect or partially reflect at the interface between the secondary optic and the cell. However, if this optical bond extends beyond the active area of the cell it may cause rays to strike areas on the PCB or cell other than the active areas. These rays may be lost due to absorption by a material other than the PV cell or scattered in such a way as they do not later strike the PV cell. This creates a challenge for manufacturing as the bond must be maintained very well controlled in both volume and location, and it makes it difficult to employ the optical bonding agent simultaneously as an encapsulating material to protect the PV cell. This is because an encapsulating material should completely envelop the PV cell, and the optical bond should only cover the PV cell active area that is smaller than the whole PV cell and excludes the PV cell front side metallization and contacts.

In order to avoid this issue a low index film, such as the fluoropolymer Teflot™ made by the company DuPont, can be employed to make a mask which covers the cell and cell receiver assembly and which prevents light from striking areas other than the PV cell. This is possible because low index optical materials can have lower indices of refraction than the materials used to make the secondary optic and the optical bonding agent, and therefore light striking the interface between either the secondary optic and the low index film mask, or light striking the interface between the optical bonding agent and the low index film mask, can totally internally reflect.

The position and shape of this mask is shown in FIG. 86a-86d. A low index film mask 1136 can be cut so that it has a circular hole in the center to correspond with a circular active area 1138 on a PV cell 1006. The film can be brought into contact or adhered to the PCB 1016 so that it only exposes the active area of the PV cell. Alternatively, if a PV cell 1006 is being employed that uses a rectangular active area 1140 then the mask 1142 can be cut accordingly so that it exposes only the rectangular active area excluding the cell bus bars 1144. The action of this film is shown in FIG. 87. The film 1136 is placed between the secondary optic 1008 and the PV cell 1006. An encapsulant 1146 is allowed to envelop the cell and can be allowed to flow onto both sides of the film, connecting it to both the secondary optic 1008 and the PCB and cell. Light will totally internally reflect 1148 at any interface between the encapsulant and the film. In the hole at the center of the film, light is allowed to pass through and strike the cell active area.

Figure 88B:
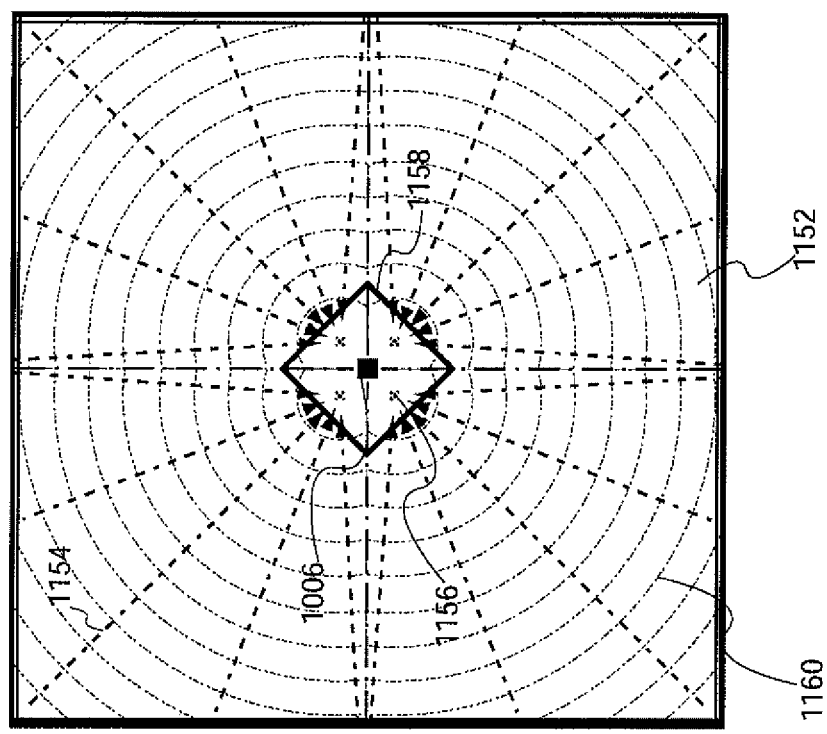
FIGS. 88A-88B show a four quadrant non-rotationally symmetric design of the light guide solar panel.
Figure 88A:
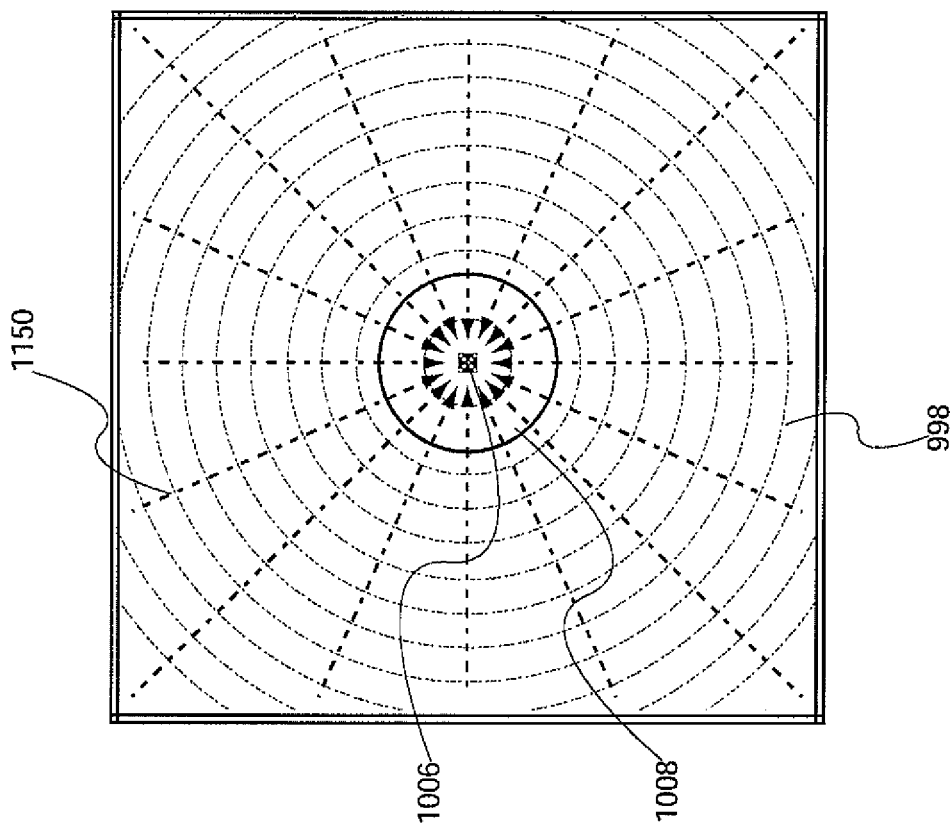

The deflecting layer and light guide layer design, such as that shown in cross section in FIG. 76, is essentially a linear optic that has been revolved so that the light that it collects converges to the central axis of revolution. This produces a rotationally symmetric optic that causes all the light to converge to the central axis of rotation where the secondary optic couples said light onto a PV cell. However, the design could be swept in another manner such that the light does not converge to a central axis, but instead converges to other points or does not converge at all. Consider one example of a useful way of doing this shown in FIGS. 88a & 88b. FIG. 88a shows the design for a light guide solar panel 998 that causes all the light trapped in the light guide layer 1150 to converge to the central PV cell 1006 where it needs to be redirected down onto the PV cell by a secondary optic 1008. An alternative light guide solar panel 1152, shown in FIG. 88b could instead have four quadrants, shown as separated by the dashed lines. The trapped light 1154 in each quadrant could converge to the points 1156 marked by a dashed X. The secondary optic 1158 would also be non-rotationally symmetric and would take the light from each quadrant and combine this light onto a single, central PV cell 1006. The four quadrants could be made by sweeping the linear optical design along circles concentric about each of the focal points 1156 in each quadrant. The resultant arcs over which the features of the deflecting layer and light guide layer would follow are shown with the dotted lines 1160. Such a light guide solar pane could be made in a nearly identical fashion as the panel already described, with the only changes being in the designs of the deflecting layer, the light guide layer, the tray (so that it conforms to the light guide layer) and the secondary optic. Everything else about materials, assembly processes, and fabrication considerations remains the same.

FIG. 89a-89e shows an example of a four-quadrant design. FIG. 89a shows a single quadrant with a deflecting layer 1162 and a light guide layer 1164 (tray and other components not shown). One quarter of the secondary optic 1158 is also shown. The PV cell 1006 is shown at the center. FIG. 89b shows the four quadrants in a light guide solar panel 1152. FIG. 89c shows how a cross section of one quadrant can look, with the deflecting layer 1162 inserting light into the light guide layer 1164, and the secondary optic 1158 employing two reflecting surfaces 1166 and 1168 with focusing power in order to couple the light from the light guide layer onto the cell 1006. FIG. 89d shows how the central portion 1170 of the deflecting layer can be arced to span over the secondary optic that is taller than the light guide layer. FIG. 89e shows another example of a secondary optic 1172 where two reflections 1174 and 1176 with focusing power are employed to couple light from the light guide onto the PV cell, however the second reflection 1176 sits on the opposite side of the center line 1178 of the whole panel.

Other designs for secondary optics can also be considered, and a few are shown in FIG. 90. FIG. 90a shows a secondary optic design 1180 where three reflecting surfaces with power 1182, 1184, and 1186 are employed to couple light from the light guide layer 1164 to the PV cell 1006. FIG. 90b shows a secondary optic 1188 that can be made with quadrants where one reflecting surface 1190 is made in four segments and the second reflecting surface 1192 is one continuous surface shared by the four quadrants. FIG. 90c shows another secondary optic 1194 where it is comprised of materials with different indices, with the outside material 1196 having index $n_1$ and the material closest to the PV cell 1198 having index $n_2$. The interface 1200 made by these two materials can have focusing power and can help to couple light from the light guide 1164 onto the PV cell 1006. This can be used in combination with a reflecting element 1202.

Although the secondary optics described in FIGS. 89-90 were described in reference to a four quadrant design, all could just as equivalently be used in a circularly symmetric design as has been described in previous submissions of this patent family.

A different challenge is presented when one tries to do low concentration with a thin light guide solar panel onto a relatively large cell. Consider FIG. 91, showing a block diagram view of a light guide solar panel. The top of the panel 2000 has zones A that collect light and conduct that light in the light guide 2002 by total internal reflection, concentrating it so that it passes through a zone B that has less area than zone A. Then the light is spread across a third zone C onto a PV cell 2004. Light incident on a fourth zone D on top of the PV cell will pass through the light guide solar panel without being subject to total internal reflection and will strike the cell directly.

Figure 92:
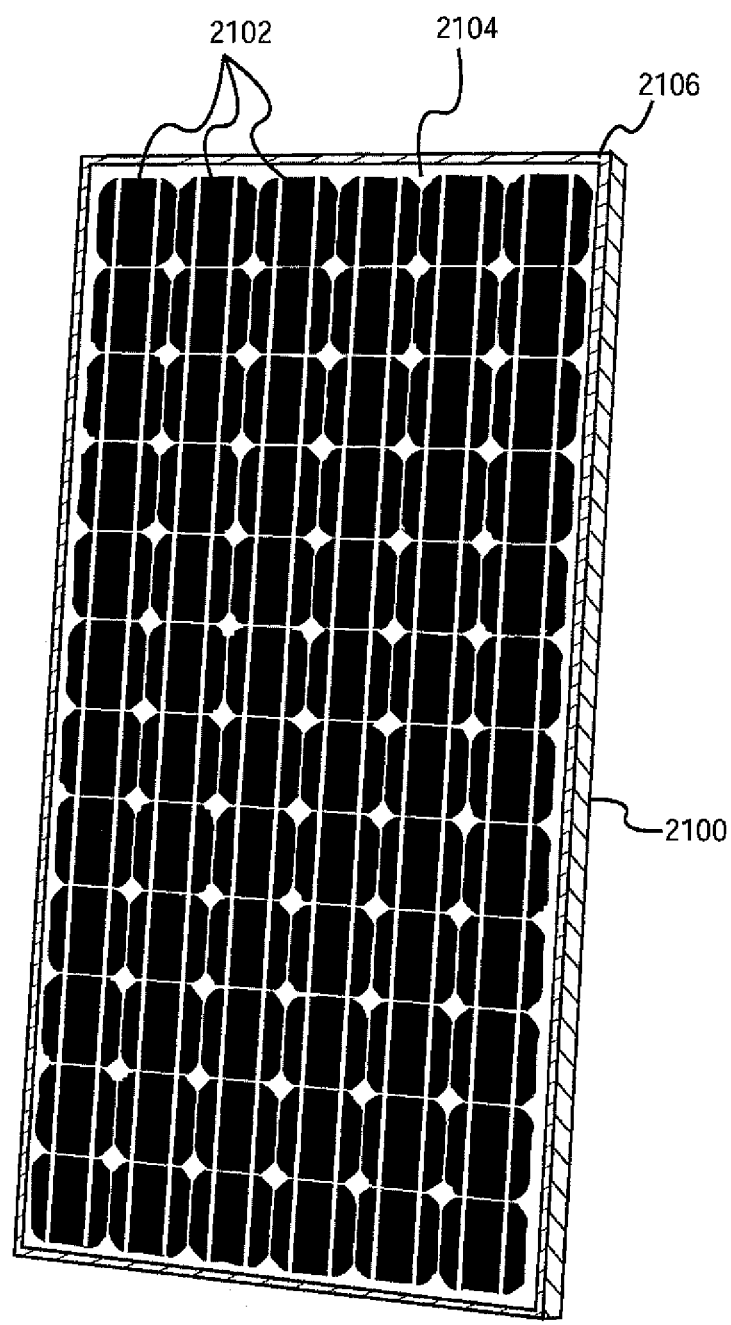
FIG. 92 shows a typical solar panel.

Medium levels of concentration are very useful for silicon solar cells such as those used in typical solar panels. A typical solar panel 2100 is shown in FIG. 92. Typical solar panels use silicon photovoltaic cells 2102 and a glass sheet cover sheet 2104, as well as an aluminum frame 2106. Typical solar panels are expensive primarily because photovoltaic cells are expensive. Concentrated photovoltaics can be less expensive because they replace the expensive photovoltaic cells with less expensive optics.

FIGS. 93a & 93b show a light guide solar panel 2107 of the present invention. In FIG. 93a most of the cells 2102 have been removed and replaced with light guide solar optics 2108 that take incident sunlight 2110 and redirect it towards the cells. The cover glass sheet 2104 is still in place and the majority of the panel structure is identical. Because of the increase in sunlight at the cells, there may be a corresponding increase in heat and therefore there may be heat sinks or other cooling on the backs of the panels in order to enable the cells to remain cool.

FIG. 93b shows another light guide solar panel 2111 where the PV cells 2112 are smaller than in the original panel. The panel in FIG. 93b has a higher concentration factor than the panel in FIG. 93a.

Figure 94A:
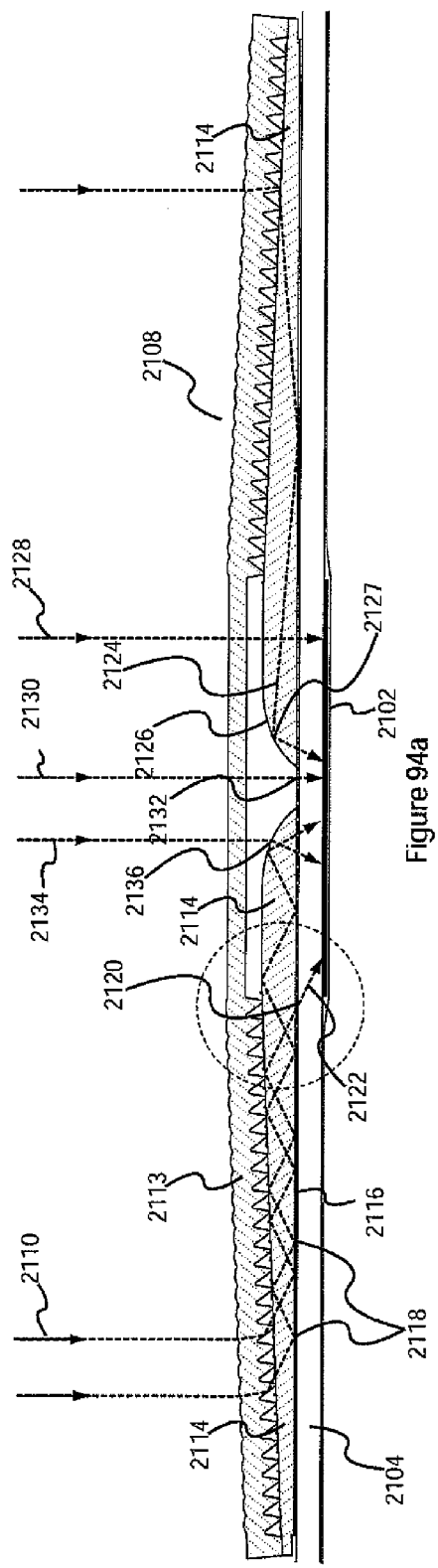
FIGS. 94A-94B show cross sectional views of a single optic and a single PV cell and describes operation.
Figure 94B:
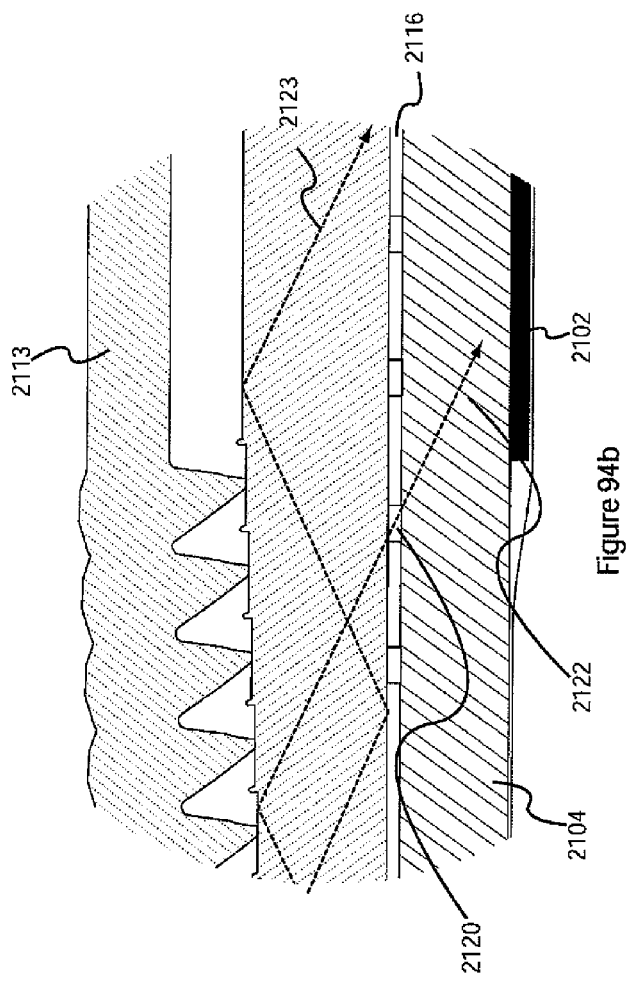

These light guide solar panels work much like previously described light guide solar panels and is shown in cross section in FIG. 94. An injection moulded PMMA deflecting layer 2113 deflects and focuses incident light 2110 into an injection moulded PMMA light guide layer 2114 which propagated the light through total internal reflection to a cell 2102 at the center of the optics. In this embodiment, the light guide layer 2114 is attached to a glass sheet 2104, the same sheet that is protecting the cells. Separating the glass sheet from the light guide layer is a sheet of low index material 2116. This low index sheet can be, for example, a sheet of fluoropolymer such as those made by DuPont. The sheet can be bonded optically to the PMMA of the light guide layer and to the glass sheet 2104 using ethylene vinyl acetate, polyvinyl acetate, silicone, or another lamination material. Because the low index sheet 2116 has a lower index than the PMMA light guide 2114 total internal reflections can occur, such as a points 2118. In the area above the PV cell the low index sheet is perforated with holes 2120. These holes are filled with a material whose index is higher than the sheet, and close to that of the glass sheet and PMMA, so that some light traveling in the light guide layer, such as the ray 2122, can pass through the low index sheet and strike the PV cell 2102. Other rays, such as ray 2123, will continue to propagate because they will reflect off the low index sheet rather than passing through the perforation holes. Other rays, such as ray 2124, will be at a shallow angle and will be deflected downwards by a curved facet 2126 at the end of the light guide. This reflection 2127 can be by total internal reflection. Other rays, such as ray 2128, will be incident on the optic directly above the PV cell and will simply pass through the various windows of the deflecting layer and light guide layer and low index film without being deflected and hit the PV cell. Other rays, such as ray 2130, hit the optic directly above the small hole 2132 in the center of the light guide layer and will pass through the deflecting layer window and the glass sheet to hit the PV cell. Other rays, such as ray 2134, will hit the curved facet 2126 at the end of the light guide layer at 2136, and they will be deflected but still hit the PV cell.

The uniformity of light on the PV cell is determined by the perforation pattern in the low index film. FIG. 95 shows some low index films 2116 with perforation holes 2120 in two configurations. As will be understood by a skilled worker, the optimal mask configuration can be worked out using a computer optimization routine. It is possible to make masks that provide for fully uniform light on the PV cell, which enhances performance. The perforated film is what allows the light guide to be leaky; it allows some light to escape which allowing other light to continue inside the light guide. In this way, the concentration on the cell can be controlled and large cells can be employed at medium concentration levels.

FIG. 96 shows a cut away three-dimensional view including a heat sink 2140. The heat sink sits under the PV cell 2102. The PV cell is encapsulated under a sheet of glass sheet 2104, with the low index film 2116 on top of that and the deflecting layer 2113 and light guide layer 2114 on top of that. The deflecting layer is bonded to the light guide layer at the flange 2142 of the optics.

Figures 96A, 96B:
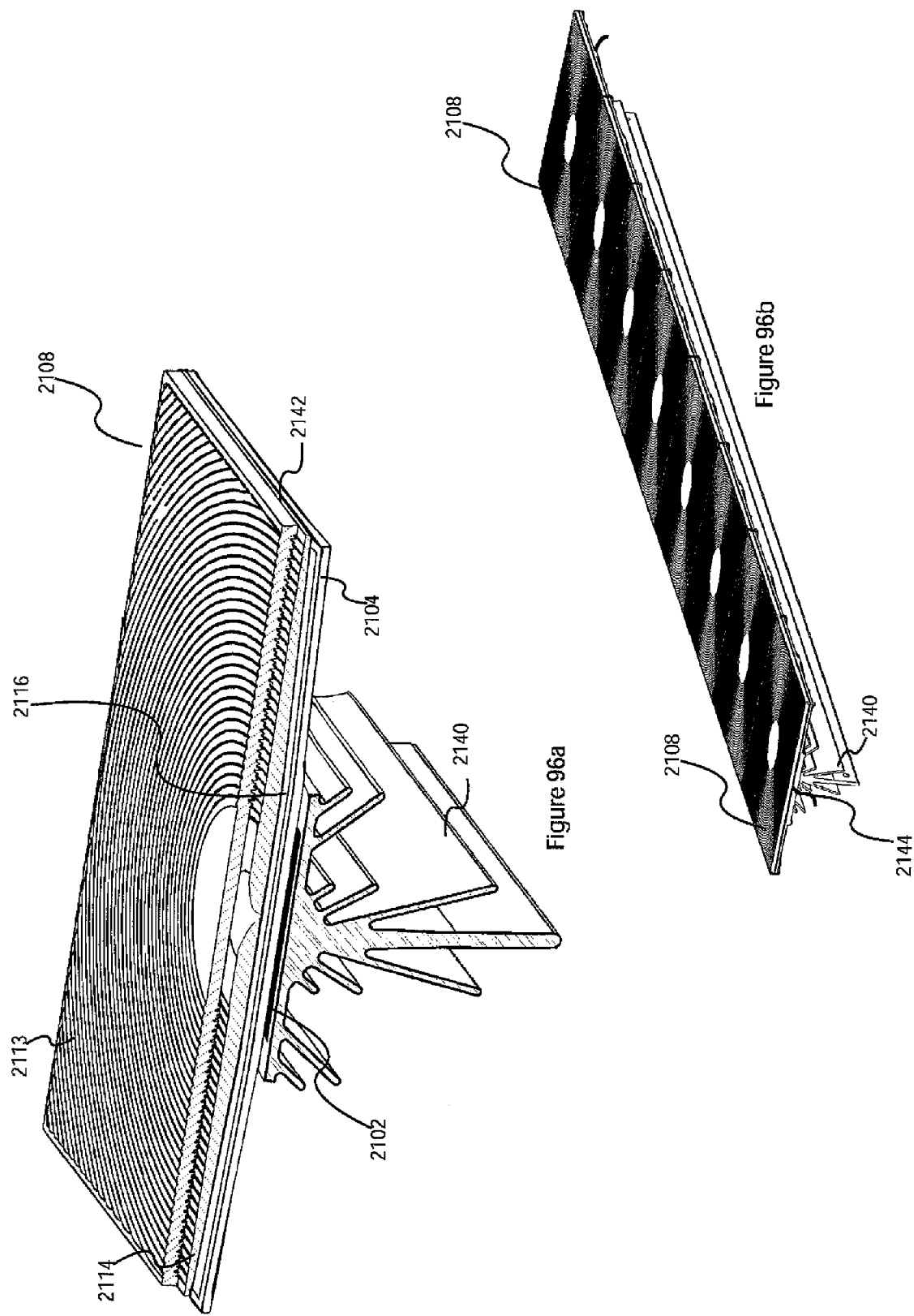
FIGS. 96A-96B show a light guide solar panel with a heat sink.

The heat sink configuration shown in FIG. 96a could be used* in conjunction with the *panels shown in FIG. 93. Alternatively, the aluminum heat sink could be extruded and longer than a single and serve as a support for the module in the manner shown in FIG. 96b.

Figure 97:
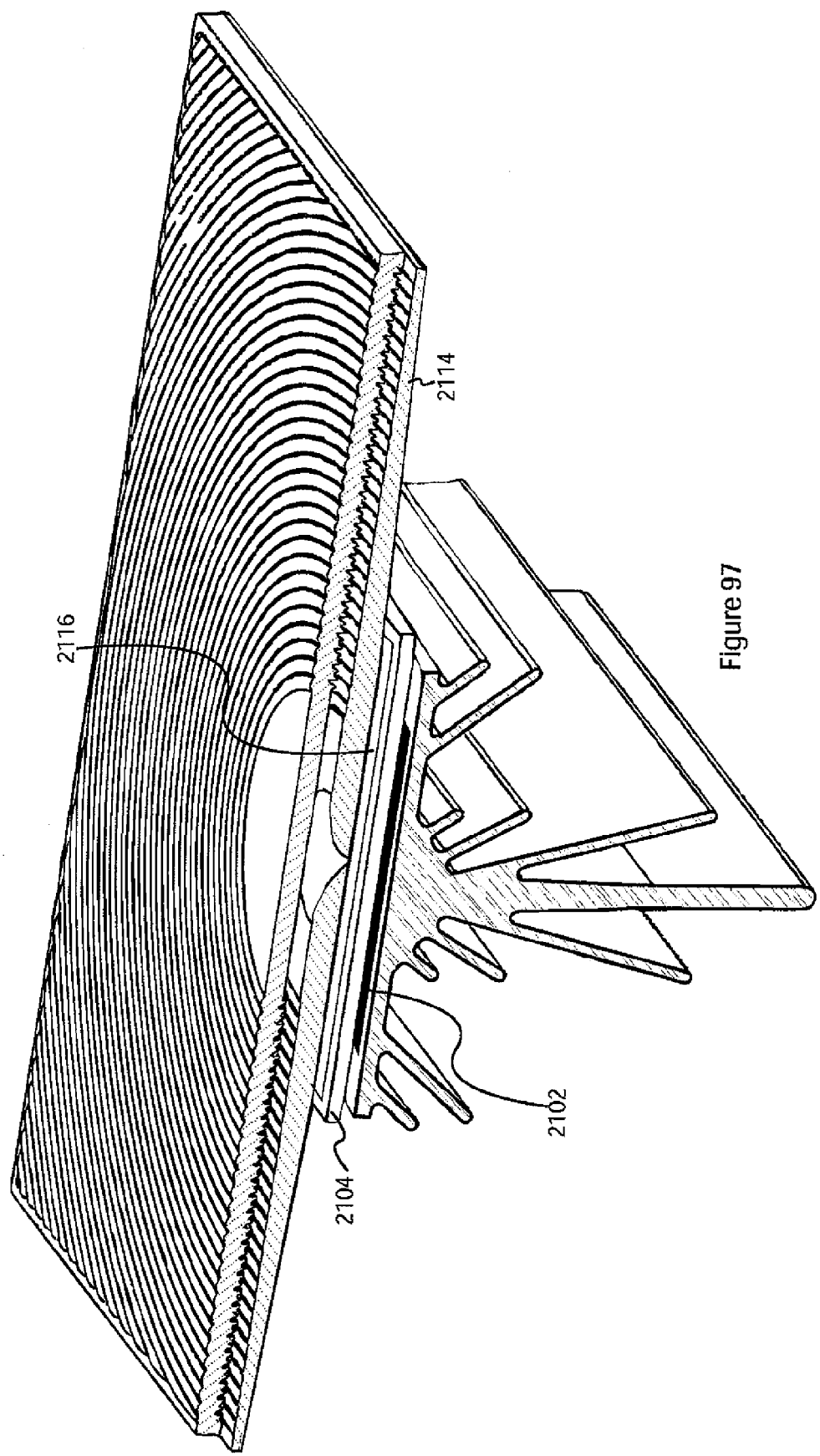
FIG. 97 shows another embodiment of a light guide solar panel with a heat sink.

The glass sheet does not need to extend the full width of the light guide layer; it only needs to cover the cell. This is shown in FIG. 97. The glass sheet 2104 is smaller than the light guide layer 2114 and only just covers the cell 2102. The perforated low index film 2116 is only needed in the area between the PV cell and the light guide layer.

For greater clarity, the holes 2120 in the low index film 2116 must be filled with a material whose index is greater than the index of the low index film. This material inside the holes must be optically bonded to the light guide layer and the glass sheet in order to provide an optical path from the light guide to the glass sheet and make the light guide leak.

In place of a low index film, air, which has an index of refraction of 1.0, could also be used. In this case, steps would need to be taken in order to ensure that the air gap between then light guide layer and the glass substrate did not collapse. FIG. 98 shows some examples of this. FIG. 98a shows how an optical path can be made between the light guide layer 2114 and the glass 2104 if there are dimples 2146 on the bottom of the light guide layer. These dimples make contact with and are optically bonded to the glass 2104, and they preserve an air gap 2148. This creates exactly the same leaky light guide layer as a perforated low index film, with the dimples acting as the holes in the film and the air acting as the film itself. The dimples would be patterned on the bottom of the light guide layer above the cell in the same pattern that the perforations in the low index film would be.

Alternately, as shown in FIGS. 98b & 98c a film 2150 whose index is close to the index of PMMA and the glass sheet could be perforated and placed in between the light guide layer 2114 and the glass sheet 2104. The air 2148 in the holes would be left in place. The film would be optically bonded to the glass sheet and the light guide layer, and act as an optical conduit from the light guide layer to the glass sheet allowing for the leaky light guide. Rays striking the bottom fact 2152 of the light guide layer above where a hole is present would see a PMMA to air interface and would totally internally reflect.

Figure 99:
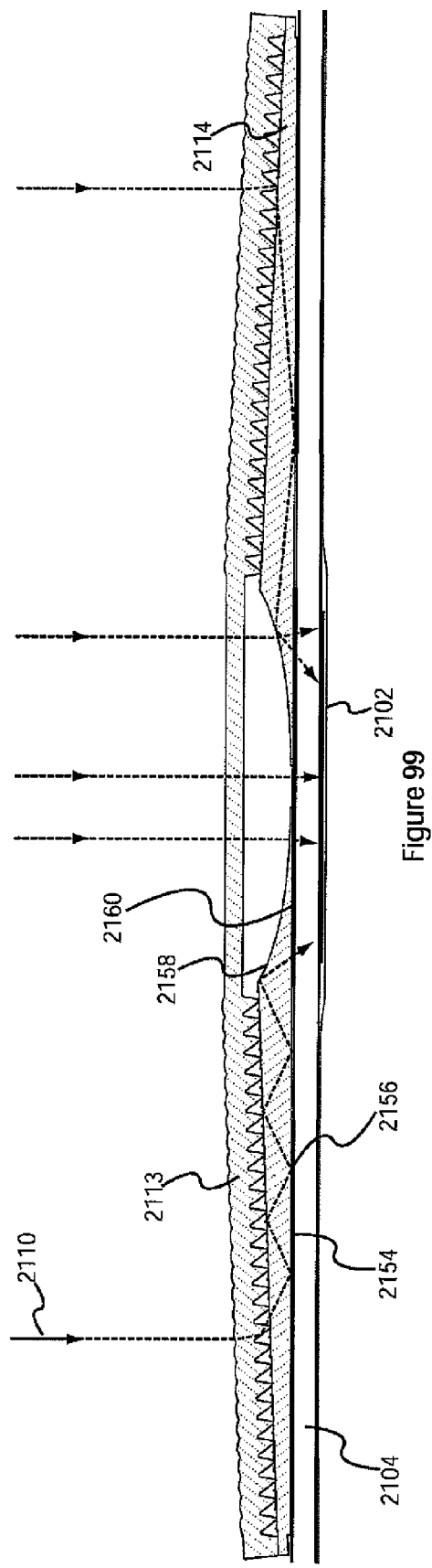
FIG. 99 shows another embodiment of a light guide solar panel with a secondary reflecting surface for spreading out the light.

Another way to do medium concentration is shown in FIG. 99. An air gap or low index gap 2154 is between the light guide layer 2114 and the glass cover sheet 2104. This allows light in the light guide layer to totally internally reflect 2156. A curved surface 2158 is used to reflect the light in the light guide layer down towards the PV cell. The curved surface spreads the light towards the PV cell 2102. An optical bond 2160 is between the light guide layer 2114 and the glass cover sheet 2104 so that light can pass from the light guide layer through the glass cover sheet to the PV cell 2102.

Figure 100A:
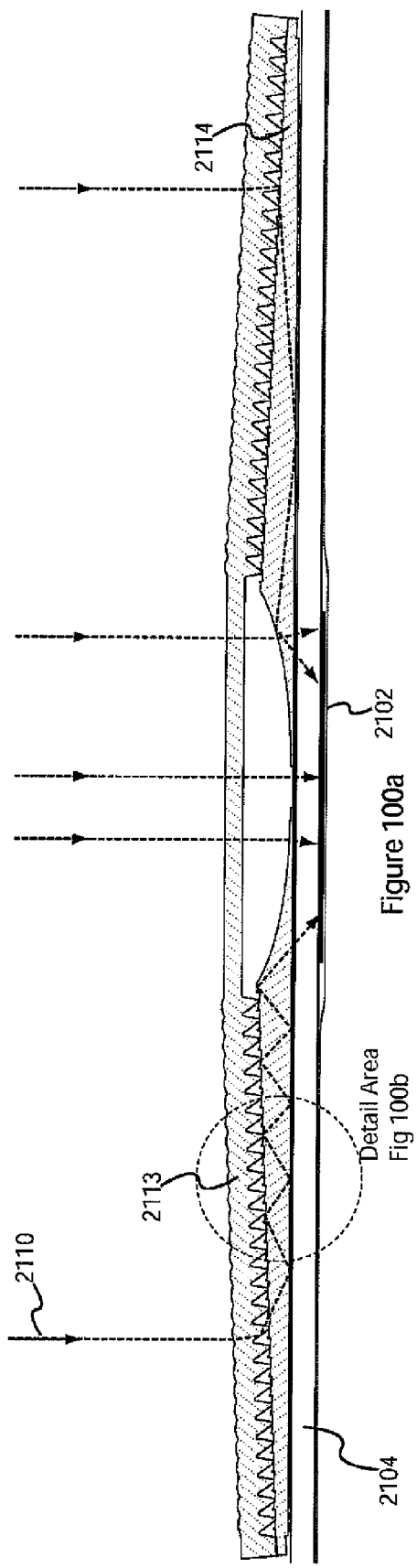
FIGS. 100A-100B show an embodiment of a light guide solar panel where the top facets and the bottom face of the light guide layer converge.
Figure 100B:
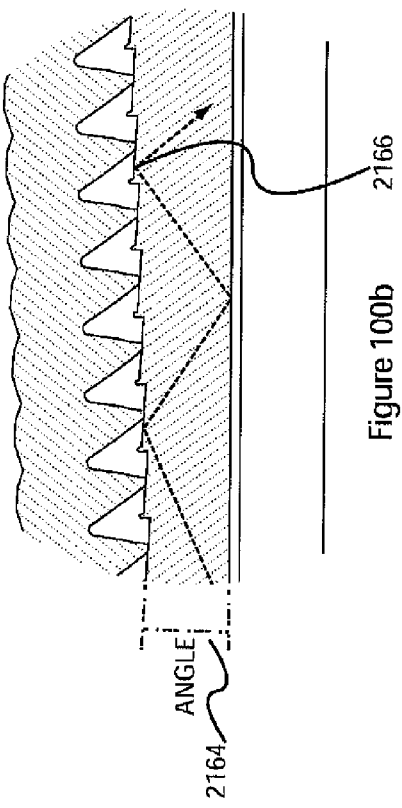

FIGS. 100a & 100b show another variant on the design from FIG. 99. The top facets 2160 (shown at FIG. 99a) of the light guide layer 2114 and the bottom facets 2162 can have a slight convergence as shown by the angle 2164. As will be understood by the skilled worker, this slight convergence causes the light rays traveling in the light guide layer to increase in angle of incidence 2166 slightly with each reflection. This can eventually lead to light escaping the light guide layer. This was described in FIG. 6 to show that the light will eventually escape due to increased angle of incidence. However, provided that the increase in angle of incidence is done in a controlled manner it can be used to increase the angle of incidence of light without causing that light to escape, and this can encourage light to strike the PV cell towards its outside edge. This is a good thing to do for medium concentration levels as defined in FIG. 91.

Figure 101:
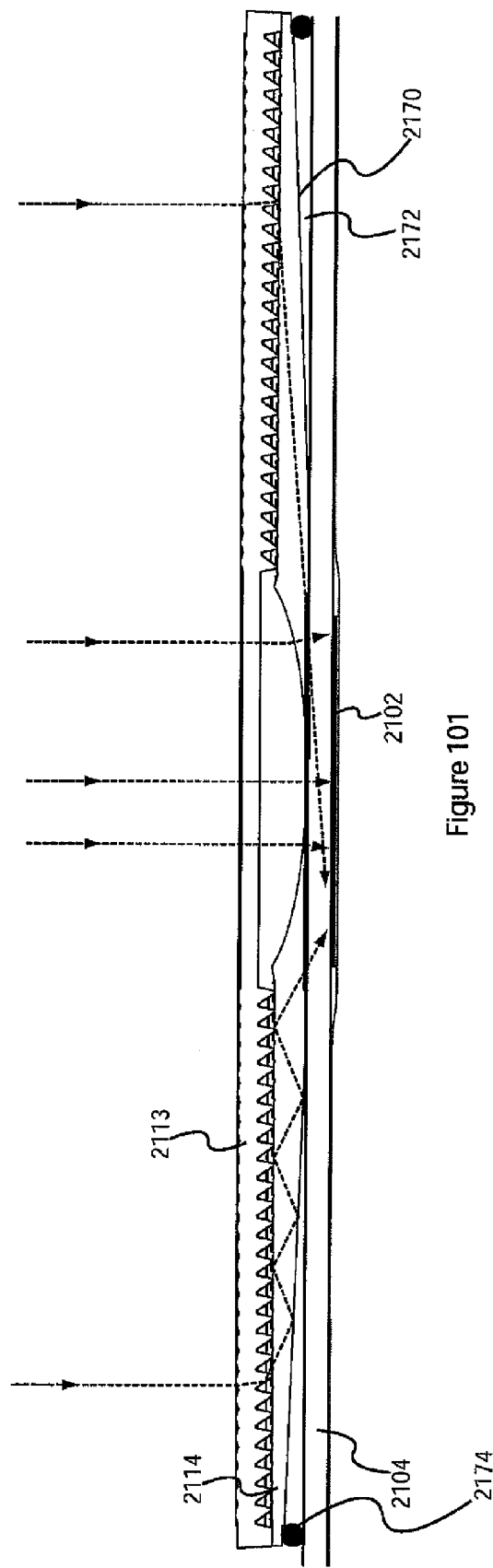
FIG. 101 shows another embodiment of a light guide solar panel.

FIG. 101 shows another embodiment of a medium concentration light guide solar panel where the light guide layer's bottom face 2170 is not in contact with the glass sheet 2104 but instead is sloped leaving a substantial air gap 2172 between the light guide layer and the glass cover sheet. A sealant of some sort 2174 would be employed at the edges of the light guide layer to prevent the light guide layer from coming off the glass and in order to prevent dirt and other contaminants from entering the gap.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A solar concentrator comprising:
a light-insertion layer that is transmissive to sunlight, the light-insertion layer having a plurality of optical deflecting elements for redirecting light impinging thereon into an optical waveguide slab via total internal reflection;
the optical waveguide slab being transmissive to sunlight and having:
a first reflective surface;
a plurality of reflectors opposite the first reflective surface and proximate the light-insertion layer; and
an output surface;
the optical waveguide slab being substantially wedge-shaped in cross-section between the output surface and an upstream edge of the optical waveguide slab, with the wedge opening toward the output surface,
the optical waveguide slab being optically coupled to the optical deflecting elements of the light-insertion layer to receive light therefrom,
the optical deflecting elements, the first reflective surface and the plurality of reflectors being positioned and arranged such that received light from the light insertion layer is guided through the optical waveguide slab towards the output surface via reflections between the first reflective surface and the plurality of reflectors, and
the optical deflecting elements and the reflectors being arranged along arcs of concentric circles; and
a secondary optical element that is transmissive to sunlight, the secondary optical element having:
an optical entry surface optically coupled to the output surface to receive light therefrom;
an optical exit surface; and
at least one secondary reflective surface positioned to redirect at least a portion of the light received through the optical entry surface, to the optical exit surface;
the solar concentrator having a substantially planar shape.

2. The solar concentrator of claim 1, wherein:
the optical waveguide slab comprises a plurality of waveguide entry surfaces through which light is received from the light-insertion layer;
each waveguide entry surface is located adjacent to and between the reflectors;
each of the optical deflecting elements is associated with and redirects light toward one of the waveguide entry surfaces, and
the first reflective surface is opposite the plurality of waveguide entry surfaces.

3. The solar concentrator of claim 1 wherein the optical deflecting elements and the reflectors have rotational symmetry about a common central axis of rotational symmetry.

4. The solar concentrator of claim 3 wherein the optical deflecting elements and the reflectors are arranged along concentric circles and wherein the optical entry surface of the secondary optical element is an annular ring centered about the common central axis of rotational symmetry.

5. The solar concentrator of claim 2 wherein the plurality of deflecting elements are arranged in a plurality of functional units, each functional unit comprising one or more of the plurality of deflecting elements and each functional unit being associated with one of the plurality of waveguide entry surfaces, and wherein at least one of the deflecting elements of each functional unit is a reflective surface.

6. The solar concentrator of claim 2 wherein each waveguide entry surface is part of a ridge.

7. The solar concentrator of claim 3 wherein:
the secondary optical element has rotational symmetry about the common central axis of rotational symmetry;
the optical entry surface of the secondary optical element is for receiving light travelling substantially toward the common central axis of rotational symmetry; and
the optical exit surface of the secondary optical element is generally parallel to the plane of the solar concentrator.

8. The solar concentrator of claim 7, wherein in operation, light received by the secondary optical element is guided by total internal reflection.

9. The solar concentrator of claim 1, wherein the secondary reflective surface comprises at least one first curved portion.

10. The solar concentrator of claim 9, wherein the at least one first curved portion comprises a mirror coating to redirect the received light toward the optical exit surface of the secondary optical element.

11. The solar concentrator of claim 1, wherein the solar concentrator is of a planar shape that is tileable.

12. The solar concentrator of claim 11, wherein the planar shape of the solar concentrator is square.

13. The solar concentrator of claim 1 wherein the surface of the optical waveguide slab through which the optical waveguide slab is optically coupled to the light-insertion layer comprises an anti-reflection texture for preventing back reflections.

14. The solar concentrator of claim 1, wherein the secondary optical element is made of a thermally insulating material.

15. A light-guide solar panel module comprising the solar concentrator of claim 1 and at least one solar energy collector optically coupled to the optical exit surface.

16. The light-guide solar panel module of claim 15 wherein the at least one solar energy collector is at least one photovoltaic cell mounted on a circuit board and the light-guide solar panel module further comprises a low index film mask between the circuit board, and the optical waveguide slab and the secondary optic for preventing light from striking areas of the printed circuit board other than the at least one photovoltaic cell.

17. The light-guide solar panel module of claim 15 wherein the at least one solar energy collector is at least one photovoltaic cell mounted on a circuit board and the light-guide solar panel module further comprises:
- a tray for supporting the light-insertion layer and the optical waveguide slab; and
- a heat sink in thermal communication with the at least one photovoltaic cell.

18. The light-guide solar panel module of claim 15 wherein each of the at least one solar energy collector is a photovoltaic cell and the secondary reflective surface of the secondary optical element comprises four quadrants, each quadrant having a curved portion and tapering toward a common point, and each quadrant for focusing the light impinging on that quadrant onto an associated photovoltaic cell that is distinct from the photovoltaic cells associated with the other quadrants.

19. A light-guide solar panel assembly comprising a plurality of electrically interconnected optical subassemblies affixed to a heat sink, each optical subassembly comprising:
- a light-guide solar panel module of claim 18 wherein each of the at least one solar energy collector is a photovoltaic cell mounted on a circuit board, and
- a tray supporting the light-insertion layer, the optical waveguide slab, the secondary optic and the circuit board, the tray comprising a bottom wall and an aperture through the bottom wall, wherein the at least one photovoltaic cell is optically connected to the secondary optic through the aperture of the tray, and wherein the circuit boards of the plurality of optical subassemblies are electrically interconnected in series, and wherein the photovoltaic cells are in thermal communication with the heat sink.

20. The light-guide solar panel assembly of claim 19 wherein the trays are integrally formed such that the plurality of light-guide solar panel modules are supported by a single assembly tray, and wherein the light-insertion layers are integrally formed.

* * * * *